US012772729B2

(12) United States Patent
Lee et al.

(10) Patent No.: US 12,772,729 B2
(45) Date of Patent: Oct. 20, 2026

(54) LIGHT-EMITTING DEVICE AND ELECTRONIC APPARATUS INCLUDING THE LIGHT-EMITTING DEVICE

(71) Applicant: SAMSUNG DISPLAY CO., LTD., Yongin-si (KR)

(72) Inventors: Dongchan Lee, Yongin-si (KR); Jinwon Sun, Yongin-si (KR); Eunhye Song, Yongin-si (KR); Jonghyeon Lee, Yongin-si (KR); Pyungeun Jeon, Yongin-si (KR); Changwoong Chu, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 961 days.

(21) Appl. No.: 18/150,053

(22) Filed: Jan. 4, 2023

(65) Prior Publication Data

US 2023/0217817 A1 Jul. 6, 2023

(30) Foreign Application Priority Data

Jan. 5, 2022 (KR) ........................ 10-2022-0001685

(51) Int. Cl.

| | |
|---|---|
| ***H10K 50/11*** | (2023.01) |
| ***C09K 11/06*** | (2006.01) |
| ***H10K 85/30*** | (2023.01) |
| ***H10K 85/60*** | (2023.01) |
| *H10K 50/16* | (2023.01) |
| *H10K 59/12* | (2023.01) |
| *H10K 101/00* | (2023.01) |
| *H10K 101/40* | (2023.01) |

(52) U.S. Cl.

CPC ............ *H10K 85/654* (2023.02); *C09K 11/06* (2013.01); *H10K 85/346* (2023.02); *H10K 85/6572* (2023.02); *C09K 2211/1044* (2013.01); *C09K 2211/185* (2013.01); *H10K 50/11* (2023.02); *H10K 50/166* (2023.02); *H10K 59/12* (2023.02); *H10K 2101/40* (2023.02); *H10K 2101/90* (2023.02)

(58) Field of Classification Search

None

See application file for complete search history.

(56) References Cited

U.S. PATENT DOCUMENTS

| | | | | |
|---|---|---|---|---|
| 7,994,713 | B2 | 8/2011 | Yoon et al. | |
| 10,879,472 | B2 * | 12/2020 | Yoo | H10K 85/626 |
| 2003/0043571 | A1 * | 3/2003 | Toguchi | H10K 59/878 362/559 |
| 2005/0073247 | A1 * | 4/2005 | Yamazaki | H10K 50/17 313/506 |
| 2014/0034940 | A1 * | 2/2014 | Yu | H10K 85/6572 252/500 |
| 2016/0336519 | A1 | 11/2016 | Seo et al. | |
| 2017/0170411 | A1 * | 6/2017 | Wallikewitz | H10K 85/626 |
| 2017/0331067 | A1 * | 11/2017 | Park | H10K 50/16 |
| 2018/0033993 | A1 * | 2/2018 | Seo | H10K 85/615 |
| 2019/0252622 | A1 | 8/2019 | Kim et al. | |
| 2019/0393426 | A1 | 12/2019 | Masuda et al. | |
| 2020/0295272 | A1 * | 9/2020 | Lee | C09K 11/025 |
| 2020/0388767 | A1 | 12/2020 | Masuda et al. | |
| 2021/0013440 | A1 * | 1/2021 | Kim | H10K 50/19 |
| 2021/0066617 | A1 | 3/2021 | Shin et al. | |
| 2021/0074940 | A1 | 3/2021 | Song et al. | |
| 2021/0184151 | A1 | 6/2021 | Lee et al. | |
| 2021/0320255 | A1 * | 10/2021 | Kim | H10K 71/70 |
| 2021/0367157 | A1 * | 11/2021 | Galan Garcia | C07D 221/18 |
| 2022/0002218 | A1 * | 1/2022 | García | C07D 241/12 |
| 2022/0169661 | A1 * | 6/2022 | Yan | H10K 85/654 |
| 2023/0126868 | A1 * | 4/2023 | Kambe | H10K 50/12 257/40 |
| 2023/0232651 | A1 * | 7/2023 | Gao | H10K 50/181 257/40 |
| 2023/0413666 | A1 * | 12/2023 | Gao | H10K 85/622 |
| 2024/0400892 | A1 * | 12/2024 | Stoessel | C09K 11/06 |
| 2025/0126967 | A1 * | 4/2025 | Pavicic | H10K 85/654 |

FOREIGN PATENT DOCUMENTS

| | | | |
|---|---|---|---|
| KR | 10-0894627 | B1 | 4/2009 |
| KR | 10-2016-0134501 | A | 11/2016 |
| KR | 10-2016-0141672 | A | 12/2016 |
| KR | 10-2019-0097971 | A | 8/2019 |
| KR | 10-2019-0111948 | A | 10/2019 |
| KR | 10-2020-0122313 | A | 10/2020 |
| KR | 10-2021-0028085 | A | 3/2021 |
| KR | 10-2021-0029879 | A | 3/2021 |
| KR | 10-2021-0075283 | A | 6/2021 |

* cited by examiner

*Primary Examiner* — Robert S Loewe

(74) *Attorney, Agent, or Firm* — Womble Bond Dickinson (US) LLP

(57) ABSTRACT

A light-emitting device includes an electron transport region including a first electron transport layer and a second electron transport layer. The first electron transport layer includes a first compound, the second electron transport layer includes a second compound, the first compound includes a pyrimidine group, the second compound includes a triazine group, and an absolute value of a lowest unoccupied molecular orbital (LUMO) energy of the first compound ($E_{LUMO\_E1}$) is less than an absolute value of a LUMO energy of the second compound ($E_{LUMO\_E2}$). An electronic apparatus including the light-emitting device.

19 Claims, 3 Drawing Sheets

LIGHT-EMITTING DEVICE AND ELECTRONIC APPARATUS INCLUDING THE LIGHT-EMITTING DEVICE

CROSS-REFERENCE TO RELATED APPLICATION

This application claims priority to and the benefit of Korean Patent Application No. 10-2022-0001685, filed on Jan. 5, 2022, in the Korean Intellectual Property Office, the entire content of which is hereby incorporated by reference.

BACKGROUND

1. Field

One or more embodiments relate to a light-emitting device and an electronic apparatus including the same.

2. Description of the Related Art

Self-emissive devices from among light-emitting devices have wide viewing angles, high contrast ratios, short response times, and/or excellent or suitable characteristics in terms of luminance, driving voltage, and/or response speed.

In a light-emitting device, a first electrode is arranged on a substrate, and a hole transport region, an emission layer, an electron transport region, and a second electrode are sequentially arranged on the first electrode. Holes provided from the first electrode may move toward the emission layer through the hole transport region, and electrons provided from the second electrode may move toward the emission layer through the electron transport region. Carriers, such as holes and electrons, recombine in the emission layer region to produce excitons. These excitons transition from an excited state to a ground state to thereby generate light.

SUMMARY

Aspects according to one or more embodiments of the present disclosure are directed toward a light-emitting device and an electronic apparatus including the light-emitting device.

Additional aspects will be set forth in part in the description, which follows and, in part, will be apparent from the description, or may be learned by practice of the presented embodiments of the disclosure.

According to one or more embodiments, a light-emitting device includes a first electrode, a second electrode facing the first electrode, and an interlayer between the first electrode and the second electrode, wherein the interlayer includes an emission layer and an electron transport region between the emission layer and the second electrode, the electron transport region includes a first electron transport layer between the emission layer and the second electrode and a second electron transport layer between the first electron transport layer and the second electrode, the first electron transport layer includes a first compound, the second electron transport layer includes a second compound, the first compound includes a pyrimidine group, the second compound includes a triazine group, and an absolute value of a lowest unoccupied molecular orbital (LUMO) energy of the first compound ($E_{LUMO\_E1}$) is less than an absolute value of a LUMO energy of the second compound ($E_{LUMO\_E2}$).

According to one or more embodiments, an electronic apparatus includes the light-emitting device.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
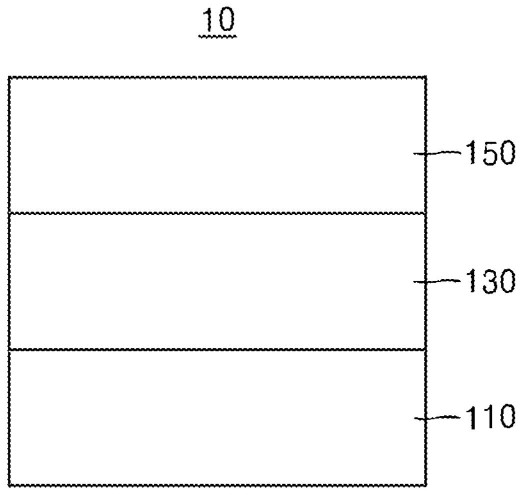
FIG. 1 is a schematic cross-sectional view of a light-emitting device according to an embodiment.

Reference will now be made in more detail to embodiments, examples of which are illustrated in the accompanying drawings, wherein like reference numerals refer to like elements throughout, and duplicative descriptions thereof may not be provided. In this regard, the present embodiments may have different forms and should not be construed as being limited to the descriptions set forth herein. Accordingly, the embodiments are merely described below, by referring to the drawings, to explain aspects of the present description. As utilized herein, the term "and/or" includes any and all combinations of one or more of the associated listed items. Throughout the disclosure, the expression such as "at least one of a, b or c", "at least one selected from a, b, and c", "at least one selected from the group consisting of a, b, and c", etc., indicates only a, only b, only c, both (e.g., simultaneously) a and b, both (e.g., simultaneously) a and c, both (e.g., simultaneously) b and c, all of a, b, and c, or variation(s) thereof.

A light-emitting device according to an embodiment of the disclosure includes: a first electrode; a second electrode facing the first electrode; and an interlayer including an emission layer arranged between the first electrode and the second electrode and an electron transport region arranged between the emission layer and the second electrode, the electron transport region may include a first electron transport layer arranged between the emission layer and the second electrode and a second electron transport layer arranged between the first electron transport layer and the second electrode, the first electron transport layer may include a first compound, the second electron transport layer may include a second compound, the first compound may include a pyrimidine group, the second compound may include a triazine group, and an absolute value of a lowest unoccupied molecular orbital (LUMO) energy of the first compound ($E_{LUMO\_E1}$) may be less than an absolute value of a LUMO energy of the second compound ($E_{LUMO\_E2}$).

In an embodiment, the LUMO energy level may be evaluated by utilizing the Gaussian 09 program with molecular structure enhancement or optimization obtained by B3LYP-based density functional theory (DFT).

In an embodiment, the first compound may include a pyrimidine group, and may not include (e.g., may exclude) a triazine group.

In an embodiment, the second compound may include a triazine group, and may not include (e.g., may exclude) a pyrimidine group.

In an embodiment, at least one of the first compound or the second compound may further include a cyano group.

In an embodiment, the first compound or the second compound may further include a nitrogen-free cyclic group.

In an embodiment, the first compound or the second compound may further include a $C_6$-$C_{14}$ carbocyclic group.

In an embodiment, the first compound may be represented by Formula 1 and may not include (e.g., may exclude) a triazine group (e.g., any triazine group), and the second compound may be represented by Formula 2 and may not include (e.g., may exclude) a pyrimidine group (e.g., any pyrimidine group).

Formula 1

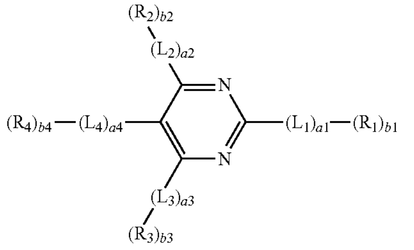

Formula 2

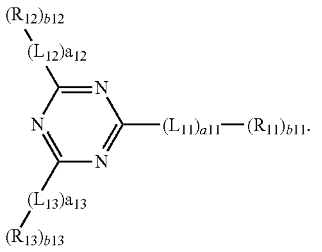

In Formulae 1 and 2, $L_1$ to $L_4$ and $L_{11}$ to $L_{13}$ may each independently be a single bond, a $C_5$-$C_{30}$ carbocyclic group that is unsubstituted or substituted with at least one $R_{10a}$, or a $C_1$-$C_{30}$ heterocyclic group that is unsubstituted or substituted with at least one $R_{10a}$.

In an embodiment, in Formulae 1 and 2, $L_1$ to $L_4$ and $L_{11}$ to $L_{13}$ may each independently be a single bond, a $C_6$-$C_{14}$ carbocyclic group that is unsubstituted or substituted with at least one $R_{10a}$, or a $C_3$-$C_{14}$ nitrogen-free heterocyclic group that is unsubstituted or substituted with at least one $R_{10a}$.

In an embodiment, in Formulae 1 and 2, $L_1$ to $L_4$ and $L_{11}$ to $L_{13}$ may each independently be a nitrogen-free cyclic group. In an embodiment, $L_1$ to $L_4$ and $L_{11}$ to $L_{13}$ may each independently be a $C_6$-$C_{14}$ carbocyclic group that is unsubstituted or substituted with at least one $R_{10a}$.

In an embodiment, in Formulae 1 and 2, $L_1$ to $L_4$ and $L_{11}$ to $L_{13}$ may each independently be: a single bond; a phenylene group, a pentalenylene group, an indenylene group, a naphthylene group, an azulenylene group, a heptalenylene group, an indacenylene group, an acenaphthylene group, a 9,9'-dimethylfluorenylene group, a benzofluorenylene group, a dibenzofluorenylene group, a phenalenylene group, a fluoranthenylene group, a pyrenylene group, a naphthacenylene group, a picenylene group, a perylenylene group, a pentaphenylene group, a hexacenylene group, a pentacenylene group, a rubicenylene group, a coronenylene group, an ovalenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, a quinolinylene group, an isoquinolinylene group, a benzoquinolinylene group, a benzoisoquinolinylene group, a dibenzoquinolinylene group, a dibenzoisoquinolinylene group, a biphenylene group, a phenylpyridinylene group, a phenanthrolenylene group, a dibenzoquinolenylene group, a bipyridinylene group, or a pyridinylene group; or a phenylene group, a pentalenylene group, an indenylene group, a naphthylene group, an azulenylene group, a heptalenylene group, an indacenylene group, an acenaphthylene group, a 9,9'-dimethylfluorenylene group, a benzofluorenylene group, a dibenzofluorenylene group, a phenalenylene group, a fluoranthenylene group, a pyrenylene group, a naphthacenylene group, a picenylene group, a perylenylene group, a pentaphenylene group, a hexacenylene group, a pentacenylene group, a rubicenylene group, a coronenylene group, an ovalenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, a quinolinylene group, an isoquinolinylene group, a benzoquinolinylene group, a benzoisoquinolinylene group, a dibenzoquinolinylene group, a dibenzoisoquinolinylene group, a biphenylene group, a phenylpyridinylene group, a bipyridinylene group, or a pyridinylene group, each substituted with deuterium, —F, —Cl, —Br, —I, a hydroxyl group, a cyano group, a nitro group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a pentalenyl group, an indenyl group, a naphthyl group, an azulenyl group, a heptalenyl group, an indacenyl group, an acenaphthyl group, a 9,9'-dimethylfluorenyl group, a benzofluorenyl group, a dibenzofluorenyl group, a phenalenyl group, a fluoranthenyl group, a triphenylenyl group, a pyrenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a quinolinyl group, an isoquinolinyl group, a benzoquinolinyl group, a benzoisoquinolinyl group, a dibenzoquinolinyl group, a dibenzoisoquinolinyl group, a biphenyl group, a phenylpyridinyl group, a phenanthrenyl group, a dibenzoquinol group, a bipyridinyl group, a pyridinyl group, $—Si(Q_{31})(Q_{32})(Q_{33})$, $—N(Q_{31})(Q_{32})$, $—B(Q_{31})(Q_{32})$, $—C(=O)(Q_{31})$, $—S(=O)_2(Q_{31})$, $—P(=O)(Q_{31})(Q_{32})$, or any combination thereof.

In an embodiment, in Formulae 1 and 2, $L_1$ to $L_4$ and $L_{11}$ to $L_{13}$ may each independently be: a single bond; a phenylene group, a naphthylene group, a 9,9'-dimethylfluorenylene group, a benzofluorenylene group, a dibenzofluorenylene group, a phenalenylene group, a fluoranthenylene group, a pyrenylene group, a naphthacenylene group, a picenylene group, a perylenylene group, a thiophenylene group, a furanylene group, a carbazolylene group, a benzofuranylene group, a benzothiophenylene group, a dibenzofuranylene group, a dibenzothiophenylene group, a benzocarbazolylene group, a dibenzocarbazolylene group, a dibenzosilolylene group, a quinolinylene group, an isoquinolinylene group, a benzoquinolinylene group, a benzoisoquinolinylene group, a dibenzoquinolinylene group, a dibenzoisoquinolinylene group, a biphenylene group, a phenylpyridinylene group, a phenanthrenylene group, a dibenzoquinolenylene group, a bipyridinylene group, or a pyridinylene group; or a phenylene group, a naphthylene group, a 9,9'-dimethylfluorenylene group, a benzofluorenylene group, a dibenzofluorenylene group, phenalenylene group, a phenanthrenylene group, a fluoranthenylene group, a pyrenylene group, a naphthacenylene group, a picenylene group, a perylenylene group, a thiophenylene group, a furanylene group, a carbazolylene group, a benzofuranylene group, a benzothiophenylene group, a dibenzofuranylene group, a dibenzothiophenylene group, a benzocarbazolylene group, a dibenzocarbazolylene group, a dibenzosilolylene group, a quinolinylene group, an isoquinolinylene group, a benzoquinolinylene group, a benzoisoquinolinylene group, a dibenzoquinolinylene group, a dibenzoisoquinolinylene group, a biphenylene group, a phenylpyridinylene group, a bipyridinylene group, or a pyridinylene group, each substituted with deuterium, —F, —Cl, —Br, —I, a hydroxyl group, a cyano group, a nitro group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a naphthyl group, a 9,9'-dimethylfluorenyl group, a benzofluorenyl group, a dibenzofluorenyl group, a phenalenyl group, a fluoranthenyl group, a pyrenyl group, a naphthacenyl group, a picenyl group, a perylenyl group, a thiophenyl group, a furanyl group, a carbazolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a quinolinyl group, an isoquinolinyl group, a benzoquinolinyl group, a benzoisoquinolinyl group, a dibenzoquinolinyl group, a dibenzoisoquinolinyl group, a biphenyl group, a phenylpyridinyl group, a phenanthrenyl group, a dibenzoquinol group, a bipyridinyl group, a pyridinyl group, or any combination thereof.

In an embodiment, in Formulae 1 and 2, $L_1$ to $L_4$ and $L_{11}$ to $L_{13}$ may each independently be: a single bond; a phenylene group, a naphthylene group, or a 9,9'-dimethylfluorenylene group; or a phenylene group, a naphthylene group, or a 9,9'-dimethylfluorenylene group, each substituted with deuterium, —F, —Cl, —Br, —I, a hydroxyl group, a cyano group, a nitro group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a naphthyl group, or any combination thereof.

In an embodiment, in Formulae 1 and 2, $L_1$ to $L_4$ and $L_{11}$ to $L_{13}$ may each not be any of the groups selected from an anthracenylene group, a 9,9'-diphenylfluorenylene group, a phenanthrenylene group, a chrysenylene group, a benzochrysenylene group, a triphenylenylene group, a spirofluorenylene group, and a spirofluorenexanthenylene group. That is, none of $L_1$ to $L_4$ and $L_{11}$ to $L_{13}$ may be any of the groups selected from an anthracenylene group, a 9,9'-diphenylfluorenylene group, a phenanthrenylene group, a chrysenylene group, a benzochrysenylene group, a triphenylenylene group, a spirofluorenylene group, and a spirofluorenexanthenylene group.

In an embodiment, in Formula 1, $L_1$ to $L_4$ may each not be a triazine group. That is, none of $L_1$ to $L_4$ may be a triazine group.

In an embodiment, in Formula 2, $L_{11}$ to $L_{13}$ may each not be a pyrimidine group. That is, none of $L_{11}$ to $L_{13}$ may be a pyrimidine group.

In an embodiment, in Formula 1, at least one of $L_1$ to $L_4$ may be a phenylene group, and a1 to a4 may each be 1.

In an embodiment, in Formula 2, at least one of $L_{11}$ to $L_{13}$ may be a phenylene group, and a11 to a13 may each be 1.

In Formulae 1 and 2, a1 to a4 and a11 to a13 may each independently be an integer from 0 to 3. a1 to a4 and a11 to a13 may respectively indicate the numbers of $L_1$(s) to $L_4$(s) and $L_{11}$(s) to $L_{13}$(s).

In an embodiment, when a1 is an integer of 2 or more, two or more of $L_1$(s) may be identical to or different from each other. In an embodiment, when a2 is an integer of 2 or more, two or more of $L_2$(s) may be identical to or different from each other. In an embodiment, when a3 is an integer of 2 or more, two or more of $L_3$(s) may be identical to or different from each other. In an embodiment, when a4 is an integer of 2 or more, two or more of $L_4$(s) may be identical to or different from each other. In an embodiment, when a11 is an integer of 2 or more, two or more of $L_{11}$(s) may be identical to or different from each other. In an embodiment, when a12 is an integer of 2 or more, two or more of $L_{12}$(s) may be identical to or different from each other. In an embodiment, when a13 is an integer of 2 or more, two or more of $L_{13}$(s) may be identical to or different from each other. In an embodiment, when a14 is an integer of 2 or more, two or more of $L_{14}$(s) may be identical to or different from each other.

In an embodiment, in Formulae 1 and 2, a1 to a4 and a11 to a13 may each independently be an integer from 0 to 2.

In Formulae 1 and 2, $R_1$ to $R_4$ and $R_{11}$ to $R_{13}$ may each independently be hydrogen, deuterium, —F, —Cl, —Br, —I, a hydroxyl group, a cyano group, a nitro group, a $C_1$-$C_{60}$ alkyl group that is unsubstituted or substituted with at least one $R_{10a}$, a $C_2$-$C_{60}$ alkenyl group that is unsubstituted or substituted with at least one $R_{10a}$, a $C_2$-$C_{60}$ alkynyl group that is unsubstituted or substituted with at least one $R_{10a}$, a $C_1$-$C_{60}$ alkoxy group that is unsubstituted or substituted with at least one $R_{10a}$, a $C_3$-$C_{60}$ carbocyclic group that is unsubstituted or substituted with at least one $R_{10a}$, a $C_1$-$C_{60}$ heterocyclic group that is unsubstituted or substituted with at least one $R_{10a}$, a $C_6$-$C_{60}$ aryloxy group that is unsubstituted or substituted with at least one $R_{10a}$, a $C_6$-$C_{60}$ arylthio group that is unsubstituted or substituted with at least one $R_{10a}$, a $C_7$-$C_{60}$ aryl alkyl group that is unsubstituted or substituted with at least one $R_{10a}$, a $C_2$-$C_{60}$ heteroaryl alkyl group that is unsubstituted or substituted with at least one $R_{10a}$, —$Si(Q_1)(Q_2)(Q_3)$, —$N(Q_1)(Q_2)$, —$B(Q_1)(Q_2)$, —$C(=O)(Q_1)$, —$S(=O)_2(Q_1)$, or —$P(=O)(Q_1)(Q_2)$.

In an embodiment, in Formulae 1 and 2, $R_1$ to $R_4$ and $R_{11}$ to $R_{13}$ may each independently be a $C_3$-$C_{60}$ carbocyclic group that is unsubstituted or substituted with at least one $R_{10a}$ or a nitrogen-free $C_1$-$C_{60}$ heterocyclic group that is unsubstituted or substituted with at least one $R_{10a}$. In an embodiment, in Formulae 1 and 2, $R_1$ to $R_4$ and $R_{11}$ to $R_{13}$ may each independently be a $C_6$-$C_{14}$ carbocyclic group that is unsubstituted or substituted with at least one $R_{10a}$.

In an embodiment, in Formulae 1 and 2, at least one of $R_1$ to $R_4$ and $R_{11}$ to $R_{13}$ may be a cyano group.

In an embodiment, in Formula 1, $R_1$ to $R_4$ may each not be a triazine group. That is, none of $R_1$ to $R_4$ may be a triazine group. In an embodiment, in Formula 2, $R_{11}$ to $R_{13}$ may each not be a pyrimidine group. That is, none of $R_{11}$ to $R_{13}$ may be a pyrimidine group.

In an embodiment, in Formulae 1 and 2, $R_1$ to $R_4$ and $R_{11}$ to $R_{13}$ may each independently be: hydrogen, deuterium, —F, —Cl, —Br, —I, —$CD_3$, a hydroxyl group, a cyano group, a nitro group, a $C_1$-$C_{20}$ alkyl group, or a $C_1$-$C_{20}$ alkoxy group; a $C_1$-$C_{20}$ alkyl group or a $C_1$-$C_{20}$ alkoxy group, each substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, a $C_1$-$C_{20}$ alkyl group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a tert-butyl group, a phenyl group, a biphenyl group, a terphenyl group, a naphthyl group, a pyridinyl group, a pyrimidinyl group, or any combination thereof; a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a terphenyl group, a $C_1$-$C_{20}$ alkylphenyl group, a naphthyl group, a 9,9'-methylfluorenyl group, a fluoranthenyl group, a pyrenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an indenyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzoimidazolyl group, a benzofuranyl group, a benzothiophenyl group, a benzosilolyl group, a benzoisothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a benzofluorenyl group, a benzocarbazolyl group, a naphthobenzofuranyl group, a naphthobenzothiophenyl group, a naphthobenzosilolyl group, a dibenzofluorenyl group, a dibenzocarbazolyl group, a dinaphthofuranyl group, a dinaphthothiophenyl group, a dinaphthosilolyl group, an indenocarbazolyl group, an indolocarbazolyl group, a benzofuranocarbazolyl group, a benzothienocarbazolyl group, a benzosilolocarbazolyl group, an imidazopyridinyl group, an imidazopyrimidinyl group, an azafluorenyl group, an azacarbazolyl group, an azadibenzofuranyl group, an azadibenzothiophenyl group, or an azadibenzosilolyl group, each unsubstituted or substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, a $C_1$-$C_{20}$ alkyl group, a $C_1$-$C_{20}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a tert-butyl group, a phenyl group, a biphenyl group, a terphenyl group, a $C_1$-$C_{20}$ alkylphenyl group, a naphthyl group, a 9,9'-methylfluorenyl group, a fluoranthenyl group, a pyrenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an indenyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzoimidazolyl group, a benzofuranyl group, a benzothiophenyl group, a benzosilolyl group, a benzoisothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a benzofluorenyl group, a benzocarbazolyl group, a naphthobenzofuranyl group, a naphthobenzothiophenyl group, naphthobenzosilolyl group, a dibenzofluorenyl group, a dibenzocarbazolyl group, a dinaphthofuranyl group, a dinaphthothiophenyl group, a dinaphthosilolyl group, an indenocarbazolyl group, an indolocarbazolyl group, a benzofuranocarbazolyl group, a benzothienocarbazolyl group, a benzosilolocarbazolyl group, an imidazopyridinyl group, an imidazopyrimidinyl group, —$Si(Q_{31})(Q_{32})(Q_{33})$, —$N(Q_{31})(Q_{32})$, —$B(Q_{31})(Q_{32})$, —$P(Q_{31})(Q_{32})$, —$C(=O)(Q_{31})$, —$S(=O)_2(Q_{31})$, —$P(=O)(Q_{31})(Q_{32})$, or any combination thereof; or —$Si(Q_1)(Q_2)(Q_3)$, —$N(Q_1)(Q_2)$, —$B(Q_1)(Q_2)$, —$C(=O)(Q_1)$, —$S(=O)_2(Q_1)$, or —$P(=O)(Q_1)(Q_2)$, and $Q_1$ to $Q_3$ and $Q_{31}$ to $Q_{33}$ may each independently be: —$CH_3$, —$CD_3$, —$CD_2H$, —$CDH_2$, —$CH_2CH_3$, —$CH_2CD_3$, —$CH_2CD_2H$, —$CH_2CDH_2$, —$CHDCH_3$, —$CHDCD_2H$, —$CHDCDH_2$, —$CHDCD_3$, —$CD_2CD_3$, —$CD_2CD_2H$, or —$CD_2CDH_2$; or an n-propyl group, an iso-propyl group, an n-butyl group, an isobutyl group, a sec-butyl group, a tert-butyl group, an n-pentyl group, an isopentyl group, a sec-pentyl group, a tert-pentyl group, a phenyl group, a naphthyl group, a pyridinyl group, a pyrimidinyl group, a pyridazinyl group, a pyrazinyl group, a triazinyl group, a fluorenyl group, a carbazolyl group, a dibenzofuranyl group, or a dibenzothiophenyl group, each unsubstituted or substituted with deuterium, a cyano group, —$CD_3$, a tert-butyl group, a $C_1$-$C_{20}$ alkyl group, a phenyl group, a naphthyl group, a pyridinyl group, a pyrimidinyl group, a pyridazinyl group, a pyrazinyl group, a triazinyl group, a fluorenyl group, a carbazolyl group, a dibenzofuranyl group, a dibenzothiophenyl group, or any combination thereof.

In an embodiment, in Formulae 1 and 2, $R_1$ to $R_4$ and $R_{11}$ to $R_{13}$ may each independently be: hydrogen, deuterium, —F, a cyano group, —$CD_3$, a $C_1$-$C_{20}$ alkyl group, or a $C_1$-$C_{20}$ alkoxy group; a $C_1$-$C_{20}$ alkyl group or a $C_1$-$C_{20}$ alkoxy group, each substituted with deuterium, —F, —$CD_3$, —$CD_2H$, —$CDH_2$, —$CF_3$, —$CF_2H$, —$CFH_2$, a cyano group, or any combination thereof; or a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a tert-butyl group, a phenyl group, a biphenyl group, a terphenyl group, a $C_1$-$C_{20}$ alkylphenyl group, a naphthyl group, a 9,9'-dimethylfluorenyl group, a thiophenyl group, a furanyl group, an indenyl group, an isoindolyl group, an indolyl group, a carbazolyl group, a benzofuranyl group, a benzothiophenyl group, a benzosilolyl group, a dibenzofuranyl group, a dibenzothiophenyl group, a dibenzosilolyl group, a benzofluorenyl group, a benzocarbazolyl group, a naphthobenzofuranyl group, a naphthobenzothiophenyl group, a naphthobenzosilolyl group, a dibenzofluorenyl group, a dibenzocarbazolyl group, a dinaphthofuranyl group, a dinaphthothiophenyl group, a dinaphthosilolyl group, an indenocarbazolyl group, an indolocarbazolyl group, a benzofuranocarbazolyl group, a benzothienocarbazolyl group, a benzosilolocarbazolyl group, a pyridinyl group, a pyrazinyl group, a pyrimidinyl group, a pyridazinyl group, or a triazinyl group, each unsubstituted or substituted with deuterium, —F, —$CD_3$, —$CD_2H$, —$CDH_2$, —$CF_3$, —$CF_2H$, —$CFH_2$, a cyano group, a $C_1$-$C_{20}$ alkyl group, a $C_1$-$C_{20}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a tert-butyl group, a phenyl group, a biphenyl group, a terphenyl group, a $C_1$-$C_{20}$ alkylphenyl group, a naphthyl group, a 9,9'-dimethylfluorenyl group, a thiophenyl group, a furanyl group, an indenyl group, an isoindolyl group, an indolyl group, a carbazolyl group, a benzofuranyl group, a benzothiophenyl group, a benzosilolyl group, a dibenzofuranyl group, a dibenzothiophenyl group, a dibenzosilolyl group, a benzofluorenyl group, a benzocarbazolyl group, a naphthobenzofuranyl group, a naphthobenzothiophenyl group, a naphthobenzosilolyl group, a dibenzofluorenyl group, a dibenzocarbazolyl group, a dinaphthofuranyl group, a dinaphthothiophenyl group, a dinaphthosilolyl group, an indenocarbazolyl group, an indolocarbazolyl group, a benzofuranocarbazolyl group, a benzothienocarbazolyl group, a benzosilolocarbazolyl group, a pyridinyl group, a pyrazinyl group, a pyrimidinyl group, a pyridazinyl group, a triazinyl group, or any combination thereof.

In an embodiment, in Formulae 1 and 2, $R_1$ to $R_4$ and $R_{11}$ to $R_{13}$ may each independently be: hydrogen, deuterium, —F, a methyl group, an iso-propyl group, a tert-butyl group, or a cyano group; or a phenyl group, a biphenyl group, a naphthyl group, a pyridinyl group, a pyrimidinyl group, a pyridazinyl group, a pyrazinyl group, a triazinyl group, a 9,9'-dimethylfluorenyl group, a quinolinyl group, an isoquinolinyl group, or a carbazolyl group, each unsubstituted or substituted with deuterium, —F, a tert-butyl group, a cyano group, a $C_1$-$C_{20}$ alkyl group, a phenyl group, a biphenyl group, a naphthyl group, a $C_1$-$C_{20}$ alkylphenyl group, a pyridinyl group, a pyrimidinyl group, a pyridazinyl group, a pyrazinyl group, a triazinyl group, a fluorenyl group, a carbazolyl group, a dibenzofuranyl group, a dibenzothiophenyl group, or any combination thereof.

In an embodiment, in Formulae 1 and 2, $R_1$ to $R_4$ and $R_{11}$ to $R_{13}$ may each independently be: hydrogen, deuterium, a $C_1$-$C_{20}$ alkyl group, or a cyano group; or a phenyl group, a biphenyl group, a naphthyl group, or a 9,9'-dimethylfluorenyl group, each unsubstituted or substituted with deuterium, a cyano group, a $C_1$-$C_{20}$ alkyl group, a phenyl group, a biphenyl group, a naphthyl group, a $C_1$-$C_{20}$ alkylphenyl group, or any combination thereof.

In an embodiment, in Formulae 1 and 2, $R_1$ to $R_4$ and $R_{11}$ to $R_{13}$ may each not be any of the groups selected from an anthracenyl group, a 9,9'-diphenylfluorenyl group, a phenanthrenyl group, a chrysenyl group, a benzochrysenyl group, a triphenylenyl group, a spirofluorenyl group, and a spirofluorenexanthenyl group. That is, none of $R_1$ to $R_4$ and $R_{11}$ to $R_{13}$ may be any of the groups selected from an anthracenyl group, a 9,9'-diphenylfluorenyl group, a phenanthrenyl group, a chrysenyl group, a benzochrysenyl group, a triphenylenyl group, a spirofluorenyl group, and a spirofluorenexanthenyl group.

In Formulae 1 and 2, b1 to b4 and b11 to b13 may each independently be an integer from 0 to 10. b1 to b4 and b11 to b13 may respectively indicate the numbers of $R_1$(s) to $R_4$(s) and $R_{11}$(s) to $R_{13}$(s).

In an embodiment, when b1 is an integer of 2 or more, two or more of $R_1$(s) may be identical to or different from each other. In an embodiment, when b2 is an integer of 2 or more, two or more of $R_2$(s) may be identical to or different from each other. In an embodiment, when b3 is an integer of 2 or more, two or more of $R_3$(s) may be identical to or different from each other. In an embodiment, when b4 is an integer of 2 or more, two or more of $R_4$(s) may be identical to or different from each other. In an embodiment, when b11 is an integer of 2 or more, two or more of $R_{11}$(s) may be identical to or different from each other. In an embodiment, when b12 is an integer of 2 or more, two or more of $R_{12}$(s) may be identical to or different from each other. In an embodiment, when b13 is an integer of 2 or more, two or more of $R_{13}$(s) may be identical to or different from each other.

In an embodiment, in Formulae 1 and 2, b1 to b4 and b11 to b13 may each independently be an integer from 0 to 5.

In an embodiment, the first compound may be represented by Formula 1a, and the second compound may be represented by Formula 2a.

Formula 1a

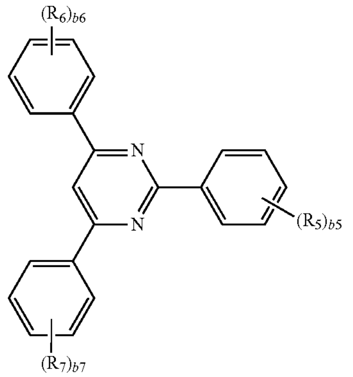

Formula 2a

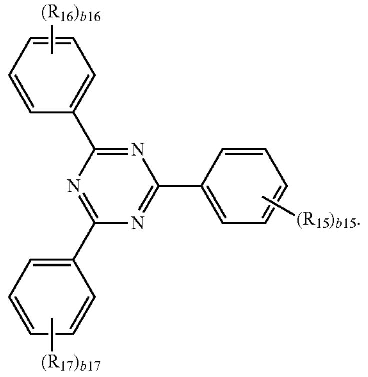

In Formulae 1a and 2a, $R_5$ to $R_7$ and $R_{15}$ to $R_{17}$ may each independently the same as described in connection with $R_1$ in the present specification.

In an embodiment, in Formulae 1a and 2a, $R_5$ to $R_7$ and $R_{15}$ to $R_{17}$ may each independently be a $C_6$-$C_{14}$ carbocyclic group that is unsubstituted or substituted with at least one $R_{10a}$.

In an embodiment, in Formula 1a, $R_5$ to $R_7$ may each not be a triazine group. That is, none of $R_5$ to $R_7$ may be a triazine group. In an embodiment, in Formula 2a, $R_{15}$ to $R_{17}$ may each not be a pyrimidine group. That is, none of $R_{15}$ to $R_{17}$ may be a pyrimidine group.

In an embodiment, the first compound may be one of compounds represented by Formulae 1-1 to 1-16.

-continued
1-1
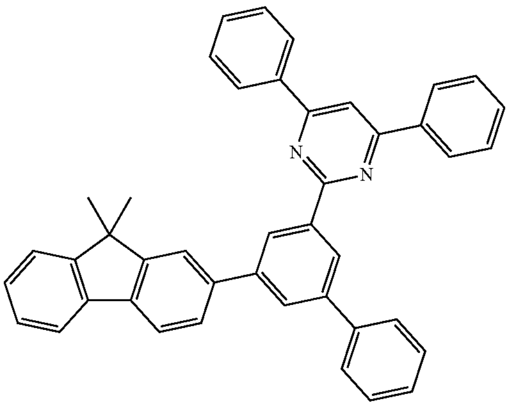
1-2
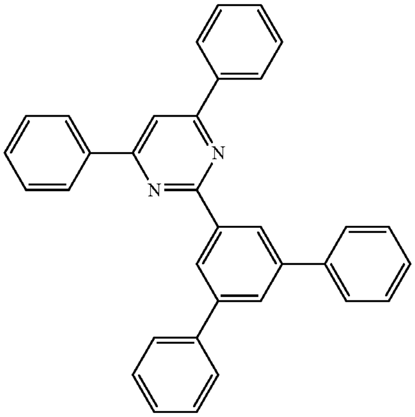
1-3
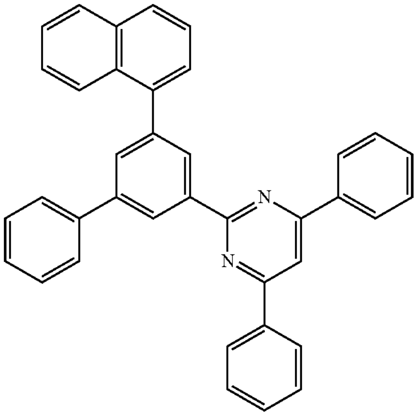
1-4
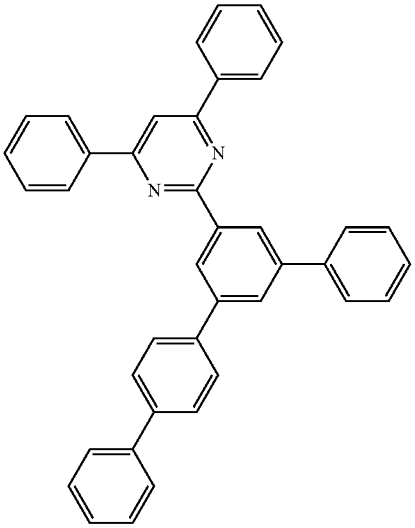
1-5
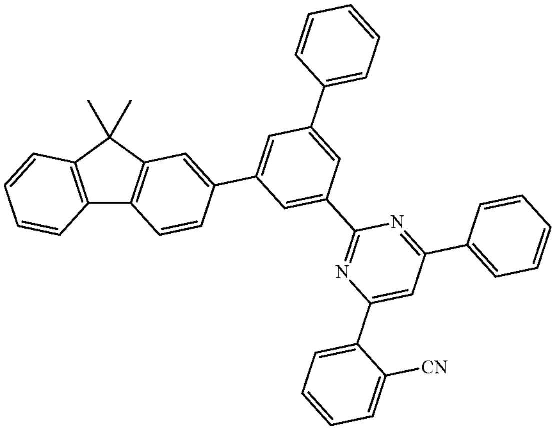
1-6
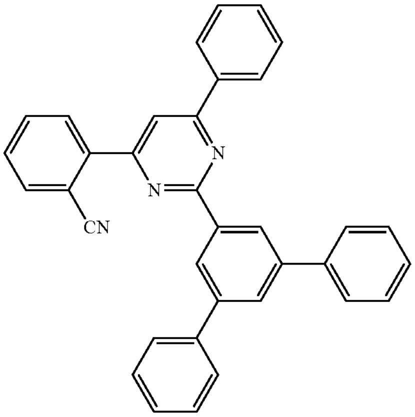

-continued
1-7
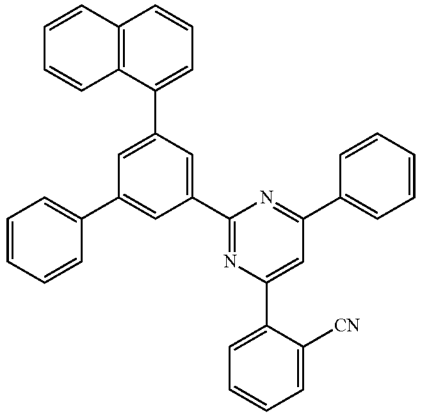
1-8
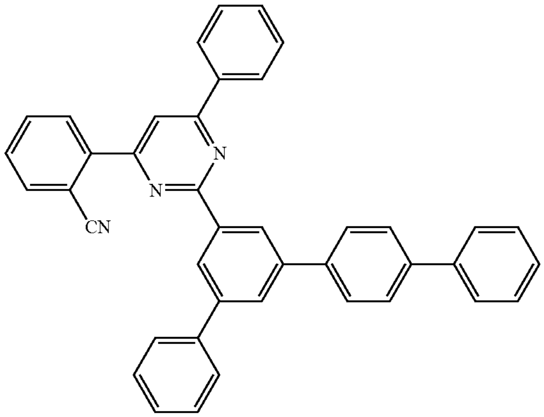
1-9
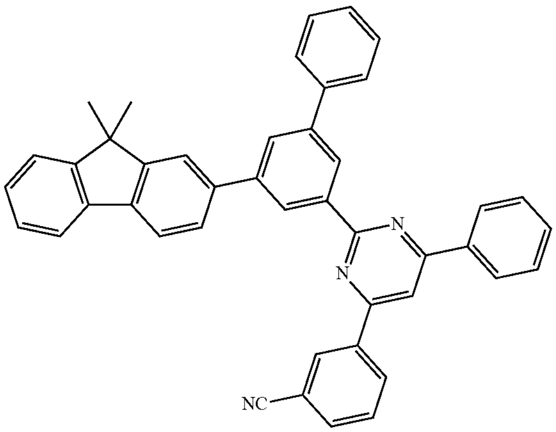
-continued
1-10
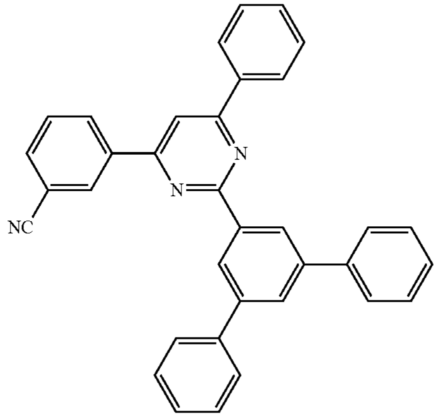
1-11
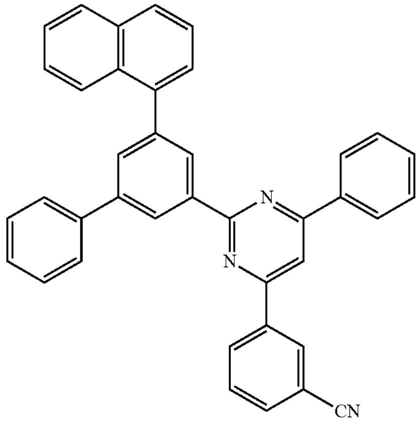
1-12
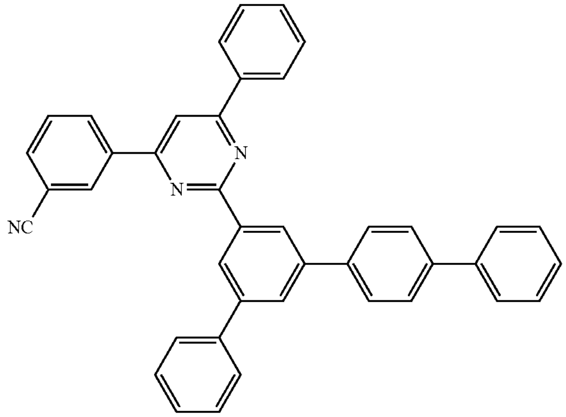

-continued
1-13
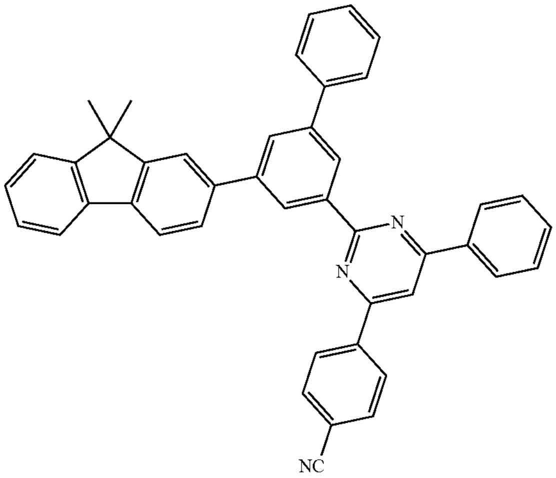
1-14
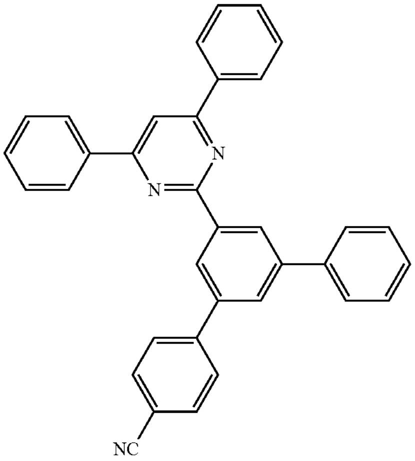
1-15
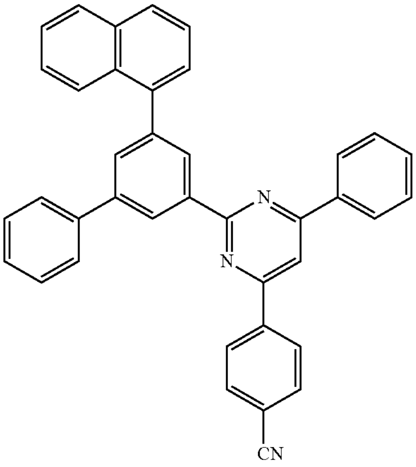
-continued
1-16
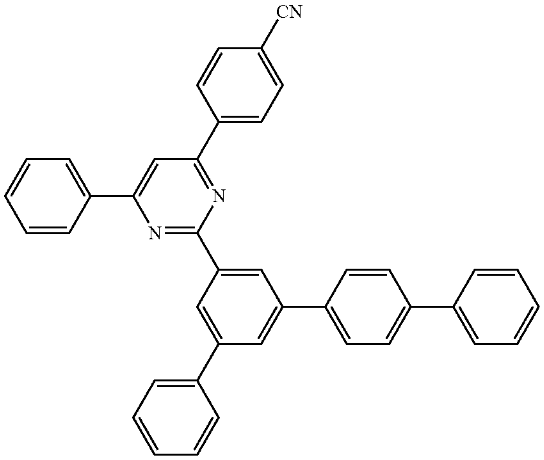
.
In an embodiment, the second compound may be one of compounds represented by Formulae 2-1 to 2-16.
2-1
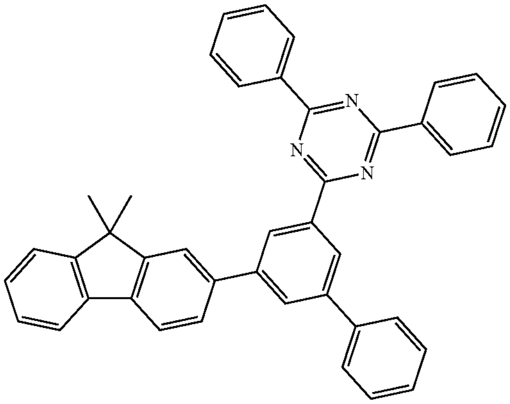
2-2
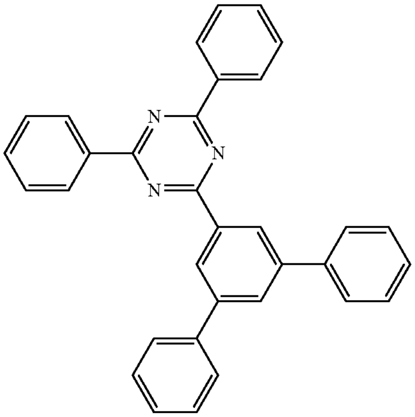

-continued
2-3
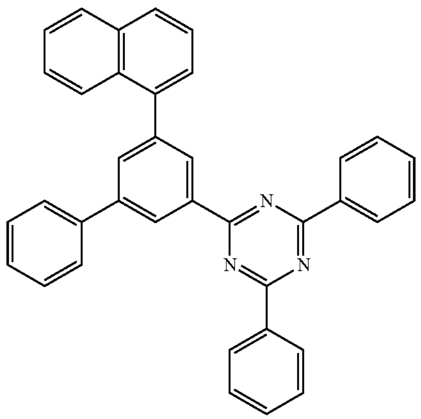
2-4
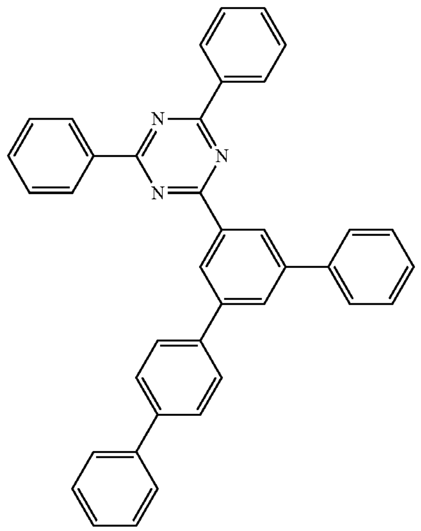
2-5
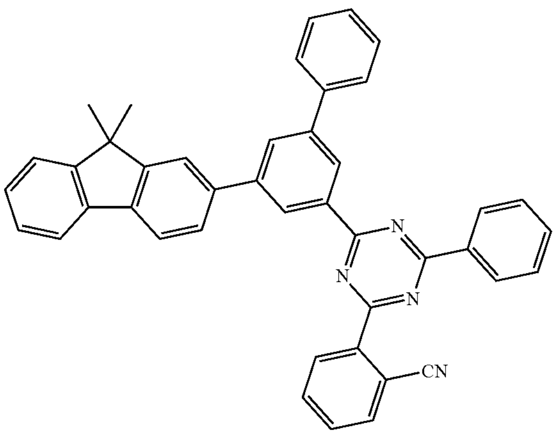
-continued
2-6
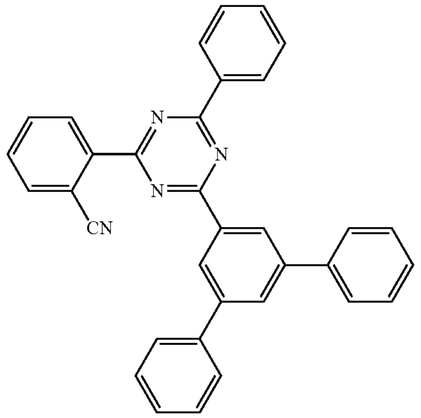
2-7
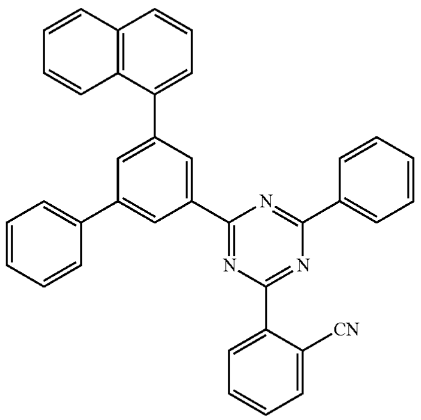
2-8
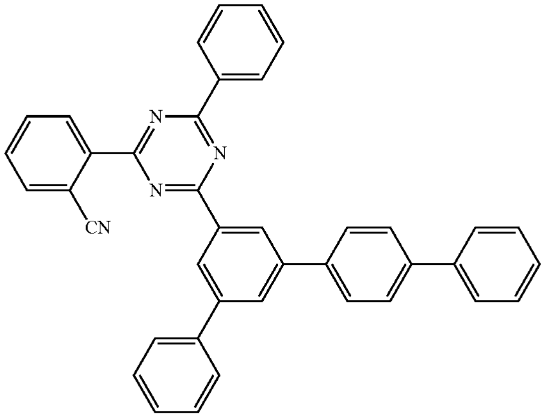

-continued
2-9
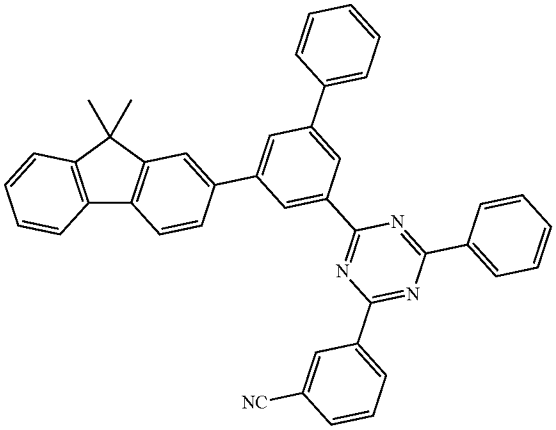
2-10
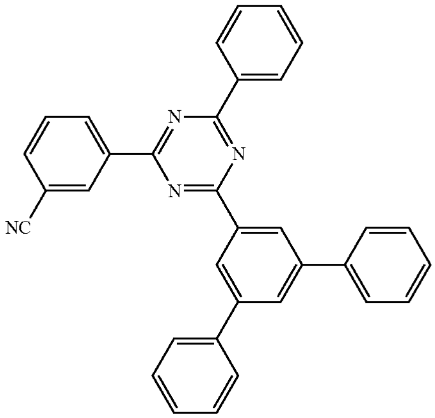
2-11
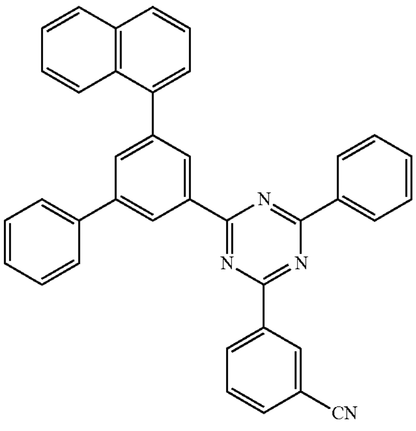
-continued
2-12
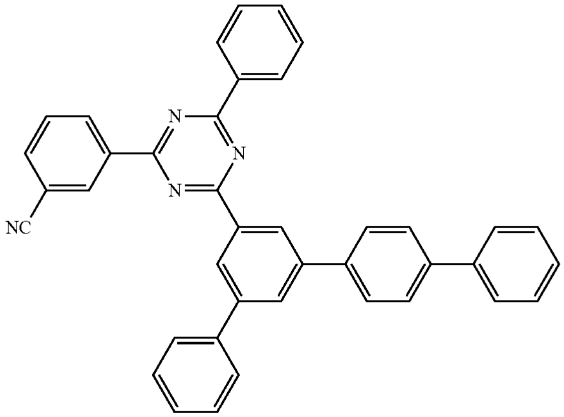
2-13
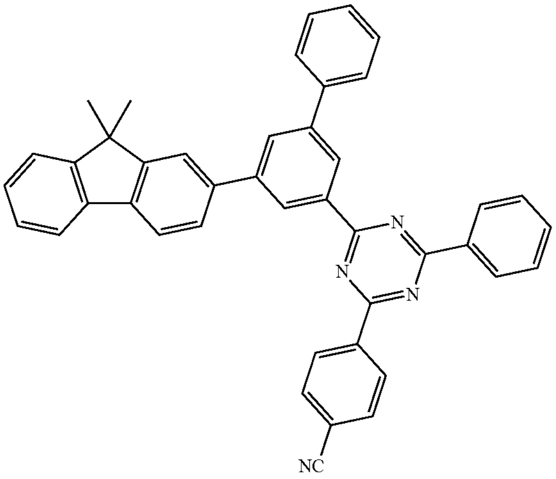
2-14
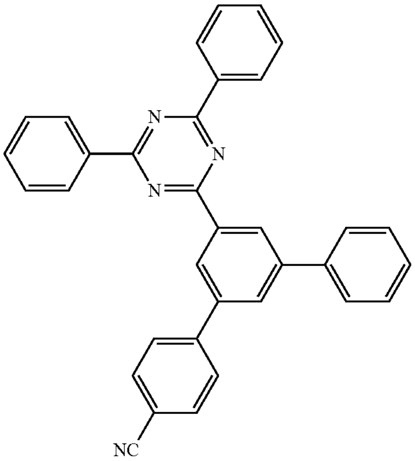

-continued 2-15

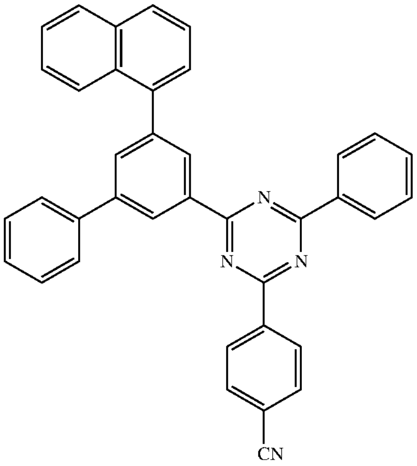

2-16

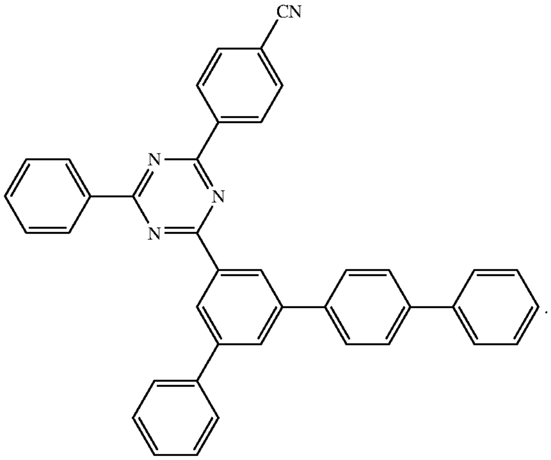

In an embodiment, the emission layer may include a host and a dopant, and the host may include two different hosts, each independently represented by Formula 3.

$$[Ar_{31}]_{c31}-[(L_{31})_{a31}-R_{31}]_{b31}$$ Formula 3

In Formula 3, $Ar_{31}$ and $L_{31}$ may each independently be a $C_3$-$C_{60}$ carbocyclic group that is unsubstituted or substituted with at least one $R_{10a}$ or a $C_1$-$C_{60}$ heterocyclic group that is unsubstituted or substituted with at least one $R_{10a}$, a31 and c31 may each independently be an integer from 0 to 3, $R_{31}$ may be hydrogen, deuterium, —F, —Cl, —Br, —I, a hydroxyl group, a cyano group, a nitro group, a $C_1$-$C_{60}$ alkyl group that is unsubstituted or substituted with at least one $R_{10a}$, a $C_2$-$C_{60}$ alkenyl group that is unsubstituted or substituted with at least one $R_{10a}$, a $C_2$-$C_{60}$ alkynyl group that is unsubstituted or substituted with at least one $R_{10a}$, a $C_1$-$C_{60}$ alkoxy group that is unsubstituted or substituted with at least one $R_{10a}$, a $C_3$-$C_{60}$ carbocyclic group that is unsubstituted or substituted with at least one $R_{10a}$, a $C_1$-$C_{60}$ heterocyclic group that is unsubstituted or substituted with at least one $R_{10a}$, $—Si(Q_{301})(Q_{302})(Q_{303})$, $—N(Q_{301})(Q_{302})$, $—B(Q_{301})(Q_{302})$, $—C(=O)(Q_{301})$, $—S(=O)_2(Q_{301})$, or $—P(=O)(Q_{301})(Q_{302})$, b31 may be an integer from 1 to 5, and $Q_{301}$ to $Q_{303}$ may respectively be the same as described in connection with $Q_1$ in the present specification.

In an embodiment, the emission layer may include a host and a dopant, and the host may include a first host represented by Formula 3a or 3b and a second host represented by Formula 4a or 4b.

Formula 3a

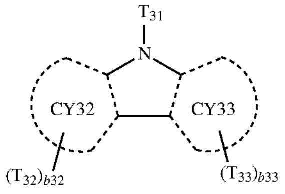

Formula 3b

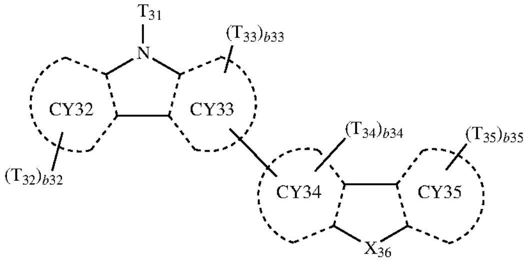

Formula 4a

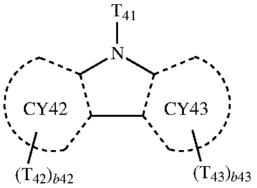

Formula 4b

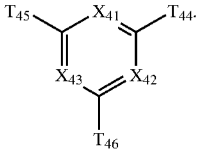

In Formulae 3a, 3b, 4a, and 4b, ring CY32 to ring CY35 and ring CY42 and ring CY43 may each independently be a $C_3$-$C_{60}$ carbocyclic group that is unsubstituted or substituted with at least one $R_{10a}$ or a $C_1$-$C_{60}$ heterocyclic group that is unsubstituted or substituted with at least one $R_{10a}$.

In an embodiment, ring CY32 to ring CY35 and ring CY42 and ring CY43 may each independently be a benzene group, a naphthalene group, an anthracene group, a phenanthrene group, a carbazole group, a dibenzofuran group, a fluorene group, a dibenzothiophene group, or a dibenzosilole group.

In an embodiment, ring CY32 to ring CY35, ring CY42, and ring CY43 may each independently be a benzene group, a naphthalene group, or a phenanthrene group.

In Formula 3b, $X_{36}$ may be O, S, $N(T_{36})$, $C(R_{36})(R_{37})$, or $Si(R_{36})(R_{37})$.

In an embodiment, in Formula 3b, $X_{36}$ may be O or $N(T_{36})$.

In Formula 4b, $X_{41}$ may be N, $C(R_{41})$, or $Si(R_{41})$, $X_{42}$ may be N, $C(R_{42})$, or $Si(R_{42})$, and $X_{43}$ may be N, $C(R_{43})$, or $Si(R_{43})$.

In an embodiment, in Formula 4b, $X_{41}$ may be N or $C(R_{41})$, $X_{42}$ may be N or $C(R_{42})$, and $X_{43}$ may be N or $C(R_{43})$.

In an embodiment, the second host may be represented by Formula 4b and may satisfy one of Conditions 4-1 to 4-3.

Condition 4-1

$X_{41}$ is N, $X_{42}$ is N, and $X_{43}$ is N.

Condition 4-2

$X_{41}$ is $C(R_{41})$, $X_{42}$ is N, and $X_{43}$ is N.

Condition 4-3

$X_{41}$ is $C(R_{41})$, $X_{42}$ is $C(R_{42})$, and $X_{43}$ is N.

In Formulae 3a, 3b, 4a, and 4b, $T_{31}$ may be $*\text{-}[(L_{31})_{a31}\text{-}R_{31}]$, $T_{32}$ may be $*\text{-}[(L_{32})_{a32}\text{-}R_{32}]$, $T_{33}$ may be $*\text{-}[(L_{33})_{a33}\text{-}R_{33}]$, $T_{34}$ may be $*\text{-}[(L_{34})_{a34}\text{-}R_{34}]$, $T_{35}$ may be $*\text{-}[(L_{35})_{a35}\text{-}R_{35}]$, $T_{36}$ may be $*\text{-}[(L_{36})_{a36}\text{-}R_{36}]$, $T_{41}$ may be $*\text{-}[(L_{41})_{a41}\text{-}R_{41}]$, $T_{42}$ may be $*\text{-}[(L_{42})_{a42}\text{-}R_{42}]$, $T_{43}$ may be $*\text{-}[(L_{43})_{a43}\text{-}R_{43}]$, $T_{44}$ may be $*\text{-}[(L_{44})_{a44}\text{-}R_{44}]$, $T_{45}$ may be $*\text{-}[(L_{45})_{a45}\text{-}R_{45}]$, and $T_{46}$ may be $*\text{-}[(L_{46})_{a46}\text{-}R_{46}]$. * indicates a binding site to a neighboring atom.

In Formulae 3a, 3b, 4a, and 4b, $L_{31}$ to $L_{36}$ and $L_{41}$ to $L_{46}$ may each independently each independently be a single bond, a $C_5$-$C_{30}$ carbocyclic group that is unsubstituted or substituted with at least one $R_{10a}$, or a $C_1$-$C_{30}$ heterocyclic group that is unsubstituted or substituted with at least one $R_{10a}$.

In an embodiment, in Formulae 3a, 3b, 4a, and 4b, $L_{31}$ to $L_{36}$ and $L_{41}$ to $L_{46}$ may each independently be: a single bond;

a phenylene group, a pentalenylene group, an indenylene group, a naphthylene group, an azulenylene group, a heptalenylene group, an indacenylene group, an acenaphthylene group, a fluorenylene group, a spiro-bifluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, a quinolinylene group, an isoquinolinylene group, a benzoquinolinylene group, a benzoisoquinolinylene group, a dibenzoquinolinylene group, a dibenzoisoquinolinylene group, a biphenylene group, a phenylpyridinylene group, a phenanthroline group, a dibenzoquinolene group, a bipyridinylene group, or a pyridinylene group; or a phenylene group, a pentalenylene group, an indenylene group, a naphthylene group, an azulenylene group, a heptalenylene group, an indacenylene group, an acenaphthylene group, a fluorenylene group, a spiro-bifluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, a quinolinylene group, an isoquinolinylene group, a benzoquinolinylene group, a benzoisoquinolinylene group, a dibenzoquinolinylene group, a dibenzoisoquinolinylene group, a biphenylene group, a phenylpyridinylene group, a phenanthroline group, a bipyridinylene group, a dibenzoquinolene group, or a pyridinylene group, each substituted with deuterium, —F, —Cl, —Br, —I, a hydroxyl group, a cyano group, a nitro group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a quinolinyl group, an isoquinolinyl group, a benzoquinolinyl group, a benzoisoquinolinyl group, a dibenzoquinolinyl group, a dibenzoisoquinolinyl group, a biphenyl group, a phenylpyridinyl group, a phenanthrenyl group, a dibenzoquinol group, a bipyridinyl group, a pyridinyl group, $-Si(Q_{31})(Q_{32})(Q_{33})$, $-N(Q_{31})(Q_{32})$, $-B(Q_{31})(Q_{32})$, $-C(=O)(Q_{31})$, $-S(=O)_2(Q_{31})$, $-P(=O)(Q_{31})(Q_{32})$, or any combination thereof.

In an embodiment, in Formulae 3a, 3b, 4a, and 4b, $L_{31}$ to $L_{36}$ and $L_{41}$ to $L_{46}$ may each independently be: a single bond;

a phenylene group, a naphthylene group, a fluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a thiophenylene group, a furanylene group, a carbazolylene group, a benzofuranylene group, a benzothiophenylene group, a dibenzofuranylene group, a dibenzothiophenylene group, a benzocarbazolylene group, a dibenzocarbazolylene group, a dibenzosilolylene group, a quinolinylene group, an isoquinolinylene group, a benzoquinolinylene group, a benzoisoquinolinylene group, a dibenzoquinolinylene group, a dibenzoisoquinolinylene group, a biphenylene group, a phenylpyridinylene group, a phenanthrenylene group, a dibenzoquinolene group, a bipyridinylene group, or a pyridinylene group; or a phenylene group, a naphthylene group, a fluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a thiophenylene group, a furanylene group, a carbazolylene group, a benzofuranylene group, a benzothiophenylene group, a dibenzofuranylene group, a dibenzothiophenylene group, a benzocarbazolylene group, a dibenzocarbazolylene group, a dibenzosilolylene group, a quinolinylene group, an isoquinolinylene group, a benzoquinolinylene group, a benzoisoquinolinylene group, a dibenzoquinolinylene group, a dibenzoisoquinolinylene group, a biphenylene group, a phenylpyridinylene group, a phenanthrenylene group, a dibenzoquinolene group, a bipyridinylene group, or a pyridinylene group, each substituted with deuterium, —F, —Cl, —Br, —I, a hydroxyl group, a cyano group, a nitro group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a naphthyl group, a fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a thiophenyl group, a furanyl group, a carbazolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a quinolinyl group, an isoquinolinyl group, a benzoquinolinyl group, a benzoisoquinolinyl group, a dibenzoquinolinyl group, a dibenzoisoquinolinyl group, a biphenyl group, a phenylpyridinyl group, a phenanthrenyl group, a dibenzoquinol group, a bipyridinyl group, a pyridinyl group, —Si($Q_{31}$)($Q_{32}$)($Q_{33}$), or any combination thereof.

In an embodiment, in Formulae 3a, 3b, 4a, and 4b, $L_{31}$ to $L_{36}$ and $L_{41}$ to $L_{46}$ may each independently be: a single bond; or a phenylene group, a naphthylene group, a fluorenylene group, a triphenylenylene group, a carbazolylene group, a dibenzofuranylene group, a dibenzothiophenylene group, a benzocarbazolylene group, or a dibenzocarbazolylene group; or a phenylene group, a naphthylene group, a fluorenylene group, a triphenylenylene group, a carbazolylene group, a dibenzofuranylene group, a dibenzothiophenylene group, a benzocarbazolylene group, or dibenzocarbazolylene group, each substituted with deuterium, —F, —Cl, —Br, —I, a hydroxyl group, a cyano group, a nitro group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a naphthyl group, a fluorenyl group, a triphenylenyl group, a carbazolyl group, a dibenzofuranyl group, a dibenzothiophenylene group, a benzocarbazolyl group, a dibenzocarbazolyl group, or any combination thereof.

In Formulae 3a, 3b, 4a, and 4b, a31 to a36 and a41 to a46 may each independently be an integer from 0 to 3.

a31 to a36 and a41 to a46 may respectively indicate the numbers of $L_{31}$(s) to $L_{36}$(s) and $L_{44}$(s) to $L_{46}$(s). When a31 is an integer of 2 or more, two or more of $L_{31}$(s) may be identical to or different from each other. When a32 is an integer of 2 or more, two or more of $L_{32}$(s) may be identical to or different from each other. When a33 is an integer of 2 or more, two or more of $L_{33}$(s) may be identical to or different from each other. When a34 is an integer of 2 or more, two or more of $L_{34}$(s) may be identical to or different from each other. When a41 is an integer of 2 or more, two or more of $L_{41}$(s) may be identical to or different from each other. When a42 is an integer of 2 or more, two or more of $L_{42}$(s) may be identical to or different from each other. When a43 is an integer of 2 or more, two or more of $L_{43}$(s) may be identical to or different from each other. When a44 is an integer of 2 or more, two or more of $L_{44}$(s) may be identical to or different from each other. When a45 is an integer of 2 or more, two or more of $L_{45}$(s) may be identical to or different from each other. When a46 is an integer of 2 or more, two or more of $L_{46}$(s) may be identical to or different from each other.

In an embodiment, a31 to a36 and a41 to a46 may each independently be an integer of 0 to 2.

In Formulae 3a, 3b, 4a, and 4b, $R_{31}$ to $R_{37}$ and $R_{41}$ to $R_{46}$ may each independently be hydrogen, deuterium, —F, —Cl, —Br, —I, a hydroxyl group, a cyano group, a nitro group, a $C_1$-$C_{60}$ alkyl group that is unsubstituted or substituted with at least one $R_{10a}$, a $C_2$-$C_{60}$ alkenyl group that is unsubstituted or substituted with at least one $R_{10a}$, a $C_2$-$C_{60}$ alkynyl group that is unsubstituted or substituted with at least one $R_{10a}$, a $C_1$-$C_{60}$ alkoxy group that is unsubstituted or substituted with at least one $R_{10a}$, a $C_3$-$C_{60}$ carbocyclic group that is unsubstituted or substituted with at least one $R_{10a}$, a $C_1$-$C_{60}$ heterocyclic group that is unsubstituted or substituted with at least one $R_{10a}$, a $C_6$-$C_{60}$ aryloxy group that is unsubstituted or substituted with at least one $R_{10a}$, a $C_6$-$C_{60}$ arylthio group that is unsubstituted or substituted with at least one $R_{10a}$, a $C_7$-$C_{60}$ aryl alkyl group that is unsubstituted or substituted with at least one $R_{10a}$, a $C_2$-$C_{60}$ heteroaryl alkyl group that is unsubstituted or substituted with at least one $R_{10a}$, —Si($Q_1$)($Q_2$)($Q_3$), —N($Q_1$)($Q_2$), —B($Q_1$)($Q_2$), —C(=O)($Q_1$), —S(=O)$_2$($Q_1$), or —P(=O)($Q_1$)($Q_2$).

In an embodiment, in Formulae 3a, 3b, 4a, and 4b, $R_{31}$ to $R_{37}$ and $R_{41}$ to $R_{46}$ may each independently be: hydrogen, deuterium, —F, —Cl, —Br, —I, —$CD_3$, a hydroxyl group, a cyano group, a nitro group, a $C_1$-$C_{20}$ alkyl group, or a $C_1$-$C_{20}$ alkoxy group;

a $C_1$-$C_{20}$ alkyl group or a $C_1$-$C_{20}$ alkoxy group, each substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, a $C_1$-$C_{20}$ alkyl group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a tert-butyl group, a phenyl group, a biphenyl group, a terphenyl group, a naphthyl group, a pyridinyl group, a pyrimidinyl group, or any combination thereof;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a terphenyl group, a $C_1$-$C_{20}$ alkylphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an indenyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzoimidazolyl group, a benzofuranyl group, a benzothiophenyl group, a benzosilolyl group, a benzoisothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a benzofluorenyl group, a benzocarbazolyl group, a naphthobenzofuranyl group, a naphthobenzothiophenyl group, a naphthobenzosilolyl group, a dibenzofluorenyl group, a dibenzocarbazolyl group, a dinaphthofuranyl group, a dinaphthothiophenyl group, a dinaphthosilolyl group, an indenocarbazolyl group, an indolocarbazolyl group, a benzofuranocarbazolyl group, a benzothienocarbazolyl group, a benzosilolocarbazolyl group, an imidazopyridinyl group, an imidazopyrimidinyl group, an azafluorenyl group, an azacarbazolyl group, an azadibenzofuranyl group, an azadibenzothiophenyl group, or an azadibenzosilolyl group, each unsubstituted or substituted with deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, a $C_1$-$C_{20}$ alkyl group, a $C_1$-$C_{20}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a tert-butyl group, a phenyl group, a biphenyl group, a terphenyl group, a $C_1$-$C_{20}$ alkylphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an indenyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzoimidazolyl group, a benzofuranyl group, a benzothiophenyl group, a benzosilolyl group, a benzoisothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a benzofluorenyl group, a benzocarbazolyl group, a naphthobenzofuranyl group, a naphthobenzothiophenyl group, a naphthobenzosilolyl group, a dibenzofluorenyl group, a dibenzocarbazolyl group, a dinaphthofuranyl group, a dinaphthothiophenyl group, a dinaphthosilolyl group, an indenocarbazolyl group, an indolocarbazolyl group, a benzofuranocarbazolyl group, a benzothienocarbazolyl group, a benzosilolocarbazolyl group, an imidazopyridinyl group, an imidazopyrimidinyl group, $—Si(Q_{31})(Q_{32})(Q_{33})$, $—N(Q_{31})(Q_{32})$, $—B(Q_{31})(Q_{32})$, $—P(Q_{31})(Q_{32})$, $—C(=O)(Q_{31})$, $—S(=O)_2(Q_{31})$, $—P(=O)(Q_{31})(Q_{32})$, or any combination thereof; or $—Si(Q_1)(Q_2)(Q_3)$, $—N(Q_1)(Q_2)$, $—B(Q_1)(Q_2)$, $—C(=O)(Q_1)$, $—S(=O)_2(Q_1)$, or $—P(=O)(Q_1)(Q_2)$.

In an embodiment, in Formulae 3a, 3b, 4a, and 4b, $R_{31}$ to $R_{37}$ and $R_{41}$ to $R_{46}$ may each independently be: hydrogen, deuterium, —F, a cyano group, $—CD_3$, a $C_1$-$C_{20}$ alkyl group, or a $C_1$-$C_{20}$ alkoxy group;

a $C_1$-$C_{20}$ alkyl group or a $C_1$-$C_{20}$ alkoxy group, each substituted with deuterium, —F, $—CD_3$, $—CD_2H$, $—CDH_2$, $—CF_3$, $—CF_2H$, $—CFH_2$, a cyano group, or any combination thereof;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a tert-butyl group, a phenyl group, a biphenyl group, a terphenyl group, a $C_1$-$C_{20}$ alkylphenyl group, a naphthyl group, a tetrahydronaphthyl group, a fluorenyl group, a phenanthrenyl group, an anthracenyl group, a triphenylenyl group, a thiophenyl group, a furanyl group, an indenyl group, an isoindolyl group, an indolyl group, a carbazolyl group, a benzofuranyl group, a benzothiophenyl group, a benzosilolyl group, a dibenzofuranyl group, a dibenzothiophenyl group, a dibenzosilolyl group, a benzofluorenyl group, a benzocarbazolyl group, a naphthobenzofuranyl group, a naphthobenzothiophenyl group, a naphthobenzosilolyl group, a dibenzofluorenyl group, a dibenzocarbazolyl group, a dinaphthofuranyl group, a dinaphthothiophenyl group, a dinaphthosilolyl group, an indenocarbazolyl group, an indolocarbazolyl group, a benzofuranocarbazolyl group, a benzothienocarbazolyl group, a benzosilolocarbazolyl group, a quinolinyl group, an isoquinolinyl group, a pyridinyl group, a pyrazinyl group, a pyrimidinyl group, a pyridazinyl group, or a triazinyl group, each unsubstituted or substituted with deuterium, —F, $—CD_3$, $—CD_2H$, $—CDH_2$, $—CF_3$, $—CF_2H$, $—CFH_2$, a cyano group, a $C_1$-$C_{20}$ alkyl group, a $C_1$-$C_{20}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a tert-butyl group, a phenyl group, a biphenyl group, a terphenyl group, a $C_1$-$C_{20}$ alkylphenyl group, a naphthyl group, a fluorenyl group, a phenanthrenyl group, an anthracenyl group, a triphenylenyl group, a thiophenyl group, a furanyl group, an indenyl group, an isoindolyl group, an indolyl group, a carbazolyl group, a benzofuranyl group, a benzothiophenyl group, a benzosilolyl group, a dibenzofuranyl group, a dibenzothiophenyl group, a dibenzosilolyl group, a benzofluorenyl group, a benzocarbazolyl group, a naphthobenzofuranyl group, a naphthobenzothiophenyl group, a naphthobenzosilolyl group, a dibenzofluorenyl group, a dibenzocarbazolyl group, a dinaphthofuranyl group, a dinaphthothiophenyl group, a dinaphthosilolyl group, an indenocarbazolyl group, an indolocarbazolyl group, a benzofuranocarbazolyl group, a benzothienocarbazolyl group, a benzosilolocarbazolyl group, a pyridinyl group, a pyrazinyl group, a pyrimidinyl group, a pyridazinyl group, a triazinyl group, or any combination thereof; or $—Si(Q_1)(Q_2)(Q_3)$.

In an embodiment, in Formulae 3a, 3b, 4a, and 4b, $R_{31}$ to $R_{37}$ and $R_{41}$ to $R_{46}$ may each independently be: hydrogen, deuterium, —F, a methyl group, an iso-propyl group, a tert-butyl group, or a cyano group;

a phenyl group, a biphenyl group, a naphthyl group, a $C_1$-$C_{20}$ alkylphenyl group, a triphenylenyl group, a pyridinyl group, a pyrimidinyl group, a pyridazinyl group, a pyrazinyl group, a triazinyl group, a fluorenyl group, a carbazolyl group, a benzocarbazolyl group, a dibenzocarbazolyl group, a dibenzofuranyl group, or a dibenzothiophenyl group, each unsubstituted or substituted with deuterium, —F, a tert-butyl group, a cyano group, a $C_1$-$C_{20}$ alkyl group, a phenyl group, a biphenyl group, a naphthyl group, a $C_1$-$C_{20}$ alkylphenyl group, a triphenylenyl group, a pyridinyl group, a pyrimidinyl group, a pyridazinyl group, a pyrazinyl group, a triazinyl group, a fluorenyl group, a carbazolyl group, a benzocarbazolyl group, a dibenzocarbazolyl group, a dibenzofuranyl group, a dibenzothiophenyl group, or any combination thereof; or —$Si(Q_1)(Q_2)(Q_3)$.

In Formulae 3a, 3b, 4a, and 4b, b32 to b35, b42, and b43 may each independently be an integer from 0 to 10.

b32 to b35 and b42 to b43 may respectively indicate the numbers of $T_{32}$(s) to $T_{35}$(s) and $T_{42}$(s) to $T_{43}$(s). When b32 is an integer of 2 or more, two or more of $T_{32}$(s) may be identical to or different from each other. When b33 is an integer of 2 or more, two or more of $T_{33}$(s) may be identical to or different from each other. When b34 is an integer of 2 or more, two or more of $T_{34}$(s) may be identical to or different from each other. When b35 is an integer of 2 or more, two or more of $T_{35}$(s) may be identical to or different from each other. When b42 is an integer of 2 or more, two or more of $T_{42}$(s) may be identical to or different from each other. When b43 is an integer of 2 or more, two or more of $T_{43}$(s) may be identical to or different from each other.

In an embodiment, b32 to b35 and b42 to b43 may each independently be an integer from 0 to 5.

In an embodiment, the first host may be one of compounds represented by Formulae 3-1 to 3-22.

3-1

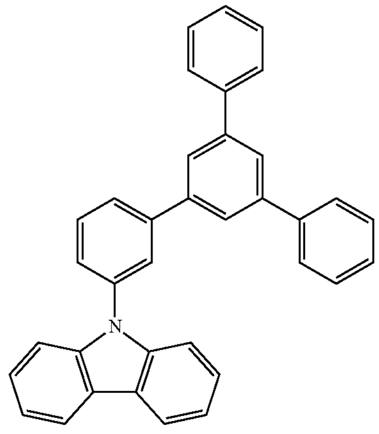

3-2

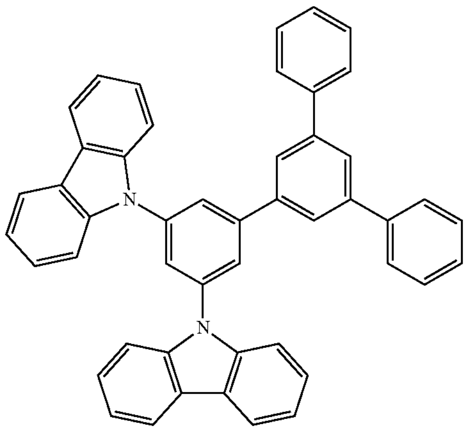

-continued 3-3

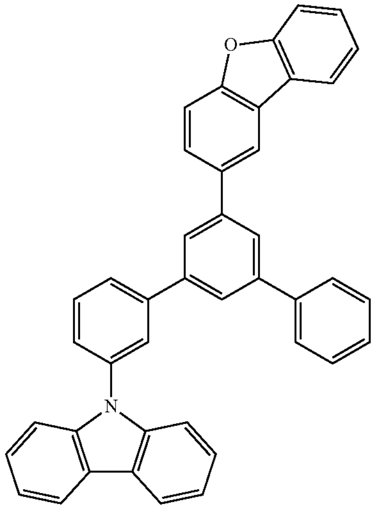

3-4

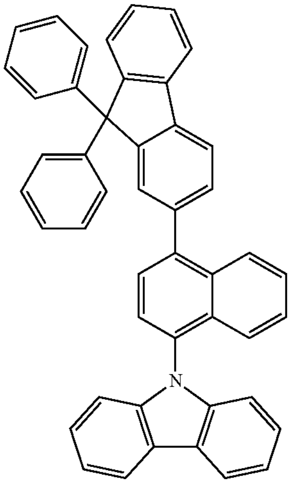

3-5

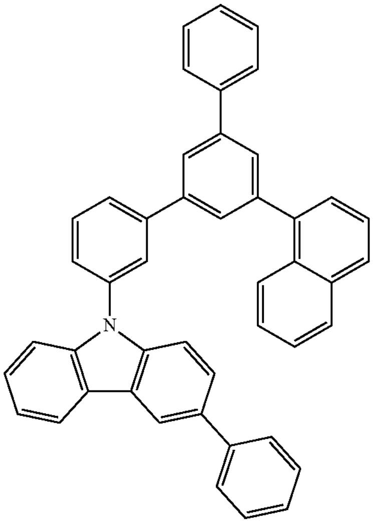

-continued
3-6
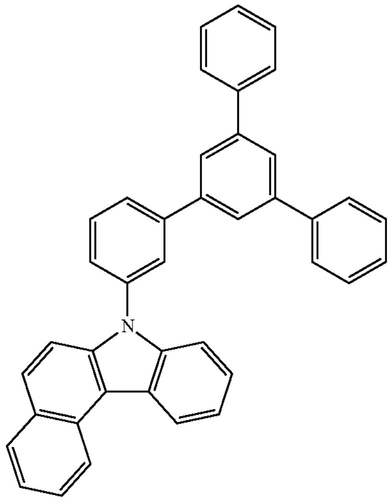
3-7
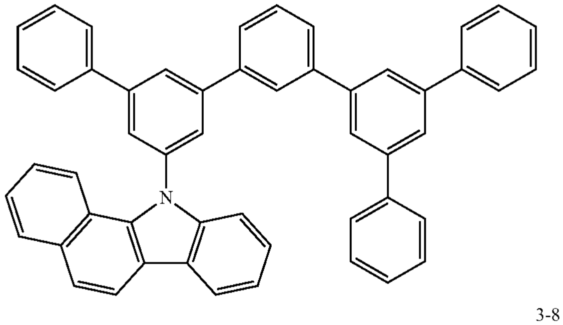
3-8
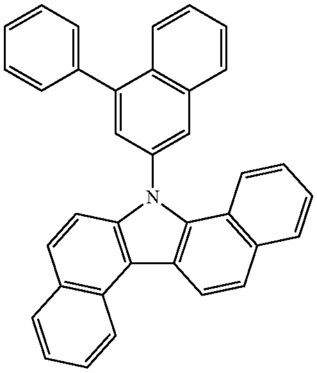
3-9
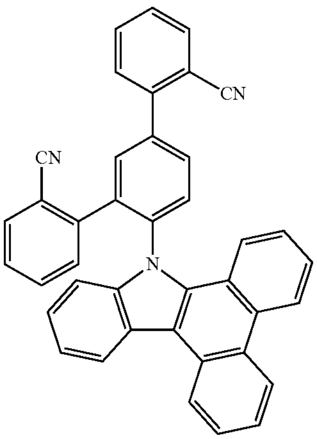
-continued
3-10
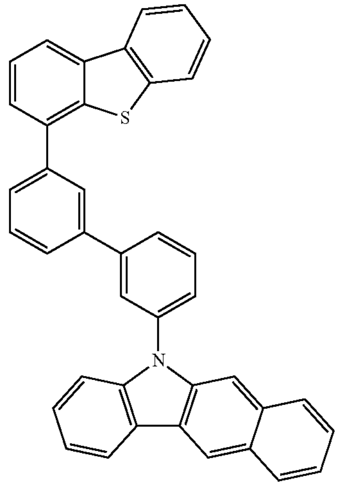
3-11
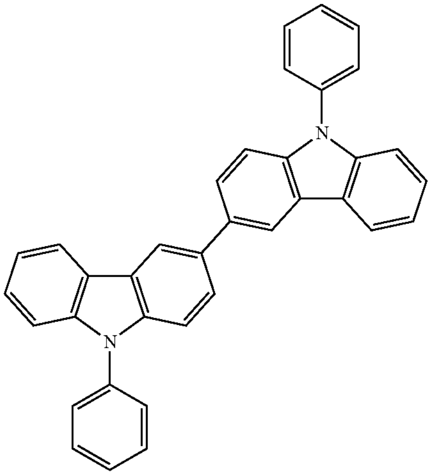
3-12
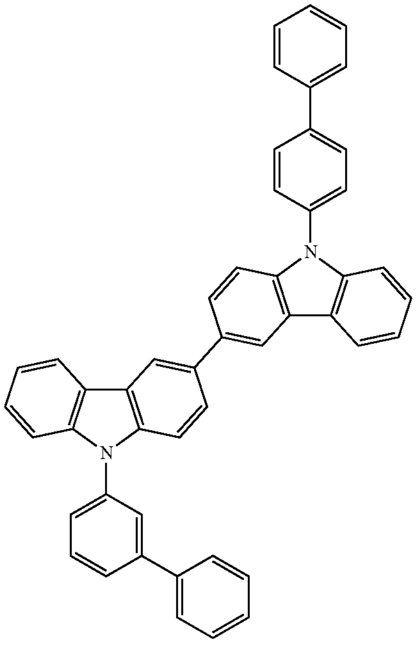

-continued
3-13
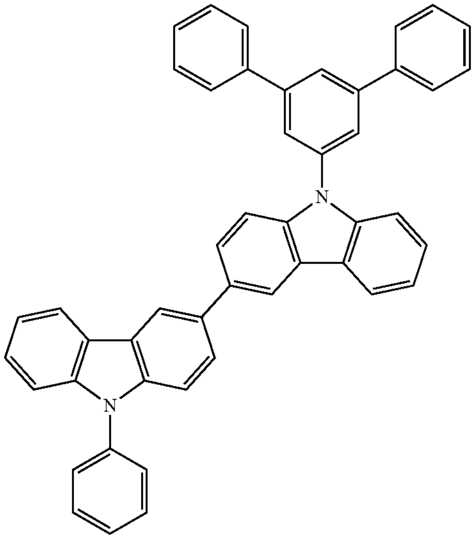
3-14
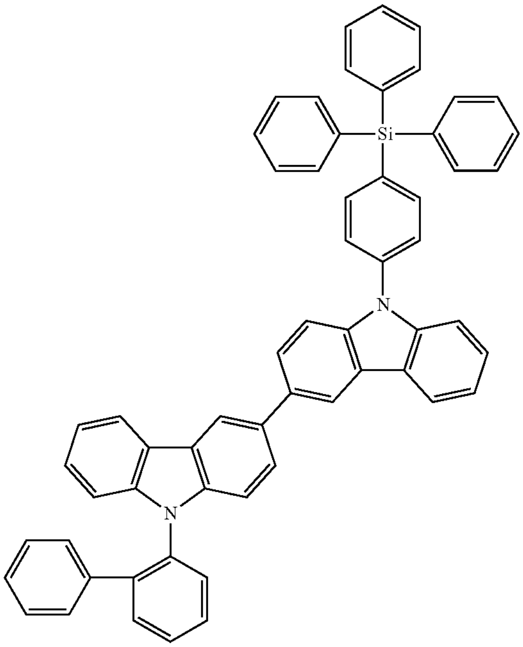
-continued
3-15
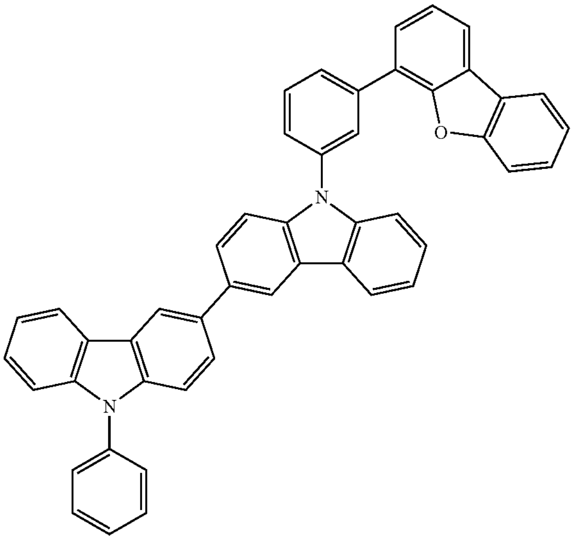
3-16
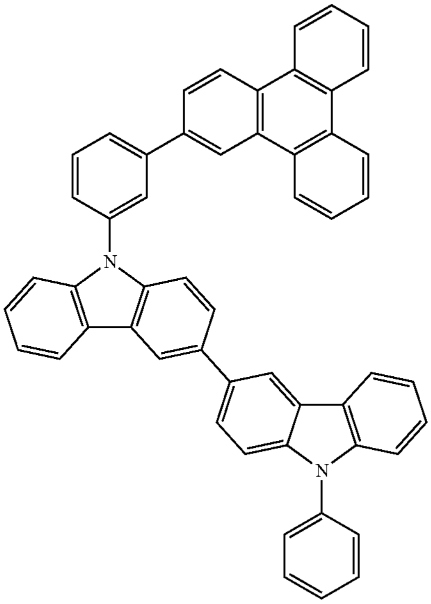
3-17
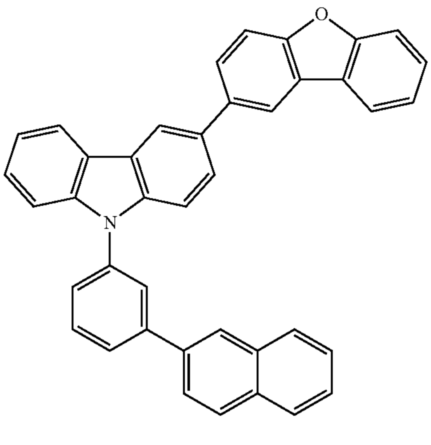

-continued
3-18
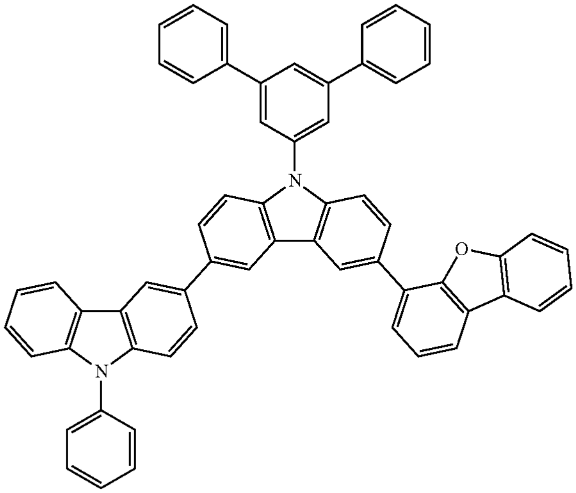
3-19
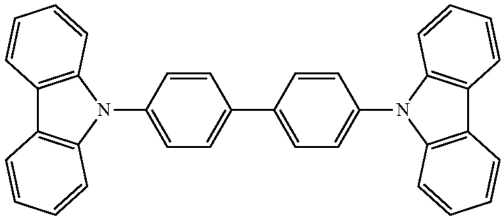
3-20
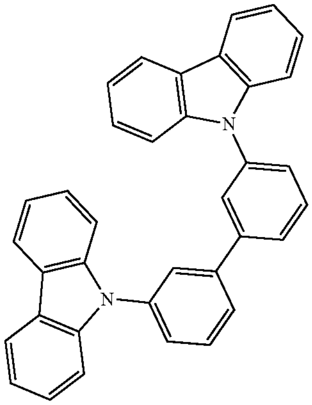
3-21
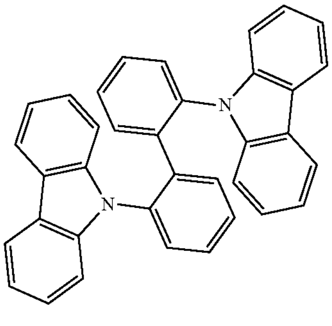
-continued
3-22
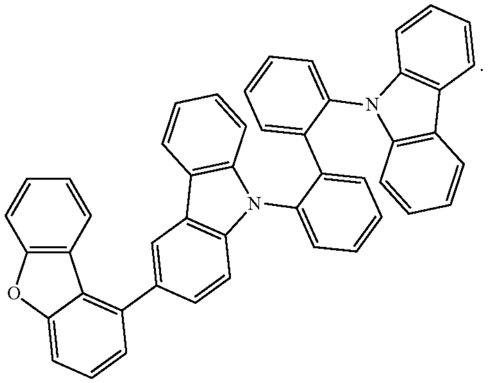
In an embodiment, the second host may be one of compounds represented by Formulae 4-1 to 4-16.
4-1
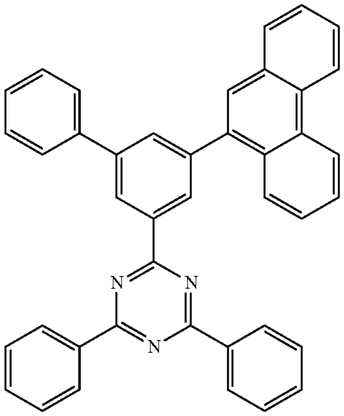
4-2
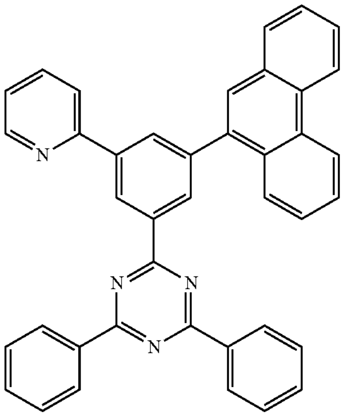

-continued
4-3
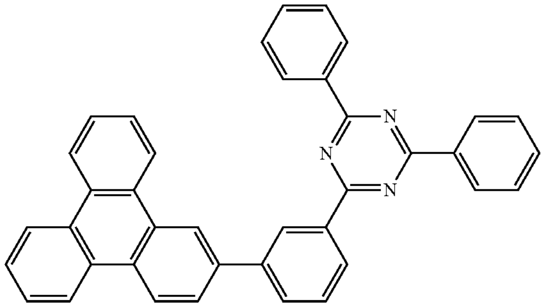
4-4
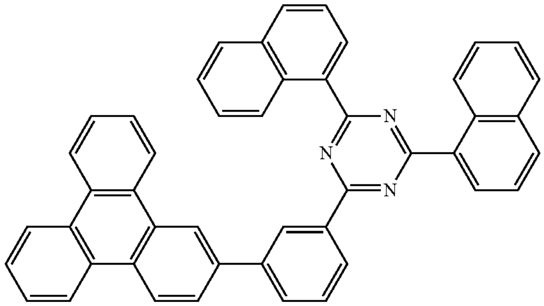
4-5
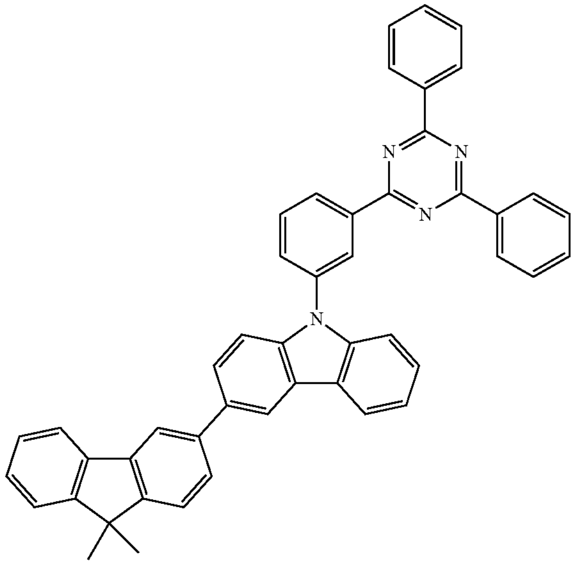
-continued
4-6
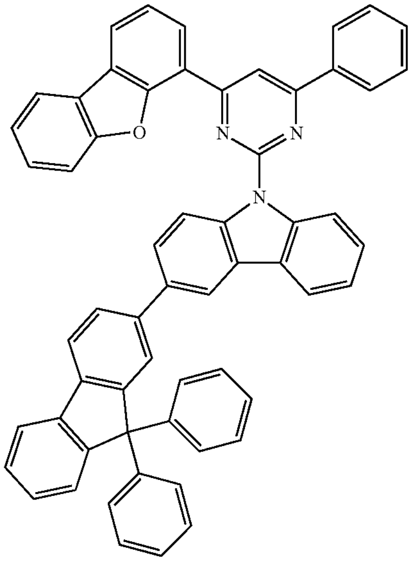
4-7
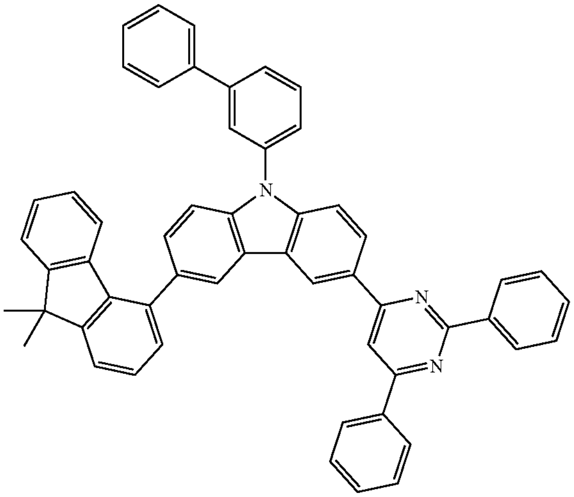
4-8
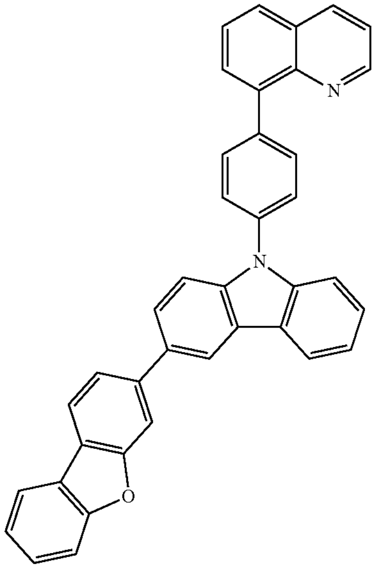

-continued
4-9
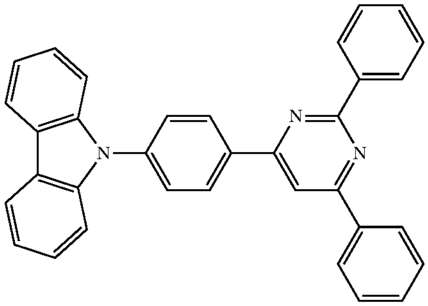
4-10
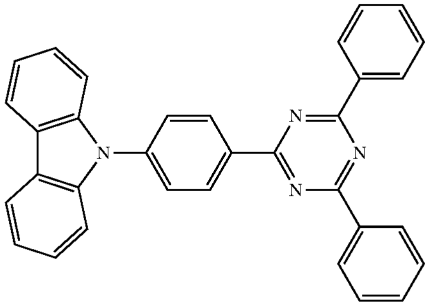
4-11
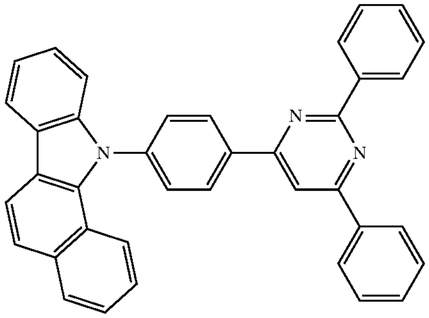
4-12
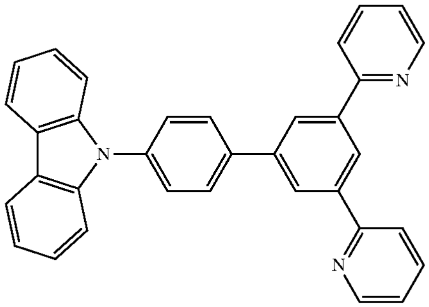
4-13
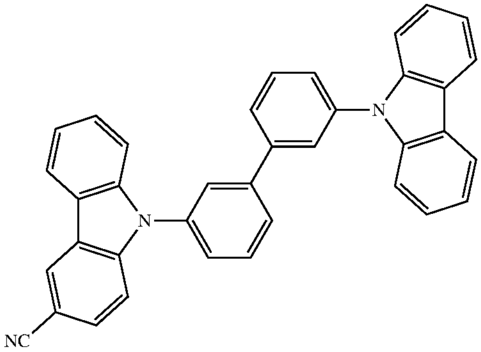
-continued
4-14
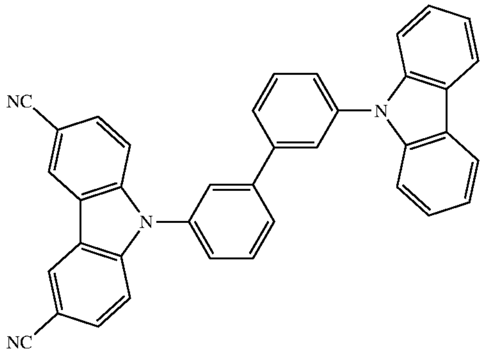
4-15
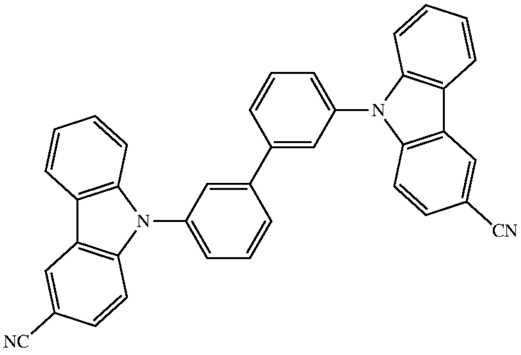
4-16
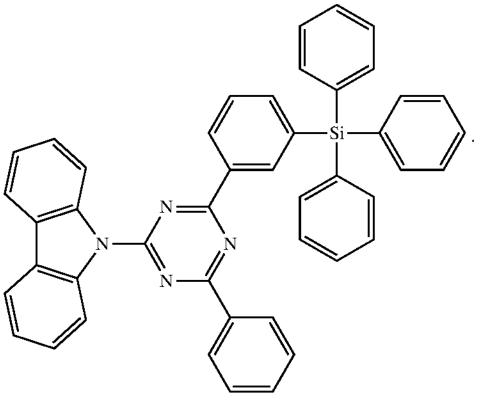
In an embodiment, the emission layer may include a host and a dopant, and the dopant may be an organometallic compound represented by Formula 5.
$$M(L_{51})_{a51}(L_{52})_{a52}$$ Formula 5

Formula 5a

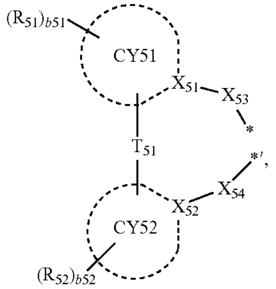

In Formulae 5 and 5a, M may be iridium (Ir), platinum (Pt), palladium (Pd), osmium (Os), titanium (Ti), gold (Au), hafnium (Hf), europium (Eu), terbium (Tb), rhodium (Rh), rhenium (Re), or thulium (Tm).

In an embodiment, in Formula 5, M may be iridium (Ir) or platinum (Pt).

In Formula 5, $L_{51}$ may be a ligand represented by Formula 5a.

In Formula 5, a51 may be an integer from 1 to 3. a51 may indicate the number of $L_{51}$(s). When a51 is 2 or 3, two or three of $L_{51}$(s) may be identical to or different from each other.

When a51 is 2 or 3, two rings CY51 of two or more of $L_{51}$(s) may optionally be linked together via $T_{52}$, which is a linking group, or two rings CY52 may optionally be linked together via $T_{53}$, which is a linking group.

In Formula 5, $L_{52}$ may be an organic ligand.

In an embodiment, the organic ligand may be a halogen group, a diketone group, a carboxylic acid group, —C(═O), an isonitrile group, a —CN group, a phosphorus group, or any combination thereof.

In Formula 5, a52 may be an integer from 1 to 3. a52 may indicate the number of $L_{52}$(s). When a52 is 2 or 3, two or three of $L_{52}$(s) may be identical to or different from each other.

In Formula 5a, $X_{51}$ and $X_{52}$ may each independently be nitrogen or carbon.

In an embodiment, in Formula 5a, $X_{51}$ and $X_{52}$ may satisfy one of Conditions 5-1 to 5-3.

Condition 5-1

$X_{51}$ is nitrogen, and $X_{52}$ is carbon.

Condition 5-2

$X_{51}$ is carbon, and $X_{52}$ is carbon.

Condition 5-3

$X_{51}$ is nitrogen, and $X_{52}$ is nitrogen.

In an embodiment, in Formula 5a, $X_{51}$ and $X_{52}$ may satisfy Condition 5-1 or 5-2.

In Formula 5a, ring CY51 and ring CY52 may each independently be a $C_3$-$C_{60}$ carbocyclic group or a $C_1$-$C_{60}$ heterocyclic group.

In an embodiment, in Formula 5a, ring CY51 and ring CY52 may each independently be a benzene group, a naphthalene group, an anthracene group, a phenanthrene group, an imidazole group, a pyrazole group, a pyridine group, a pyrimidine group, a pyridoindole group, a benzimidazole group, a carbazole group, a dibenzofuran group, a fluorene group, a dibenzothiophene group, or a dibenzosilole group.

In an embodiment, in Formula 5a, ring CY51 and ring CY52 may each independently be a benzene group, an imidazole group, a pyrazole group, a pyridine group, a pyrimidine group, a pyridoindole group, a benzimidazole group, or a carbazole group.

In Formula 5a, $T_{51}$ to $T_{53}$ may each independently be a single bond, *"—O—*'", *"—S—*'", *"—C(═O)—*'", *"—N($Q_{411}$)-*'", *"—C($Q_{411}$)($Q_{412}$)-*'", *"—C($Q_{411}$)═C($Q_{412}$)-*'", *"—C($Q_{411}$)═*'", or *"═C═*'". $Q_{411}$ to $Q_{414}$ are respectively the same as described in connection with $Q_1$ in the present specification.

*" and *'" may each indicate a biding site to a neighboring atom.

In an embodiment, in Formula 5a, $T_{51}$ to $T_{53}$ may each independently be a single bond or *"—O—*'".

In Formula 5a, $R_{51}$ and $R_{52}$ may each independently be hydrogen, deuterium, —F, —Cl, —Br, —I, a hydroxyl group, a cyano group, a nitro group, a $C_1$-$C_{20}$ alkyl group that is unsubstituted or substituted with at least one $R_{10a}$, a $C_1$-$C_{20}$ alkoxy group that is unsubstituted or substituted with at least one $R_{10a}$, a $C_3$-$C_{60}$ carbocyclic group that is unsubstituted or substituted with at least one $R_{10a}$, a $C_1$-$C_{60}$ heterocyclic group that is unsubstituted or substituted with at least one $R_{10a}$, —Si($Q_{401}$)($Q_{402}$)($Q_{403}$), —N($Q_{401}$)($Q_{402}$), —B($Q_{401}$)($Q_{402}$), —C(═O)($Q_{401}$), —S(═O)$_2$($Q_{401}$), or —P(═O)($Q_{401}$)($Q_{402}$).

$Q_{401}$ to $Q_{403}$ are respectively the same as described in connection with $Q_1$ in the present specification.

In an embodiment, in Formula 5a, $R_{51}$ and $R_{52}$ may each independently be: hydrogen, deuterium, —F, —Cl, —Br, —I, —$CD_3$, a hydroxyl group, a cyano group, a nitro group, a $C_1$-$C_{20}$ alkyl group, or a $C_1$-$C_{20}$ alkoxy group;

a $C_1$-$C_{20}$ alkyl group or a $C_1$-$C_{20}$ alkoxy group, each substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, a $C_1$-$C_{20}$ alkyl group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a tert-butyl group, a phenyl group, a biphenyl group, a terphenyl group, a naphthyl group, a pyridinyl group, a pyrimidinyl group, or any combination thereof;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a terphenyl group, a $C_1$-$C_{20}$ alkylphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an indenyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzoimidazolyl group, a benzofuranyl group, a benzothiophenyl group, a benzosilolyl group, a benzoisothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a benzofluorenyl group, a benzocarbazolyl group, a naphthobenzofuranyl group, a naphthobenzothiophenyl group, a naphthobenzosilolyl group, a dibenzofluorenyl group, a dibenzocarbazolyl group, a dinaphthofuranyl group, a dinaphthothiophenyl group, a dinaphthosilolyl group, an indenocarbazolyl group, an indolocarbazolyl group, a benzofuranocarbazolyl group, a benzothienocarbazolyl group, a benzosilolocarbazolyl group, an imidazopyridinyl group, an imidazopyrimidinyl group, an azafluorenyl group, an azacarbazolyl group, an azadibenzofuranyl group, an azadibenzothiophenyl group, or an azadibenzosilolyl group, each unsubstituted or substituted with deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, a $C_1$-$C_{20}$ alkyl group, a $C_1$-$C_{20}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a tert-butyl group, a phenyl group, a biphenyl group, a terphenyl group, a $C_1$-$C_{20}$ alkylphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an indenyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzoimidazolyl group, a benzofuranyl group, a benzothiophenyl group, a benzosilolyl group, a benzoisothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a benzofluorenyl group, a benzocarbazolyl group, a naphthobenzofuranyl group, a naphthobenzothiophenyl group, a naphthobenzosilolyl group, a dibenzofluorenyl group, a dibenzocarbazolyl group, a dinaphthofuranyl group, a dinaphthothiophenyl group, a dinaphthosilolyl group, an indenocarbazolyl group, an indolocarbazolyl group, a benzofuranocarbazolyl group, a benzothienocarbazolyl group, a benzosilolocarbazolyl group, an imidazopyridinyl group, an imidazopyrimidinyl group, $—Si(Q_{31})(Q_{32})(Q_{33})$, $—N(Q_{31})(Q_{32})$, $—B(Q_{31})(Q_{32})$, $—P(Q_{31})(Q_{32})$, $—C(=O)(Q_{31})$, $—S(=O)_2(Q_{31})$, $—P(=O)(Q_{31})(Q_{32})$, or any combination thereof; or $—Si(Q_1)(Q_2)(Q_3)$, $—N(Q_1)(Q_2)$, $—B(Q_1)(Q_2)$, $—C(=O)(Q_1)$, $—S(=O)_2(Q_1)$, or $—P(=O)(Q_1)(Q_2)$.

In an embodiment, in Formula 5a, $R_{51}$ and $R_{52}$ may each independently be: hydrogen, deuterium, —F, a cyano group, $—CD_3$, a $C_1$-$C_{20}$ alkyl group, or a $C_1$-$C_{20}$ alkoxy group;

a $C_1$-$C_{20}$ alkyl group or a $C_1$-$C_{20}$ alkoxy group, each substituted with deuterium, —F, $—CD_3$, $—CD_2H$, $—CDH_2$, $—CF_3$, $—CF_2H$, $—CFH_2$, a cyano group, or any combination thereof; or a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a tert-butyl group, a phenyl group, a biphenyl group, a terphenyl group, a $C_1$-$C_{20}$ alkylphenyl group, a naphthyl group, a tetrahydronaphthyl group, a fluorenyl group, a phenanthrenyl group, an anthracenyl group, a triphenylenyl group, a thiophenyl group, a furanyl group, an indenyl group, an isoindolyl group, an indolyl group, a carbazolyl group, a benzofuranyl group, a benzothiophenyl group, a benzosilolyl group, a dibenzofuranyl group, a dibenzothiophenyl group, a dibenzosilolyl group, a benzofluorenyl group, a benzocarbazolyl group, a naphthobenzofuranyl group, a naphthobenzothiophenyl group, a naphthobenzosilolyl group, a dibenzofluorenyl group, a dibenzocarbazolyl group, a dinaphthofuranyl group, a dinaphthothiophenyl group, a dinaphthosilolyl group, an indenocarbazolyl group, an indolocarbazolyl group, a benzofuranocarbazolyl group, a benzothienocarbazolyl group, a benzosilolocarbazolyl group, a quinolinyl group, an isoquinolinyl group, a pyridinyl group, a pyrazinyl group, a pyrimidinyl group, a pyridazinyl group, or a triazinyl group, each unsubstituted or substituted with deuterium, —F, $—CD_3$, $—CD_2H$, $—CDH_2$, $—CF_3$, $—CF_2H$, $—CFH_2$, a cyano group, a $C_1$-$C_{20}$ alkyl group, a $C_1$-$C_{20}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a tert-butyl group, a phenyl group, a biphenyl group, a terphenyl group, a $C_1$-$C_{20}$ alkylphenyl group, a naphthyl group, a fluorenyl group, a phenanthrenyl group, an anthracenyl group, a triphenylenyl group, a thiophenyl group, a furanyl group, an indenyl group, an isoindolyl group, an indolyl group, a carbazolyl group, a benzofuranyl group, a benzothiophenyl group, a benzosilolyl group, a dibenzofuranyl group, a dibenzothiophenyl group, a dibenzosilolyl group, a benzofluorenyl group, a benzocarbazolyl group, a naphthobenzofuranyl group, a naphthobenzothiophenyl group, a naphthobenzosilolyl group, a dibenzofluorenyl group, a dibenzocarbazolyl group, a dinaphthofuranyl group, a dinaphthothiophenyl group, a dinaphthosilolyl group, an indenocarbazolyl group, an indolocarbazolyl group, a benzofuranocarbazolyl group, a benzothienocarbazolyl group, a benzosilolocarbazolyl group, a pyridinyl group, a pyrazinyl group, a pyrimidinyl group, a pyridazinyl group, a triazinyl group, or any combination thereof.

In an embodiment, in Formula 5a, $R_{51}$ and $R_{52}$ may each independently be: hydrogen, deuterium, —F, a methyl group, an iso-propyl group, a tert-butyl group, or a cyano group; or a phenyl group, a biphenyl group, a naphthyl group, a $C_1$-$C_{20}$ alkylphenyl group, a triphenylenyl group, a pyridinyl group, a pyrimidinyl group, a pyridazinyl group, a pyrazinyl group, a triazinyl group, a fluorenyl group, a carbazolyl group, a benzocarbazolyl group, a dibenzocarbazolyl group, a dibenzofuranyl group, or a dibenzothiophenyl group, each unsubstituted or substituted with deuterium, —F, a tert-butyl group, a cyano group, a $C_1$-$C_{20}$ alkyl group, a phenyl group, a biphenyl group, a naphthyl group, a $C_1$-$C_{20}$ alkylphenyl group, a triphenylenyl group, a pyridinyl group, a pyrimidinyl group, a pyridazinyl group, a pyrazinyl group, a triazinyl group, a fluorenyl group, a carbazolyl group, a benzocarbazolyl group, a dibenzocarbazolyl group, a dibenzofuranyl group, a dibenzothiophenyl group, or any combination thereof.

b51 and b52 in Formula 5a may each independently be an integer from 0 to 10.

b51 and b52 may respectively indicate the numbers of $R_{51}$(s) and $R_{52}$(s). When b51 is an integer of 2 or more, two or more of $R_{51}$(s) may be identical to or different from each other. When b52 is an integer of 2 or more, two or more of $R_{52}$(s) may be identical to or different from each other.

In an embodiment, two or more of $R_{51}$(s); two or more of $R_{52}$(s); and $R_{51}$ and $R_{52}$ may optionally be bonded together to form a $C_3$-$C_{60}$ carbocyclic group that is unsubstituted or substituted with at least one $R_{10a}$ or a $C_1$-$C_{60}$ heterocyclic group that is unsubstituted or substituted with at least one $R_{10a}$.

* and *' in Formula 5a may each indicate a binding site to M in Formula 5.

In an embodiment, the dopant may be one of compounds represented by Formulae 5-1 to 5-8.

5-1

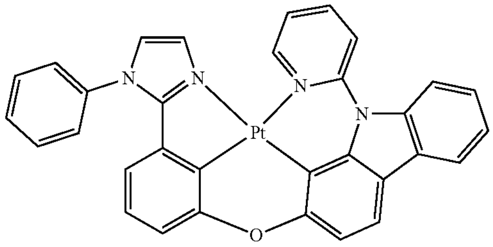

5-2

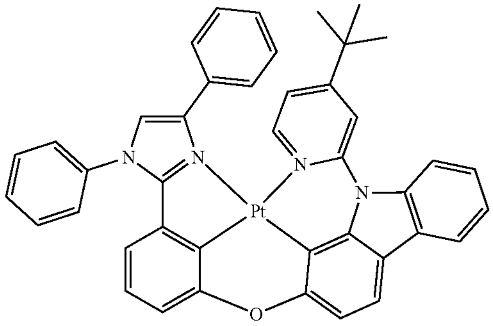

5-3

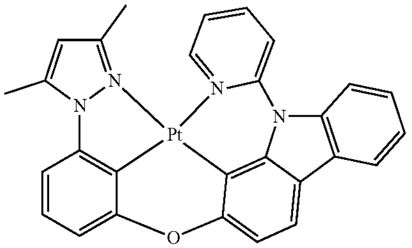

5-4

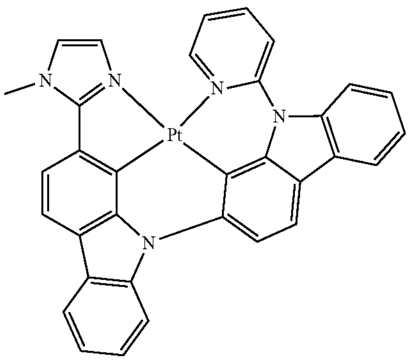

-continued 5-5

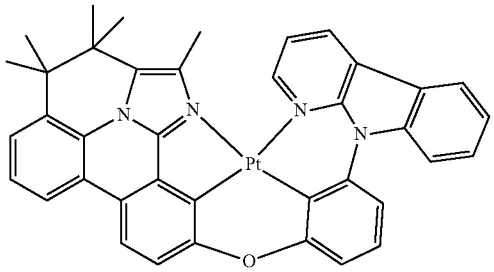

5-6

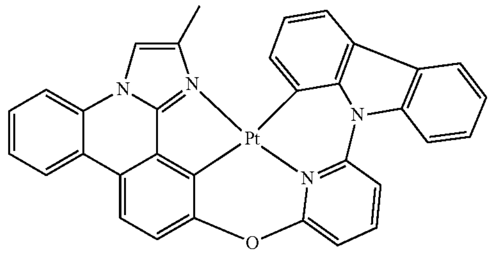

5-7

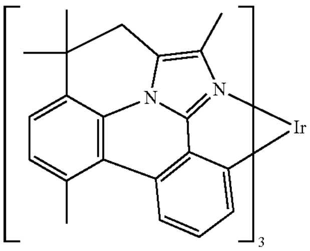

5-8

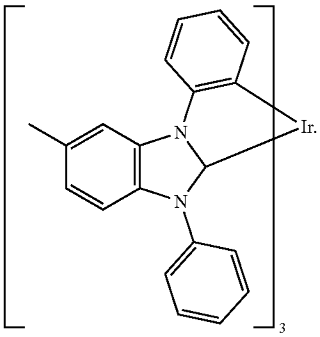

The light-emitting device may include an electron transport region including a first electron transport layer and a second electron transport layer. The first electron transport layer may include a first compound, the second electron transport layer may include a second compound, the first compound may include a pyrimidine group, the second compound may include a triazine group, and an absolute value of a LUMO energy of the first compound ($E_{LUMO\_E1}$) may be less than an absolute value of a LUMO energy of the second compound ($E_{LUMO\_E2}$).

Although embodiments are not limited by any specific theory, the light-emitting device as described above may include the first and second electron transport layers, each with a respective specific compound, and the specific compounds included in the first and second electron transport layers satisfy a specific LUMO energy condition, resulting in improvement in electron mobility.

Therefore, because the electron transport region has improved electron mobility, an electronic device, for example, a light-emitting device, including the electron transport region including the first electron transport layer and the second electron transport layer, may have low voltage characteristics and/or an improved lifespan.

Synthesis method of the compound represented by Formula 1, the compound represented by Formula 2, the compound represented by Formula 3, the compound represented by Formula 4, and the compound represented by Formula 5 may be recognizable by one of ordinary skill in the art by referring to Examples provided below.

In an embodiment, a light-emitting device includes: a first electrode;

a second electrode facing the first electrode; and an interlayer arranged between the first electrode and the second electrode, wherein the interlayer may include an emission layer and an electron transport region arranged between the emission layer and the second electrode, and the electron transport region may include a first electron transport layer arranged between the emission layer and the second electrode and a second electron transport layer arranged between the first electron transport layer and the second electrode.

In an embodiment, the first electrode of the light-emitting device may be an anode, the second electrode of the light-emitting device may be a cathode, and the interlayer may further include a hole transport region arranged between the first electrode and the emission layer.

The hole transport region may include a hole injection layer, a hole transport layer, an emission auxiliary layer, an electron blocking layer, or any combination thereof.

The electron transport region may further include a buffer layer, a hole blocking layer, an electron control layer, an electron transport layer, an electron injection layer, or any combination thereof.

The emission layer may be to emit red light, green light, blue light, and/or white light.

In an embodiment, the emission layer may be to emit blue light. The blue light may have a maximum emission wavelength of, for example, about 400 nm to about 490 nm. The blue light may have a maximum emission wavelength of, for example, about 440 nm to about 480 nm.

In an embodiment, the emission layer may further include a host (i.e., another host) other than the first host and the second host.

In an embodiment, the emission layer may further include a phosphorescent dopant, a delayed fluorescence material, or a combination thereof. In an embodiment, the emission layer may further include a phosphorescent dopant other than the above host(s) and the above dopant(s).

In an embodiment, the dopant may include a transition metal and ligand(s) in the number of m, m may be an integer from 1 to 6, the ligand(s) in the number of m may be identical to or different from each other, at least one of the ligand(s) in the number of m may be bound to the transition metal via a carbon-transition metal bond, and the carbon-transition metal bond may be a coordinate bond. For example, at least one of the ligand(s) in the number of m may be a carbene ligand (e.g., Ir(pmp)3 and/or the like). The transition metal may be, for example, iridium, platinum, osmium, palladium, rhodium, or gold. The emission layer and the dopant may respectively be the same as described in the present specification.

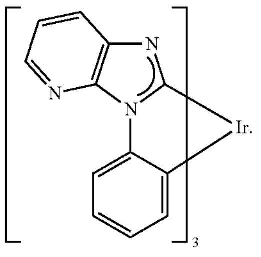

$Ir(pmp)_3$

In an embodiment, the light-emitting device may include a capping layer located outside the first electrode or located outside the second electrode.

For example, the light-emitting device may further include at least one of a first capping layer located outside the first electrode or a second capping layer located outside the second electrode. More details for the first capping layer and/or second capping layer are respectively the same as described in the present specification.

The wording "(interlayer and/or electron transport layer) includes a compound" as used herein may refer to that the (interlayer and/or electron transport layer) may include one kind of compound represented by Formula 1 or two or more different kinds of compounds, each represented by Formula 1.

In an embodiment, the electron transport region may include the compound represented by Formula 1 and the compound represented by Formula 2.

In an embodiment, the compound represented by Formula 1 may be included in the first electron transport layer. In an embodiment, the compound represented by Formula 2 may be included in the second electron transport layer.

The term "interlayer" as utilized herein refers to a single layer and/or all of a plurality of layers located between the first electrode and the second electrode of the light-emitting device.

According to one or more embodiments, provided is an electronic apparatus including the light-emitting device. The electronic apparatus may further include a thin-film transistor. In an embodiment, the electronic apparatus may further include a thin-film transistor including a source electrode and a drain electrode, wherein the first electrode of the light-emitting device may be electrically connected to the source electrode or the drain electrode. In an embodiment, the electronic apparatus may further include a color filter, a color conversion layer, a touch screen layer, a polarizing layer, or any combination thereof. More details for the electronic apparatus are as described in the present specification.

Description of FIG. 1

FIG. 1 is a schematic cross-sectional view of a light-emitting device 10 according to an embodiment of the disclosure. The light-emitting device 10 includes a first electrode 110, an interlayer 130, and a second electrode 150. The interlayer 130 includes an emission layer and an electron transport region. The electron transport region includes a first electron transport layer and a second electron transport layer.

Hereinafter, the structure of the light-emitting device 10 according to an embodiment and a method of manufacturing the light-emitting device 10 will be described in connection with FIG. 1.

First Electrode 110

In FIG. 1, a substrate may be additionally located under the first electrode 110 and/or above the second electrode 150. As the substrate, a glass substrate or a plastic substrate may be utilized. In an embodiment, the substrate may be a flexible substrate, and may include plastics with excellent or suitable heat resistance and durability, such as polyimide, polyethylene terephthalate (PET), polycarbonate, polyethylene naphthalate, polyarylate (PAR), polyetherimide, or any combination thereof.

The first electrode 110 may be formed by, for example, depositing or sputtering a material for forming the first electrode 110 on the substrate. When the first electrode 110 is an anode, a material for forming the first electrode 110 may be a high work function material that facilitates injection of holes.

The first electrode 110 may be a reflective electrode, a semi-transmissive electrode, or a transmissive electrode. When the first electrode 110 is a transmissive electrode, a material for forming the first electrode 110 may include indium tin oxide (ITO), indium zinc oxide (IZO), tin oxide ($SnO_2$), zinc oxide (ZnO), or any combination thereof. In an embodiment, when the first electrode 110 is a semi-transmissive electrode or a reflective electrode, magnesium (Mg), silver (Ag), aluminum (Al), aluminum-lithium (Al—Li), calcium (Ca), magnesium-indium (Mg—In), magnesium-silver (Mg—Ag), or any combination thereof may be utilized as a material for forming a first electrode.

The first electrode 110 may have a single-layered structure consisting of a single layer or a multilayer structure including a plurality of layers. In an embodiment, the first electrode 110 may have a three-layered structure of ITO/Ag/ITO.

Interlayer 130

The interlayer 130 may be located on the first electrode 110. The interlayer 130 may include an emission layer.

The interlayer 130 may further include a hole transport region arranged between the first electrode 110 and the emission layer.

The interlayer 130 may further include one or more metal-containing compounds such as one or more organometallic compounds, inorganic materials such as quantum dots, and/or the like, in addition to one or more suitable organic materials.

In an embodiment, the interlayer 130 may include, i) two or more emitting units sequentially stacked between the first electrode 110 and the second electrode 150, and ii) a charge generation layer located between the two or more emitting units. When the interlayer 130 includes the two or more emitting units and the charge generation layer as described above, the light-emitting device 10 may be a tandem light-emitting device.

Hole Transport Region in Interlayer 130

The hole transport region may have: i) a single-layered structure consisting of a single layer consisting of a single material, ii) a single-layered structure consisting of a single layer including (e.g., consisting of) a plurality of different materials, or iii) a multi-layered structure including a plurality of layers including different materials.

The hole transport region may include a hole injection layer, a hole transport layer, an emission auxiliary layer, an electron blocking layer, or any combination thereof.

For example, the hole transport region may have a multi-layered structure including a hole injection layer/hole transport layer structure, a hole injection layer/hole transport layer/emission auxiliary layer structure, a hole injection layer/emission auxiliary layer structure, a hole transport layer/emission auxiliary layer structure, or a hole injection layer/hole transport layer/electron blocking layer structure, with constituting layers of each structure being stacked sequentially from the first electrode 110 in the respective stated order.

The hole transport region may further include a compound represented by Formula 201, a compound represented by Formula 202, or any combination thereof:

Formula 201

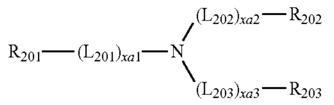

Formula 202

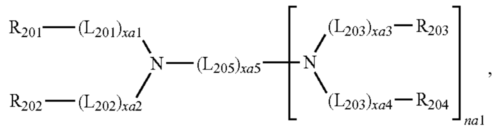

wherein, in Formulae 201 and 202, $L_{201}$ to $L_{204}$ may each independently be a $C_3$-$C_{60}$ carbocyclic group that is unsubstituted or substituted with at least one $R_{10a}$ or a $C_1$-$C_{60}$ heterocyclic group that is unsubstituted or substituted with at least one $R_{10a}$, $L_{205}$ may be *—O—*', *—S—*', *—N($Q_{201}$)-*', a $C_1$-$C_{20}$ alkylene group that is unsubstituted or substituted with at least one $R_{10a}$, a $C_2$-$C_{20}$ alkenylene group that is unsubstituted or substituted with at least one $R_{10a}$, a $C_3$-$C_{60}$ carbocyclic group that is unsubstituted or substituted with at least one $R_{10a}$, or a $C_1$-$C_{60}$ heterocyclic group that is unsubstituted or substituted with at least one $R_{10a}$, xa1 to xa4 may each independently be an integer from 0 to 5, xa5 may be an integer from 1 to 10, $R_{201}$ to $R_{204}$ and $Q_{201}$ may each independently be a $C_3$-$C_{60}$ carbocyclic group that is unsubstituted or substituted with at least one $R_{10a}$ or a $C_1$-$C_{60}$ heterocyclic group that is unsubstituted or substituted with at least one $R_{10a}$, $R_{201}$ and $R_{202}$ may optionally be linked to each other via a single bond, a $C_1$-$C_5$ alkylene group that is unsubstituted or substituted with at least one $R_{10a}$, or a $C_2$-$C_5$ alkenylene group that is unsubstituted or substituted with at least one $R_{10a}$ to form a $C_8$-$C_{60}$ polycyclic group (for example, a carbazole group and/or the like) unsubstituted or substituted with at least one $R_{10a}$ (for example, Compound HT16), $R_{203}$ and $R_{204}$ may optionally be linked to each other via a single bond, a $C_1$-$C_5$ alkylene group that is unsubstituted or substituted with at least one $R_{10a}$, or a $C_2$-$C_5$ alkenylene group that is unsubstituted or substituted with at least one $R_{10a}$ to form a $C_8$-$C_{60}$ polycyclic group that is unsubstituted or substituted with at least one $R_{10a}$, and na1 may be an integer from 1 to 4.

In an embodiment, each of Formulae 201 and 202 may include at least one of the groups represented by Formulae CY201 to CY217:

CY201

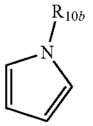

CY202

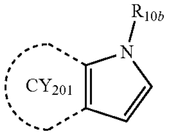

CY203

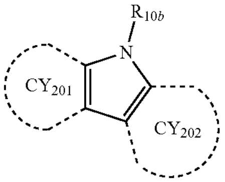

CY204

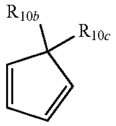

CY205

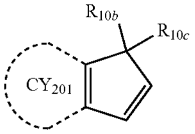

CY206

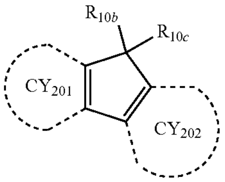

CY207

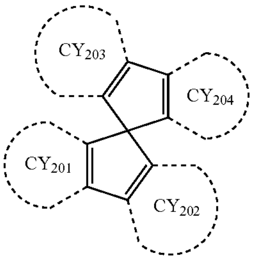

CY208

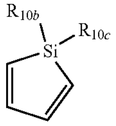

CY209

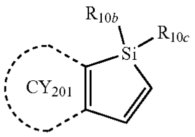

-continued

CY210

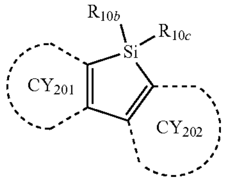

CY211

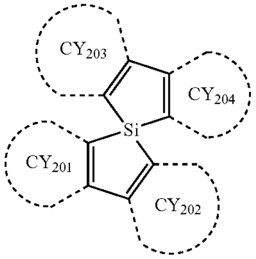

CY212

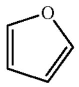

CY213

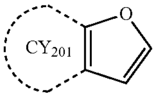

CY214

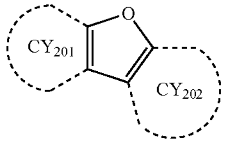

CY215

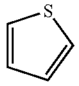

CY216

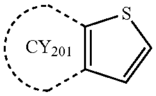

CY217

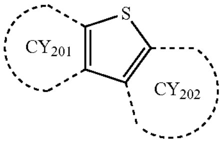, wherein in Formulae CY201 to CY217, $R_{10b}$ and $R_{10c}$ may each independently be the same as described with respect to $R_{10a}$, ring $CY_{201}$ to ring $CY_{204}$ may each independently be a $C_3$-$C_{20}$ carbocyclic group or a $C_1$-$C_{20}$ heterocyclic group, and at least one hydrogen in Formulae CY201 to CY217 may be unsubstituted or substituted with $R_{10a}$ as described above.

In an embodiment, ring $CY_{201}$ to ring $CY_{204}$ in Formulae CY201 to CY217 may each independently be a benzene group, a naphthalene group, a phenanthrene group, or an anthracene group.

In an embodiment, each of Formulae 201 and 202 may include at least one of the groups represented by Formulae CY201 to CY203.

In an embodiment, Formula 201 may include at least one of the groups represented by Formulae CY201 to CY203 and at least one of the groups represented by Formulae CY204 to CY217.

In an embodiment, xa1 in Formula 201 may be 1, $R_{201}$ may be a group represented by one of Formulae CY201 to CY203, xa2 may be 0, and $R_{202}$ may be a group represented by one of Formulae CY204 to CY207.

In an embodiment, each of Formulae 201 and 202 may not include (e.g., may exclude) any of the groups represented by Formulae CY201 to CY203.

In an embodiment, each of Formulae 201 and 202 may not include (e.g., may exclude) any of the groups represented by Formulae CY201 to CY203, and may include at least one of the groups represented by Formulae CY204 to CY217.

In an embodiment, each of Formulae 201 and 202 may not include (e.g., may exclude) any of the groups represented by Formulae CY201 to CY217.

In an embodiment, the hole transport region may include at least one of Compounds HT1 to HT50, m-MTDATA, TDATA, 2-TNATA, NPB(NPD), β-NPB, TPD, Spiro-TPD, Spiro-NPB, methylated-NPB, TAPC, HMTPD, 4,4',4"-tris (N-carbazolyl)triphenylamine (TCTA), polyaniline/dodecylbenzenesulfonic acid (PANI/DBSA), poly(3,4-ethylenedioxythiophene)/poly(4-styrenesulfonate) (PEDOT/PSS), polyaniline/camphor sulfonic acid (PANI/CSA), polyaniline/poly(4-styrenesulfonate) (PANI/PSS), CzSi(9-(4-tert-Butylphenyl)-3,6-bis(triphenylsilyl)-9H-carbazole), or any combination thereof:

HT1

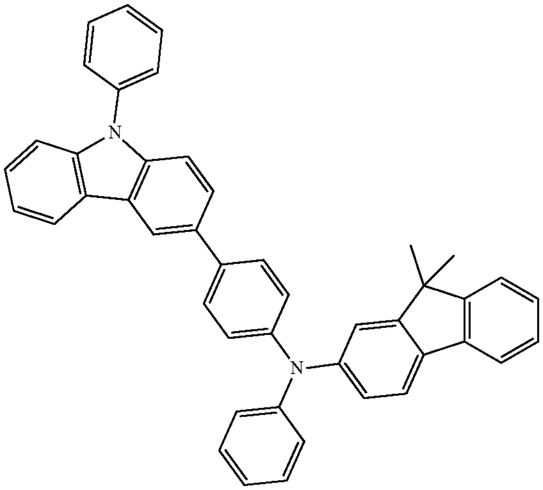

HT2

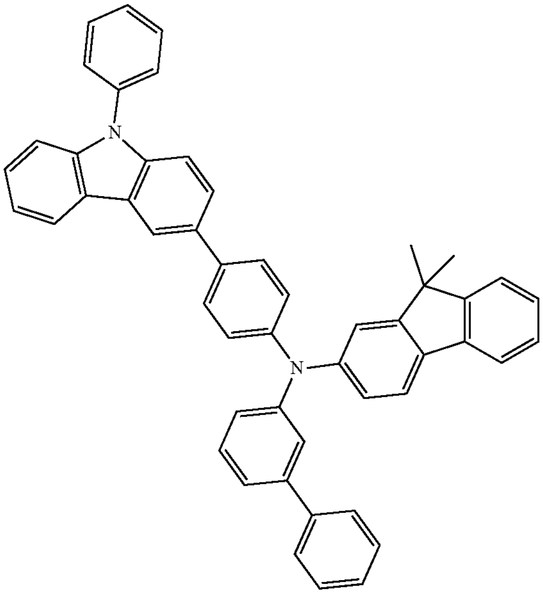

HT3

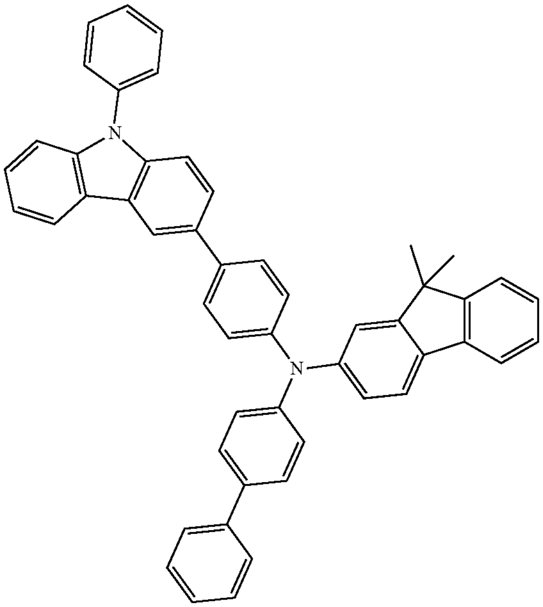

HT4

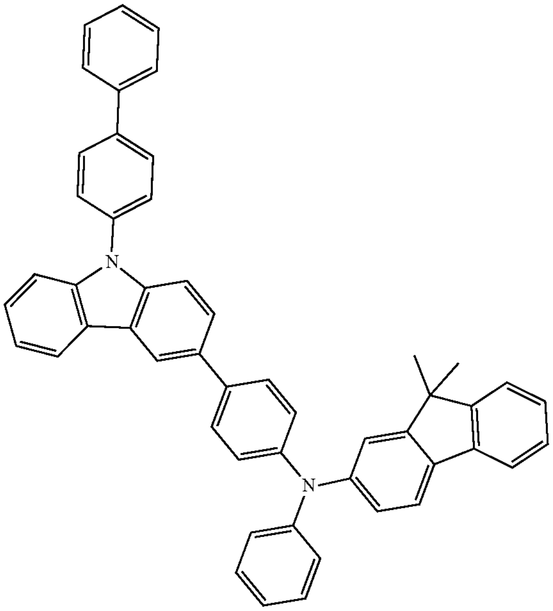

-continued
HT5
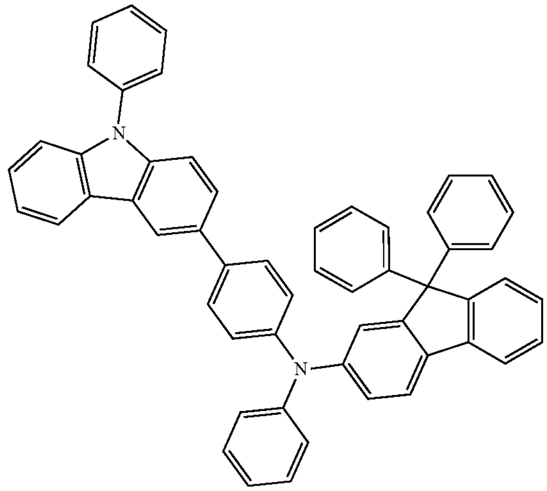
HT6
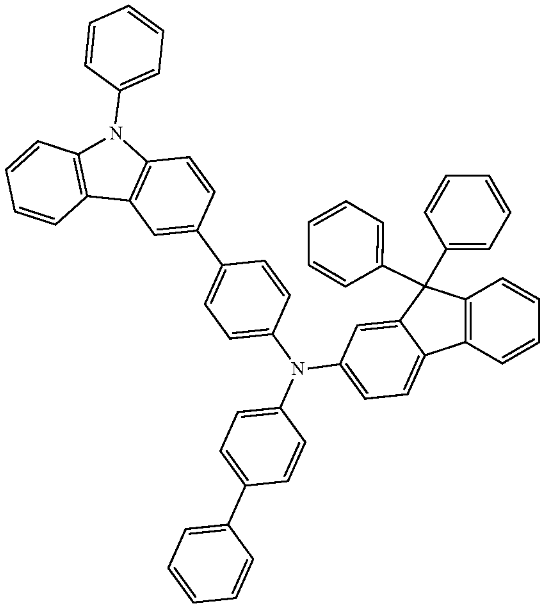
HT7
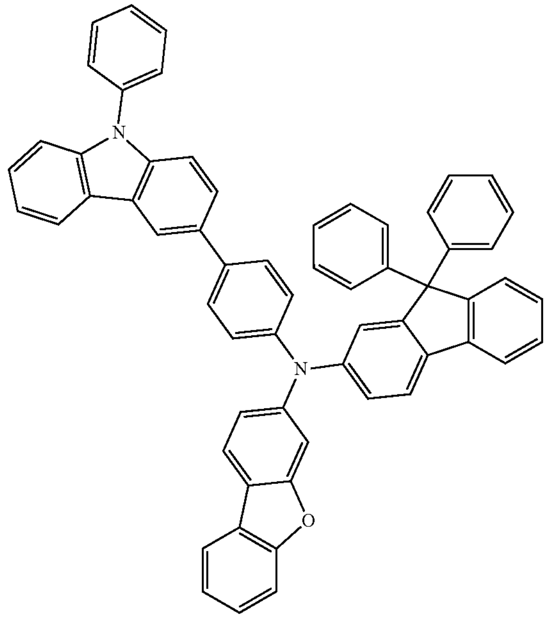
HT8
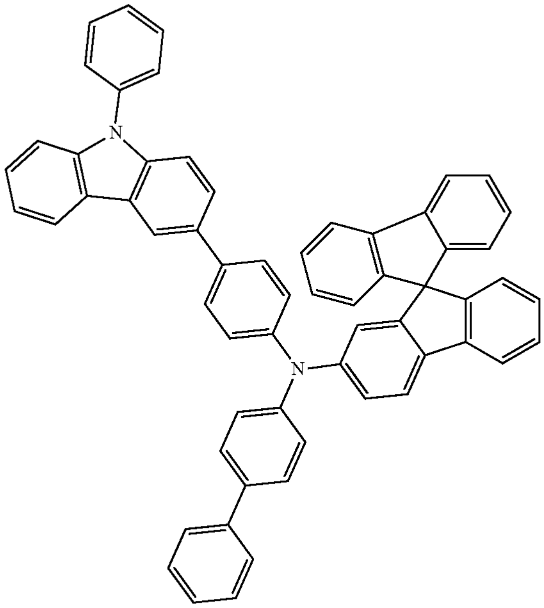

-continued
HT9
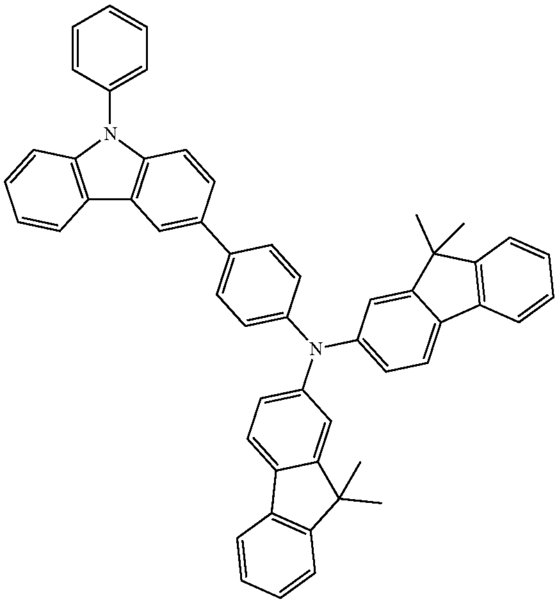
HT10
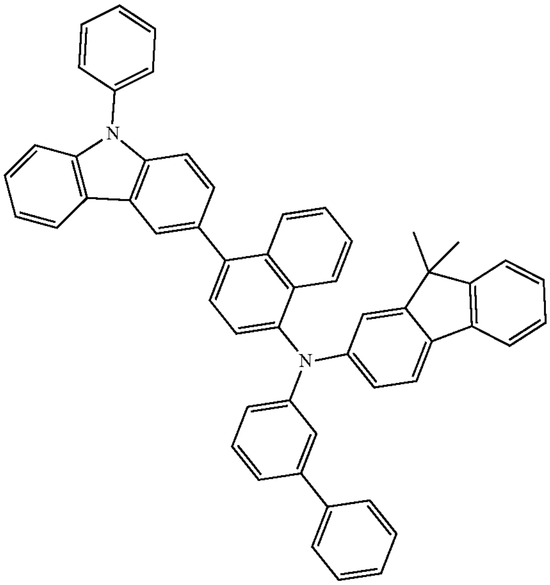
HT11
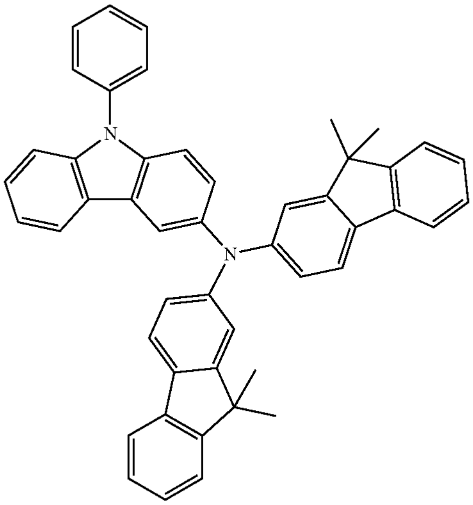
HT12
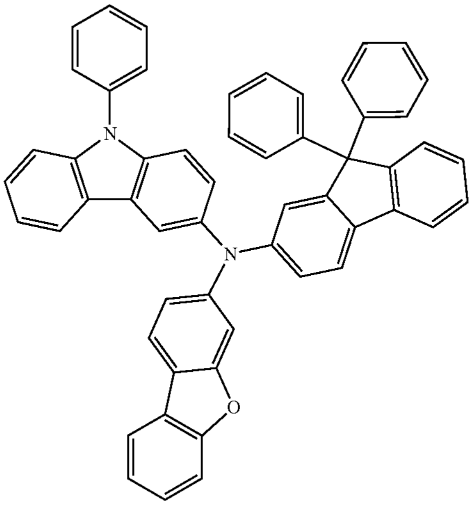

-continued
HT13
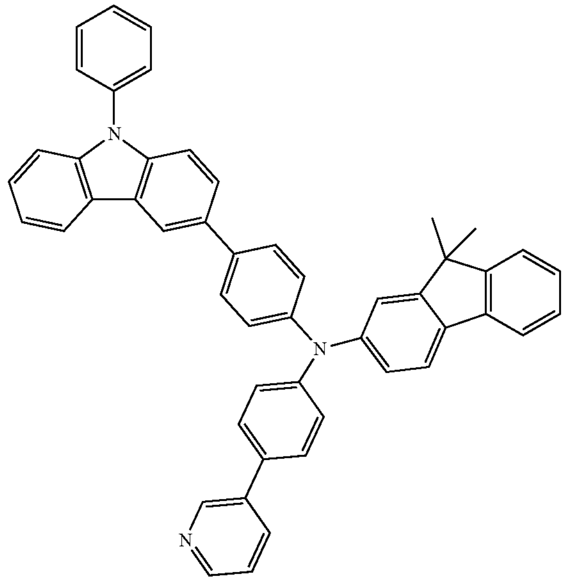
HT14
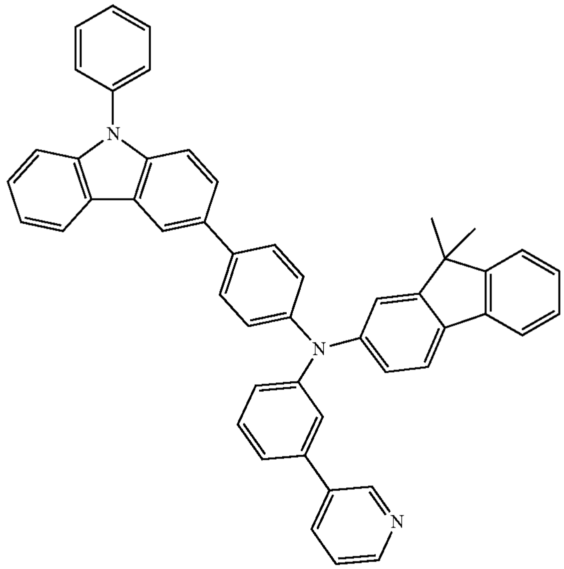
HT15
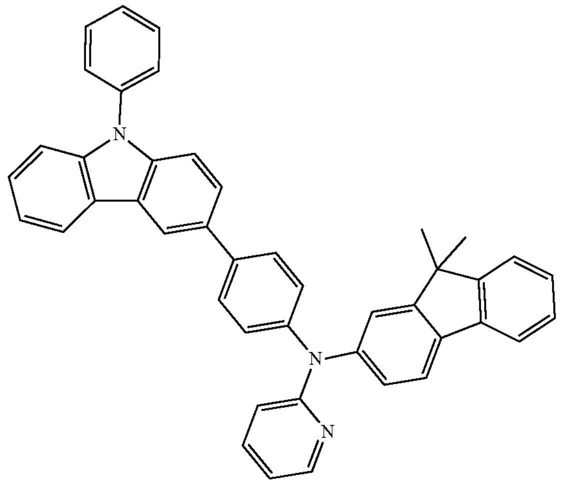
HT16
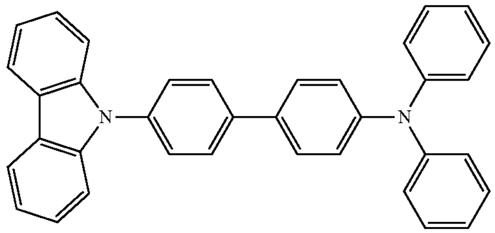
HT17
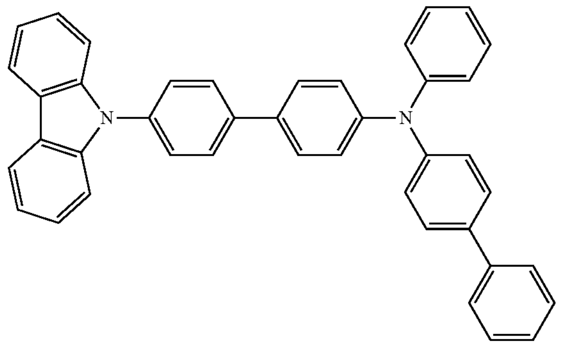
HT18
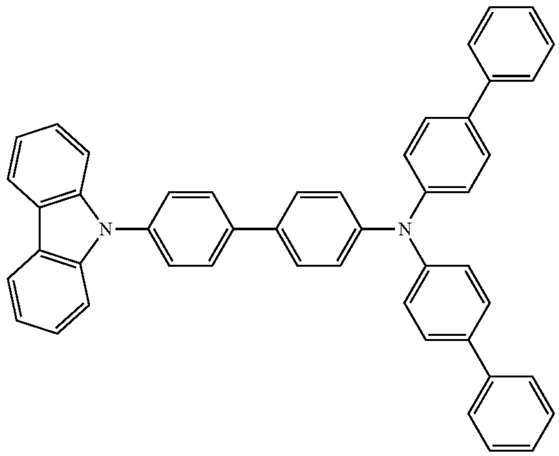

-continued
HT19
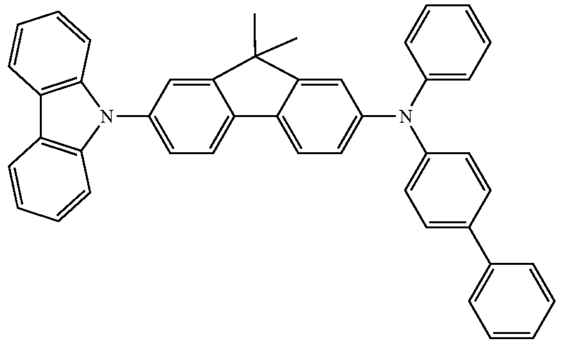
HT20
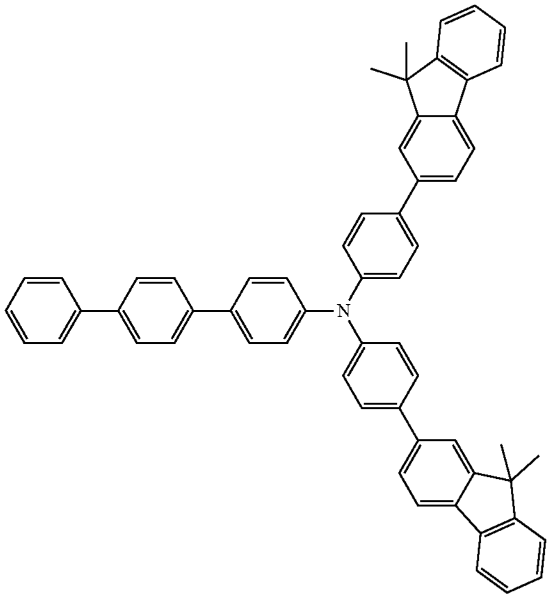
HT21
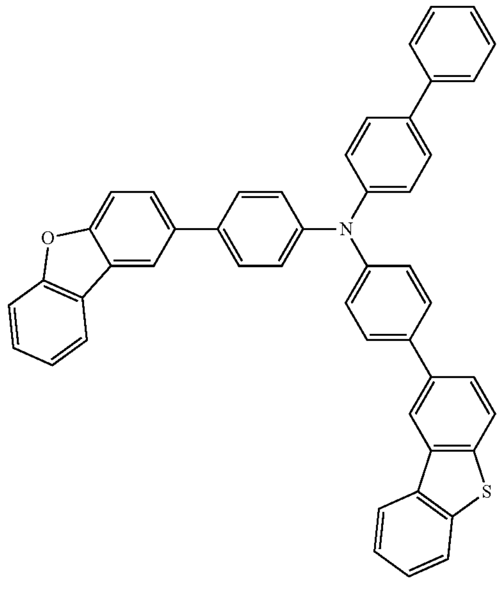
HT22
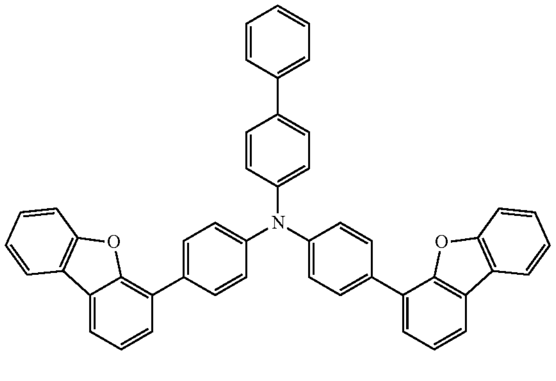

-continued
HT23
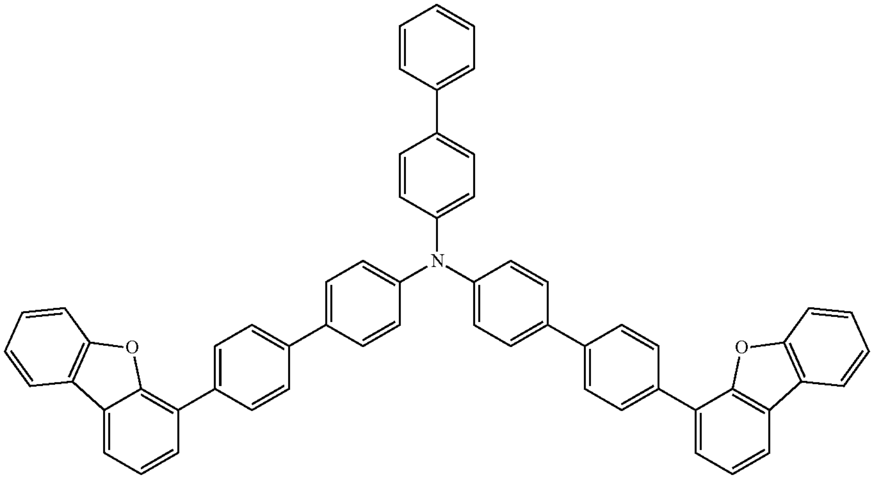
HT24
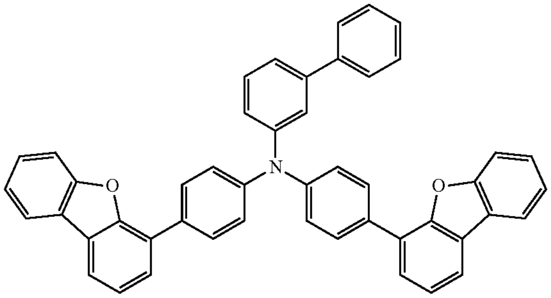
HT25
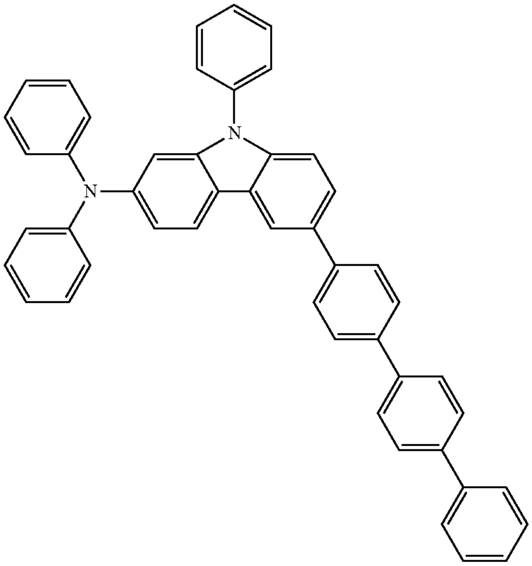
HT26
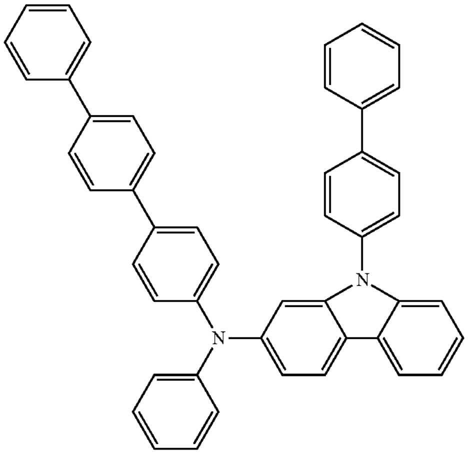
HT27
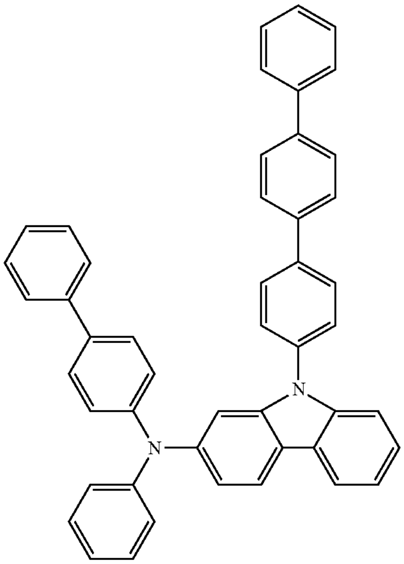

-continued
HT28
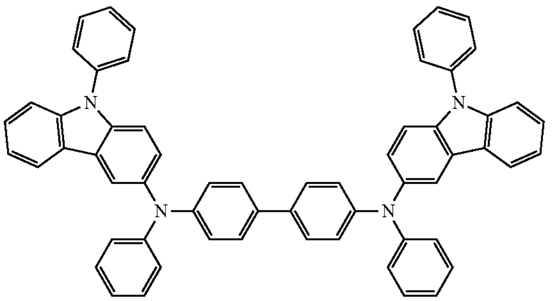
HT29
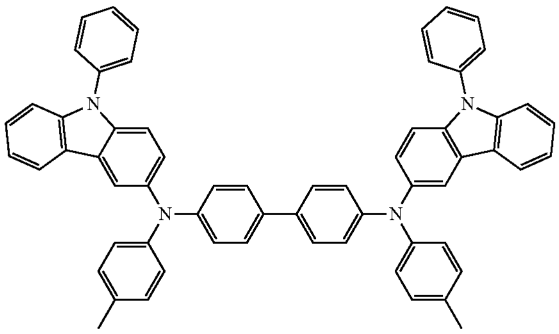
HT30
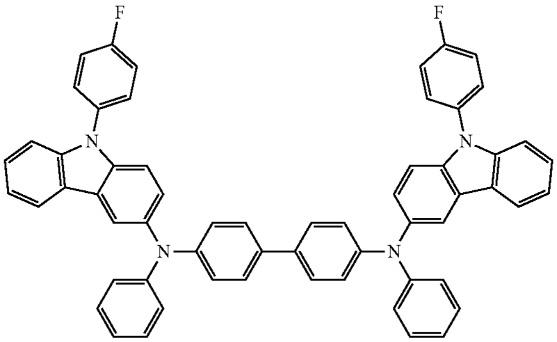
HT31
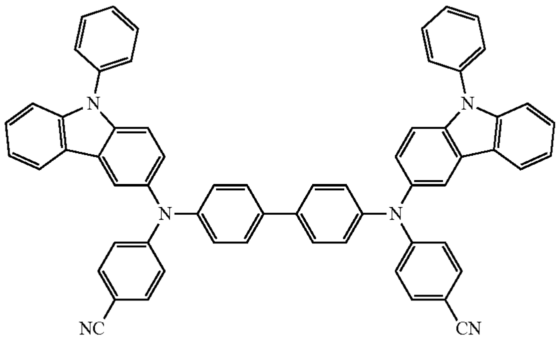
HT32
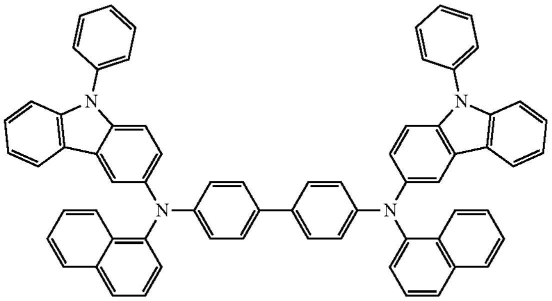
HT33
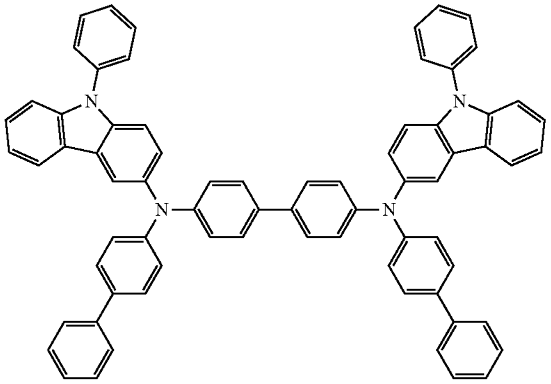
HT34
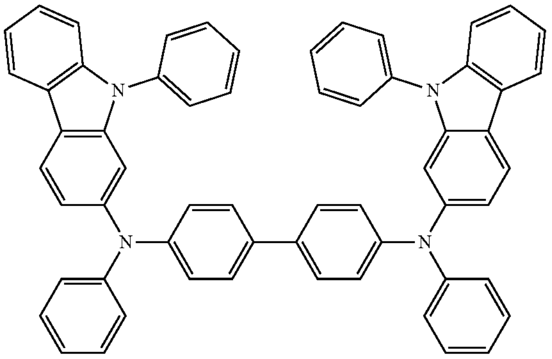
HT35
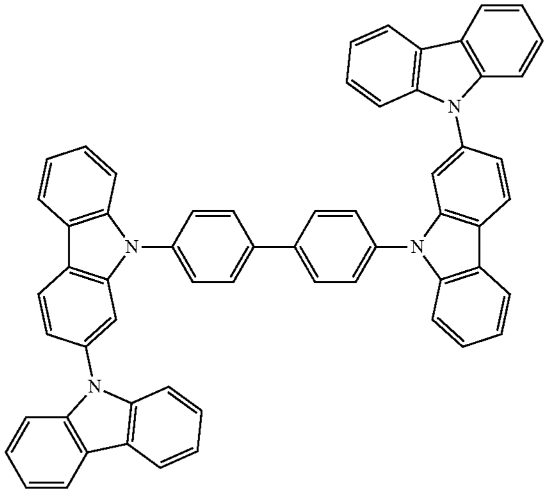

-continued
HT36
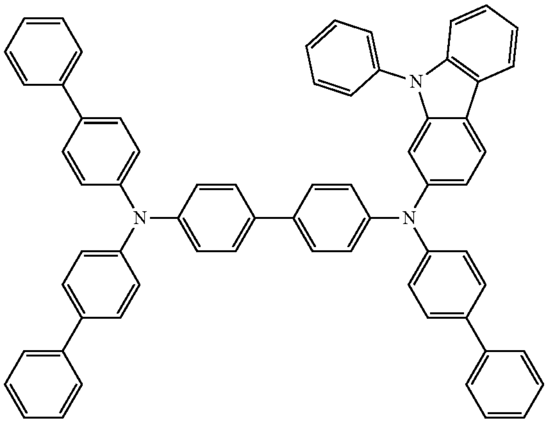
HT37
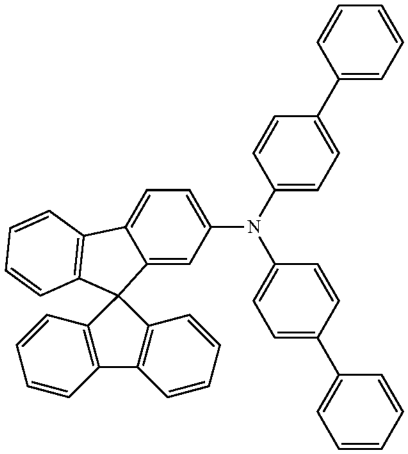
HT38
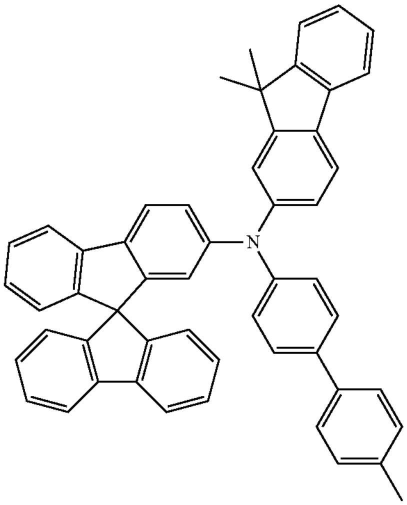
HT39
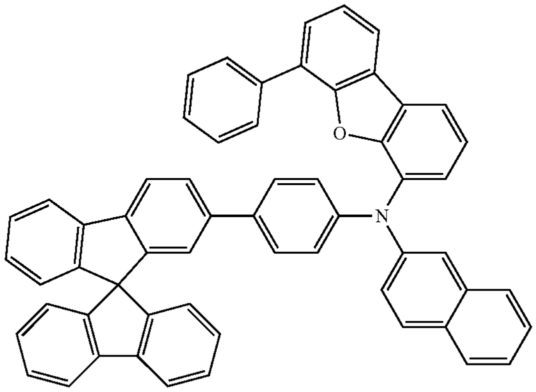
HT40
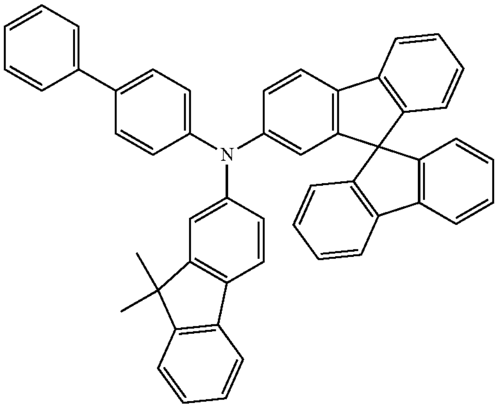
HT41
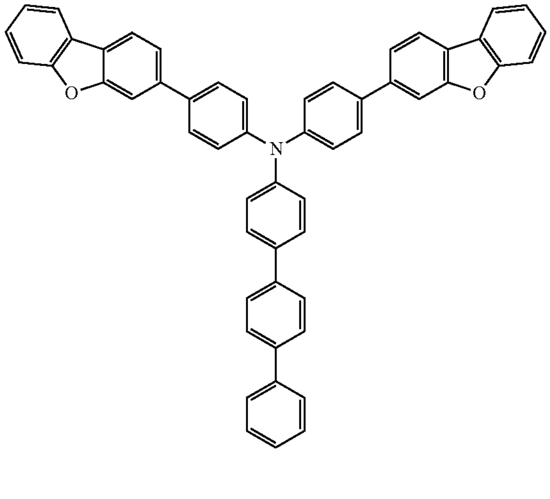

-continued
HT42
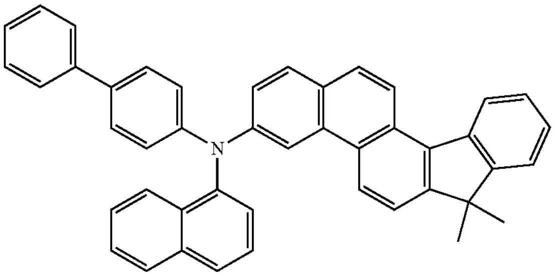
HT43
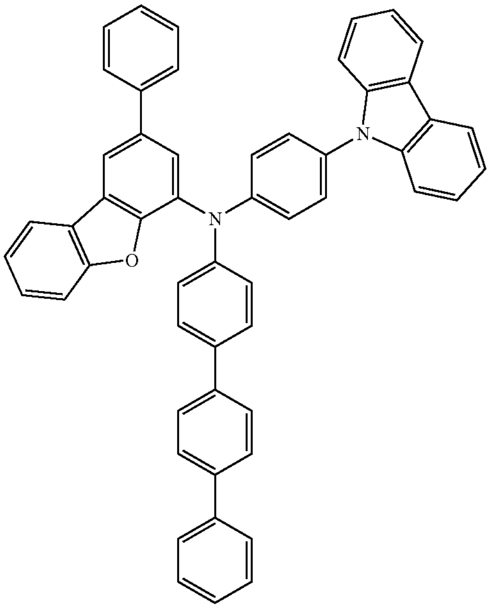
HT44
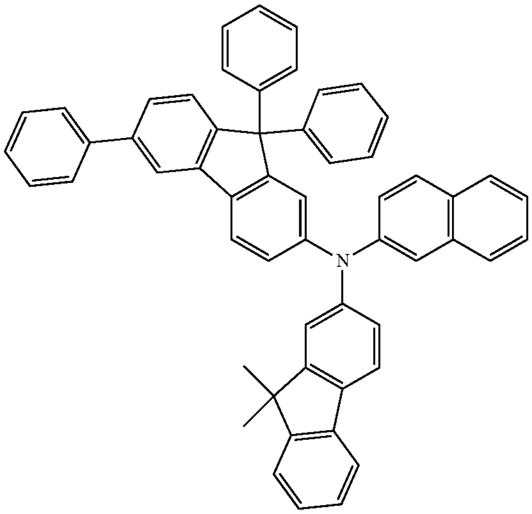
HT45
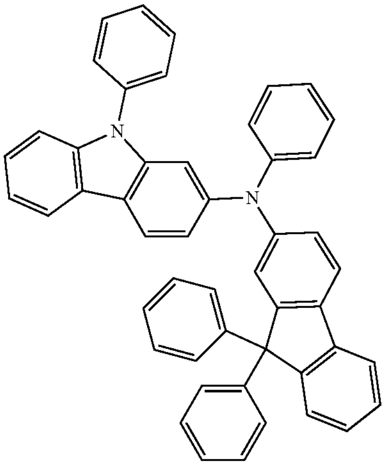
HT46
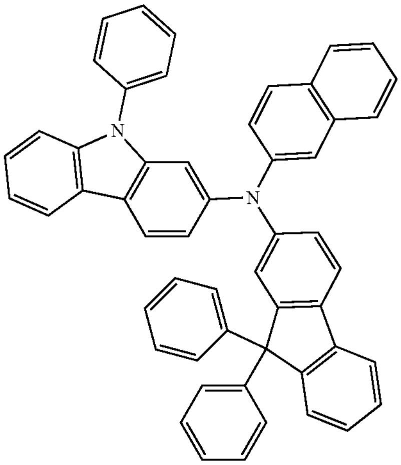
HT47
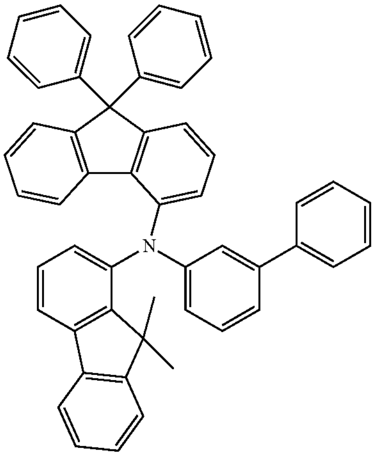

-continued
HT48
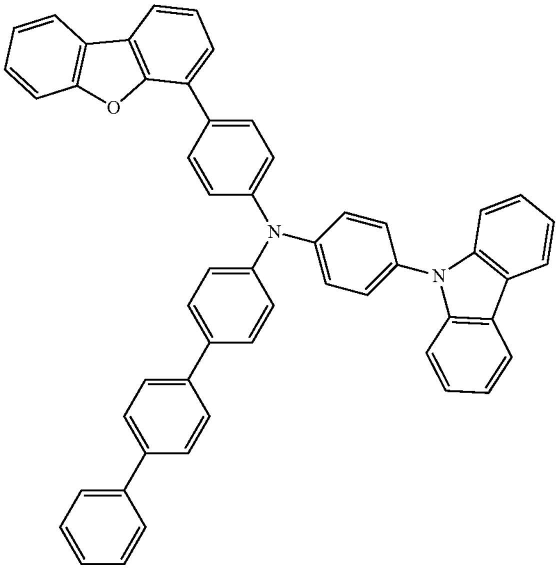
HT49
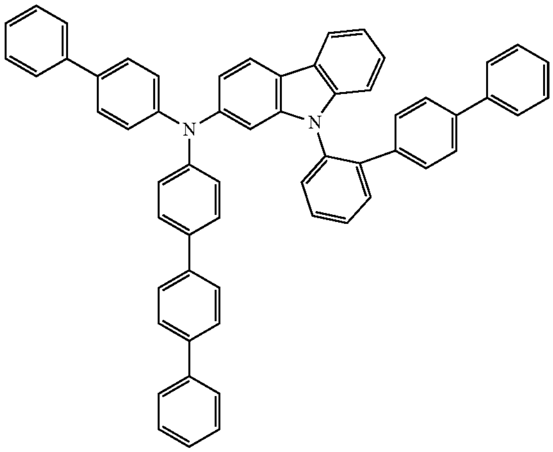
HT50
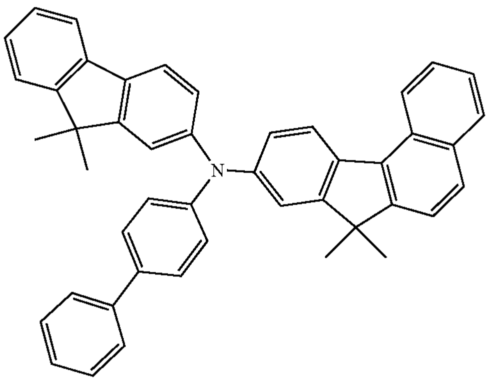
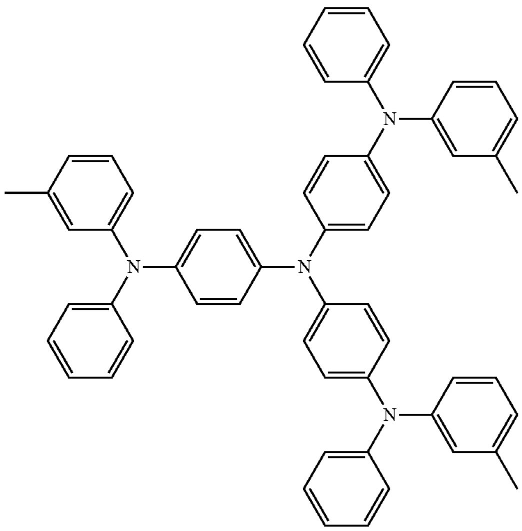
m-MTDATA -continued
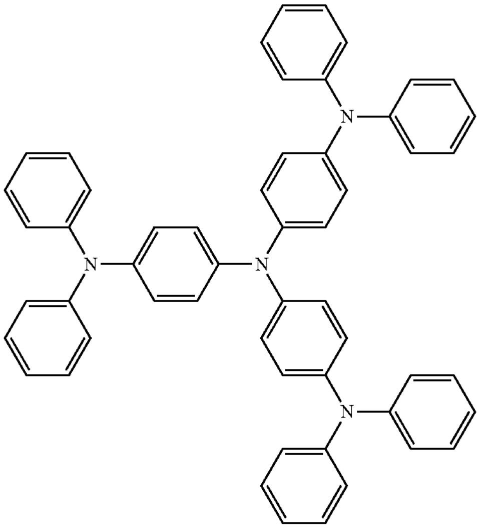
TDATA
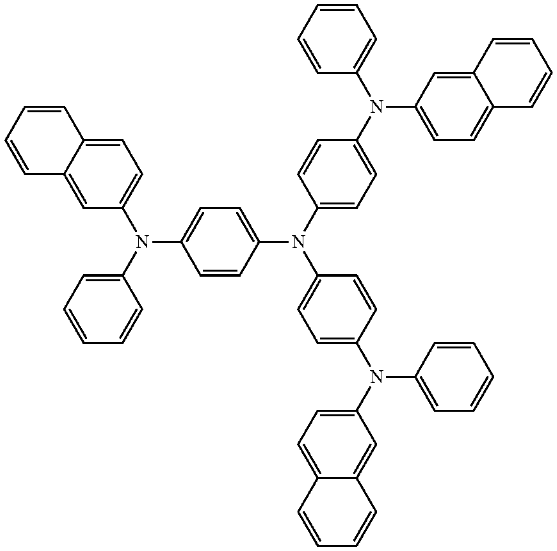
2-TNATA
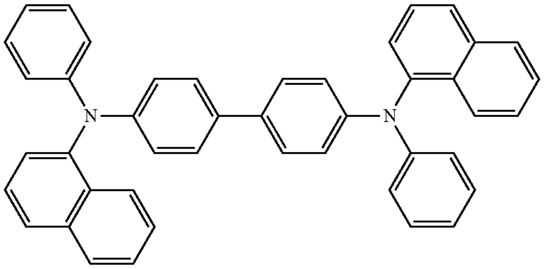
NPB
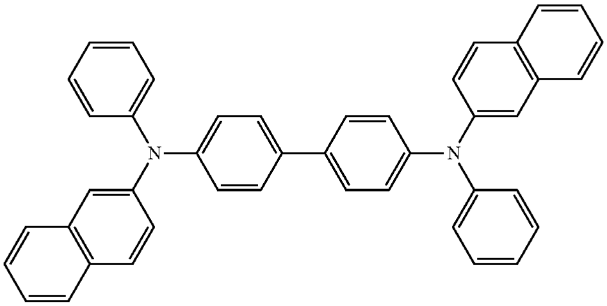
β-NPB
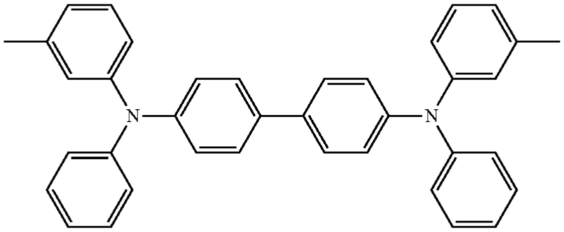
TPD
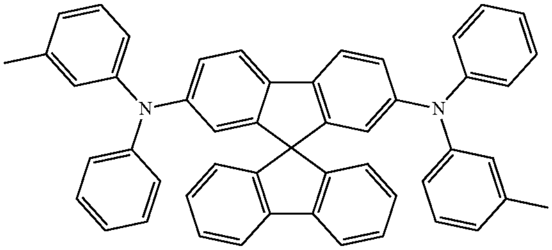
Spiro-TPD
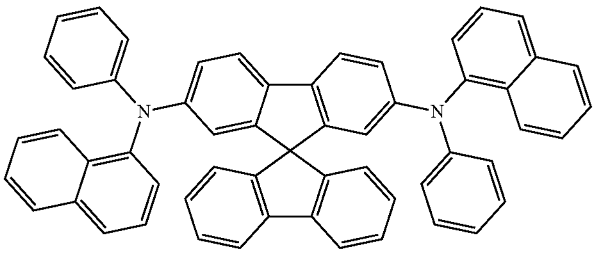
Spiro-NPB
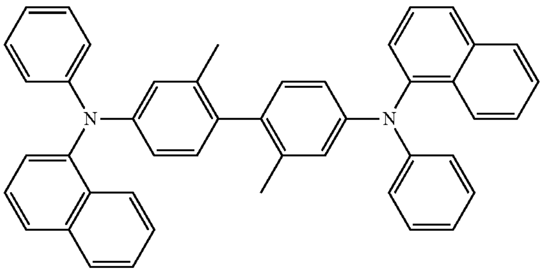
methylated-NPB -continued

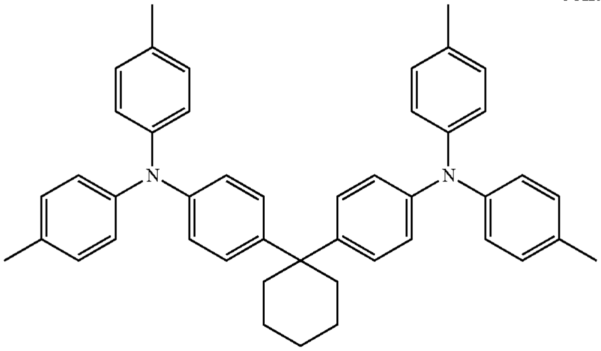

TAPC

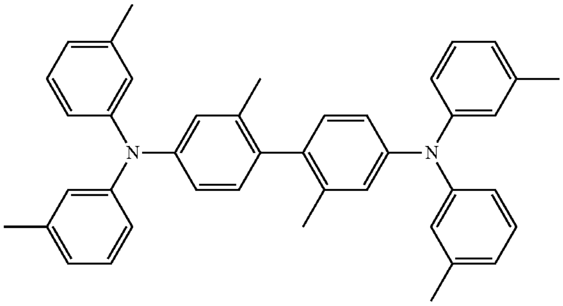

HMTPD

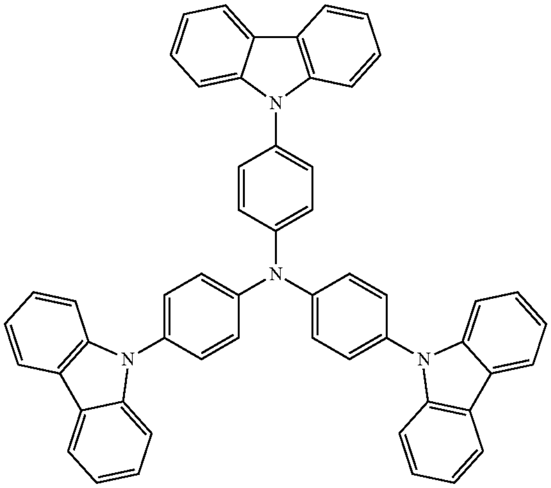

TCTA

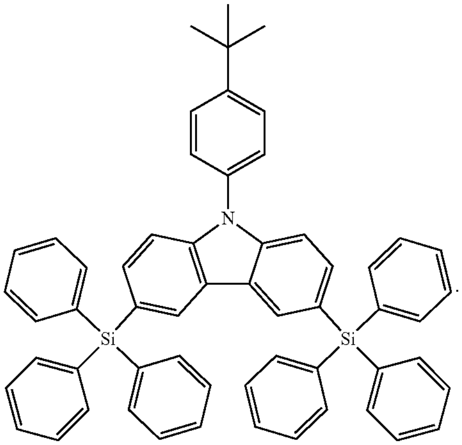

CzSi

A thickness of the hole transport region may be in a range of about 50 Å to about 10,000 Å, for example, about 100 Å to about 4,000 Å. When the hole transport region includes a hole injection layer, a hole transport layer, or any combination thereof, a thickness of the hole injection layer may be in a range of about 100 Å to about 9,000 Å, for example, about 100 Å to about 1,000 Å, and a thickness of the hole transport layer may be in a range of about 50 Å to about 2,000 Å, for example, about 100 Å to about 1,500 Å. When the thicknesses of the hole transport region, the hole injection layer, and the hole transport layer are within these ranges, satisfactory hole-transporting characteristics may be obtained without a substantial increase in driving voltage.

The emission auxiliary layer may increase light-emission efficiency by compensating for an optical resonance distance according to the wavelength of light emitted by the emission layer, and the electron blocking layer may block or reduce the leakage of electrons from the emission layer to a hole transport region. Materials that may be included in the hole transport region may be included in the emission auxiliary layer and the electron blocking layer.

p-Dopant

The hole transport region may further include, in addition to these materials, a charge-generation material for the improvement of conductive properties. The charge-generation material may be uniformly or non-uniformly dispersed in the hole transport region (for example, in the form of a single layer consisting of a charge-generation material).

The charge-generation material may be, for example, a p-dopant.

In an embodiment, a LUMO energy level of the p-dopant may be about −3.5 eV or less.

In an embodiment, the p-dopant may include a quinone derivative, a cyano group-containing compound, a compound containing an element EL1 and an element EL2 (to be described in more detail below), or any combination thereof.

Examples of the quinone derivative may include TCNQ, F4-TCNQ, and/or the like.

Examples of the cyano group-containing compound may include HAT-CN, a compound represented by Formula 221, and/or the like.

Formula 221

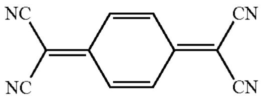

TCNQ

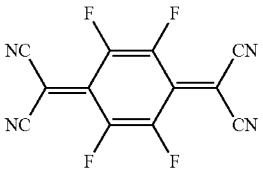

F4-TCNQ

-continued

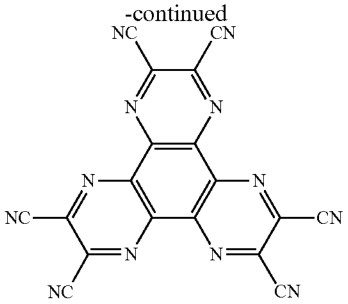

HAT-CN

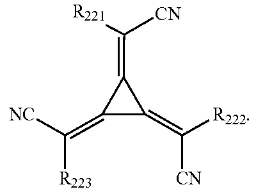

In Formula 221, $R_{221}$ to $R_{223}$ may each independently be a $C_3$-$C_{60}$ carbocyclic group that is unsubstituted or substituted with at least one $R_{10a}$ or a $C_1$-$C_{60}$ heterocyclic group that is unsubstituted or substituted with at least one $R_{10a}$, and at least one of $R_{221}$ to $R_{223}$ may each independently be a $C_3$-$C_{60}$ carbocyclic group or a $C_1$-$C_{60}$ heterocyclic group, each substituted with: a cyano group; —F; —Cl; —Br; —I; a $C_1$-$C_{20}$ alkyl group substituted with a cyano group, —F, —Cl, —Br, —I, or any combination thereof; or any combination thereof.

In the compound containing the element EL1 and the element EL2, the element EL1 may be a metal, a metalloid, or a combination thereof, and the element EL2 may be a non-metal, a metalloid, or a combination thereof.

Examples of the metal may include: an alkali metal (for example, lithium (Li), sodium (Na), potassium (K), rubidium (Rb), cesium (Cs), etc.); an alkaline earth metal (for example, beryllium (Be), magnesium (Mg), calcium (Ca), strontium (Sr), barium (Ba), etc.); a transition metal (for example, titanium (Ti), zirconium (Zr), hafnium (Hf), vanadium (V), niobium (Nb), tantalum (Ta), chromium (Cr), molybdenum (Mo), tungsten (W), manganese (Mn), technetium (Tc), rhenium (Re), iron (Fe), ruthenium (Ru), osmium (Os), cobalt (Co), rhodium (Rh), iridium (Ir), nickel (Ni), palladium (Pd), platinum (Pt), copper (Cu), silver (Ag), gold (Au), etc.); a post-transition metal (for example, zinc (Zn), indium (In), tin (Sn), etc.); and a lanthanide metal (for example, lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), lutetium (Lu), etc.).

Examples of the metalloid may include silicon (Si), antimony (Sb), and tellurium (Te).

Examples of the non-metal may include oxygen (O) and halogen (for example, F, Cl, Br, I, etc.).

In an embodiment, examples of the compound containing the element EL1 and the element EL2 may include a metal oxide, a metal halide (for example, a metal fluoride, a metal chloride, a metal bromide, or a metal iodide), a metalloid halide (for example, a metalloid fluoride, a metalloid chloride, a metalloid bromide, or a metalloid iodide), a metal telluride, or any combination thereof.

Examples of the metal oxide may include tungsten oxide (for example, WO, $W_2O_3$, $WO_2$, $WO_3$, $W_2O_5$, etc.), vanadium oxide (for example, VO, $V_2O_3$, $VO_2$, $V_2O_5$, etc.), molybdenum oxide (MoO, $Mo_2O_3$, $MoO_2$, $MoO_3$, $Mo_2O_5$, etc.), and rhenium oxide (for example, $ReO_3$, etc.).

Examples of the metal halide may include an alkali metal halide, an alkaline earth metal halide, a transition metal halide, a post-transition metal halide, and a lanthanide metal halide.

Examples of the alkali metal halide may include LiF, NaF, KF, RbF, CsF, LiCl, NaCl, KCl, RbCl, CsCl, LiBr, NaBr, KBr, RbBr, CsBr, LiI, NaI, KI, RbI, and CsI.

Examples of the alkaline earth metal halide may include $BeF_2$, $MgF_2$, $CaF_2$, $SrF_2$, $BaF_2$, $BeCl_2$, $MgCl_2$, $CaCl_2$, $SrCl_2$, $BaCl_2$, $BeBr_2$, $MgBr_2$, $CaBr_2$, $SrBr_2$, $BaBr_2$, $BeI_2$, $MgI_2$, $CaI_2$, $SrI_2$, and $BaI_2$.

Examples of the transition metal halide may include titanium halide (for example, $TiF_4$, $TiCl_4$, $TiBr_4$, $TiI_4$, etc.), zirconium halide (for example, $ZrF_4$, $ZrCl_4$, $ZrBr_4$, $ZrI_4$, etc.), hafnium halide (for example, $HfF_4$, $HfCl_4$, $HfBr_4$, $HfI_4$, etc.), vanadium halide (for example, $VF_3$, $VCl_3$, $VBr_3$, $VI_3$, etc.), niobium halide (for example, $NbF_3$, $NbCl_3$, $NbBr_3$, $NbI_3$, etc.), tantalum halide (for example, $TaF_3$, $TaCl_3$, $TaBr_3$, $TaI_3$, etc.), chromium halide (for example, $CrF_3$, $CrCl_3$, $CrBr_3$, $CrI_3$, etc.), molybdenum halide (for example, $MoF_3$, $MoCl_3$, $MoBr_3$, $MoI_3$, etc.), tungsten halide (for example, $WF_3$, $WCl_3$, $WBr_3$, $WI_3$, etc.), manganese halide (for example, $MnF_2$, $MnCl_2$, $MnBr_2$, $MnI_2$, etc.), technetium halide (for example, $TcF_2$, $TcCl_2$, $TcBr_2$, $TcI_2$, etc.), rhenium halide (for example, $ReF_2$, $ReCl_2$, $ReBr_2$, $ReI_2$, etc.), iron halide (for example, $FeF_2$, $FeCl_2$, $FeBr_2$, $FeI_2$, etc.), ruthenium halide (for example, $RuF_2$, $RuCl_2$, $RuBr_2$, $RuI_2$, etc.), osmium halide (for example, $OsF_2$, $OsCl_2$, $OsBr_2$, $OsI_2$, etc.), cobalt halide (for example, $CoF_2$, $COCl_2$, $CoBr_2$, $CoI_2$, etc.), rhodium halide (for example, $RhF_2$, $RhCl_2$, $RhBr_2$, $RhI_2$, etc.), iridium halide (for example, $IrF_2$, $IrCl_2$, $IrBr_2$, $IrI_2$, etc.), nickel halide (for example, $NiF_2$, $NiCl_2$, $NiBr_2$, $NiI_2$, etc.), palladium halide (for example, $PdF_2$, $PdCl_2$, $PdBr_2$, $PdI_2$, etc.), platinum halide (for example, $PtF_2$, $PtCl_2$, $PtBr_2$, $PtI_2$, etc.), copper halide (for example, CuF, CuCl, CuBr, CuI, etc.), silver halide (for example, AgF, AgCl, AgBr, AgI, etc.), and gold halide (for example, AuF, AuCl, AuBr, AuI, etc.).

Examples of the post-transition metal halide may include zinc halide (for example, $ZnF_2$, $ZnCl_2$, $ZnBr_2$, $ZnI_2$, etc.), indium halide (for example, $InI_3$, etc.), and tin halide (for example, $SnI_2$, etc.).

Examples of the lanthanide metal halide may include YbF, $YbF_2$, $YbF_3$, $SmF_3$, YbCl, $YbCl_2$, $YbCl_3$, $SmCl_3$, YbBr, $YbBr_2$, $YbBr_3$, $SmBr_3$, YbI, $YbI_2$, $YbI_3$, and $SmI_3$.

Examples of the metalloid halide may include antimony halide (for example, $SbCl_5$, etc.).

Examples of the metal telluride may include an alkali metal telluride (for example, $Li_2Te$, $Na_2Te$, $K_2Te$, $Rb_2Te$, $Cs_2Te$, etc.), an alkaline earth metal telluride (for example, BeTe, MgTe, CaTe, SrTe, BaTe, etc.), a transition metal telluride (for example, $TiTe_2$, $ZrTe_2$, $HfTe_2$, $V_2Te_3$, $Nb_2Te_3$, $Ta_2Te_3$, $Cr_2Te_3$, $Mo_2Te_3$, $W_2Te_3$, MnTe, TcTe, ReTe, FeTe, RuTe, OsTe, CoTe, RhTe, IrTe, NiTe, PdTe, PtTe, $Cu_2Te$, CuTe, $Ag_2Te$, AgTe, $Au_2Te$, etc.), a post-transition metal telluride (for example, ZnTe, etc.), and a lanthanide metal telluride (for example, LaTe, CeTe, PrTe, NdTe, PmTe, EuTe, GdTe, TbTe, DyTe, HoTe, ErTe, TmTe, YbTe, LuTe, etc.).

Emission Layer in Interlayer 130

When the light-emitting device 10 is a full-color light-emitting device, the emission layer may be patterned into a red emission layer, a green emission layer, and/or a blue emission layer, according to a sub-pixel. In an embodiment, the emission layer may have a stacked structure of two or more layers of a red emission layer, a green emission layer, and a blue emission layer, in which the two or more layers contact each other or are separated from each other. In one or more embodiments, the emission layer may include two or more materials of a red light-emitting material, a green light-emitting material, and a blue light-emitting material, in which the two or more materials are mixed with each other in a single layer to emit white light. In an embodiment, the emission layer may be to emit blue light.

In an embodiment, a wavelength of the blue light may be in a range of about 440 nm to about 480 nm.

In an embodiment, the emission layer may include a host and a dopant, and the host may include two different hosts represented by Formula 3.

The dopant may include the organometallic compound represented by Formula 5.

The phosphorescent dopant or the fluorescent dopant that may be included in the emission layer may be understood by referring to the descriptions of the phosphorescent dopant or the fluorescent dopant provided herein.

In an embodiment, the emission layer may include a quantum dot.

In an embodiment, the emission layer may include a delayed fluorescence material. The delayed fluorescence material may act (e.g., serve) as a host or a dopant in the emission layer.

A thickness of the emission layer may be in a range of about 100 Å to about 1,000 Å, for example, about 200 Å to about 600 Å. When the thickness of the emission layer is within these ranges, excellent or suitable light-emission characteristics may be obtained without a substantial increase in driving voltage.

Host

The host may include a carbazole-containing compound, an anthracene-containing compound, a triazine-containing compound, or any combination thereof. The host may further include, for example, a carbazole-containing compound and a triazine-containing compound.

In an embodiment, the host may further include a compound represented by Formula 301:

$$[Ar_{301}]_{xb11}-[(L_{301})_{xb1}-R_{301}]_{xb21} \quad \text{Formula 301}$$

wherein, in Formula 301, $Ar_{301}$ and $L_{301}$ may each independently be a $C_3$-$C_{60}$ carbocyclic group that is unsubstituted or substituted with at least one $R_{10a}$ or a $C_1$-$C_{60}$ heterocyclic group that is unsubstituted or substituted with at least one $R_{10a}$, xb11 may be 1, 2, or 3, xb1 may be an integer from 0 to 5, $R_{301}$ may be hydrogen, deuterium, —F, —Cl, —Br, —I, a hydroxyl group, a cyano group, a nitro group, a $C_1$-$C_{60}$ alkyl group that is unsubstituted or substituted with at least one $R_{10a}$, a $C_2$-$C_{60}$ alkenyl group that is unsubstituted or substituted with at least one $R_{10a}$, a $C_2$-$C_{60}$ alkynyl group that is unsubstituted or substituted with at least one $R_{10a}$, a $C_1$-$C_{60}$ alkoxy group that is unsubstituted or substituted with at least one $R_{10a}$, a $C_3$-$C_{60}$ carbocyclic group that is unsubstituted or substituted with at least one $R_{10a}$, a $C_1$-$C_{60}$ heterocyclic group that is unsubstituted or substituted with at least one $R_{10a}$, —$Si(Q_{301})(Q_{302})(Q_{303})$, —$N(Q_{301})(Q_{302})$, —$B(Q_{301})(Q_{302})$, —$C(=O)(Q_{301})$, —$S(=O)_2(Q_{301})$, or —$P(=O)(Q_{301})(Q_{302})$, xb21 may be an integer from 1 to 5, and $Q_{301}$ to $Q_{303}$ may each independently be the same as described in connection with $Q_1$.

In an embodiment, when xb11 in Formula 301 is 2 or more, two or more of $Ar_{301}$(s) may be linked to each other via a single bond.

In an embodiment, the host may further include a compound represented by Formula 301-1, a compound represented by Formula 301-2, or any combination thereof:

Formula 301-1

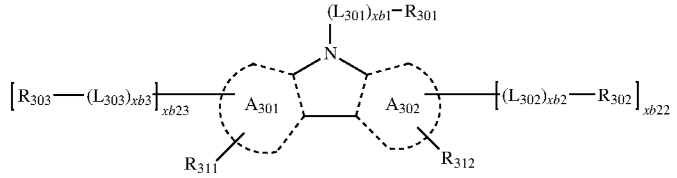

Formula 301-2

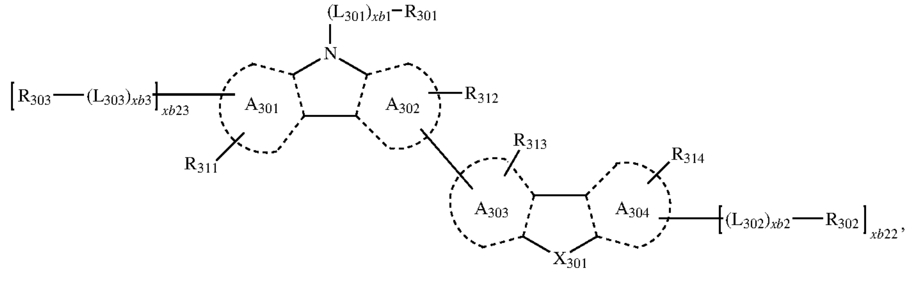

wherein, in Formulae 301-1 and 301-2, ring $A_{301}$ to ring $A_{304}$ may each independently be a $C_3$-$C_{60}$ carbocyclic group that is unsubstituted or substituted with at least one $R_{10a}$ or a $C_1$-$C_{60}$ heterocyclic group that is unsubstituted or substituted with at least one $R_{10a}$, $X_{301}$ may be O, S, N-$[(L_{304})_{xb4}$-$R_{304}]$, $C(R_{304})(R_{305})$, or $Si(R_{304})(R_{305})$, xb22 and xb23 may each independently be 0, 1, or 2, $L_{301}$, xb1, and $R_{301}$ may each independently be the same as respectively described in the present specification, $L_{302}$ to $L_{304}$ may each independently be the same as described in connection with $L_{301}$, xb2 to xb4 may each independently be the same as described in connection with xb1, and $R_{302}$ to $R_{305}$ and $R_{311}$ to $R_{314}$ may each independently be the same as described in connection with $R_{301}$.

In an embodiment, the host may further include an alkaline earth metal complex, a post-transition metal complex, or any combination thereof. In an embodiment, the host may further include a Be complex (for example, Compound H55), an Mg complex, a Zn complex, or any combination thereof.

In an embodiment, the host may further include at least one of Compounds H1 to H131, 9,10-di(2-naphthyl)anthracene (DNA), 2-methyl-9,10-bis(naphthalen-2-yl)anthracene (MADN), 9,10-di-(2-naphthyl)-2-t-butyl-anthracene (TBADN), 4,4'-bis(N-carbazolyl)-1,1'-biphenyl (CBP), 1,3-di-9-carbazolylbenzene (mCP), 1,3,5-tri(carbazol-9-yl)benzene (TCP), or any combination thereof:

H1

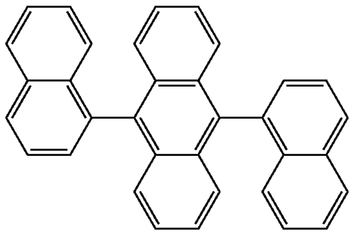

H2

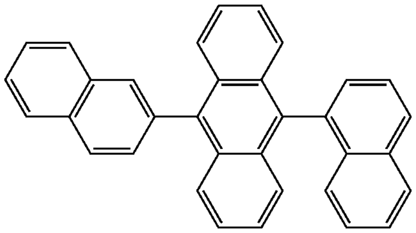

H3

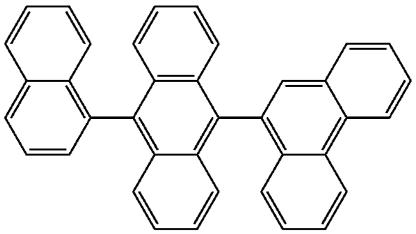

H4

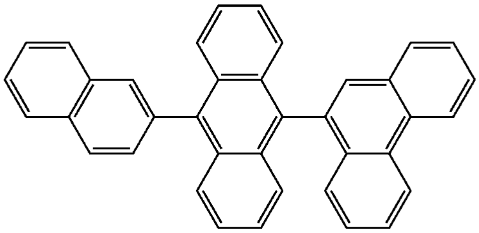

-continued

H5

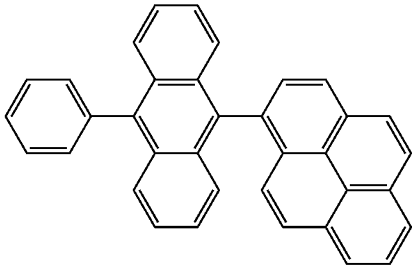

H6

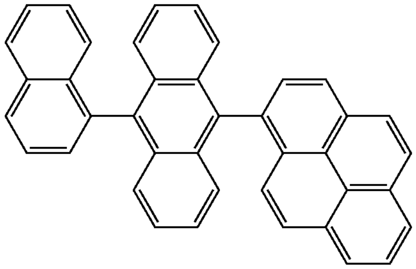

H7

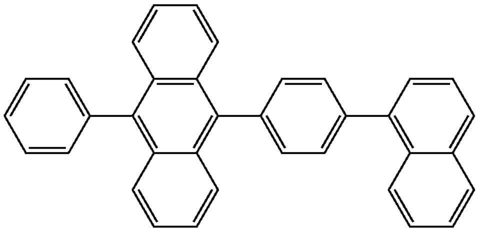

H8

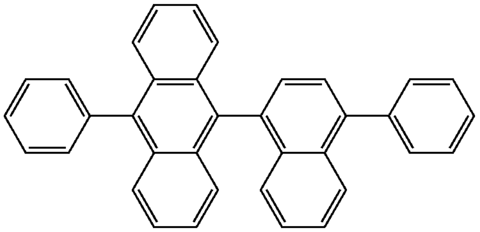

H9

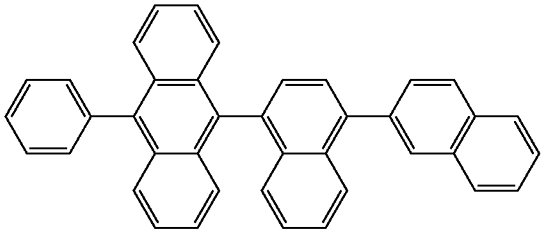

H10

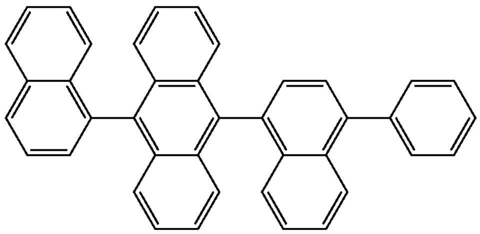

-continued
H11
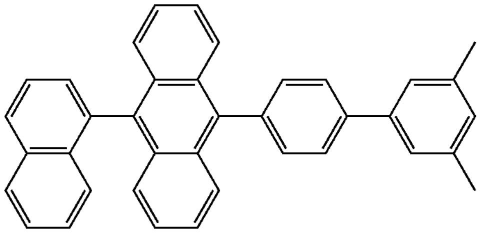
H12
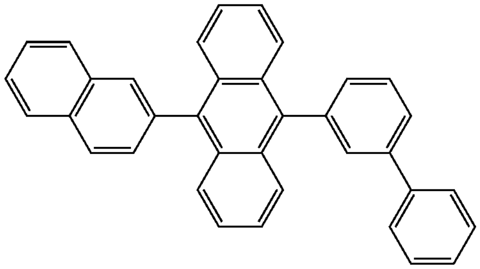
H13
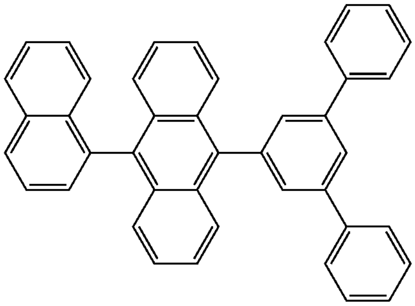
H14
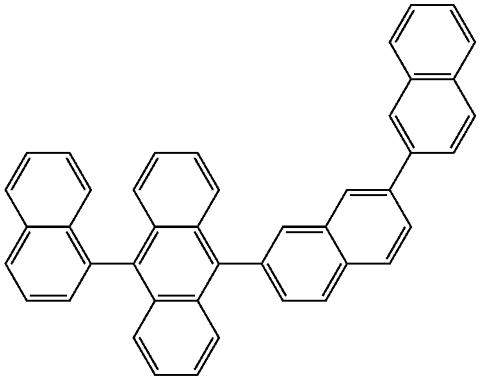
H15
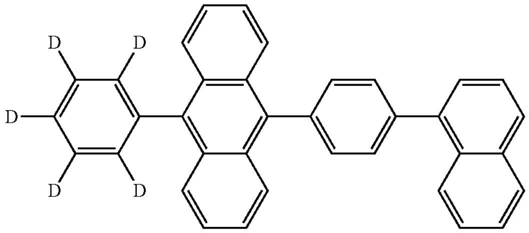
-continued
H16
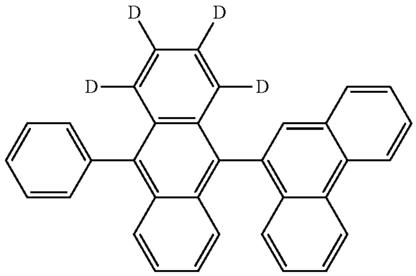
H17
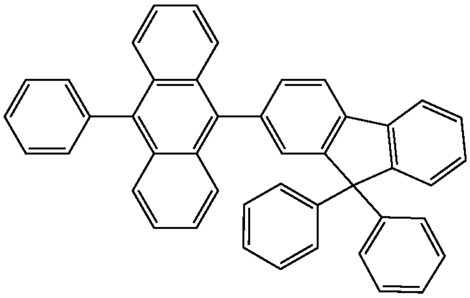
H18
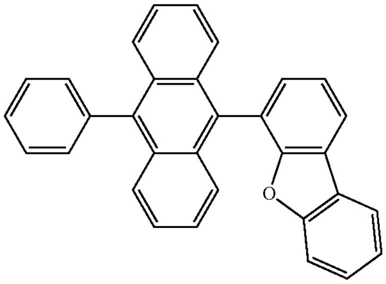
H19
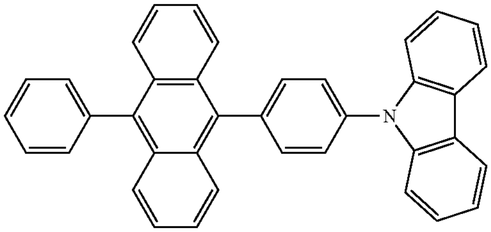
H20
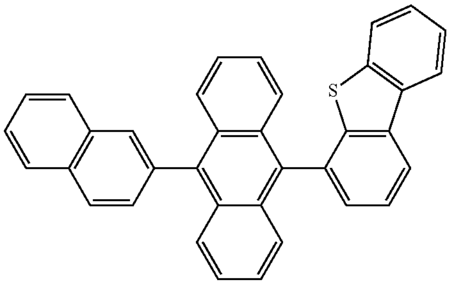

-continued
H21
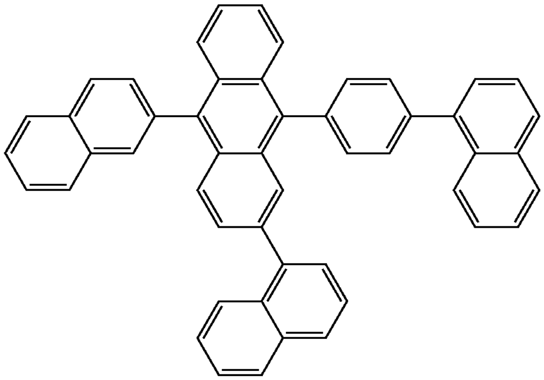
H22
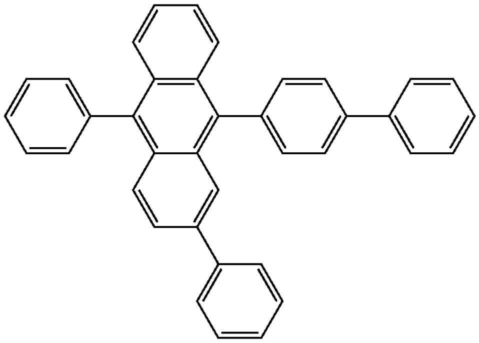
H23
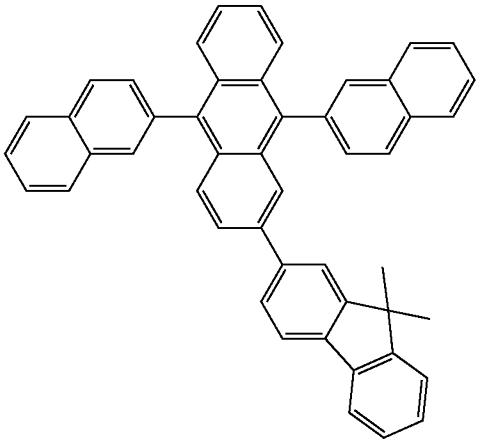
H24
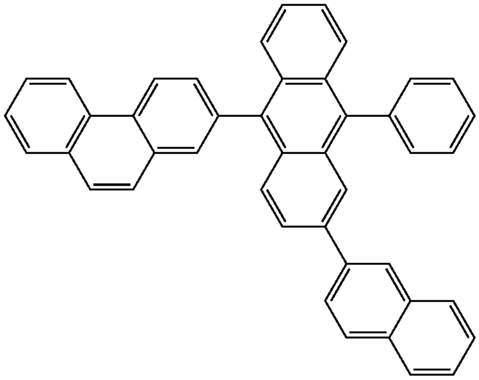
-continued
H25
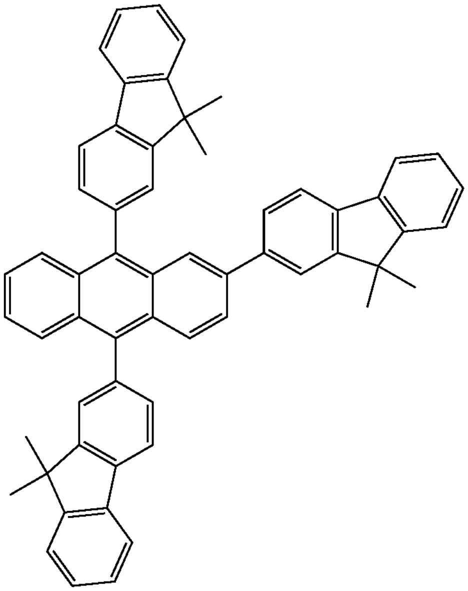
H26
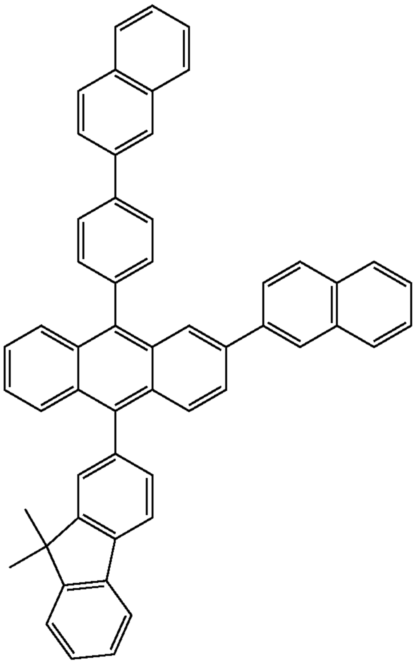

-continued
H27
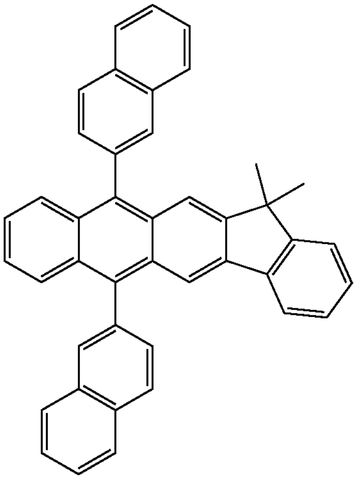
H28
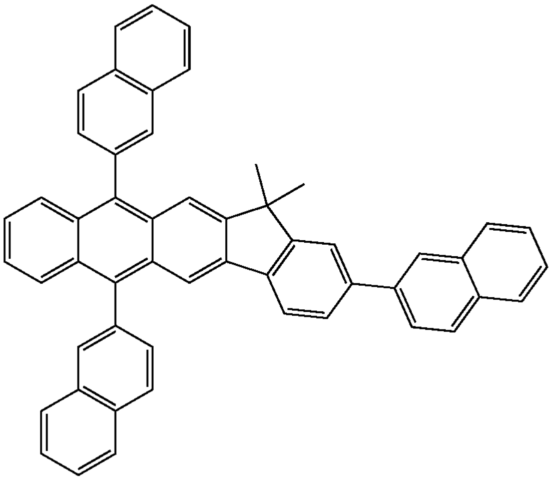
H29
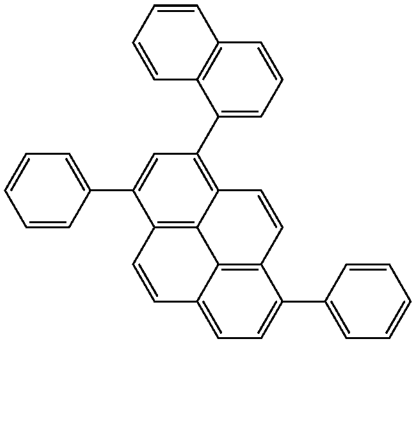
-continued
H30
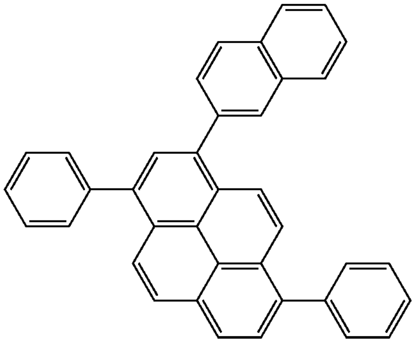
H31
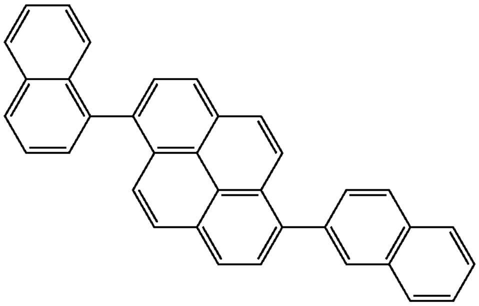
H32
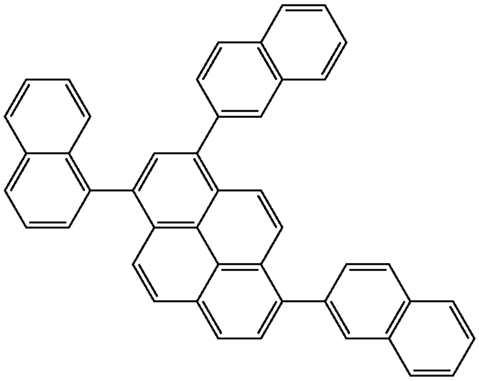
H33
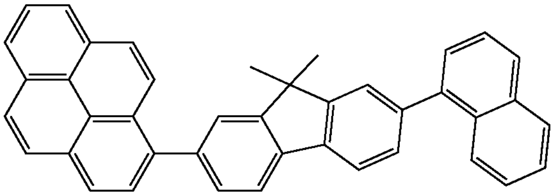
H34
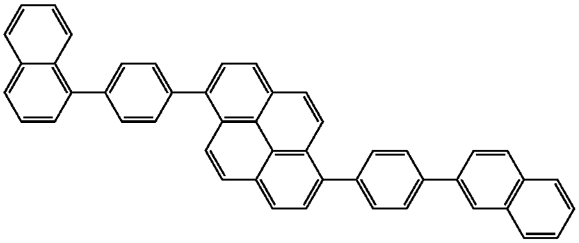

H35
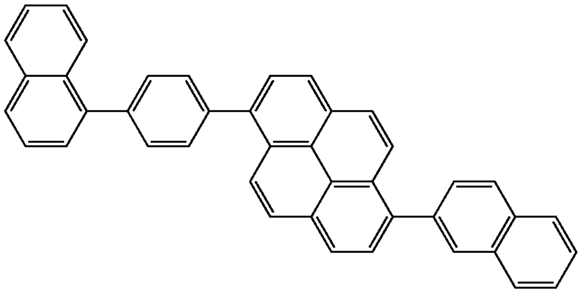
H36
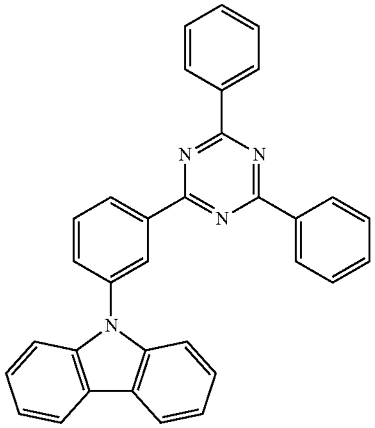
H37
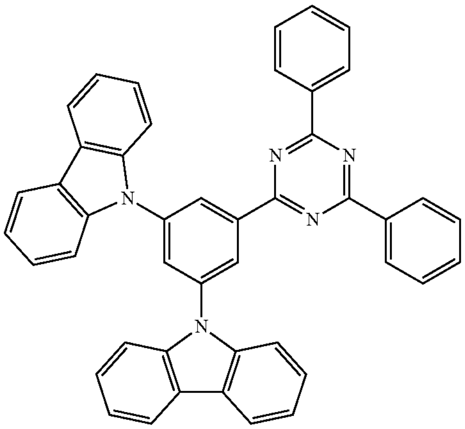
H38
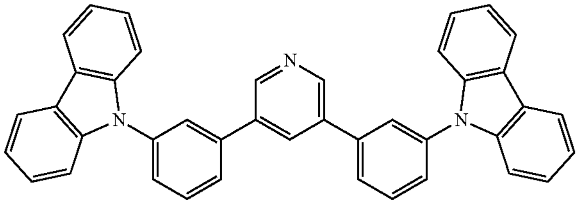
H39
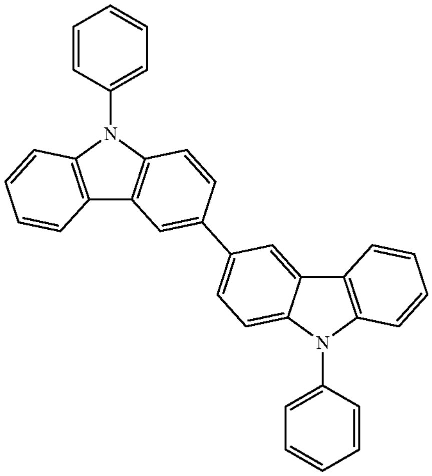
H40
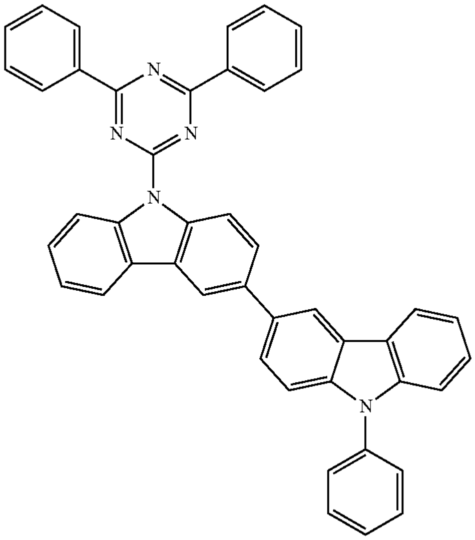
H41
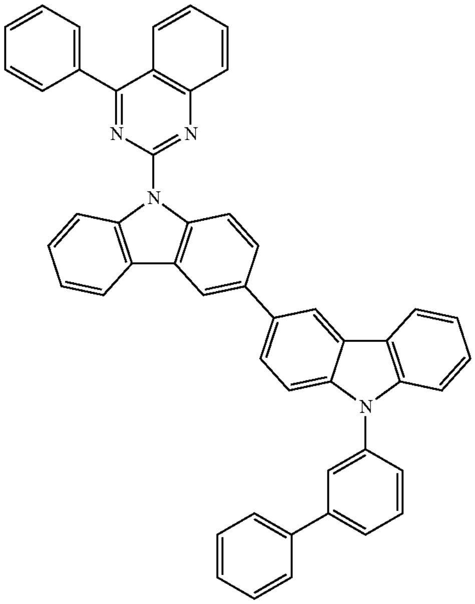

-continued
H42
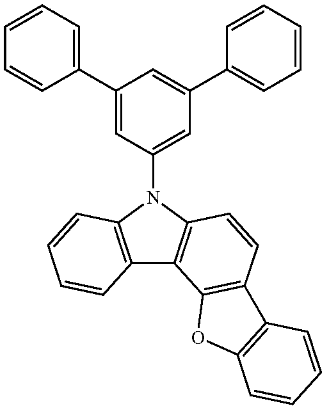
H43
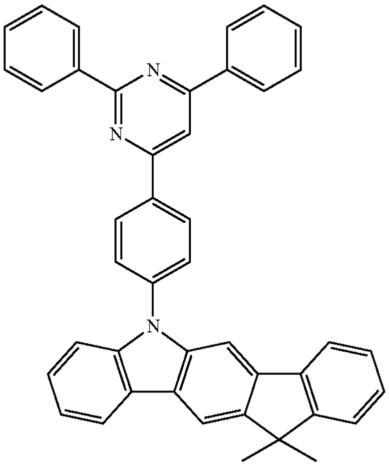
H44
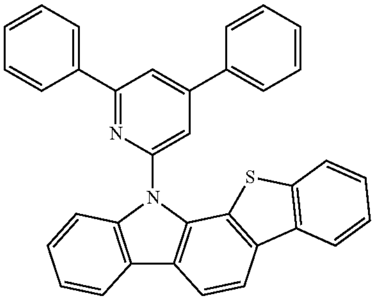
H45
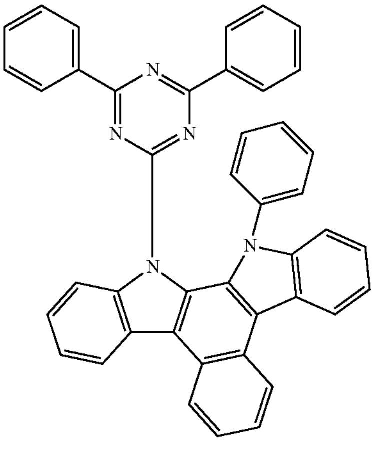
-continued
H46
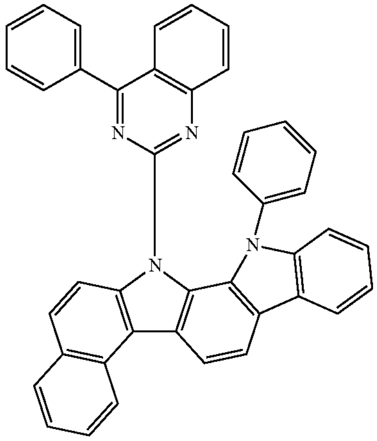
H47
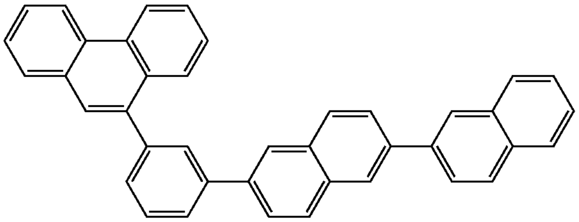
H48
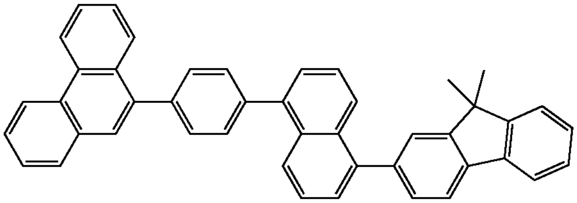
H49
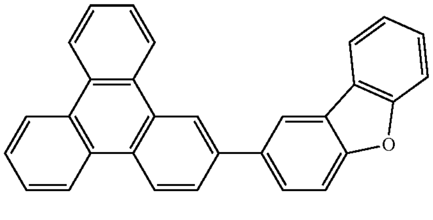
H50
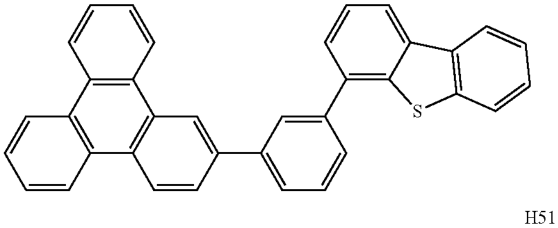
H51
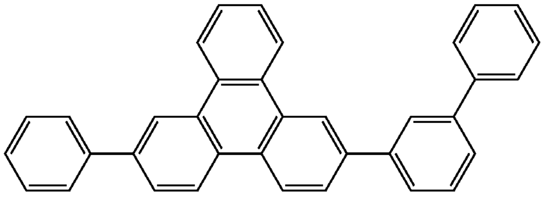

-continued
H52
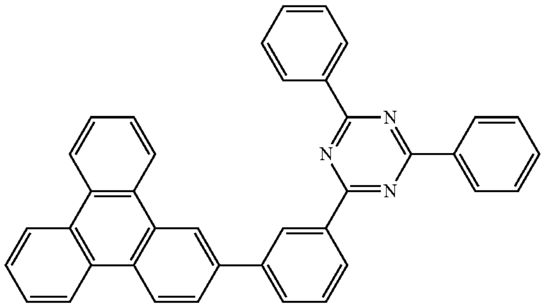
H53
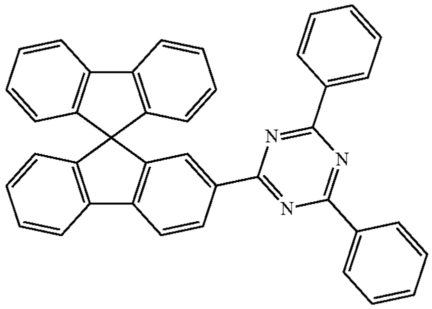
H54
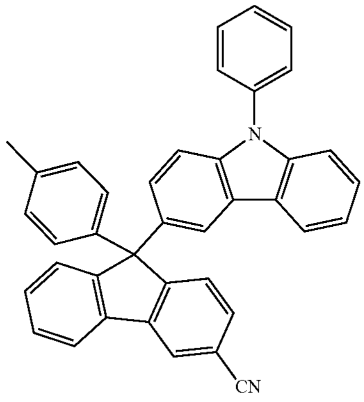
H55
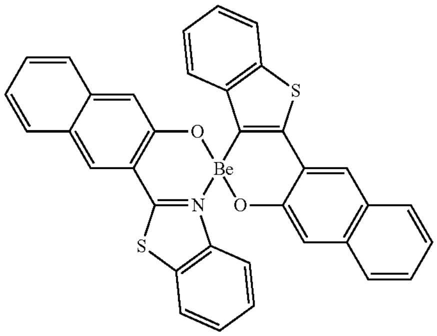
-continued
H56
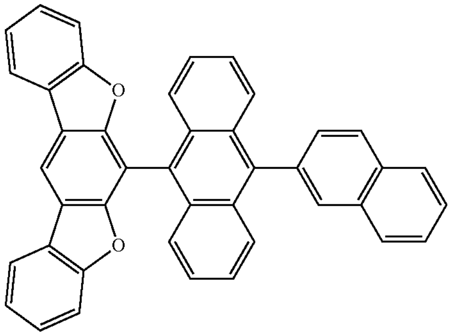
H57
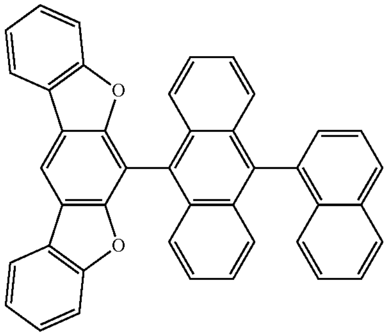
H58
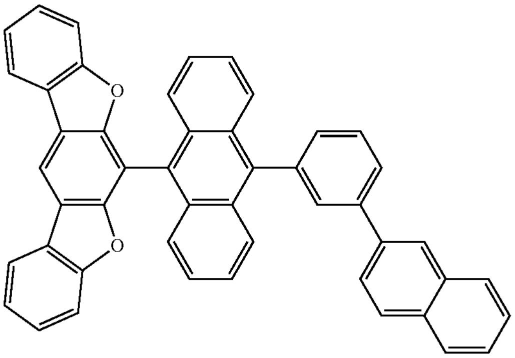
H59
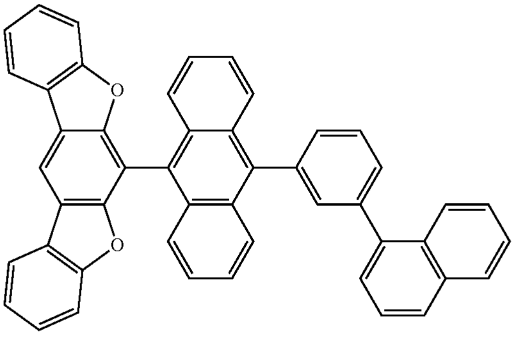

-continued
H60
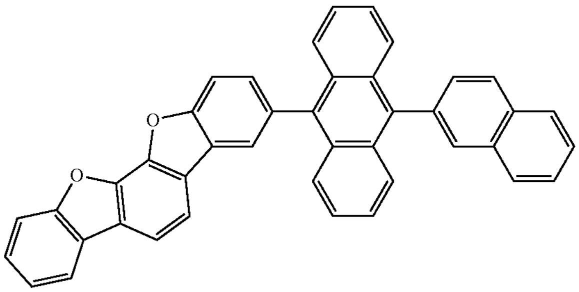
H61
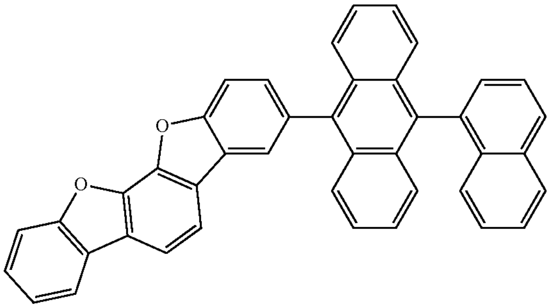
H62
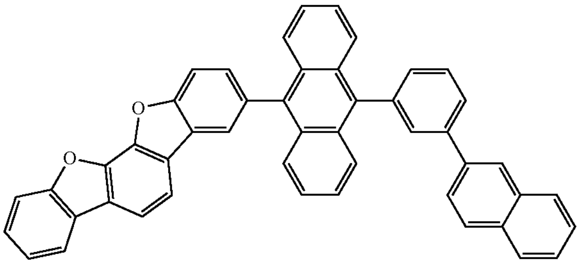
H63
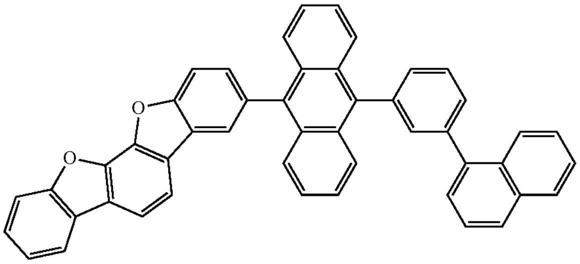
H64
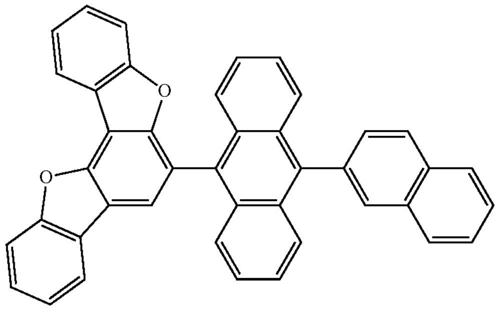
-continued
H65
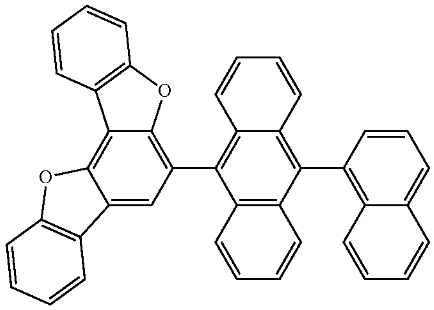
H66
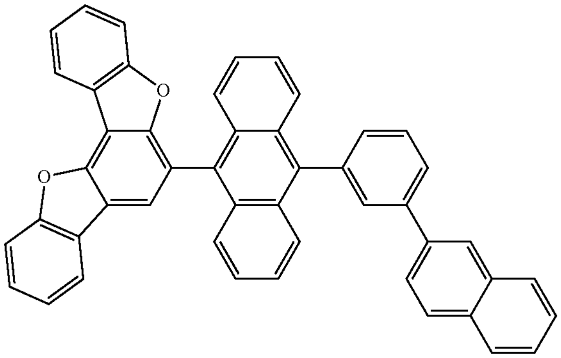
H67
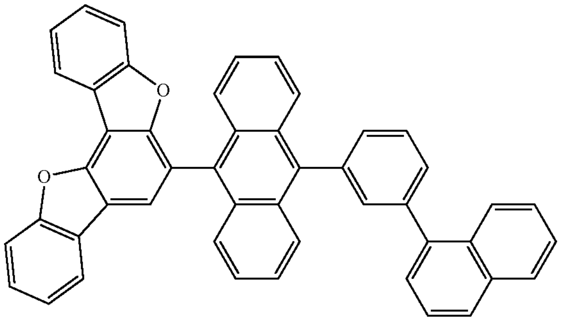
H68
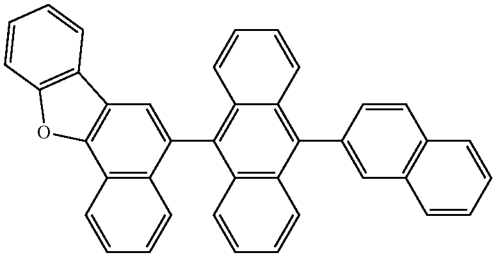
H69
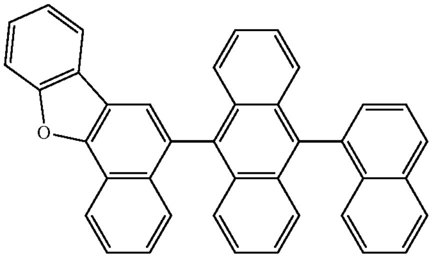

-continued
H70
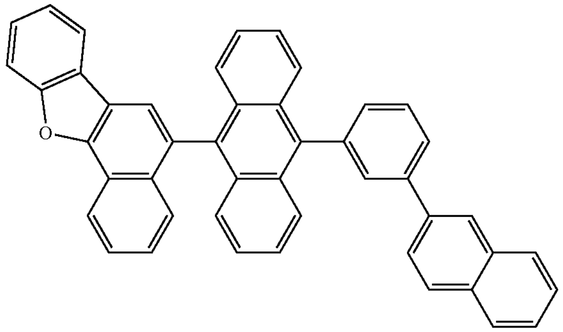
H71
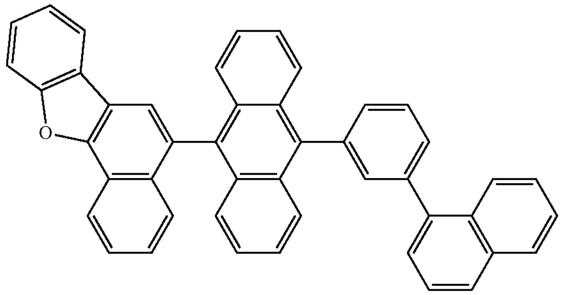
H72
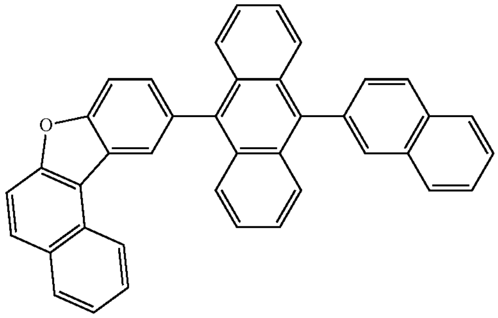
H73
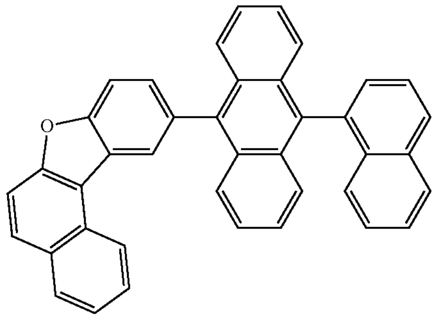
-continued
H74
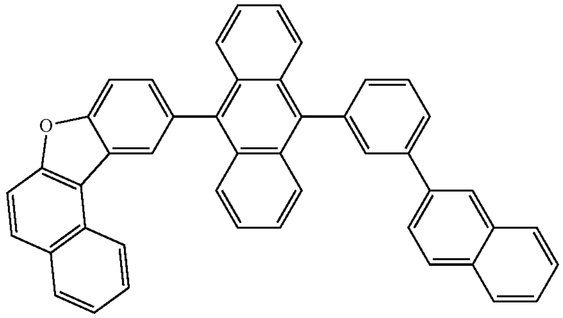
H75
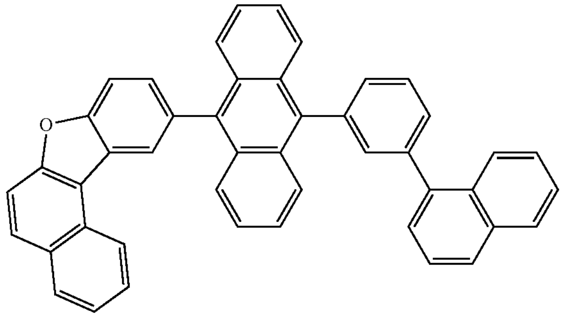
H76
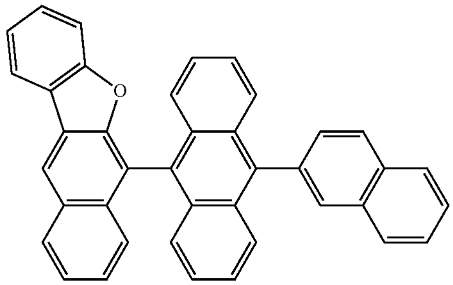
H77
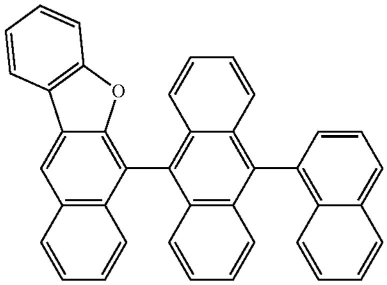
H78
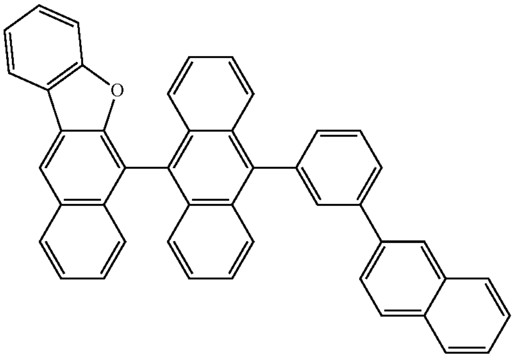

-continued
H79
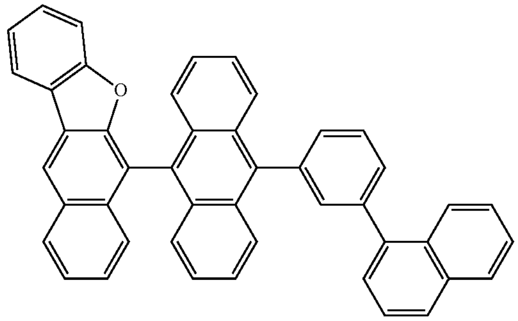
H80
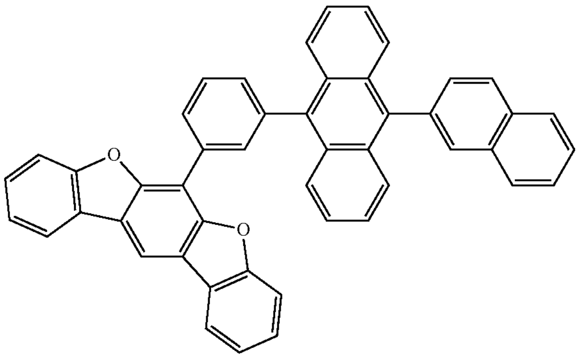
H81
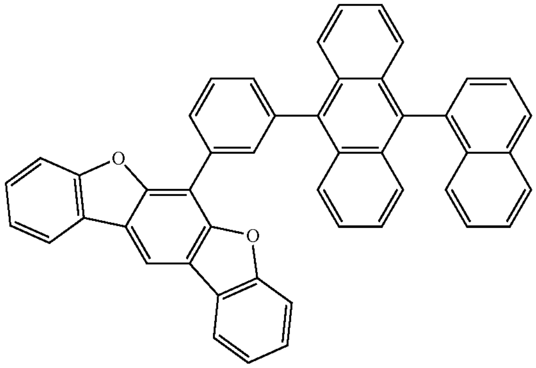
H82
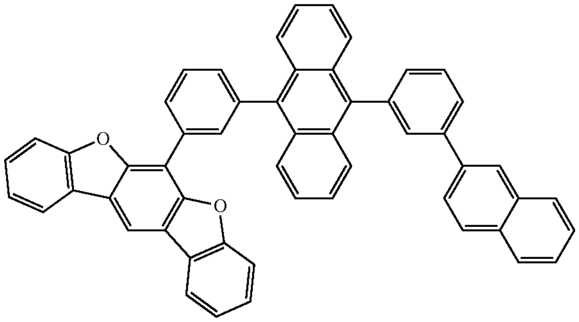
-continued
H83
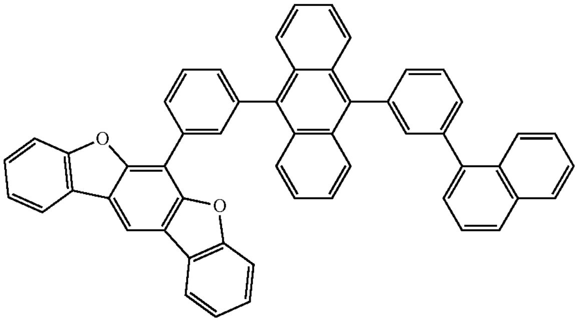
H84
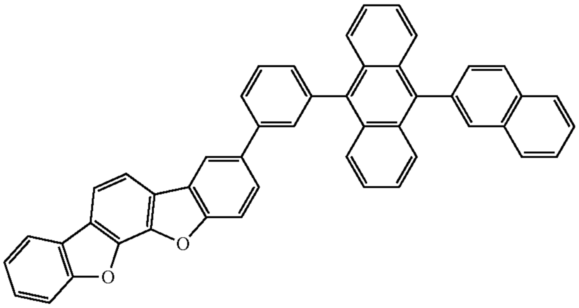
H85
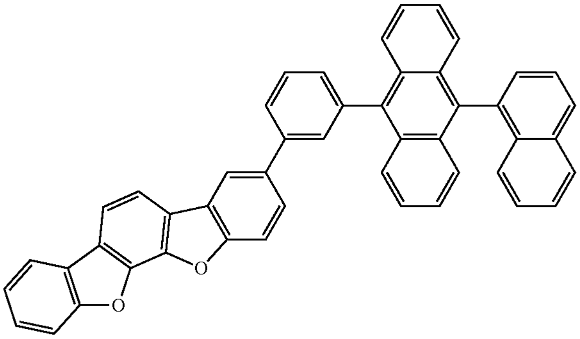
H86
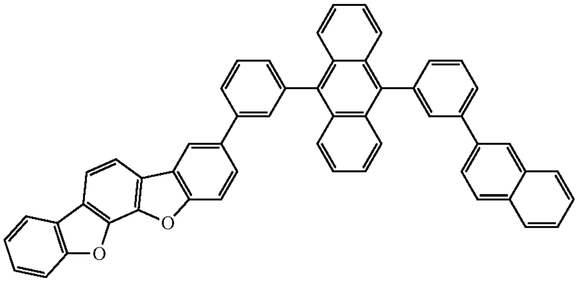

-continued
H87
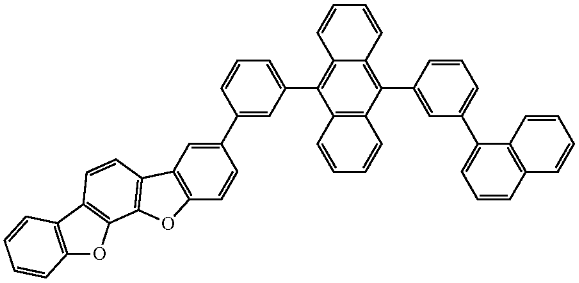
H88
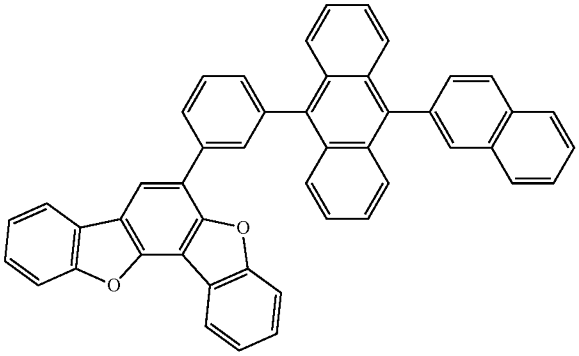
H89
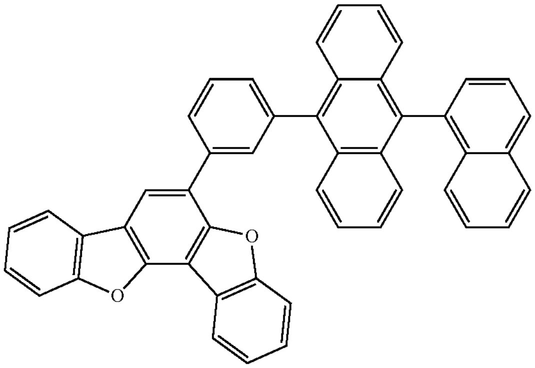
H90
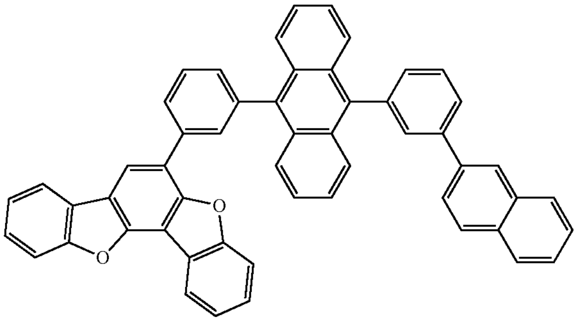
-continued
H91
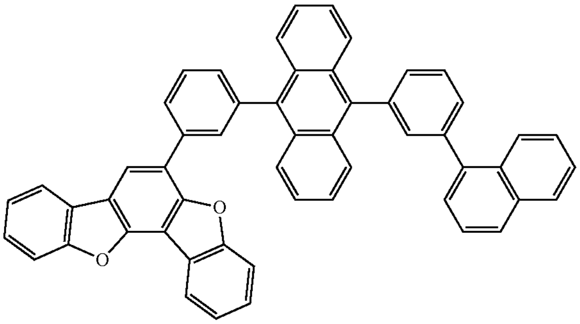
H92
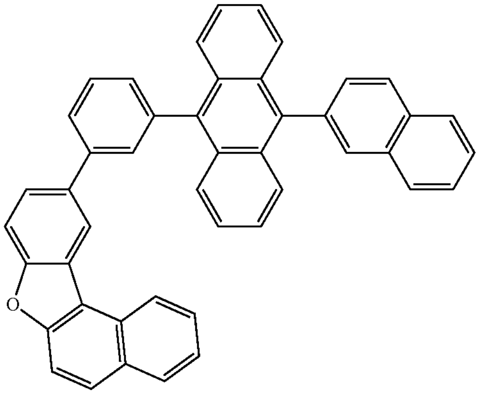
H93
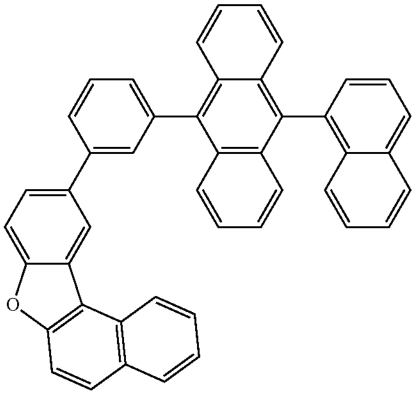
H94
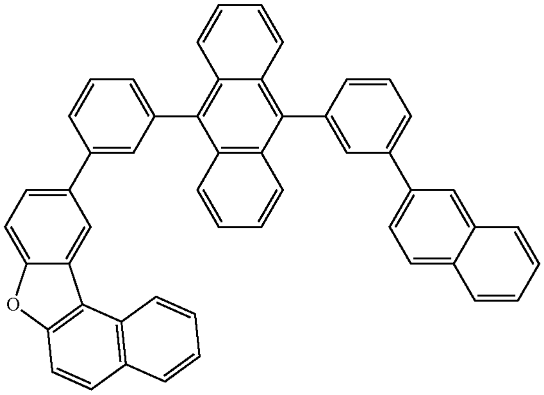

-continued
H95
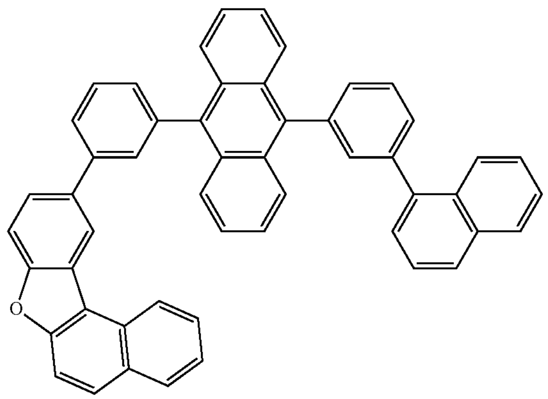
H96
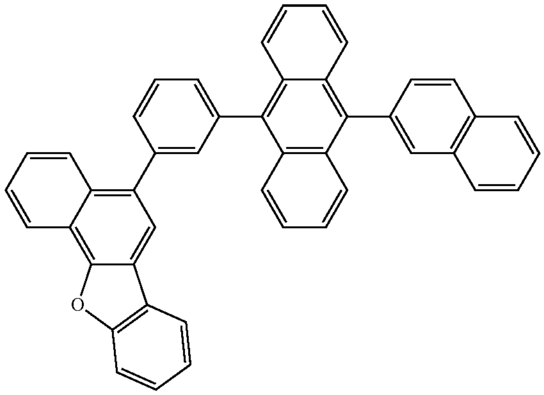
H97
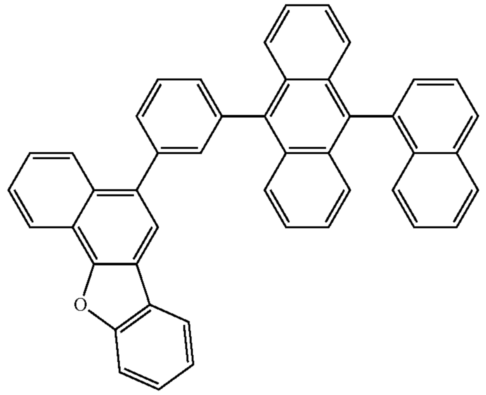
H98
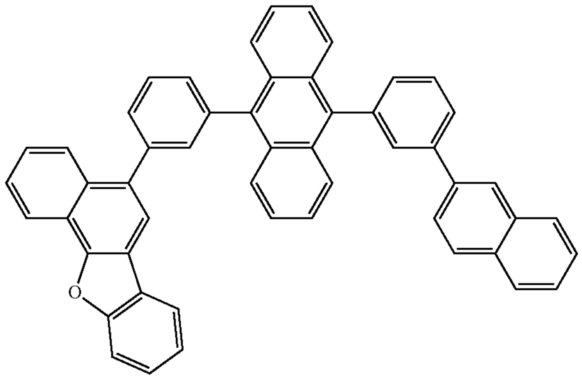
-continued
H99
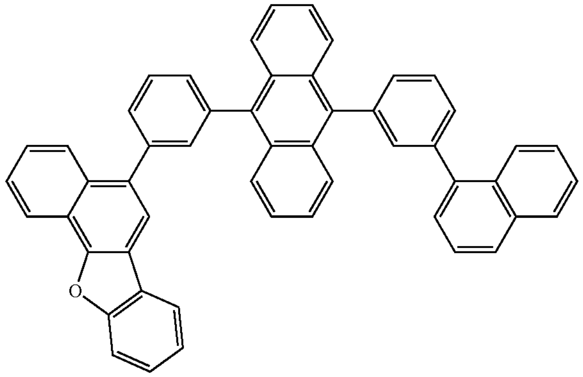
H100
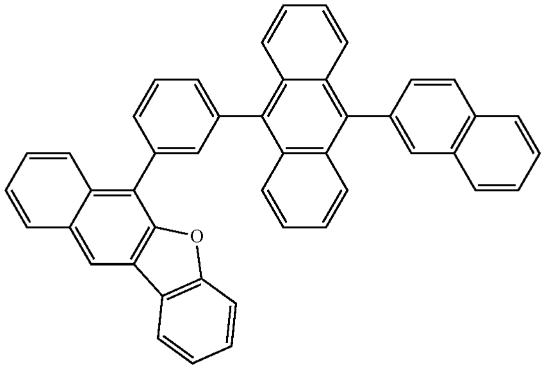
H101
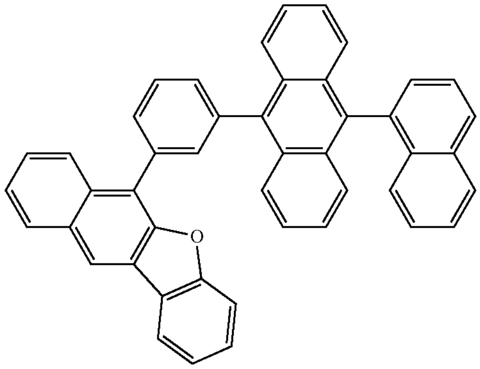
H102
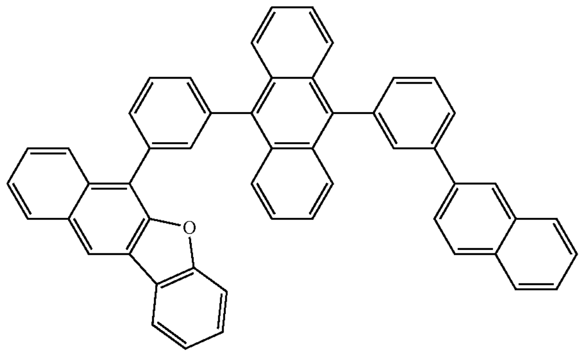

-continued
H103
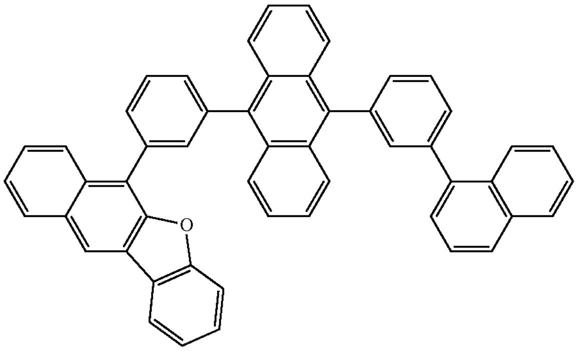
H104
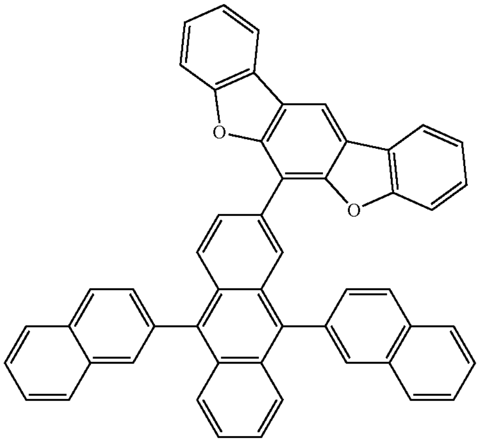
H105
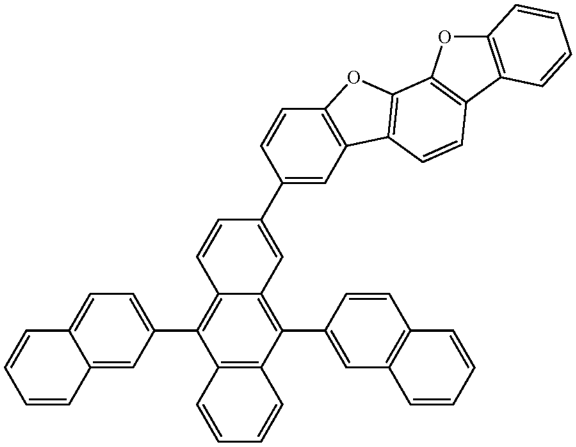
-continued
H106
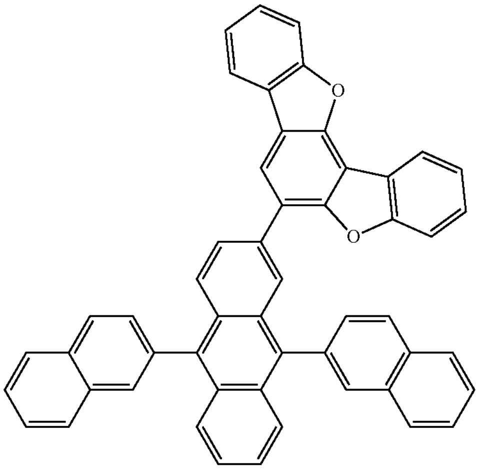
H107
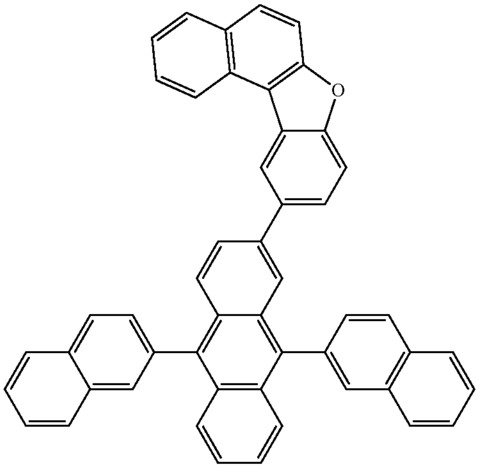
H108
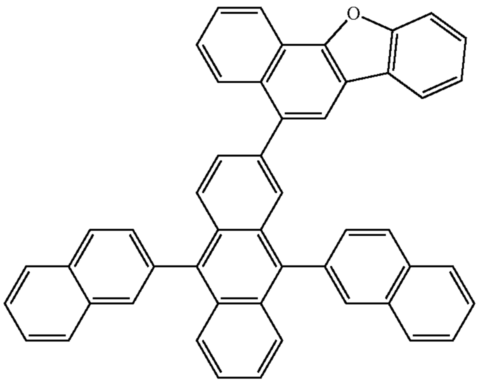

-continued
H109
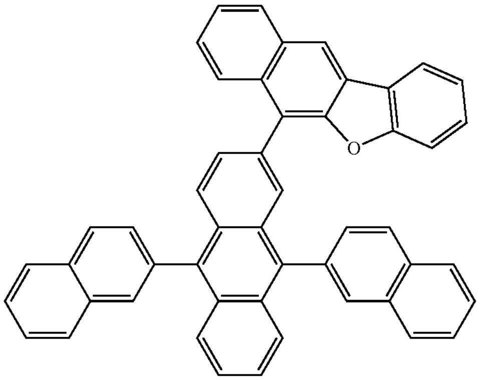
H110
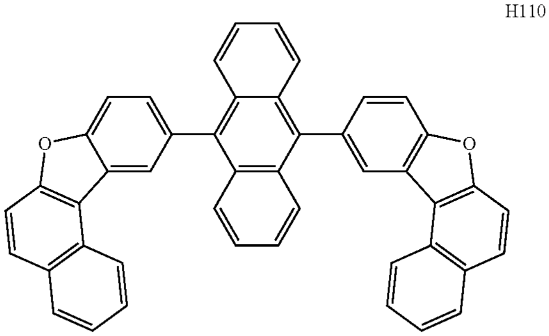
H111
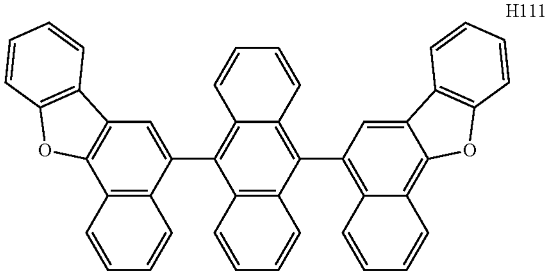
H112
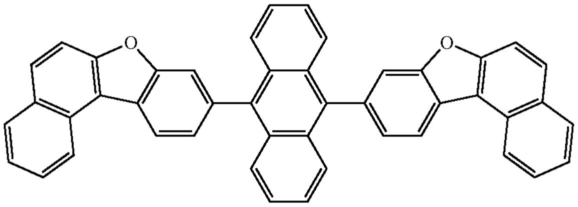
H113
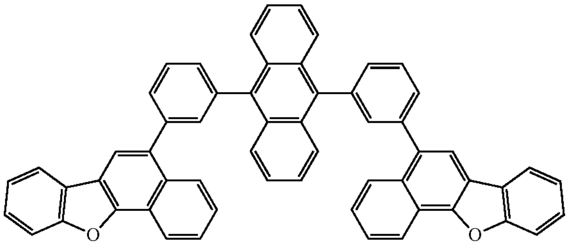
-continued
H114
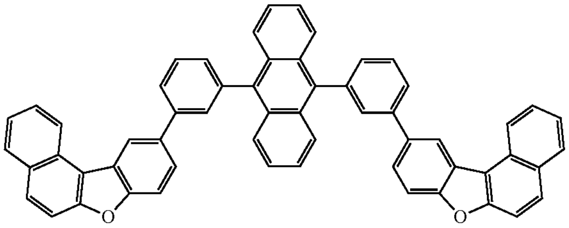
H115
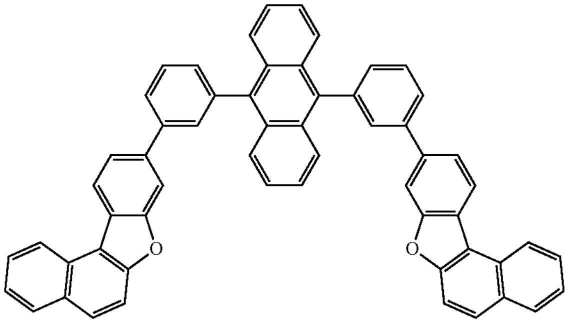
H116
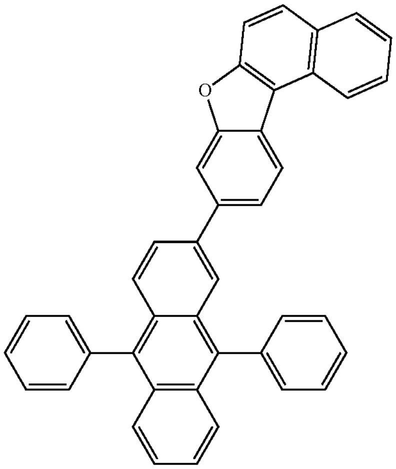
H117
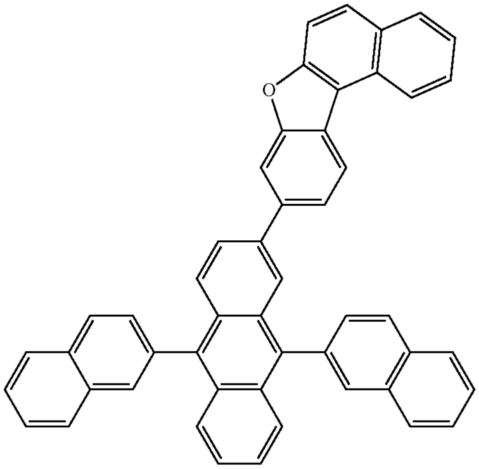

-continued
H118
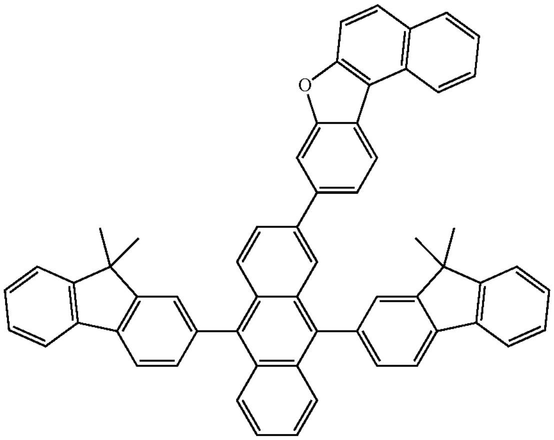
H119
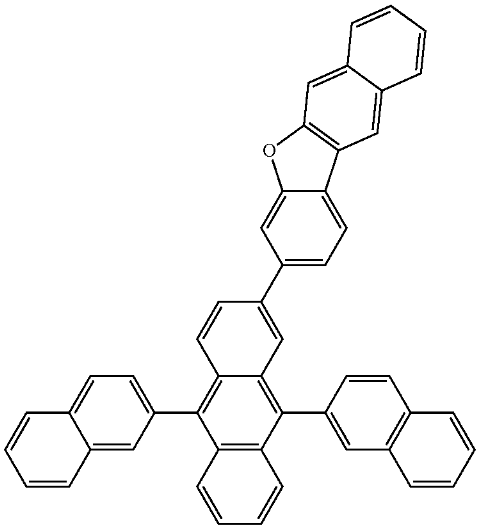
H120
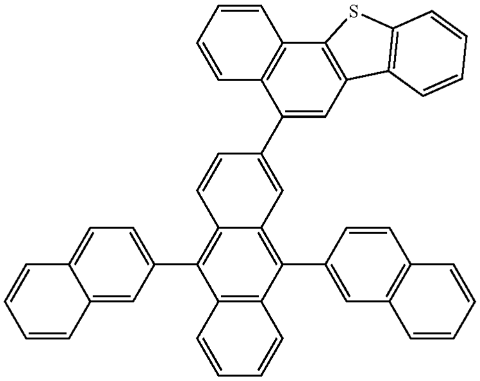
-continued
H121
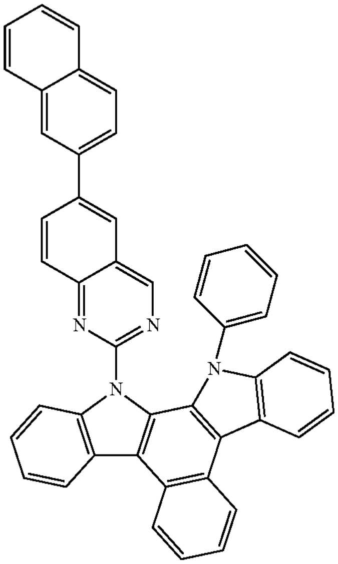
H122
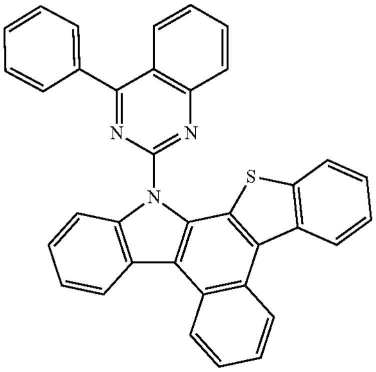
H123
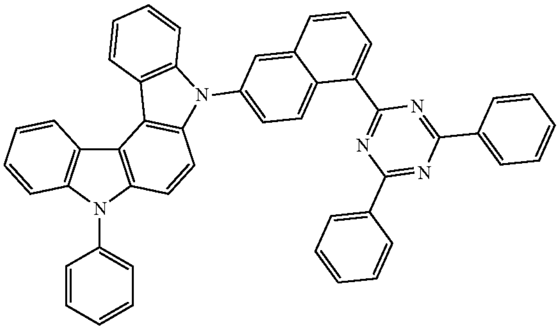

-continued
H124
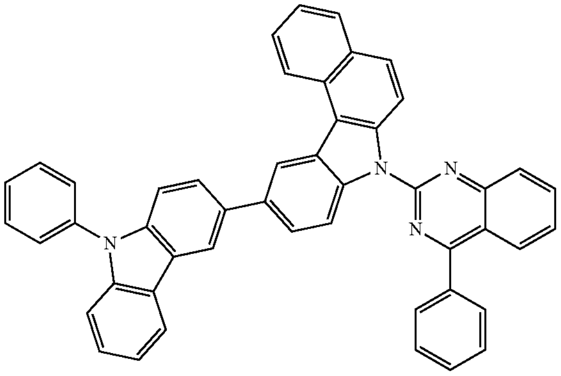
H125
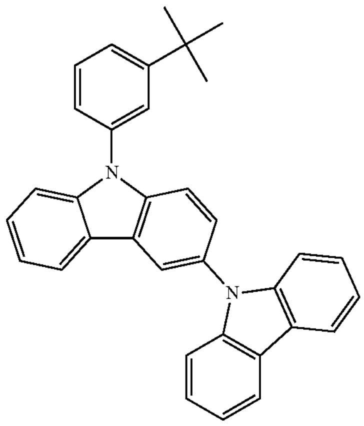
H126
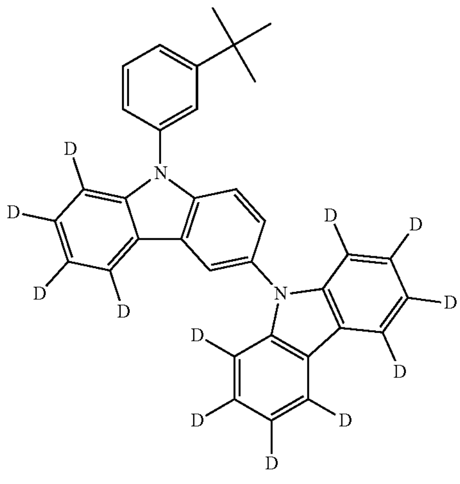
-continued
H127
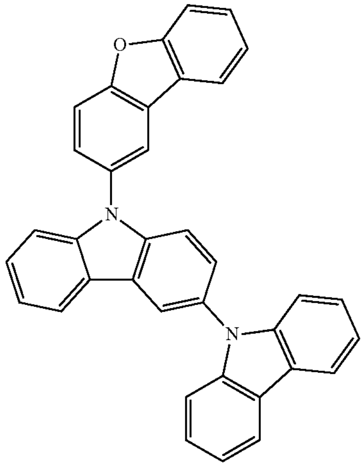
H128
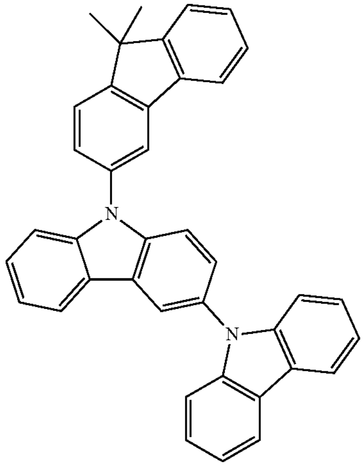
H129
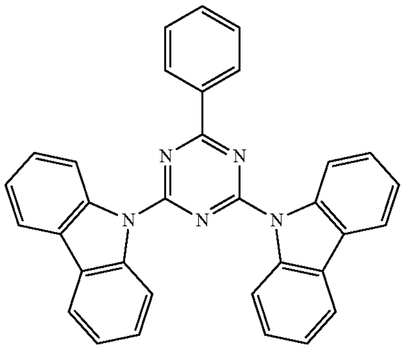

-continued

H130

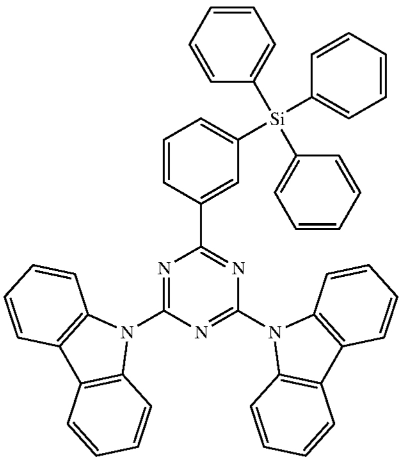

H131

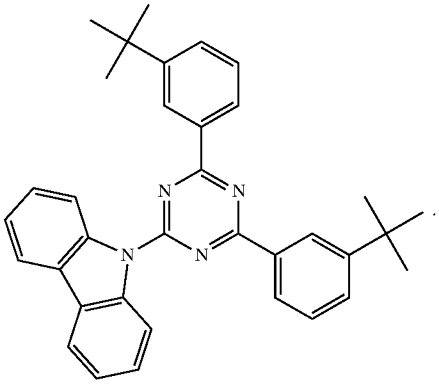

Phosphorescent Dopant

The phosphorescent dopant may include at least one transition metal as a central metal.

The phosphorescent dopant may include a monodentate ligand, a bidentate ligand, a tridentate ligand, a tetradentate ligand, a pentadentate ligand, a hexadentate ligand, or any combination thereof.

The phosphorescent dopant may be electrically neutral.

In an embodiment, the phosphorescent dopant may include an organometallic compound represented by Formula 401:

$$M(L_{401})_{xc1}(L_{402})_{xc2}$$ Formula 401

Formula 402

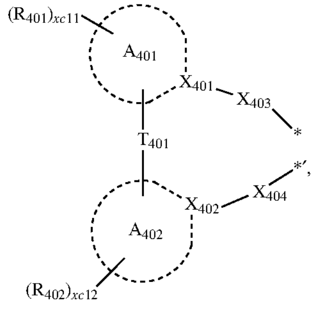

wherein, in Formulae 401 and 402,

M may be a transition metal (for example, iridium (Ir), platinum (Pt), palladium (Pd), osmium (Os), titanium (Ti), gold (Au), hafnium (Hf), europium (Eu), terbium (Tb), rhodium (Rh), rhenium (Re), or thulium (Tm)), $L_{401}$ may be a ligand represented by Formula 402, and xc1 may be 1, 2, or 3, wherein, when xc1 is two or more, two or more of $L_{401}$(s) may be identical to or different from each other, $L_{402}$ may be an organic ligand, and xc2 may be 0, 1, 2, 3, or 4, wherein, when xc2 is 2 or more, two or more of $L_{402}$(s) may be identical to or different from each other, $X_{401}$ and $X_{402}$ may each independently be nitrogen or carbon, ring $A_{401}$ and ring $A_{402}$ may each independently be a $C_3$-$C_{60}$ carbocyclic group or a $C_1$-$C_{60}$ heterocyclic group, $T_{401}$ may be a single bond, *—O—*', *—S—*', *—C(=O)—*', *—N($Q_{411}$)-*', *—C($Q_{411}$)($Q_{412}$)-*', *—C($Q_{411}$)=C($Q_{412}$)-*', *—C($Q_{411}$)=*', or *=C($Q_{411}$)=*', $X_{403}$ and $X_{404}$ may each independently be a chemical bond (for example, a covalent bond or a coordinate bond), O, S, N($Q_{413}$), B($Q_{413}$), P($Q_{413}$), C($Q_{413}$)($Q_{414}$), or Si($Q_{413}$)($Q_{414}$), $Q_{411}$ to $Q_{414}$ may each independently be the same as described in connection with $Q_1$, $R_{401}$ and $R_{402}$ may each independently be hydrogen, deuterium, —F, —Cl, —Br, —I, a hydroxyl group, a cyano group, a nitro group, a $C_1$-$C_{20}$ alkyl group that is unsubstituted or substituted with at least one $R_{10a}$, a $C_1$-$C_{20}$ alkoxy group that is unsubstituted or substituted with at least one $R_{10a}$, a $C_3$-$C_{60}$ carbocyclic group that is unsubstituted or substituted with at least one $R_{10a}$, a $C_1$-$C_{60}$ heterocyclic group that is unsubstituted or substituted with at least one $R_{10a}$, —Si($Q_{401}$)($Q_{402}$)($Q_{403}$), —N($Q_{401}$)($Q_{402}$), —B($Q_{401}$)($Q_{402}$), —C(=O)($Q_{401}$), —S(=O)$_2$($Q_{401}$), or —P(=O)($Q_{401}$)($Q_{402}$), $Q_{401}$ to $Q_{403}$ may each independently be the same as described in connection with $Q_1$, xc11 and xc12 may each independently be an integer from 0 to 10, and

* and *' in Formula 402 each indicate a binding site to M in Formula 401.

In an embodiment, in Formula 402, i) $X_{401}$ may be nitrogen, and $X_{402}$ may be carbon, or ii) each of $X_{401}$ and $X_{402}$ may be nitrogen.

In an embodiment, when xc1 in Formula 402 is 2 or more, two ring $A_{401}$ in two or more of $L_{401}$(s) may be optionally linked to each other via $T_{402}$, which is a linking group, and/or two ring $A_{402}$ may optionally be linked to each other via $T_{403}$, which is a linking group (see Compounds PD1 to PD4 and PD7). $T_{402}$ and $T_{403}$ may each independently be the same as described in connection with $T_{401}$.

$L_{402}$ in Formula 401 may be an organic ligand. In an embodiment, $L_{402}$ may include a halogen group, a diketone group (for example, an acetylacetonate group), a carboxylic acid group (for example, a picolinate group), —C(=O), an isonitrile group, —CN group, a phosphorus group (for example, a phosphine group, a phosphite group, etc.), or any combination thereof.

The phosphorescent dopant may include, for example, at least one of Compounds PD1 to PD39, at least one of PS-1 and PS-2, or any combination thereof:

PD1
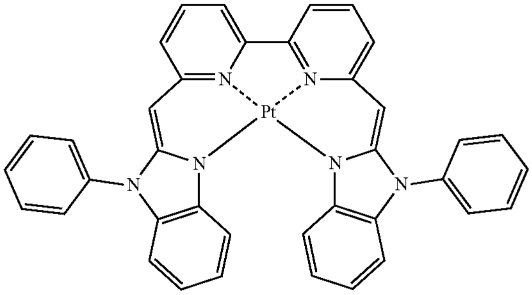
PD2
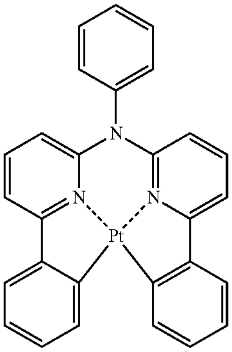
PD3
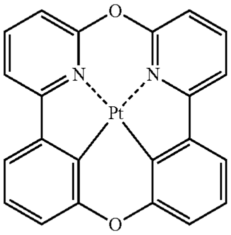
PD4
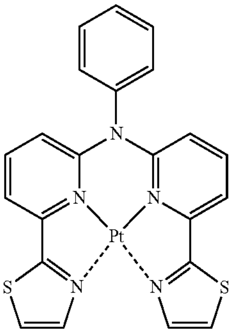
PD5
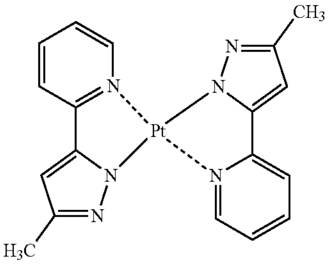
-continued
PD6
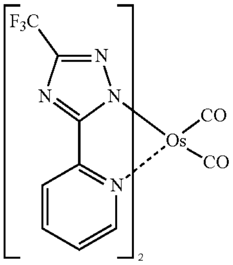
PD7
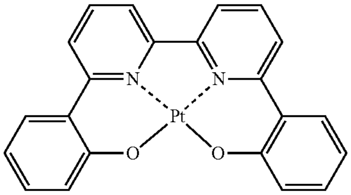
PD8
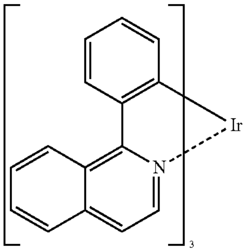
PD9
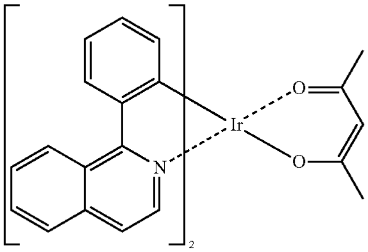
PD10
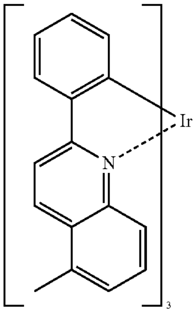
PD11
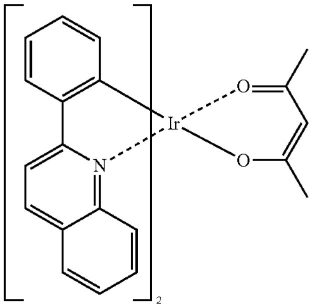

-continued
PD12
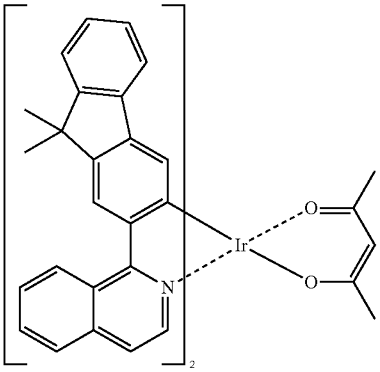
PD13
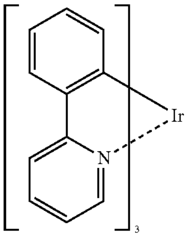
PD14
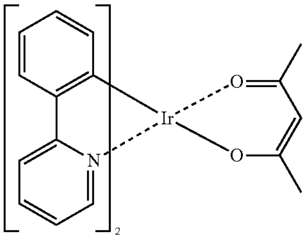
PD15
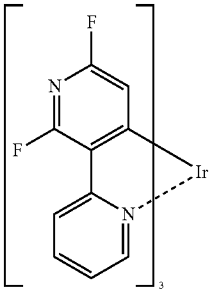
PD16
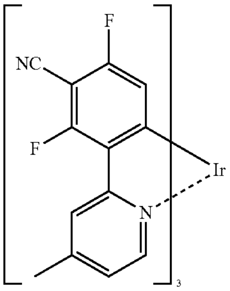
-continued
PD17
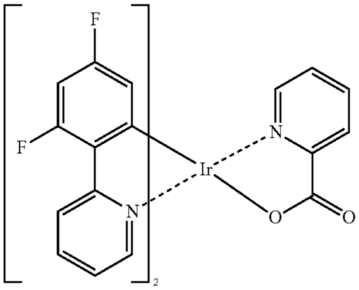
PD18
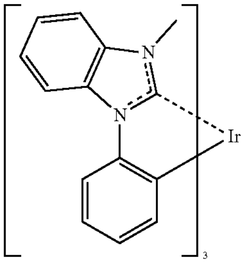
PD19
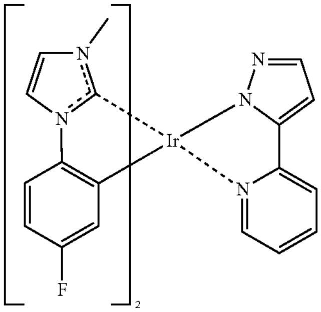
PD20
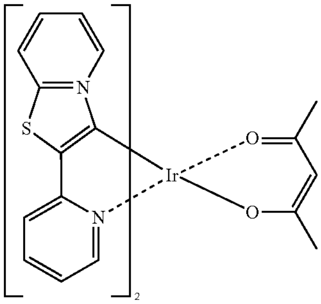
PD21
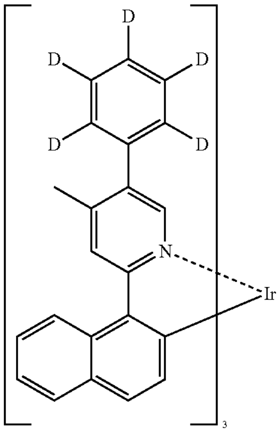

-continued
PD22
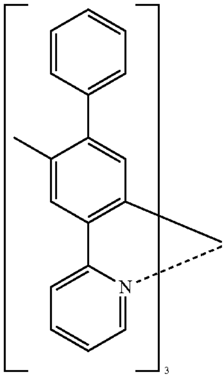
PD23
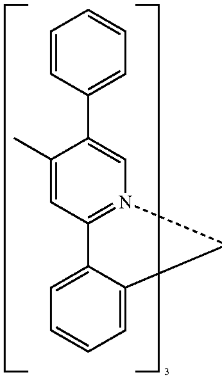
PD24
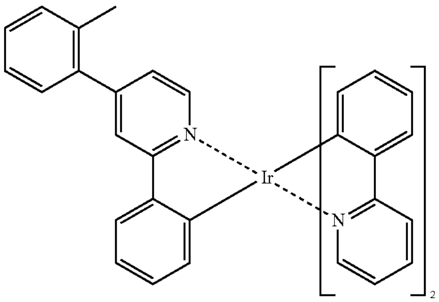
PD25
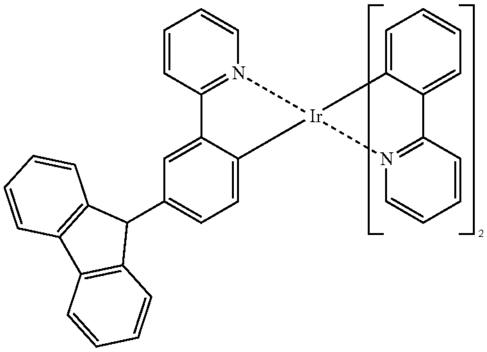
-continued
PD26
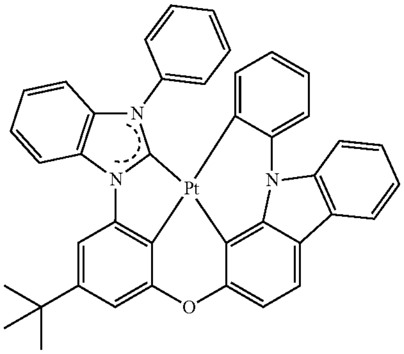
PD27
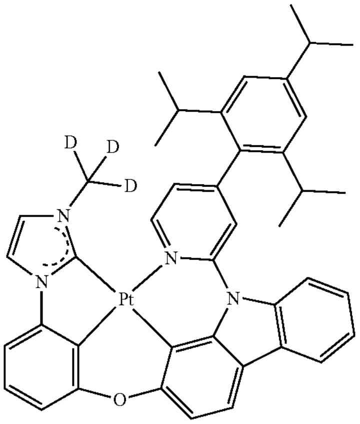
PD28
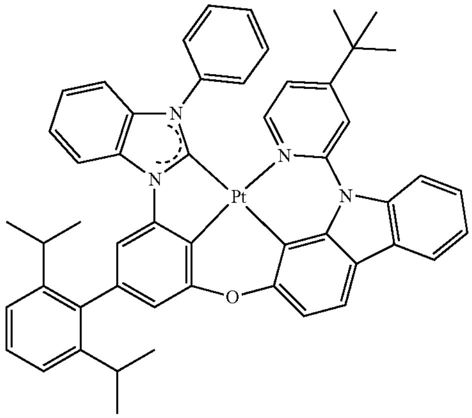
PD29
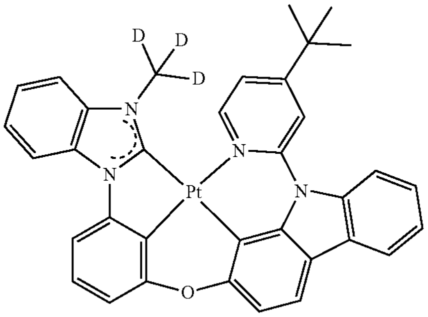

-continued
PD30
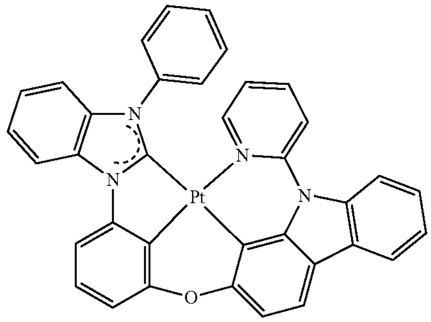
PD31
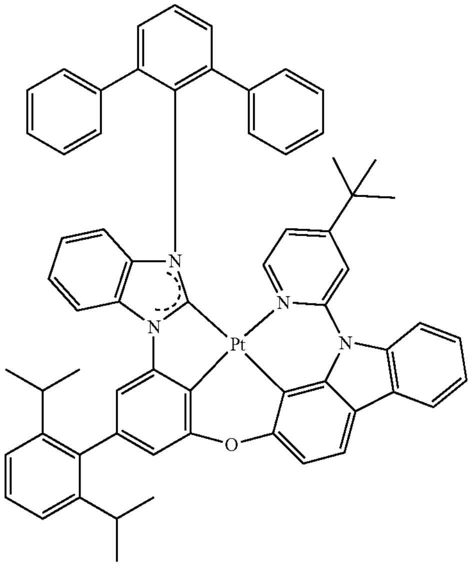
PD32
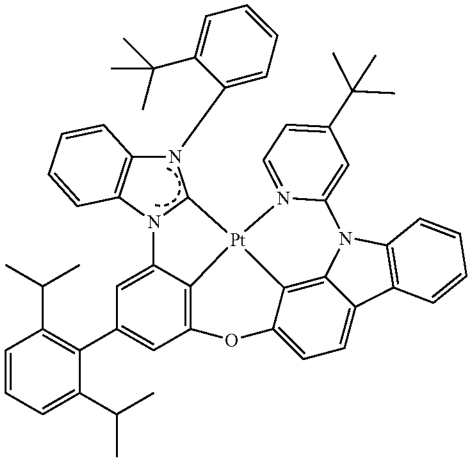
-continued
PD33
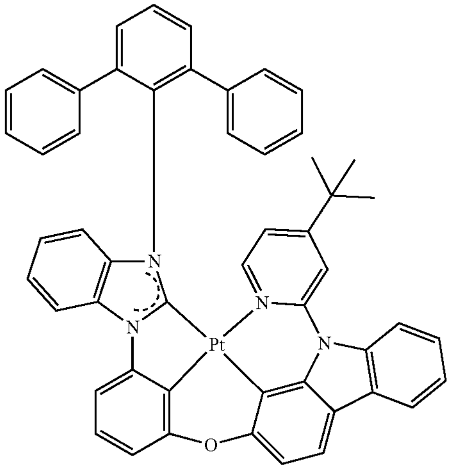
PD34
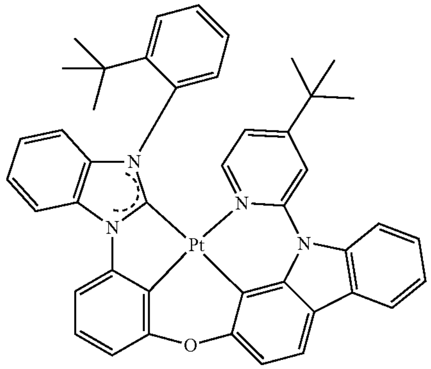
PD35
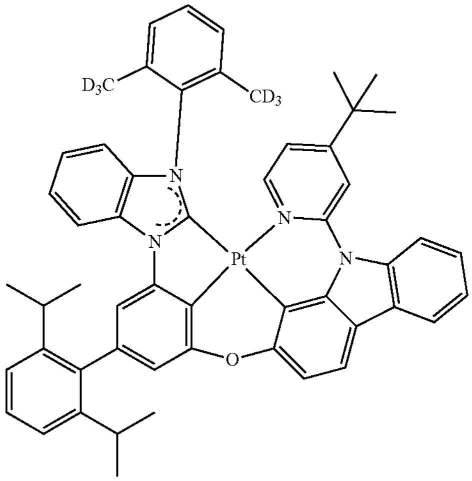

-continued
PD36
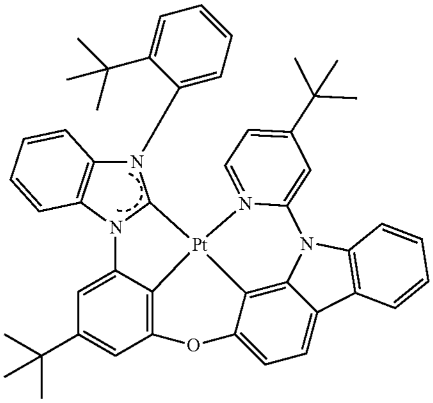
PD37
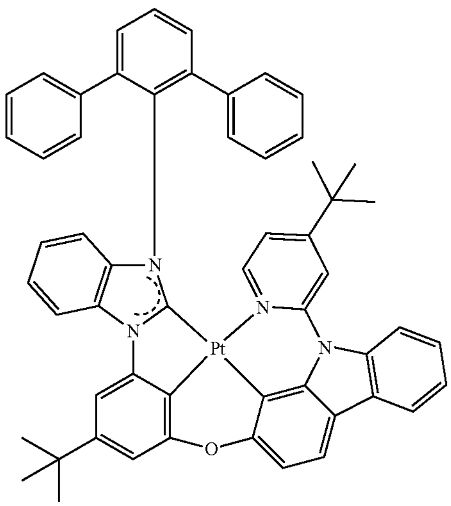
PD38
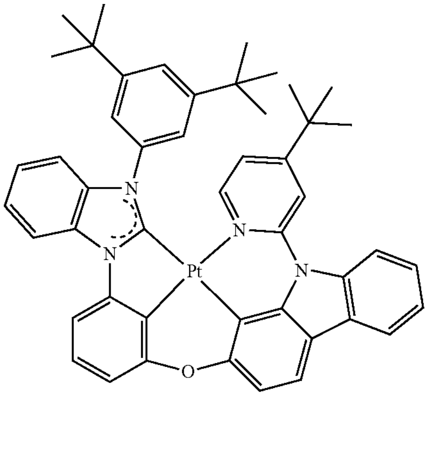
-continued
PD39
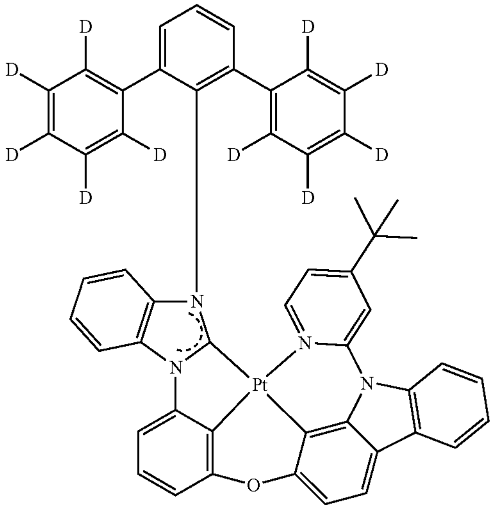
PS-1
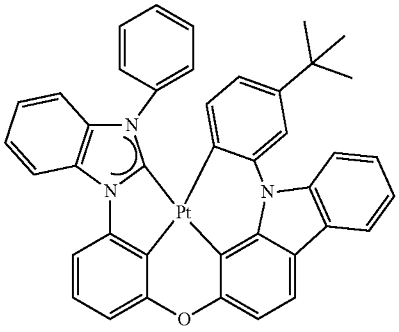
PS-2
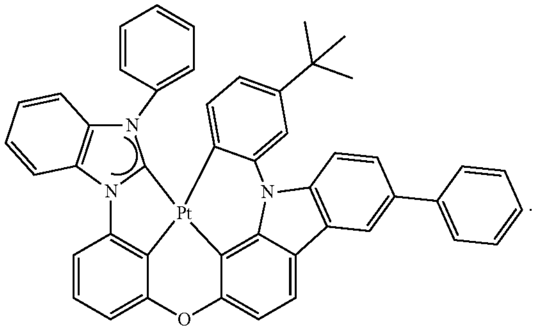
Fluorescent Dopant
The fluorescent dopant may include an amine group-containing compound, a styryl group-containing compound, or any combination thereof.
In an embodiment, the fluorescent dopant may include a compound represented by Formula 501:
Formula 501
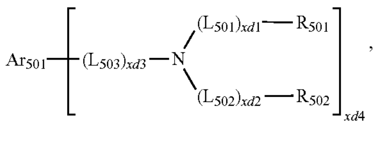

wherein, in Formula 501, $Ar_{501}$, $L_{501}$ to $L_{503}$, $R_{501}$, and $R_{502}$ may each independently be a $C_3$-$C_{60}$ carbocyclic group that is unsubstituted or substituted with at least one $R_{10a}$ or a $C_1$-$C_{60}$ heterocyclic group that is unsubstituted or substituted with at least one $R_{10a}$, xd1 to xd3 may each independently be 0, 1, 2, or 3, and xd4 may be 1, 2, 3, 4, 5, or 6.

In an embodiment, $Ar_{501}$ in Formula 501 may be a condensed cyclic group (for example, an anthracene group, a chrysene group, or a pyrene group) in which three or more monocyclic groups are condensed together.

In an embodiment, xd4 in Formula 501 may be 2.

In an embodiment, the fluorescent dopant may include: at least one of Compounds FD1 to FD36; DPVBi; DPAVBi; or any combination thereof:

FD1

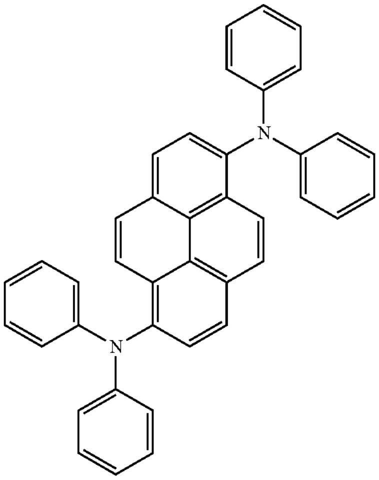

FD2

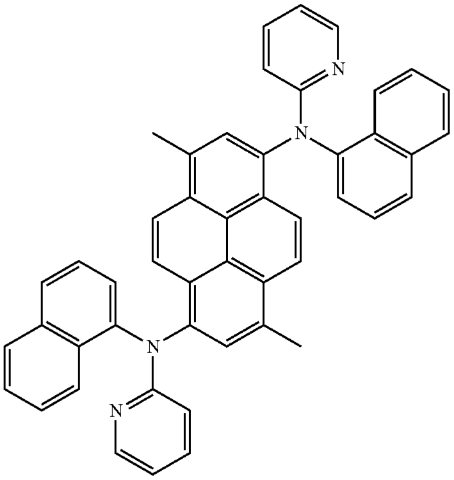

FD3

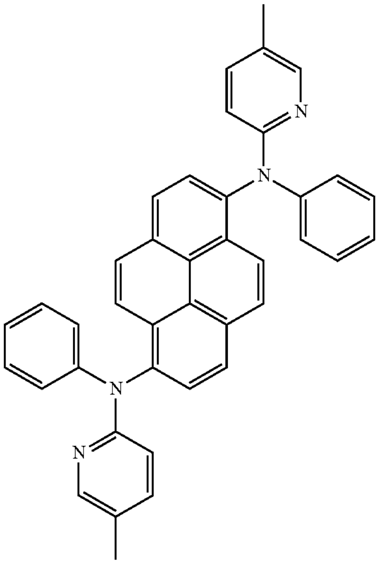

FD4

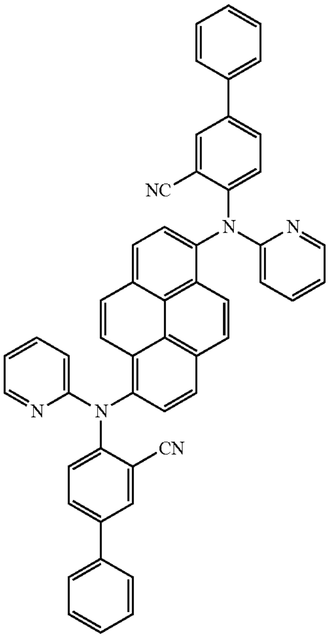

-continued
FD5
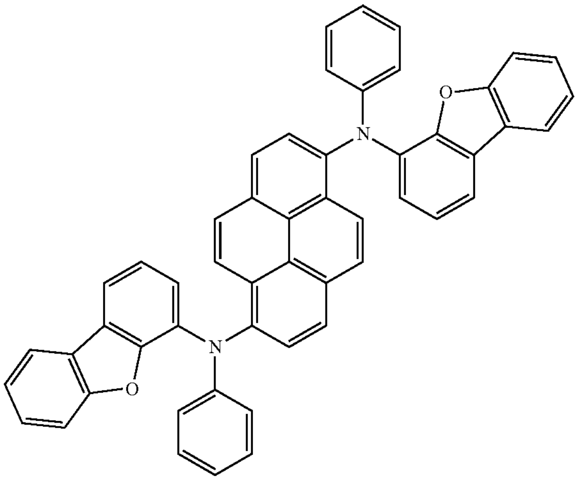
FD6
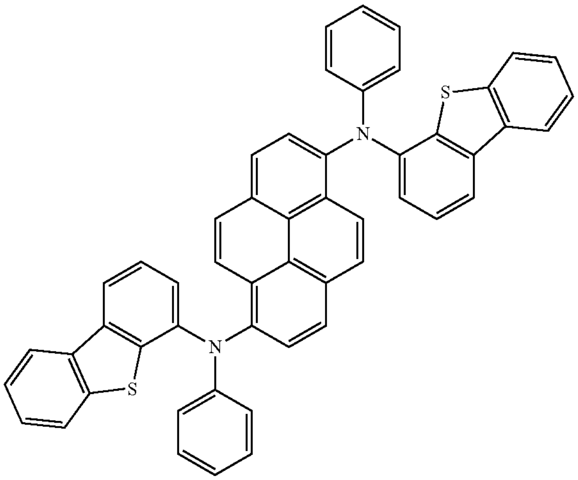
FD7
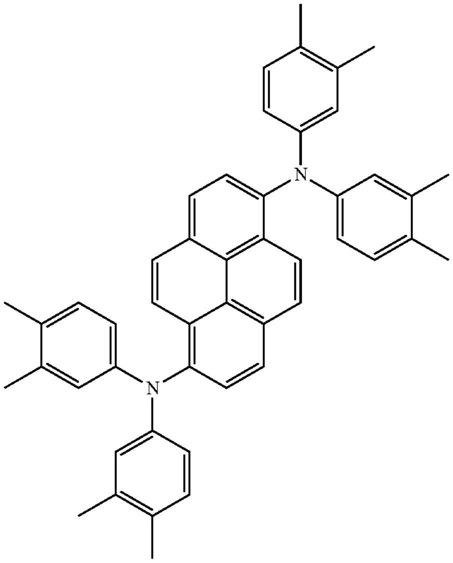
FD8
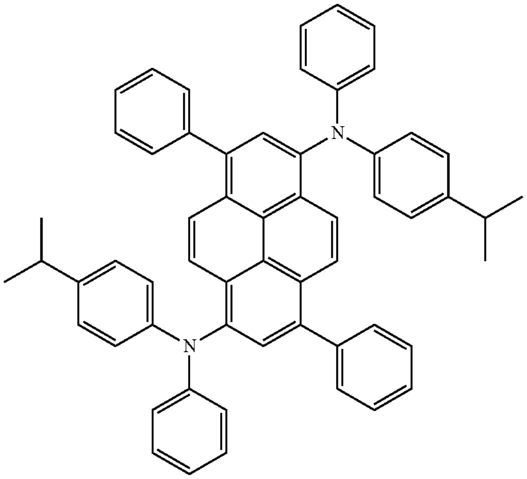
FD9
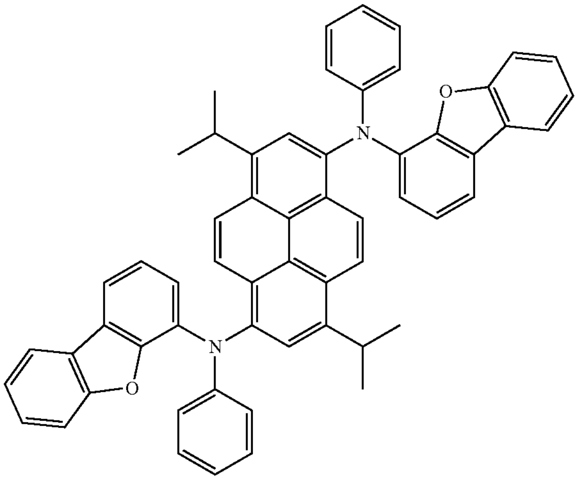
FD10
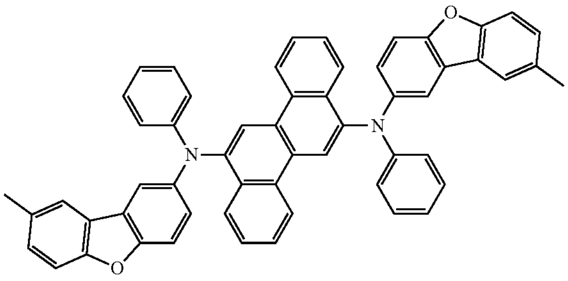

-continued
FD11
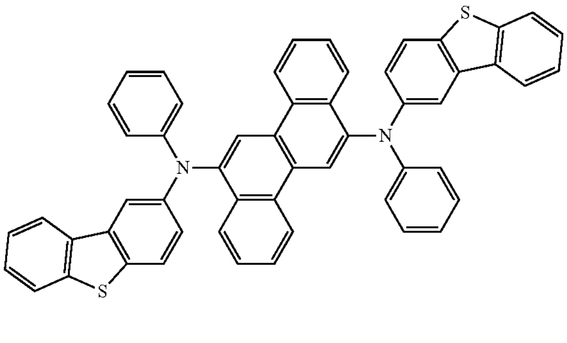
FD12
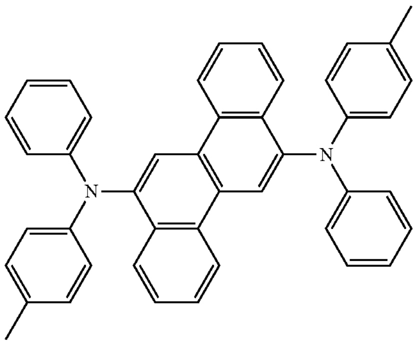
FD13
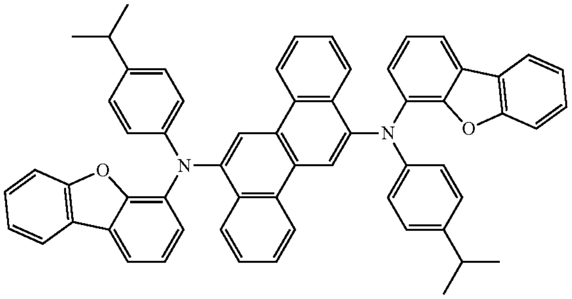
FD14
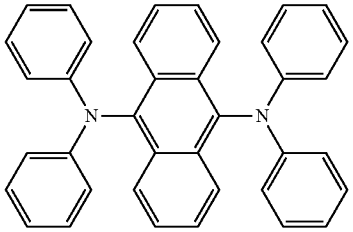
FD15
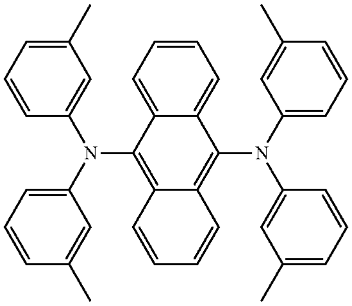
FD16
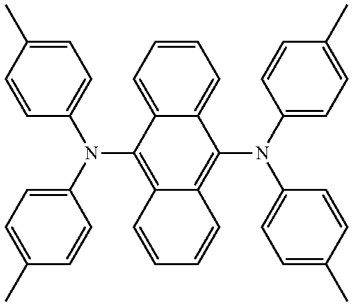
FD17
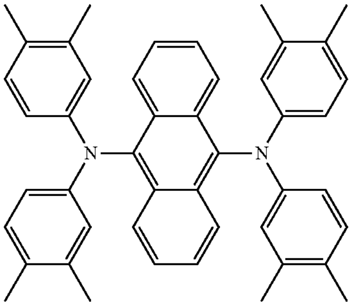
FD18
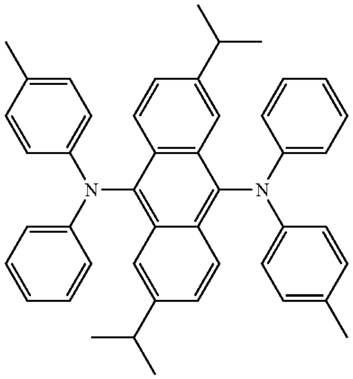

-continued
FD19
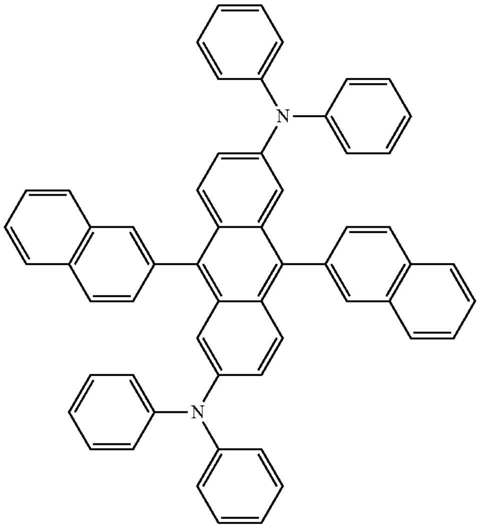
FD20
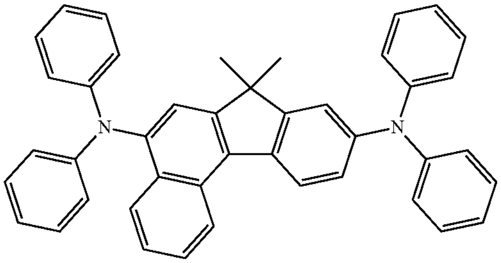
FD21
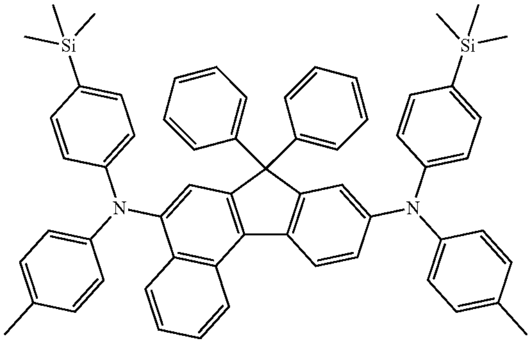
FD22
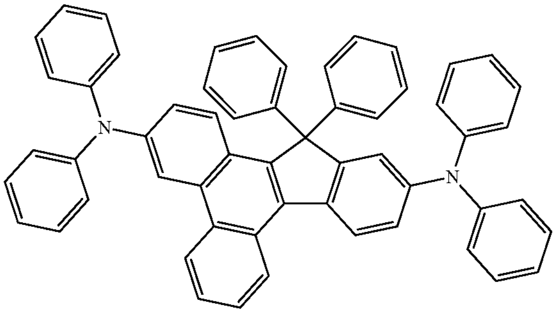
FD23
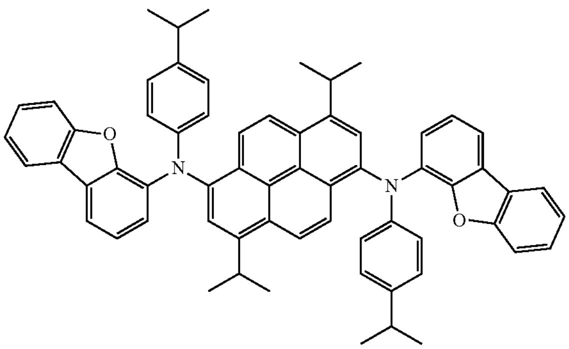
FD24
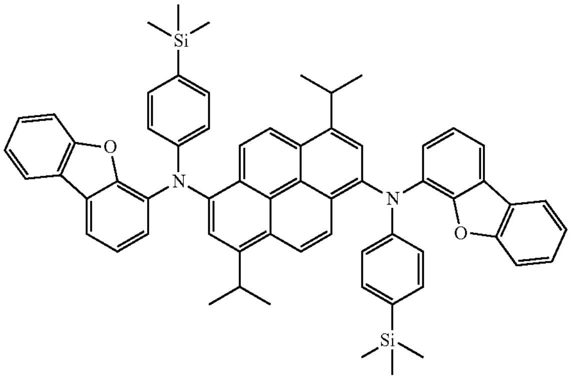

-continued
FD25
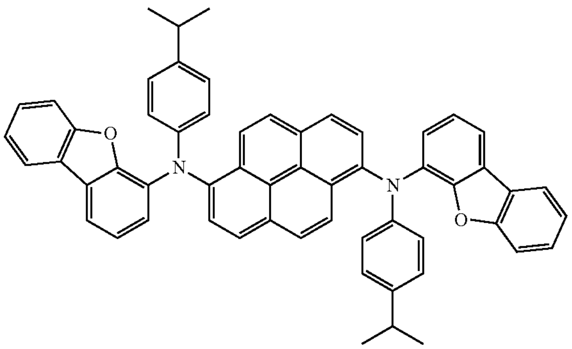
FD26
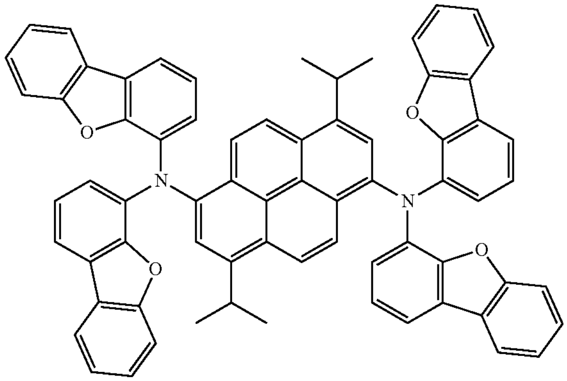
FD27
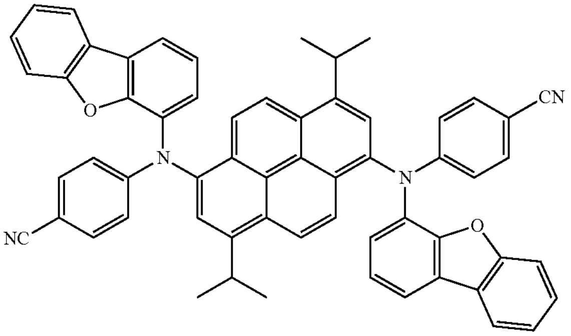
FD28
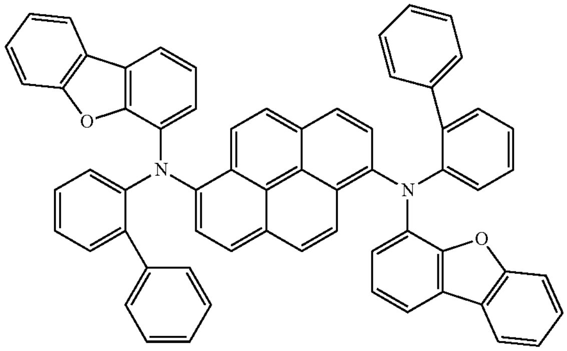
FD29
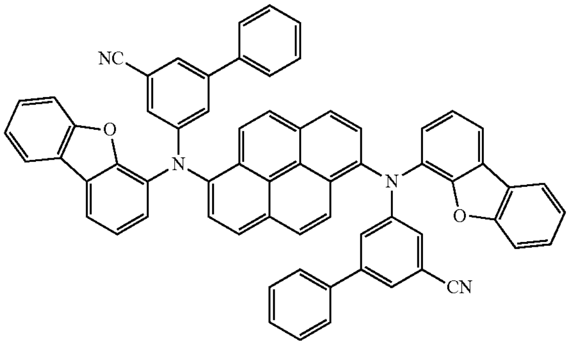
FD30
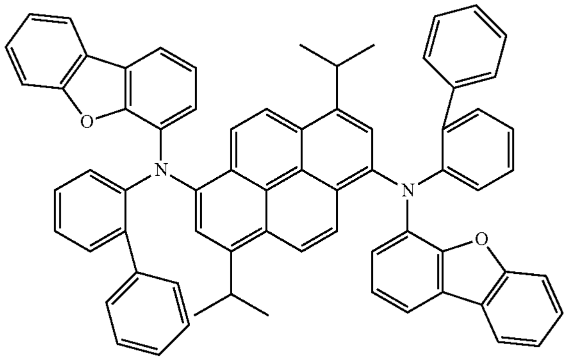
FD31
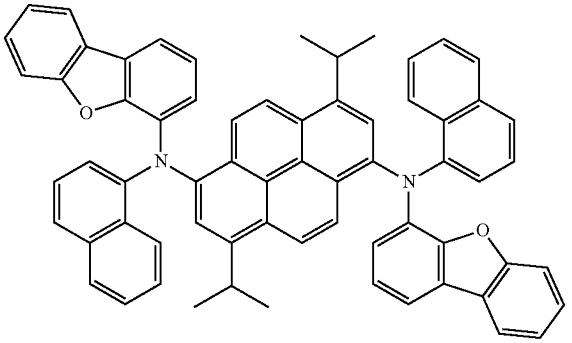
FD32
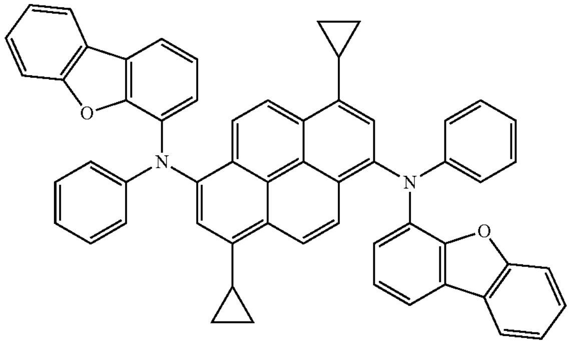

-continued

FD33

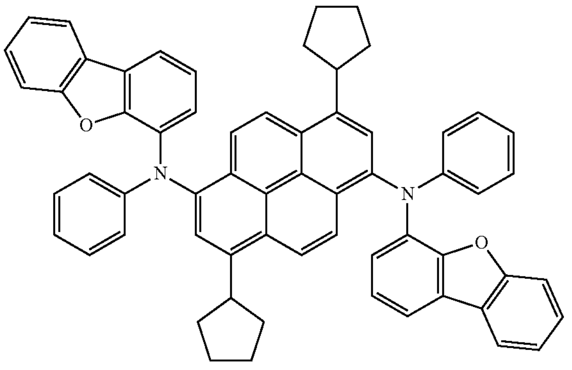

FD34

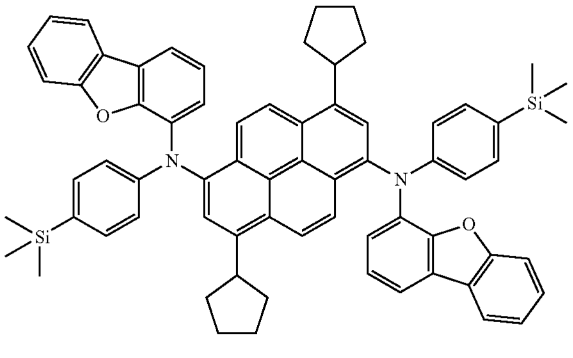

FD35

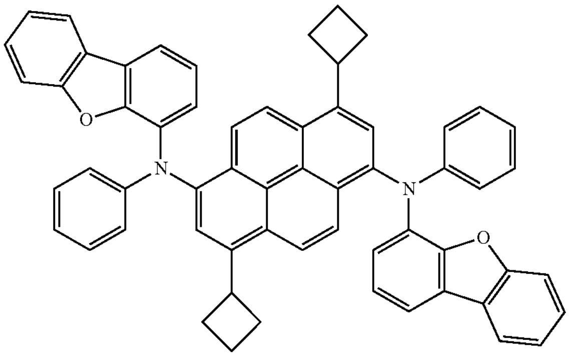

FD36

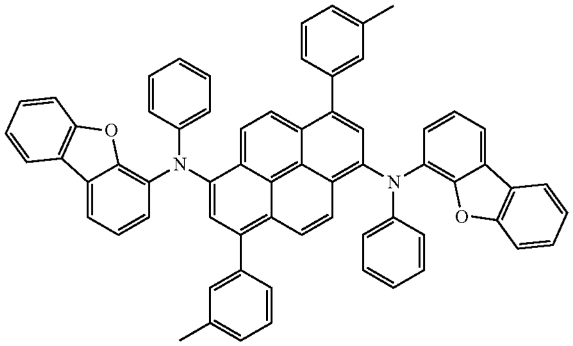

DPVBi

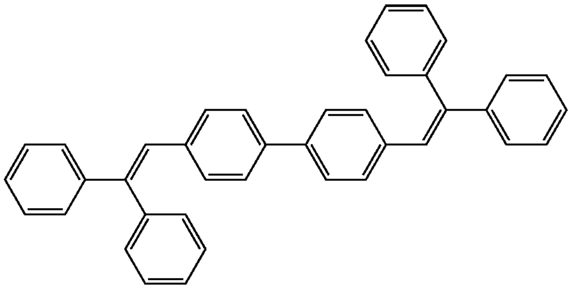

DPAVBi

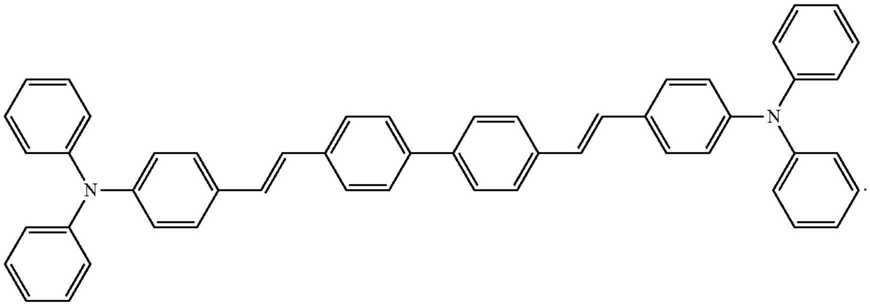

Delayed Fluorescence Material

The emission layer may include a different delayed fluorescence material.

In the present specification, the delayed fluorescence material may be selected from compounds capable of emitting delayed fluorescence based on a delayed fluorescence emission mechanism.

The delayed fluorescence material that is further included in the emission layer may act (e.g., serve) as a host or a dopant, depending on the type or kind of other materials included in the emission layer.

In an embodiment, the difference between the triplet energy level (eV) of the delayed fluorescence material and the singlet energy level (eV) of the delayed fluorescence material may be greater than or equal to about 0 eV and less than or equal to about 0.5 eV. When the difference between the triplet energy level (eV) of the delayed fluorescence material and the singlet energy level (eV) of the delayed fluorescence material satisfies the above-described range, up-conversion from the triplet state to the singlet state of the delayed fluorescence materials may effectively occur, and thus, the luminescence efficiency of the light-emitting device 10 may be improved.

In an embodiment, the delayed fluorescence material may include i) a material including at least one electron donor (for example, a π electron-rich $C_3$-$C_{60}$ cyclic group, such as a carbazole group) and at least one electron acceptor (for example, a sulfoxide group, a cyano group, and/or a π electron-deficient nitrogen-containing $C_1$-$C_{60}$ cyclic group), and ii) a material including a $C_8$-$C_{60}$ polycyclic group in which two or more cyclic groups are condensed while sharing boron (B).

Examples of the delayed fluorescence material may include at least one of the following Compounds DF1 to DF9:

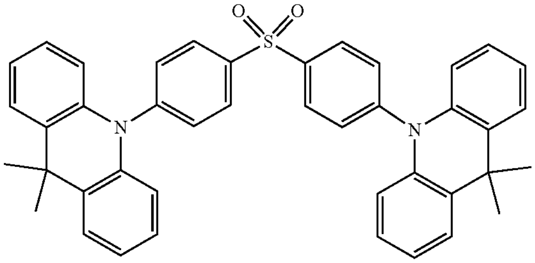

DF1(DMAC-DPS)

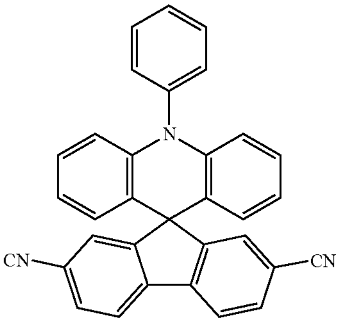

DF2(ACRFLCN)

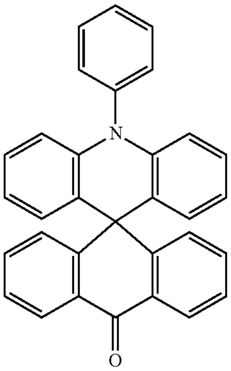

DF3(ACRSA)

-continued

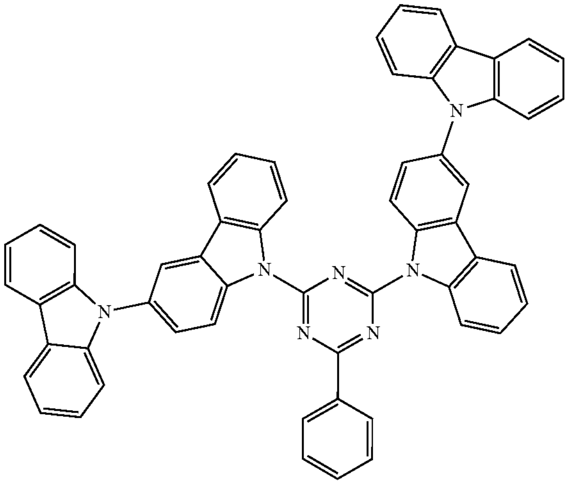

DF4(CC2TA)

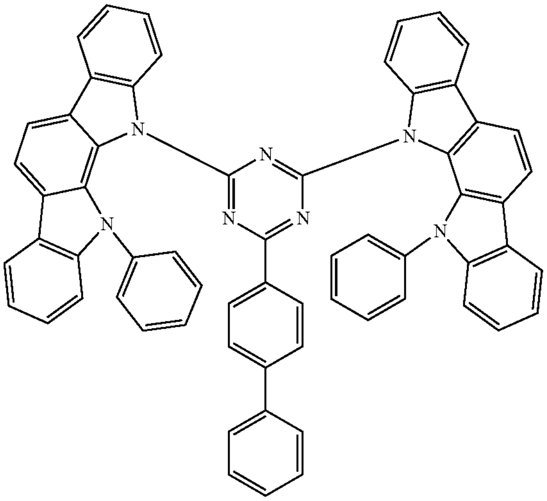

DF5(PIC-TRZ)

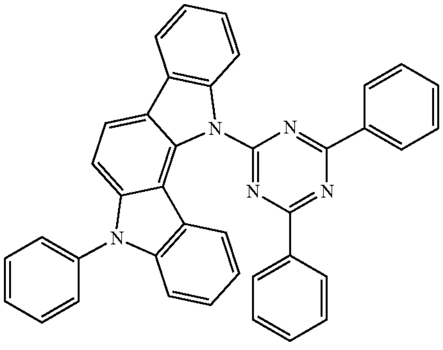

DF6(PIC-TRZ2)

-continued

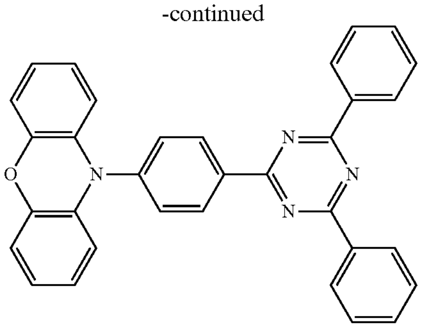

DF7(PXZ-TRZ)

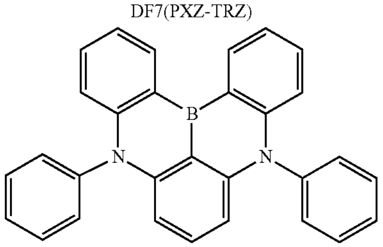

DF8(DABNA-1)

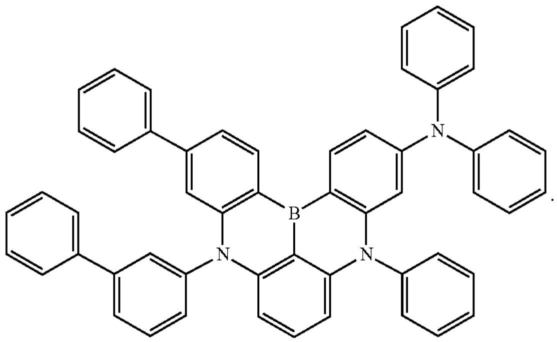

DF9(DABNA-2)

Quantum Dot

The emission layer may include a quantum dot.

In the present specification, a quantum dot refers to a crystal of a semiconductor compound, and may include any suitable material capable of emitting light of one or more suitable emission wavelengths according to the size of the crystal.

A diameter of the quantum dot may be, for example, in a range of about 1 nm to about 10 nm.

The quantum dot may be synthesized by a wet chemical process, a metal organic (e.g., organometallic) chemical vapor deposition process, a molecular beam epitaxy process, or any process similar thereto.

In the wet chemical process, a precursor material is mixed with an organic solvent to grow a quantum dot particle crystal. When the crystal grows, the organic solvent naturally acts (e.g., serves) as a dispersant coordinated on the surface of the quantum dot crystal and controls the growth of the crystal so that the growth of quantum dot particles may be controlled or selected through lower cost process which is more easily performed than vapor deposition methods, such as metal organic chemical vapor deposition (MOCVD) and/or molecular beam epitaxy (MBE).

The quantum dot may include: a Group II-VI semiconductor compound; a Group III-V semiconductor compound; a Group III-VI semiconductor compound; a Group I-III-VI semiconductor compound; a Group IV-VI semiconductor compound; a Group IV element or compound; or any combination thereof.

Examples of the Group II-VI semiconductor compound may include: a binary compound, such as CdS, CdSe, CdTe, ZnS, ZnSe, ZnTe, ZnO, HgS, HgSe, HgTe, MgSe, and/or MgS; a ternary compound, such as CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, and/or MgZnS; a quaternary compound, such as CdZnSeS, CdZnSeTe, CdZnSTe, CdHgSeS, CdHgSeTe, CdHgSTe, HgZnSeS, HgZnSeTe, and/or HgZnSTe; or any combination thereof.

Examples of the group III-V semiconductor compound may include: a binary compound such as GaN, GaP, GaAs, GaSb, AlN, AlP, AlAs, AlSb, InN, InP, InAs, and/or InSb; a ternary compound such as GaNP, GaNAs, GaNSb, GaPAs, GaPSb, AlNP, AlNAs, AlNSb, AlPAs, AlPSb, InGaP, InNP, InAlP, InNAs, InNSb, InPAs, and/or InPSb; a quaternary compound such as GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, and/or InAlPSb; or any combination thereof. In an embodiment, the Group III-V semiconductor compound may further include a Group II element. Examples of the Group III-V semiconductor compound further including a Group II element may include InZnP, InGaZnP, InAlZnP, and/or the like.

Examples of the Group III-VI semiconductor compound may include: a binary compound, such as GaS, GaSe, $Ga_2Se_3$, GaTe, InS, InSe, $In_2S_3$, $In_2Se_3$, and/or InTe; a ternary compound, such as $InGaS_3$, and/or $InGaSe_3$; or any combination thereof.

Examples of the Group I-III-VI semiconductor compound may include: a ternary compound, such as AgInS, $AgInS_2$, CuInS, $CuInS_2$, $CuGaO_2$, $AgGaO_2$, and/or $AgAlO_2$; or any combination thereof.

Examples of the Group IV-VI semiconductor compound may include: a binary compound, such as SnS, SnSe, SnTe, PbS, PbSe, PbTe, and/or the like; a ternary compound, such as SnSeS, SnSeTe, SnSTe, PbSeS, PbSeTe, PbSTe, SnPbS, SnPbSe, SnPbTe, and/or the like; a quaternary compound, such as SnPbSSe, SnPbSeTe, SnPbSTe, and/or the like; or any combination thereof.

The Group IV element or compound may include: a single element compound, such as Si and/or Ge; a binary compound, such as SiC and/or SiGe; or any combination thereof.

Each element included in a multi-element compound such as the binary compound, the ternary compound and/or the quaternary compound, may exist in a particle with a substantially uniform concentration or non-uniform concentration.

In an embodiment, the quantum dot may have a single structure or a dual core-shell structure. In the case of the quantum dot having a single structure, the concentration of each element included in the corresponding quantum dot is substantially uniform. In an embodiment, in a quantum dot with a core-shell structure, the material contained in the core and the material contained in the shell may be different from each other.

The shell of the quantum dot may act (e.g., serve) as a protective layer to prevent or reduce chemical degeneration of the core to maintain semiconductor characteristics, and/or as a charging layer to impart electrophoretic characteristics to the quantum dot. The shell may be a single layer or a multi-layer. The element presented in the interface between the core and the shell of the quantum dot may have a concentration gradient in which the concentration of an element existing in the shell decreases toward the center of the quantum dot.

Examples of the shell of the quantum dot may include (e.g., may be) an oxide of metal, metalloid, or non-metal, a semiconductor compound, and any combination thereof. Examples of the oxide of metal, metalloid, or non-metal may include: a binary compound, such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, and/or NiO; a ternary compound, such as $MgAl_2O_4$, $CoFe_2O_4$, $NiFe_2O_4$, and/or $CoMn_2O_4$; or any combination thereof. Examples of the semiconductor compound may include, as described herein, a Group II-VI semiconductor compound, a Group III-V semiconductor compound, a Group III-VI semiconductor compound, a Group I-III-VI semiconductor compound, a Group IV-VI semiconductor compound, or any combination thereof. In some embodiments, the semiconductor compound may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, or any combination thereof.

A full width at half maximum (FWHM) of the emission wavelength spectrum of the quantum dot may be about 45 nm or less, for example, about 40 nm or less, for example, about 30 nm or less, and within these ranges, color purity or color reproducibility may be increased. In some embodiments, because the light emitted through the quantum dot is emitted in all directions, the wide viewing angle may be improved.

In some embodiments, the quantum dot may be a spherical particle, a pyramidal particle, a multi-arm particle, a cubic nanoparticle, a nanotube particle, a nanowire particle, a nanofiber particle, or a nanoplate particle.

Because the energy band gap may be adjusted by controlling the size of the quantum dot, light having one or more suitable wavelength bands can be obtained from the quantum dot emission layer. Therefore, by utilizing quantum dots of different sizes, a light-emitting device that emits light of one or more suitable wavelengths may be implemented. In an embodiment, the size of the quantum dot may be selected to emit red, green and/or blue light. In some embodiments, the size of the quantum dot may be configured to emit white light by combining light of one or more suitable colors.

Electron Transport Region in Interlayer 130

The electron transport region may have: i) a single-layered structure consisting of a single layer consisting of a single material, ii) a single-layered structure consisting of a single layer including (e.g., consisting of) a plurality of different materials, or iii) a multi-layered structure including a plurality of layers including different materials.

The electron transport region may include the first compound and the second compound.

In an embodiment, the electron transport region may include a first electron transport layer including the first compound and a second electron transport layer including the second compound. In an embodiment, the electron transport region may include an electron transport layer, and the electron transport layer may include the first electron transport layer and the second electron transport layer.

The first electron transport layer may be arranged between the emission layer and the second electrode, and the second electron transport layer may be arranged between the first electron transport layer and the second electrode.

The electron transport region may further include a buffer layer, a hole blocking layer, an electron control layer, an electron injection layer, or any combination thereof.

For example, the electron transport region may have an electron transport layer/electron injection layer structure, a hole blocking layer/electron transport layer/electron injection layer structure, an electron control layer/electron transport layer/electron injection layer structure, or a buffer layer/electron transport layer/electron injection layer structure, with the constituting layers of each structure being sequentially stacked from an emission layer in the respective stated order.

In an embodiment, the electron transport region (for example, the buffer layer, the hole blocking layer, the electron control layer, and/or the electron transport layer in the electron transport region) may further include a metal-free compound including at least one π electron-deficient nitrogen-containing $C_1$-$C_{60}$ cyclic group.

In an embodiment, the electron transport region may further include a compound represented by Formula 601.

$$[Ar_{601}]_{xe11}-[(L_{601})_{xe1}-R_{601}]_{xe21} \qquad \text{Formula 601}$$

In Formula 601, $Ar_{601}$ and $L_{601}$ may each independently be a $C_3$-$C_{60}$ carbocyclic group that is unsubstituted or substituted with at least one $R_{10a}$ or a $C_1$-$C_{60}$ heterocyclic group that is unsubstituted or substituted with at least one $R_{10a}$, xe11 may be 1, 2, or 3, xe1 may be 0, 1, 2, 3, 4, or 5, $R_{601}$ may be a $C_3$-$C_{60}$ carbocyclic group that is unsubstituted or substituted with at least one $R_{10a}$, a $C_1$-$C_{60}$ heterocyclic group that is unsubstituted or substituted with at least one $R_{10a}$, $—Si(Q_{601})(Q_{602})(Q_{603})$, $—C(=O)(Q_{601})$, $—S(=O)_2(Q_{601})$, or $—P(=O)(Q_{601})(Q_{602})$, $Q_{601}$ to $Q_{603}$ may each independently be the same as described in connection with $Q_1$, xe21 may be 1, 2, 3, 4, or 5, and at least one of $Ar_{601}$, $L_{601}$, and $R_{601}$ may each independently be a π electron-deficient nitrogen-containing $C_1$-$C_{60}$ cyclic group that is unsubstituted or substituted with at least one $R_{10a}$.

In an embodiment, when xe11 in Formula 601 is 2 or more, two or more of $Ar_{601}$(s) may be linked via a single bond.

In an embodiment, $Ar_{601}$ in Formula 601 may be a substituted or unsubstituted anthracene group.

In an embodiment, the electron transport region may further include a compound represented by Formula 601-1:

Formula 601-1

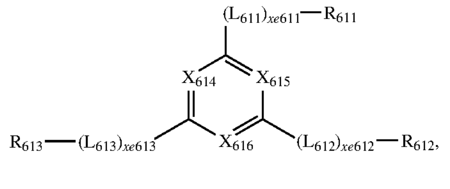

wherein, in Formula 601-1, $X_{614}$ may be N or $C(R_{614})$, $X_{615}$ may be N or $C(R_{615})$, $X_{616}$ may be N or $C(R_{616})$, and at least one of $X_{614}$ to $X_{616}$ may be N, $L_{611}$ to $L_{613}$ may each independently be the same as described in connection with $L_{601}$, xe611 to xe613 may each independently be the same as described in connection with xe1, $R_{611}$ to $R_{613}$ may each independently be the same as described in connection with $R_{601}$, and $R_{614}$ to $R_{616}$ may each independently be hydrogen, deuterium, —F, —Cl, —Br, —I, a hydroxyl group, a cyano group, a nitro group, a $C_1$-$C_{20}$ alkyl group, a $C_1$-$C_{20}$ alkoxy group, a $C_3$-$C_{60}$ carbocyclic group that is unsubstituted or substituted with at least one $R_{10a}$, or a $C_1$-$C_{60}$ heterocyclic group that is unsubstituted or substituted with at least one $R_{10a}$.

In an embodiment, xe1 and xe611 to xe613 in Formulae 601 and 601-1 may each independently be 0, 1, or 2.

The electron transport region may include at least one of Compounds ET1 to ET45, 2,9-dimethyl-4,7-diphenyl-1,10-phenanthroline (BCP), 4,7-diphenyl-1,10-phenanthroline (Bphen), $Alq_3$, BAlq, TAZ, NTAZ, TSPO1, TPBI, or any combination thereof:

ET1

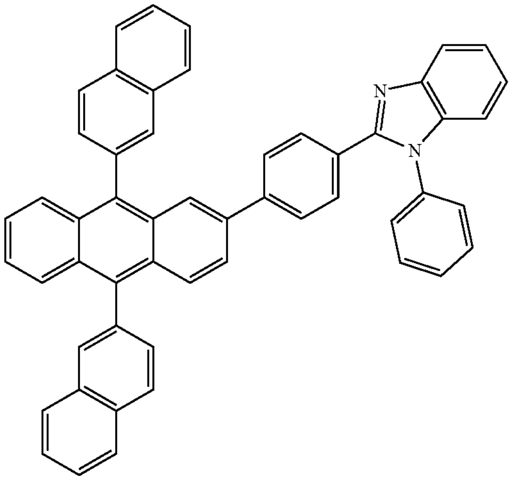

ET2

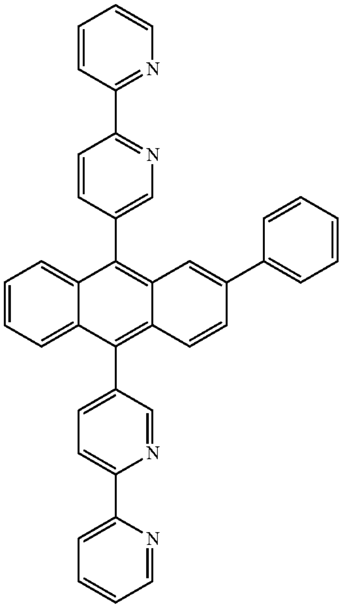

-continued

ET3

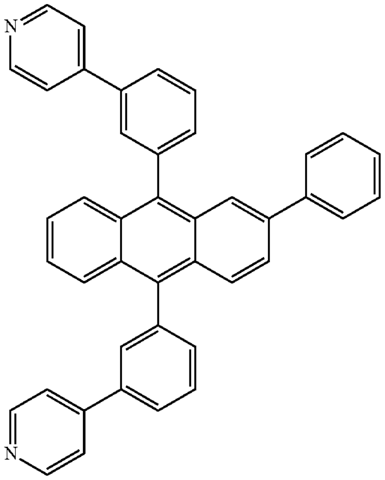

ET4

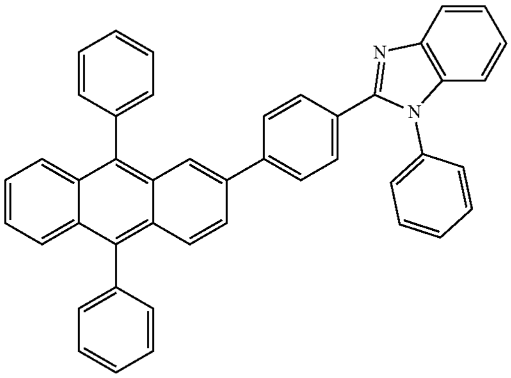

ET5

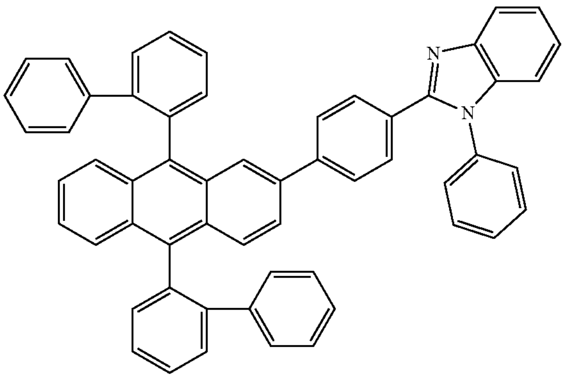

-continued
ET6
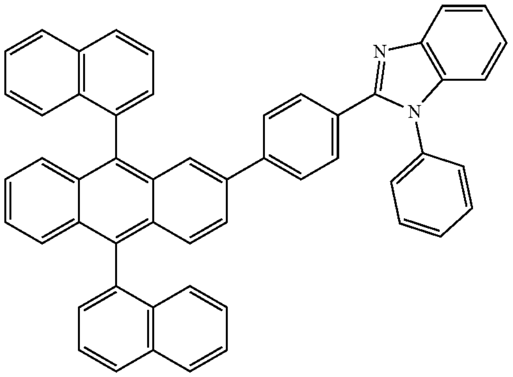
ET7
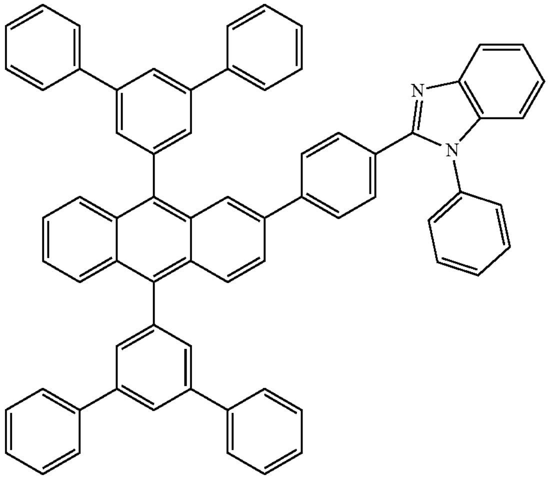
ET8
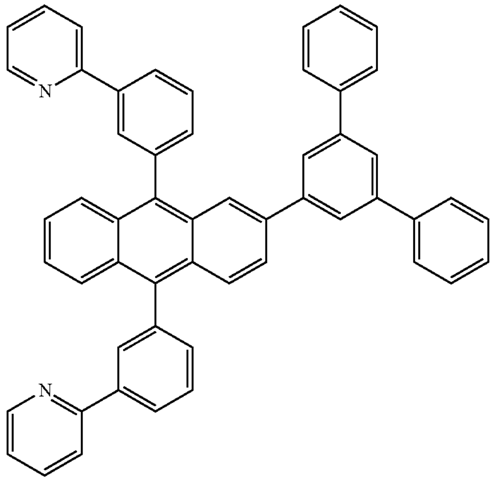
-continued
ET9
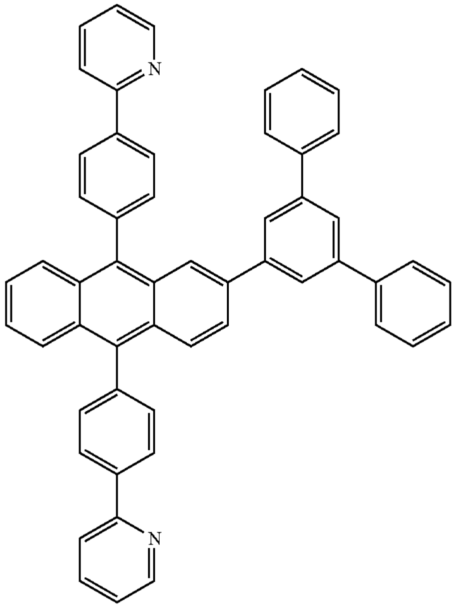
ET10
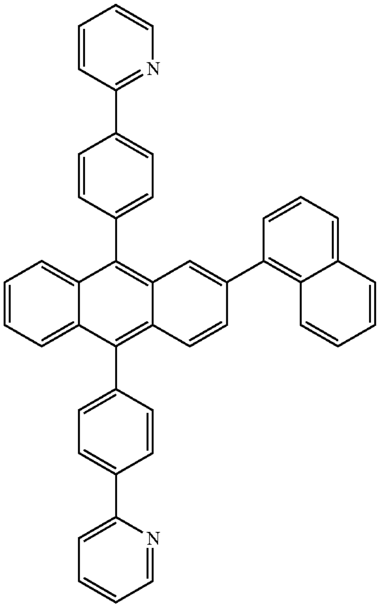

-continued
ET11
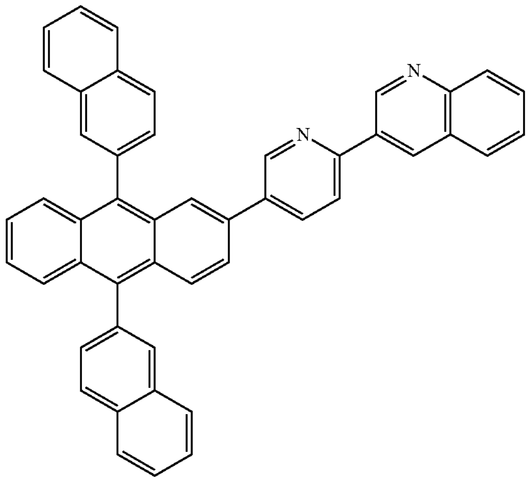
ET12
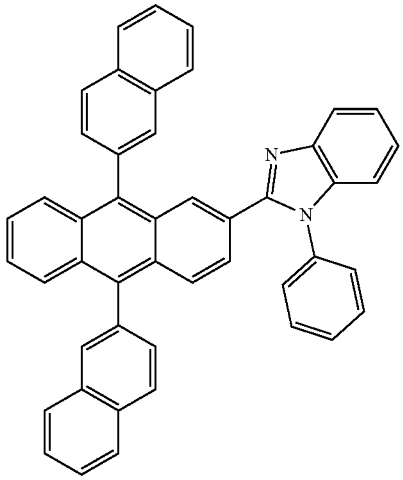
ET13
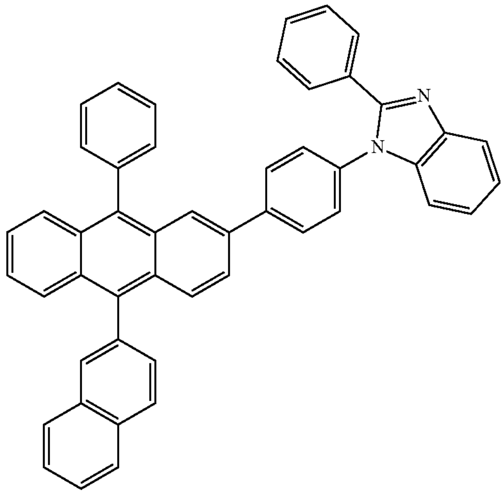
-continued
ET14
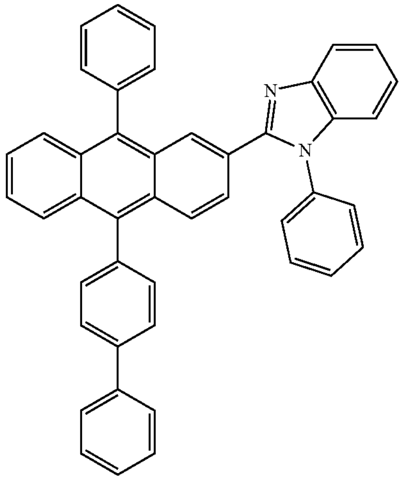
ET15
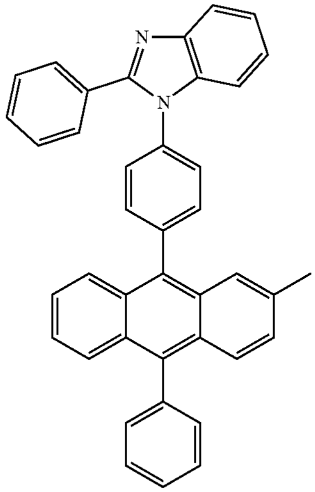
ET16
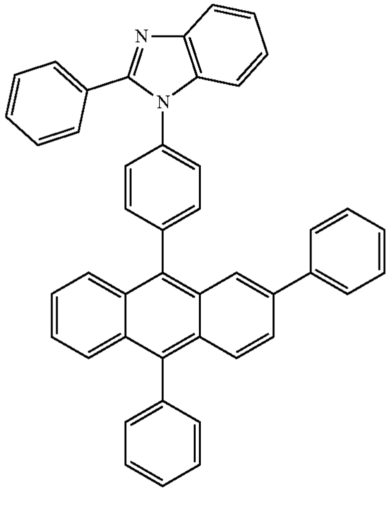

-continued
ET17
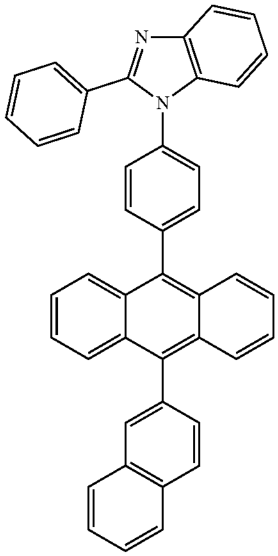
ET18
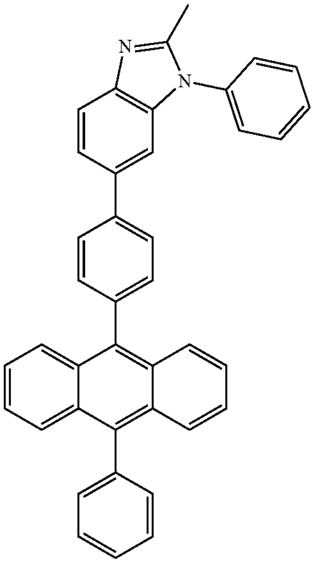
ET19
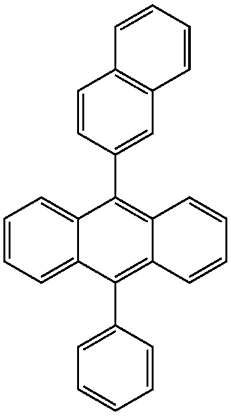
-continued
ET20
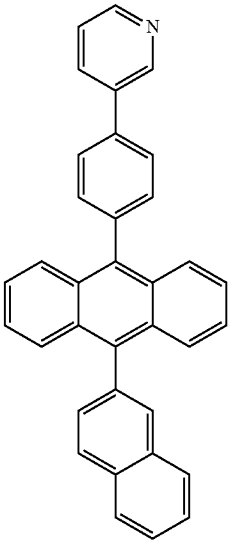
ET21
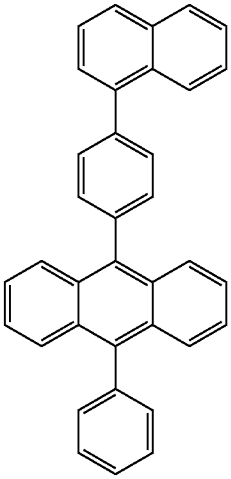
ET22
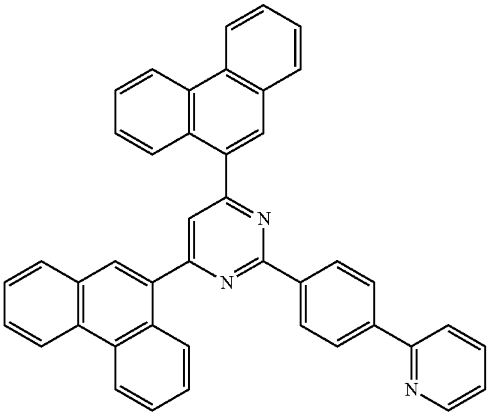

-continued
ET23
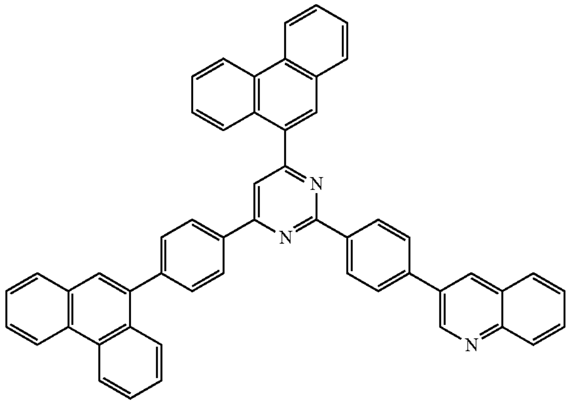
ET24
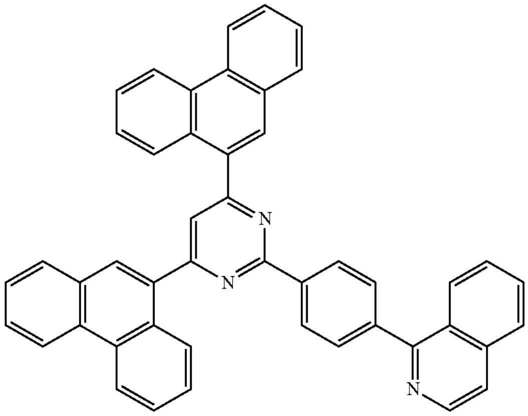
ET25
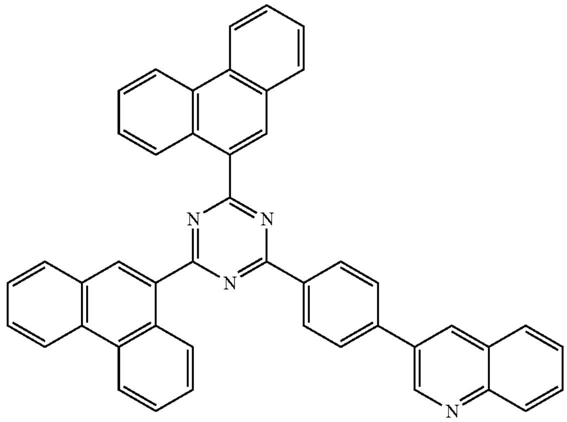
-continued
ET26
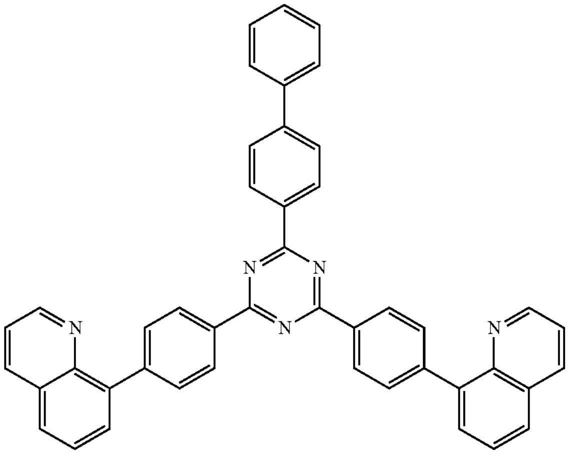
ET27
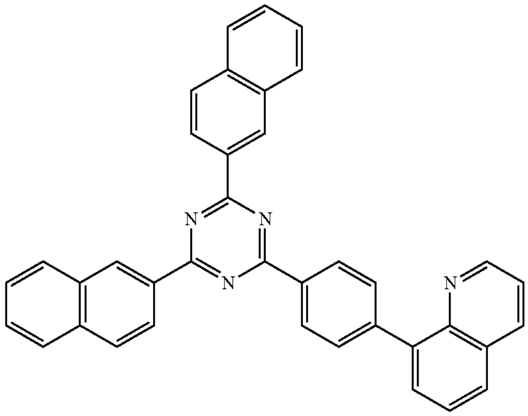
ET28
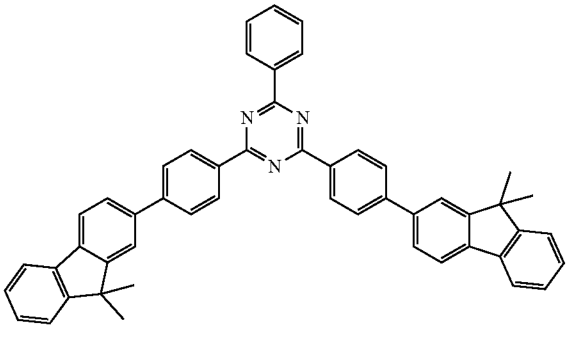

-continued
ET29
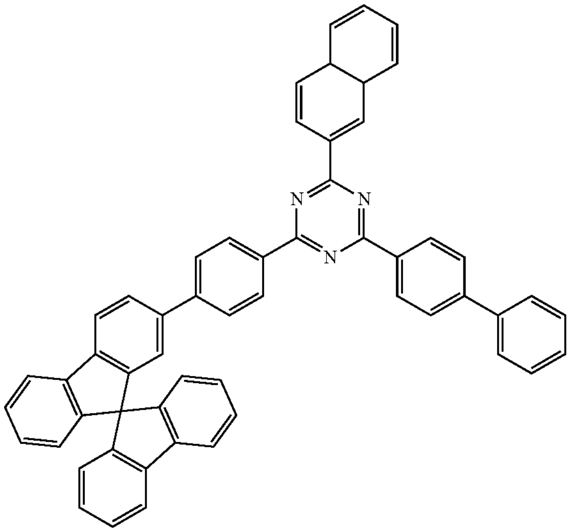
ET30
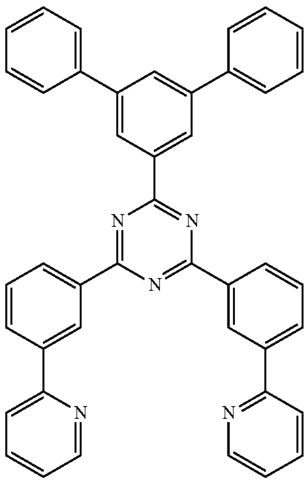
ET31
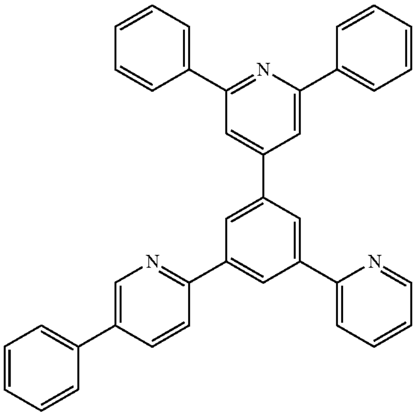
-continued
ET32
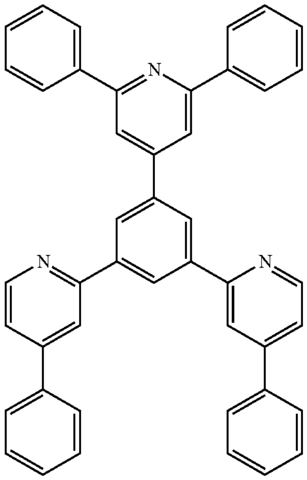
ET33
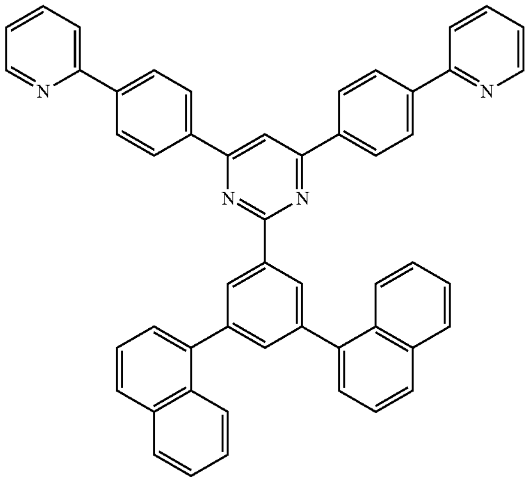
ET34
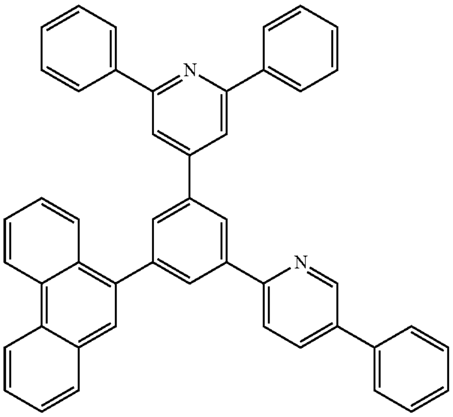

-continued
ET35
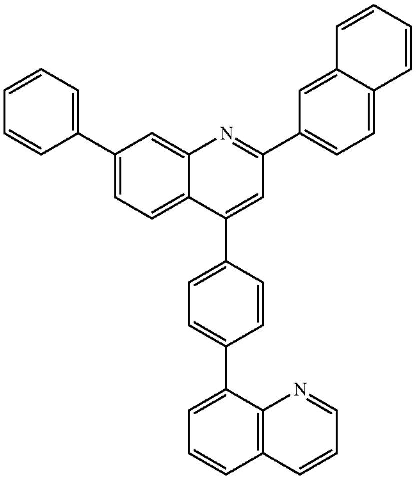
ET36
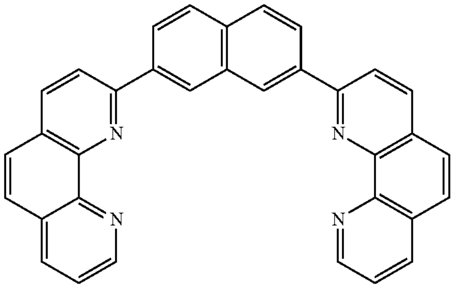
ET37
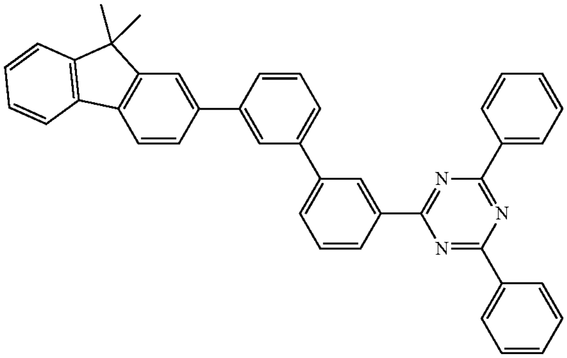
ET38
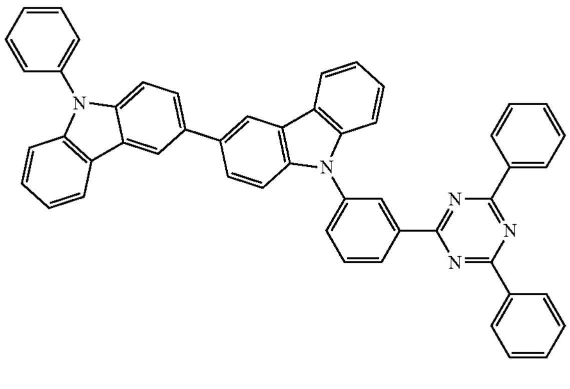
-continued
ET39
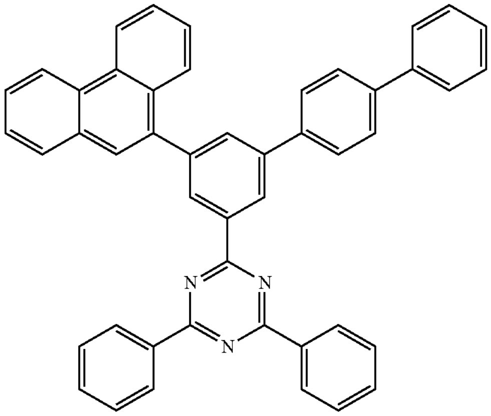
ET40
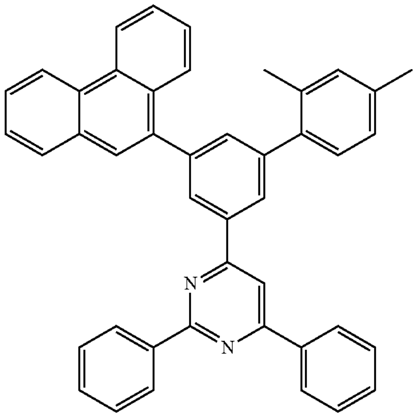
ET41
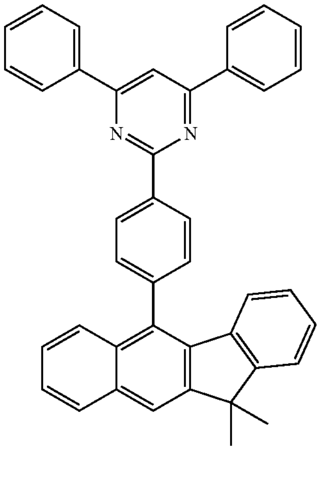

-continued
ET42
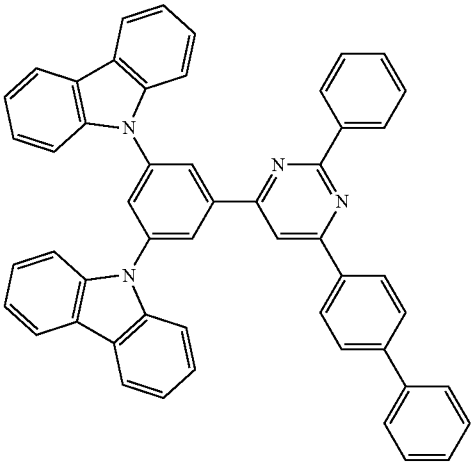
ET43
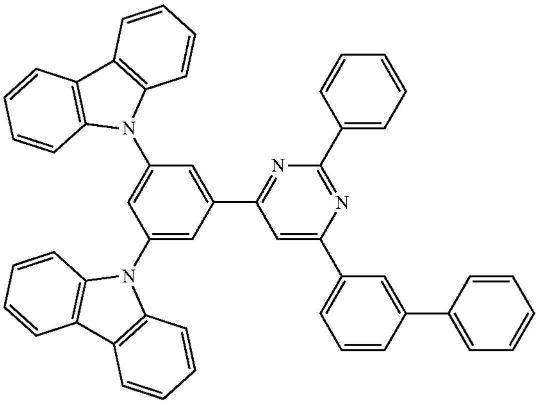
ET44
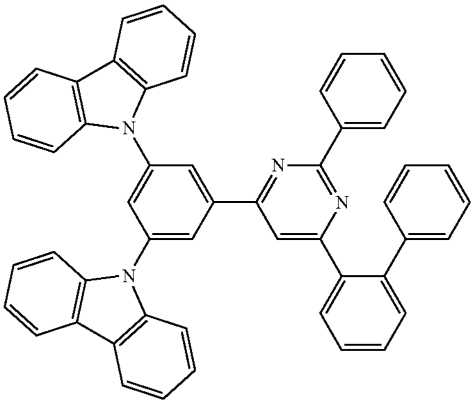
ET45
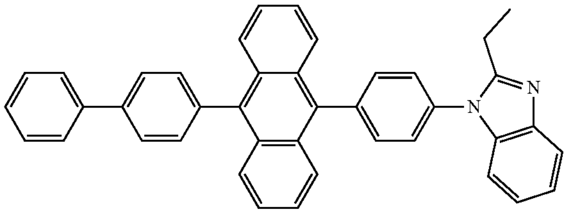
-continued
$Alq_3$
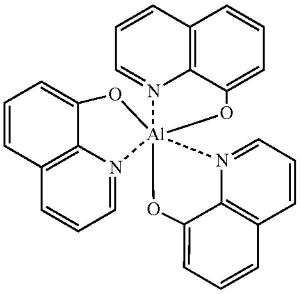
BAlq
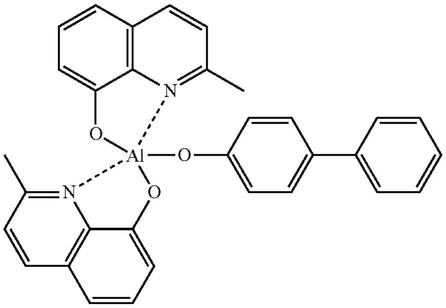
TAZ
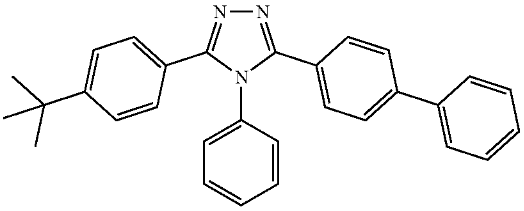
NTAZ
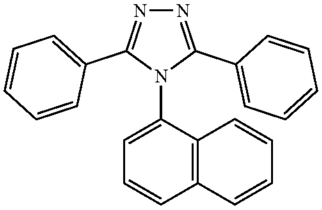
TSPO1
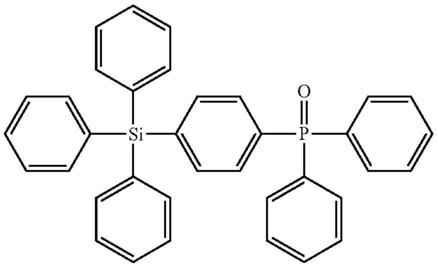

-continued

TPBI

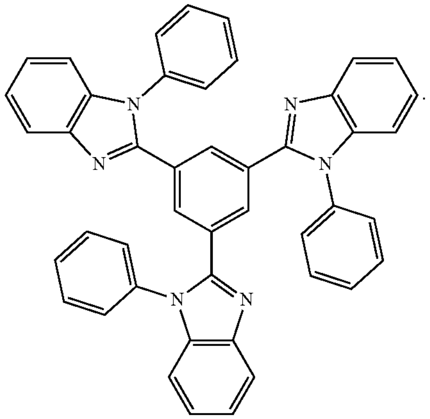

A thickness of the electron transport region may be from about 100 Å to about 5,000 Å, for example, about 160 Å to about 4,000 Å. When the electron transport region includes a buffer layer, a hole blocking layer, an electron control layer, an electron transport layer, or any combination thereof, the thickness of the buffer layer, the hole blocking layer, or the electron control layer may each independently be from about 20 Å to about 1000 Å, for example, about 30 Å to about 300 Å, and the thickness of the electron transport layer may be from about 100 Å to about 1,000 Å, for example, about 150 Å to about 500 Å. When the thickness of the buffer layer, the hole-blocking layer, the electron control layer, the electron transport layer, and/or the electron transport layer are within these ranges, satisfactory electron transporting characteristics may be obtained without a substantial increase in driving voltage.

In an embodiment, a ratio of a thickness of the first electron transport layer to a thickness of the second electron transport layer may be in a range of about 3:7 to about 7:3. In an embodiment, a ratio of the thickness of the first electron transport layer to the thickness of the second electron transport layer may be in a range of about 4:6 to about 6:4.

The electron transport region (for example, the electron transport layer in the electron transport region) may further include, in addition to the materials described above, a metal-containing material.

The metal-containing material may include an alkali metal complex, an alkaline earth metal complex, or any combination thereof. A metal ion of the alkali metal complex may be a Li ion, a Na ion, a K ion, a Rb ion, or a Cs ion, and a metal ion of the alkaline earth metal complex may be a Be ion, a Mg ion, a Ca ion, a Sr ion, or a Ba ion. A ligand coordinated with the metal ion of the alkali metal complex or the alkaline earth-metal complex may include a hydroxyquinoline, a hydroxyisoquinoline, a hydroxybenzoquinoline, a hydroxyacridine, a hydroxyphenanthridine, a hydroxyphenyloxazole, a hydroxyphenylthiazole, a hydroxyphenyloxadiazole, a hydroxyphenylthiadiazole, a hydroxyphenylpyridine, a hydroxyphenylbenzimidazole, a hydroxyphenylbenzothiazole, a bipyridine, a phenanthroline, a cyclopentadiene, or any combination thereof.

In an embodiment, the metal-containing material may include a Li complex. The Li complex may include, for example, Compound ET-D1 (LiQ) or ET-D2:

ET-D1

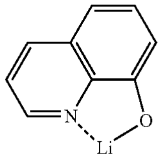

ET-D2

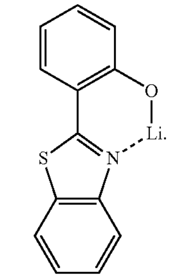

The electron transport region may include an electron injection layer that facilitates the injection of electrons from the second electrode 150. The electron injection layer may be in direct contact with the second electrode 150.

The electron injection layer may have: i) a single-layered structure consisting of a single layer consisting of a single material, ii) a single-layered structure consisting of a single layer including (e.g., consisting of) a plurality of different materials, or iii) a multi-layered structure including a plurality of layers including different materials.

The electron injection layer may include an alkali metal, an alkaline earth metal, a rare earth metal, an alkali metal-containing compound, an alkaline earth metal-containing compound, a rare earth metal-containing compound, an alkali metal complex, an alkaline earth metal complex, a rare earth metal complex, or any combination thereof.

The alkali metal may include Li, Na, K, Rb, Cs, or any combination thereof. The alkaline earth metal may include Mg, Ca, Sr, Ba, or any combination thereof. The rare earth metal may include Sc, Y, Ce, Tb, Yb, Gd, or any combination thereof.

The alkali metal-containing compound, the alkaline earth metal-containing compound, and the rare earth metal-containing compound may include one or more oxides, halides (for example, fluorides, chlorides, bromides, and/or iodides), and/or tellurides of the alkali metal, the alkaline earth metal, and/or the rare earth metal, or any combination thereof.

The alkali metal-containing compound may include one or more alkali metal oxides, such as $Li_2O$, $Cs_2O$, and/or $K_2O$, alkali metal halides, such as LiF, NaF, CsF, KF, LiI, NaI, CsI, and/or KI, or any combination thereof. The alkaline earth metal-containing compound may include an alkaline earth metal compound, such as BaO, SrO, CaO, $Ba_xSr_{1-x}O$ (x is a real number satisfying the condition of $0<x<1$), $Ba_xCa_{1-x}O$ (x is a real number satisfying the condition of $0<x<1$), and/or the like. The rare earth metal-containing compound may include $YbF_3$, $ScF_3$, $Sc_2O_3$, $Y_2O_3$, $Ce_2O_3$, $GdF_3$, $TbF_3$, $YbI_3$, $ScI_3$, $TbI_3$, or any combination thereof. In an embodiment, the rare earth metal-containing compound may include lanthanide metal telluride. Examples of the lanthanide metal telluride may include LaTe, CeTe, PrTe, NdTe, PmTe, SmTe, EuTe, GdTe, TbTe, DyTe, HoTe, ErTe, TmTe, YbTe, LuTe, $La_2Te_3$, $Ce_2Te_3$, $Pr_2Te_3$, $Nd_2Te_3$, $Pm_2Te_3$, $Sm_2Te_3$, $Eu_2Te_3$, $Gd_2Te_3$, $Tb_2Te_3$, $Dy_2Te_3$, $Ho_2Te_3$, $Er_2Te_3$, $Tm_2Te_3$, $Yb_2Te_3$, and $Lu_2Te_3$.

The alkali metal complex, the alkaline earth-metal complex, and the rare earth metal complex may include i) one of ions of the alkali metal, the alkaline earth metal, and the rare earth metal and ii), as a ligand bonded to the metal ion, for example, a hydroxyquinoline, a hydroxyisoquinoline, a hydroxybenzoquinoline, a hydroxyacridine, a hydroxyphenanthridine, a hydroxyphenyloxazole, a hydroxyphenylthiazole, a hydroxyphenyloxadiazole, a hydroxyphenylthiadiazole, a hydroxyphenylpyridine, a hydroxyphenyl benzimidazole, a hydroxyphenylbenzothiazole, a bipyridine, a phenanthroline, a cyclopentadiene, or any combination thereof.

The electron injection layer may include (e.g., consist of) an alkali metal, an alkaline earth metal, a rare earth metal, an alkali metal-containing compound, an alkaline earth metal-containing compound, a rare earth metal-containing compound, an alkali metal complex, an alkaline earth metal complex, a rare earth metal complex, or any combination thereof, as described above. In an embodiment, the electron injection layer may further include an organic material (for example, a compound represented by Formula 601).

In an embodiment, the electron injection layer may include (e.g., consist of) i) an alkali metal-containing compound (for example, an alkali metal halide), or ii) a) an alkali metal-containing compound (for example, an alkali metal halide); and b) an alkali metal, an alkaline earth metal, a rare earth metal, or any combination thereof. For example, the electron injection layer may be a KI:Yb co-deposited layer, a RbI:Yb co-deposited layer, a LiF:Yb co-deposited, and/or the like.

When the electron injection layer further includes an organic material, the alkali metal, the alkaline earth metal, the rare earth metal, the alkali metal-containing compound, the alkaline earth metal-containing compound, the rare earth metal-containing compound, the alkali metal complex, the alkaline earth-metal complex, the rare earth metal complex, or any combination thereof may be homogeneously or non-homogeneously dispersed in a matrix including the organic material.

A thickness of the electron injection layer may be in a range of about 1 Å to about 100 Å, and, for example, about 3 Å to about 90 Å. When the thickness of the electron injection layer is within the ranges described above, satisfactory electron injection characteristics may be obtained without a substantial increase in driving voltage.

Second Electrode 150

The second electrode 150 may be located on the interlayer 130 having such a structure as described above. The second electrode 150 may be a cathode, which is an electron injection electrode, and as the material for the second electrode 150, a metal, an alloy, an electrically conductive compound, or any combination thereof, each having a low work function, may be utilized.

In an embodiment, the second electrode 150 may include lithium (Li), silver (Ag), magnesium (Mg), aluminum (Al), aluminum-lithium (Al—Li), calcium (Ca), magnesium-indium (Mg—In), magnesium-silver (Mg—Ag), ytterbium (Yb), silver-ytterbium (Ag—Yb), ITO, IZO, or a combination thereof. The second electrode 150 may be a transmissive electrode, a semi-transmissive electrode, or a reflective electrode.

The second electrode 150 may have a single-layered structure or a multi-layered structure including two or more layers.

Capping Layer

A first capping layer may be located outside the first electrode 110 (e.g., on the side of the first electrode 110 facing oppositely away from the second electrode 150), and/or a second capping layer may be located outside the second electrode 150 (e.g., on the side of the second electrode 150 facing oppositely away from the first electrode 110). In one or embodiments, the light-emitting device 10 may have a structure in which the first capping layer, the first electrode 110, the interlayer 130, and the second electrode 150 are sequentially stacked in this stated order, a structure in which the first electrode 110, the interlayer 130, the second electrode 150, and the second capping layer are sequentially stacked in this stated order, or a structure in which the first capping layer, the first electrode 110, the interlayer 130, the second electrode 150, and the second capping layer are sequentially stacked in this stated order.

Light generated in an emission layer of the interlayer 130 of the light-emitting device 10 may be extracted (e.g., emitted) toward the outside through the first electrode 110, which is a semi-transmissive electrode or a transmissive electrode, and the first capping layer or light generated in an emission layer of the interlayer 130 of the light-emitting device 10 may be extracted (e.g., emitted) toward the outside through the second electrode 150, which is a semi-transmissive electrode or a transmissive electrode, and the second capping layer.

The first capping layer and the second capping layer may increase external emission efficiency according to the principle of constructive interference. Accordingly, the light extraction efficiency of the light-emitting device 10 is increased, so that the emission efficiency of the light-emitting device 10 may be improved.

Each of the first capping layer and second capping layer may include a material having a refractive index (at a wavelength of 589 nm) of 1.6 or more.

The first capping layer and the second capping layer may each independently be an organic capping layer including an organic material, an inorganic capping layer including an inorganic material, or an organic-inorganic composite capping layer including an organic material and an inorganic material.

At least one of the first capping layer or the second capping layer may each independently include one or more carbocyclic compounds, heterocyclic compounds, amine group-containing compounds, porphyrin derivatives, phthalocyanine derivatives, naphthalocyanine derivatives, alkali metal complexes, alkaline earth metal complexes, or any combination thereof. The carbocyclic compound, the heterocyclic compound, and the amine group-containing compound may be optionally substituted with a substituent containing O, N, S, Se, Si, F, Cl, Br, I, or any combination thereof. In an embodiment, at least one of the first capping layer or the second capping layer may each independently include an amine group-containing compound.

In an embodiment, at least one of the first capping layer or the second capping layer may each independently include a compound represented by Formula 201, a compound represented by Formula 202, or any combination thereof.

In an embodiment, at least one of the first capping layer or the second capping layer may each independently include at least one of Compounds HT28 to HT33, at least one of Compounds CP1 to CP6, β-NPB, P4, or any combination thereof:

CP1

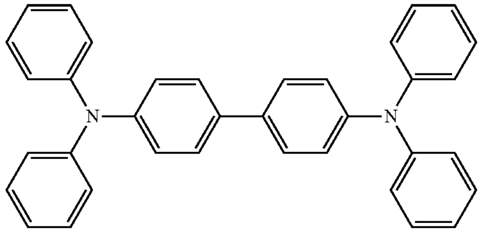

CP2

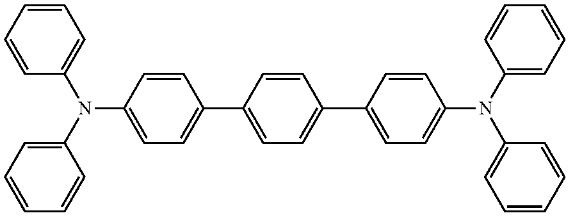

CP3

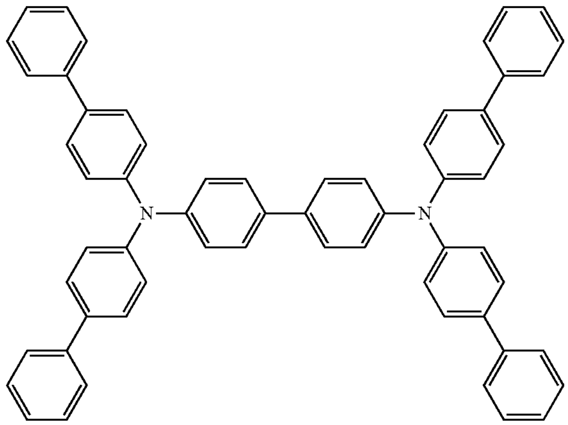

CP4

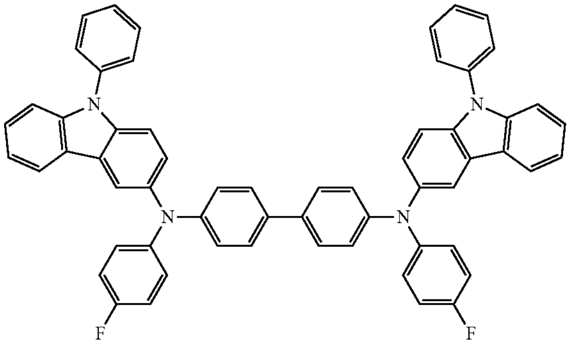

CP5

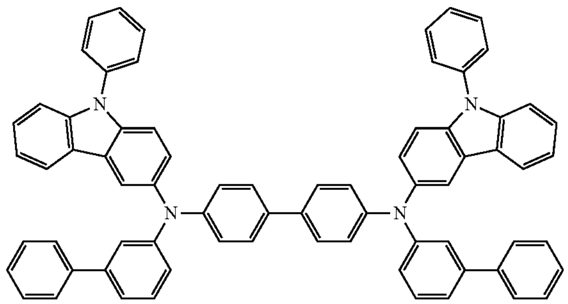

-continued

CP6

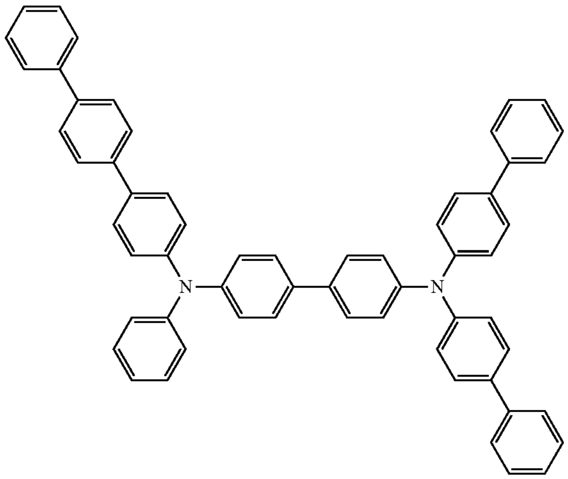

β-NPB

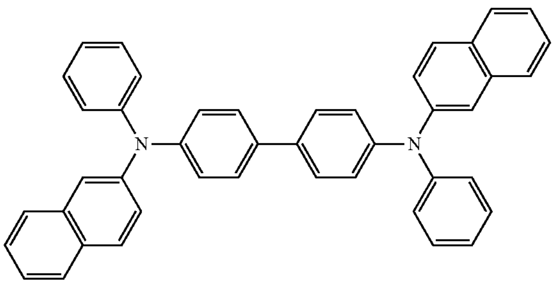

P4

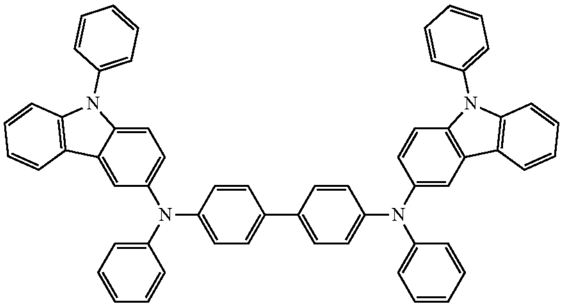

.

Electronic Apparatus

The light-emitting device may be included in one or more suitable electronic apparatuses. In an embodiment, the electronic apparatus including the light-emitting device may be a light-emitting apparatus, an authentication apparatus, and/or the like.

The electronic apparatus (for example, light-emitting apparatus) may further include, in addition to the light-emitting device, i) a color filter, ii) a color conversion layer, or iii) a color filter and a color conversion layer. The color filter and/or the color conversion layer may be located in at least one traveling direction of light emitted from the light-emitting device. For example, the light emitted from the light-emitting device may be blue light or white light. The light-emitting device may be the same as described above. In an embodiment, the color conversion layer may include quantum dots. The quantum dot may be, for example, a quantum dot as described herein.

The electronic apparatus may include a first substrate. The first substrate may include a plurality of subpixel areas, the color filter may include a plurality of color filter areas respectively corresponding to the plurality of subpixel areas, and the color conversion layer may include a plurality of color conversion areas respectively corresponding to the plurality of subpixel areas.

A pixel-defining layer may be located among the plurality of subpixel areas to define each of the subpixel areas.

The color filter may further include a plurality of color filter areas and light-shielding patterns located among the plurality of color filter areas, and the color conversion layer may include a plurality of color conversion areas and light-shielding patterns located among the plurality of color conversion areas.

The plurality of color filter areas (or the color conversion areas) may include a first area emitting a first color light, a second area emitting a second color light, and/or a third area emitting a third color light, and the first color light, the second color light, and/or the third color light may have different maximum emission wavelengths from one another. In an embodiment, the first color light may be red light, the second color light may be green light, and the third color light may be blue light. In an embodiment, the plurality of color filter areas (or the plurality of color conversion areas) may include quantum dots. For example, the first area may include a red quantum dot, the second area may include a green quantum dot, and the third area may not include (e.g., may exclude) any quantum dots. The quantum dot is the same as described in the present specification. The first area, the second area, and/or the third area may each further include a scatterer.

In an embodiment, the light-emitting device may be to emit a first light, the first area may be to absorb the first light to emit a first first-color light, the second area may be to absorb the first light to emit a second first-color light, and the third area may be to absorb the first light to emit a third first-color light. In this regard, the first first-color light, the second first-color light, and the third first-color light may have different maximum emission wavelengths. For example, the first light may be blue light, the first first-color light may be red light, the second first-color light may be green light, and the third first-color light may be blue light.

The electronic apparatus may further include a thin-film transistor in addition to the light-emitting device as described above. The thin-film transistor may include a source electrode, a drain electrode, and an activation layer, wherein the source electrode or the drain electrode may be electrically connected to the first electrode or the second electrode of the light-emitting device.

The thin-film transistor may further include a gate electrode, a gate insulating film, etc.

The activation layer may include crystalline silicon, amorphous silicon, an organic semiconductor, an oxide semiconductor, and/or the like.

The electronic apparatus may further include a sealing portion for sealing the light-emitting device. The sealing portion and/or the color conversion layer may be located between the color filter and the light-emitting device. The sealing portion allows light from the light-emitting device to be extracted to the outside, while concurrently (e.g., simultaneously) preventing or reducing ambient air and/or moisture from penetrating into the light-emitting device. The sealing portion may be a sealing substrate including a transparent glass substrate and/or a plastic substrate. The sealing portion may be a thin-film encapsulation layer including at least one layer of an organic layer and/or an inorganic layer. When the sealing portion is a thin film encapsulation layer, the electronic apparatus may be flexible.

Various suitable functional layers may be additionally located on the sealing portion, in addition to the color filter and/or the color conversion layer, according to the usage of the electronic apparatus. The functional layers may include a touch screen layer, a polarizing layer, and/or the like. The touch screen layer may be a pressure-sensitive touch screen layer, a capacitive touch screen layer, or an infrared touch screen layer. The authentication apparatus may be, for example, a biometric authentication apparatus that authenticates an individual by utilizing biometric information of a living body (for example, fingertips, pupils, etc.).

The authentication apparatus may further include, in addition to the light-emitting device, a biometric information collector.

The electronic apparatus may be applied to one or more suitable displays, light sources, lighting apparatuses, personal computers (for example, a mobile personal computer), mobile phones, digital cameras, electronic organizers (e.g., diaries), electronic dictionaries, electronic game machines, medical instruments (for example, electronic thermometers, sphygmomanometers, blood glucose meters, pulse measurement devices, pulse wave measurement devices, electrocardiogram displays, ultrasonic diagnostic devices, and/or endoscope displays), fish finders, one or more suitable measuring instruments, meters (for example, meters for a vehicle, an aircraft, and a vessel), projectors, and/or the like.

Figure 2:
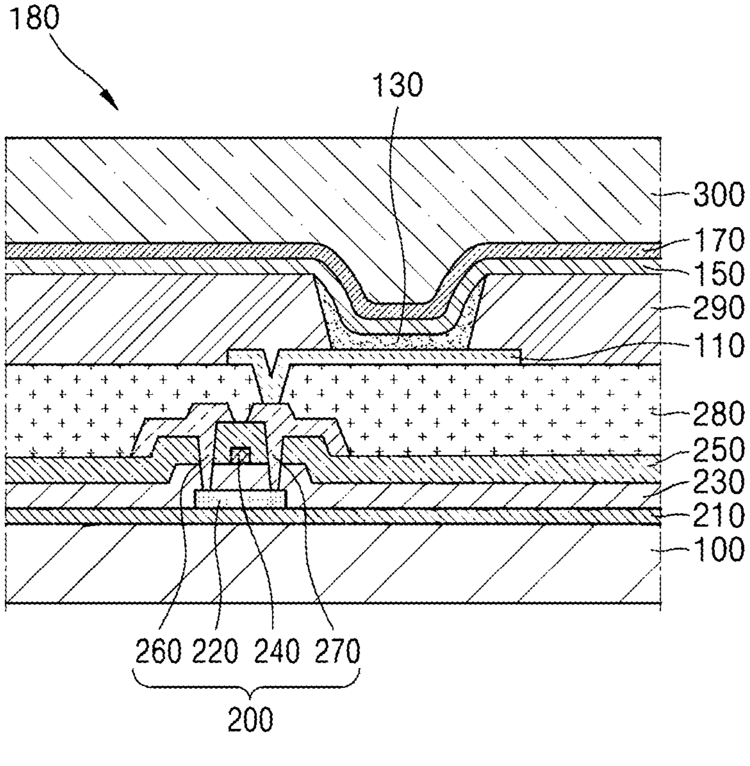
FIG. 2 is a schematic cross-sectional view of an electronic apparatus according to an embodiment.
Figure 3:
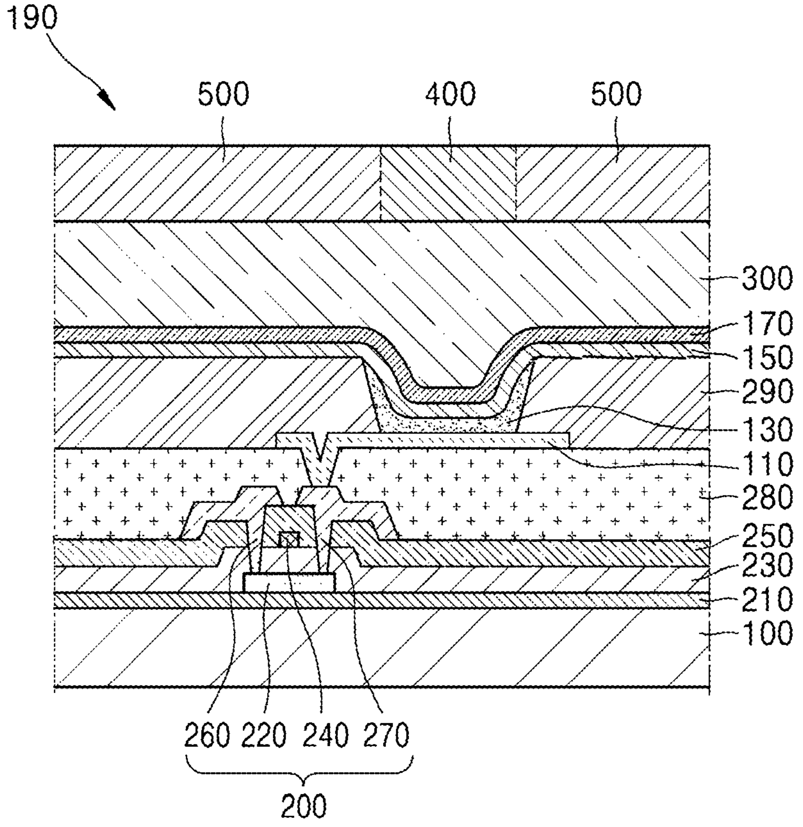
FIG. 3 is a schematic cross-sectional view of an electronic apparatus according to an embodiment.

Description of FIGS. 2 and 3

FIG. 2 is a cross-sectional view of a light-emitting apparatus 180 according to an embodiment of the disclosure.

The light-emitting apparatus 180 of FIG. 2 includes a substrate 100, a thin-film transistor (TFT), a light-emitting device, and an encapsulation portion 300 that seals the light-emitting device.

The substrate 100 may be a flexible substrate, a glass substrate, or a metal substrate. A buffer layer 210 may be formed on the substrate 100. The buffer layer 210 may prevent or reduce penetration of impurities through the substrate 100 and may provide a flat surface on the substrate 100.

A TFT may be located on the buffer layer 210. The TFT may include an activation layer 220, a gate electrode 240, a source electrode 260, and a drain electrode 270.

The activation layer 220 may include an inorganic semiconductor such as silicon and/or polysilicon, an organic semiconductor, and/or an oxide semiconductor, and may include a source region, a drain region and a channel region.

A gate insulating film 230 for insulating the activation layer 220 from the gate electrode 240 may be located on the activation layer 220, and the gate electrode 240 may be located on the gate insulating film 230.

An interlayer insulating film 250 may be located on the gate electrode 240. The interlayer insulating film 250 may be placed between the gate electrode 240 and the source electrode 260 to insulate the gate electrode 240 from the source electrode 260 and between the gate electrode 240 and the drain electrode 270 to insulate the gate electrode 240 from the drain electrode 270.

The source electrode 260 and the drain electrode 270 may be located on the interlayer insulating film 250. The interlayer insulating film 250 and the gate insulating film 230 may be formed to expose the source region and the drain region of the activation layer 220, and the source electrode 260 and the drain electrode 270 may be in contact with the exposed portions of the source region and the drain region of the activation layer 220.

The TFT is electrically connected to a light-emitting device to drive the light-emitting device, and is covered by a passivation layer 280. The passivation layer 280 may include an inorganic insulating film, an organic insulating film, or a combination thereof. A light-emitting device is provided on the passivation layer 280. The light-emitting device may include a first electrode 110, an interlayer 130, and a second electrode 150.

The first electrode 110 may be formed on the passivation layer 280. The passivation layer 280 does not completely cover the drain electrode 270 and exposes a portion of the drain electrode 270, and the first electrode 110 may be connected to the exposed portion of the drain electrode 270.

A pixel-defining layer 290 containing an insulating material may be located on the first electrode 110. The pixel-defining layer 290 exposes a region of the first electrode 110, and an interlayer 130 may be formed in the exposed region of the first electrode 110. The pixel-defining layer 290 may be a polyimide or polyacrylic organic film. In one embodiment, one or more layers of the interlayer 130 may extend beyond the upper portion of the pixel-defining layer 290 in the form of a common layer.

The second electrode 150 may be located on the interlayer 130, and a capping layer 170 may be additionally formed on the second electrode 150. The capping layer 170 may be formed to cover the second electrode 150.

The encapsulation portion 300 may be located on the capping layer 170. The encapsulation portion 300 may be located on a light-emitting device to protect the light-emitting device from moisture and/or oxygen. The encapsulation portion 300 may include: an inorganic film including silicon nitride (SiNx), silicon oxide (SiOx), indium tin oxide, indium zinc oxide, or any combination thereof; an organic film including polyethylene terephthalate, polyethylene naphthalate, polycarbonate, polyimide, polyethylene sulfonate, polyoxymethylene, polyarylate, hexamethyldisiloxane, an acrylic resin (for example, polymethyl methacrylate, polyacrylic acid, and/or the like), an epoxy-based resin (for example, aliphatic glycidyl ether (AGE), and/or the like), or a combination thereof; or a combination of the inorganic film and the organic film.

FIG. 3 is a cross-sectional view of a light-emitting apparatus 190 according to an embodiment of the disclosure.

The light-emitting apparatus 190 of FIG. 3 is the same as the light-emitting apparatus 180 of FIG. 2, except that a light-shielding pattern 500 and a functional region 400 are additionally located on the encapsulation portion 300. The functional region 400 may be i) a color filter area, ii) a color conversion area, or iii) a combination of the color filter area and the color conversion area. In an embodiment, the light-emitting device included in the light-emitting apparatus of FIG. 3 may be a tandem light-emitting device.

Manufacturing Method

Respective layers included in the hole transport region, the emission layer, and respective layers included in the electron transport region may be formed in a certain region by utilizing one or more suitable methods selected from vacuum deposition, spin coating, casting, Langmuir-Blodgett (LB) deposition, ink-jet printing, laser-printing, and laser-induced thermal imaging.

When layers constituting the hole transport region, an emission layer, and layers constituting the electron transport region are formed by vacuum deposition, the vacuum deposition may be performed at a deposition temperature of about 100° C. to about 500° C., a vacuum degree of about $10^{-8}$ torr to about $10^{-3}$ torr, and a deposition speed of about 0.01 Å/sec to about 100 Å/sec, depending on a material to be included in a layer to be formed and the structure of a layer to be formed.

Definition of Terms

The term "$C_3$-$C_{60}$ carbocyclic group" as used herein refers to a cyclic group consisting of only three to sixty carbon atoms as ring-forming atoms, and the term "$C_1$-$C_{60}$ heterocyclic group" as used herein refers to a cyclic group that has, in addition to one to sixty carbon atoms, a heteroatom as a ring-forming atom. The $C_3$-$C_{60}$ carbocyclic group and the $C_1$-$C_{60}$ heterocyclic group may each be a monocyclic group consisting of one ring or a polycyclic group in which two or more rings are condensed with each other. In an embodiment, the $C_1$-$C_{60}$ heterocyclic group has 3 to 61 ring-forming atoms.

The term "cyclic group" as used herein may include the $C_3$-$C_{60}$ carbocyclic group and the $C_1$-$C_{60}$ heterocyclic group.

The term "π electron-rich $C_3$-$C_{60}$ cyclic group" as used herein refers to a cyclic group that has three to sixty carbon atoms and does not include *—N=*' as a ring-forming moiety, and the term "π electron-deficient nitrogen-containing $C_1$-$C_{60}$ cyclic group" as used herein refers to a heterocyclic group that has one to sixty carbon atoms and includes *—N=*' as a ring-forming moiety.

In an embodiment, the $C_3$-$C_{60}$ carbocyclic group may be i) a group T1 or ii) a condensed cyclic group in which two or more groups T1 are condensed with each other (for example, the $C_3$-$C_{60}$ carbocyclic group may be a cyclopentadiene group, an adamantane group, a norbornane group, a benzene group, a pentalene group, a naphthalene group, an azulene group, an indacene group, an acenaphthylene group, a phenalene group, a phenanthrene group, an anthracene group, a fluoranthene group, a triphenylene group, a pyrene group, a chrysene group, a perylene group, a pentaphene group, a heptalene group, a naphthacene group, a picene group, a hexacene group, a pentacene group, a rubicene group, a coronene group, an ovalene group, an indene group, a fluorene group, a spiro-bifluorene group, a benzofluorene group, an indenophenanthrene group, or an indenoanthracene group), the $C_1$-$C_{60}$ heterocyclic group may be i) a group T2, ii) a condensed cyclic group in which two or more groups T2 are condensed with each other, or iii) a condensed cyclic group in which at least one group T2 and at least one group T1 are condensed with each other (for example, the $C_1$-$C_{60}$ heterocyclic group may be a pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonaphthothiophene group, a benzonaphthosilole group, a benzofurodibenzofuran group, a benzofurodibenzothiophene group, a benzothienodibenzothiophene group, a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, an azadibenzofuran group, etc.), the π electron-rich $C_3$-$C_{60}$ cyclic group may be i) a group T1, ii) a condensed cyclic group in which two or more groups T1 are condensed with each other, iii) a group T3, iv) a condensed cyclic group in which two or more groups T3 are condensed with each other, or v) a condensed cyclic group in which at least one group T3 and at least one group T1 are condensed with each other (for example, the π electron-rich $C_3$-$C_{60}$ cyclic group may be the $C_3$-$C_{60}$ carbocyclic group, a 1H-pyrrole group, a silole group, a borole group, a 2H-pyrrole group, a 3H-pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonaphthothiophene group, a benzonaphthosilole group, a benzofurodibenzofuran group, a benzofurodibenzothiophene group, a benzothienodibenzothiophene group, etc.), and the π electron-deficient nitrogen-containing $C_1$-$C_{60}$ cyclic group may be i) a group T4, ii) a condensed cyclic group in which two or more group T4 are condensed with each other, iii) a condensed cyclic group in which at least one group T4 and at least one group T1 are condensed with each other, iv) a condensed cyclic group in which at least one group T4 and at least one group T3 are condensed with each other, or v) a condensed cyclic group in which at least one group T4, at least one group T1, and at least one group T3 are condensed with one another (for example, the π electron-deficient nitrogen-containing $C_1$-$C_{60}$ cyclic group may be a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, an azadibenzofuran group, etc.), wherein the group T1 may be a cyclopropane group, a cyclobutane group, a cyclopentane group, a cyclohexane group, a cycloheptane group, a cyclooctane group, a cyclobutene group, a cyclopentene group, a cyclopentadiene group, a cyclohexene group, a cyclohexadiene group, a cycloheptene group, an adamantane group, a norbornane (or a bicyclo[2.2.1]heptane) group, a norbornene group, a bicyclo[1.1.1]pentane group, a bicyclo[2.1.1]hexane group, a bicyclo[2.2.2]octane group, or a benzene group, the group T2 may be a furan group, a thiophene group, a 1H-pyrrole group, a silole group, a borole group, a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, a tetrazine group, a pyrrolidine group, an imidazolidine group, a dihydropyrrole group, a piperidine group, a tetrahydropyridine group, a dihydropyridine group, a hexahydropyrimidine group, a tetrahydropyrimidine group, a dihydropyrimidine group, a piperazine group, a tetrahydropyrazine group, a dihydropyrazine group, a tetrahydropyridazine group, or a dihydropyridazine group, the group T3 may be a furan group, a thiophene group, a 1H-pyrrole group, a silole group, or a borole group, and the group T4 may be a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, or a tetrazine group.

The term "cyclic group", "$C_3$-$C_{60}$ carbocyclic group", "$C_1$-$C_{60}$ heterocyclic group", "π electron-rich $C_3$-$C_{60}$ cyclic group", or "π electron-deficient nitrogen-containing $C_1$-$C_{60}$ cyclic group" as used herein each refers to a group condensed to any cyclic group, a monovalent group, or a polyvalent group (for example, a divalent group, a trivalent group, a tetravalent group, etc.), depending on the structure of a formula in connection with which the terms are used. In an embodiment, "a benzene group" may be a benzo group, a phenyl group, a phenylene group, and/or the like, which may be easily understood by one of ordinary skill in the art according to the structure of a formula including the "benzene group."

Examples of the monovalent $C_3$-$C_{60}$ carbocyclic group and the monovalent $C_1$-$C_{60}$ heterocyclic group may include a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group, and examples of the divalent $C_3$-$C_{60}$ carbocyclic group and the divalent $C_1$-$C_{60}$ heterocyclic group may include a $C_3$-$C_{10}$ cycloalkylene group, a $C_1$-$C_{10}$ heterocycloalkylene group, a $C_3$-$C_{10}$ cycloalkenylene group, a $C_1$-$C_{10}$ heterocycloalkenylene group, a $C_6$-$C_{60}$ arylene group, a $C_1$-$C_{60}$ heteroarylene group, a divalent non-aromatic condensed polycyclic group, and a substituted or unsubstituted divalent non-aromatic condensed heteropolycyclic group.

The term "$C_1$-$C_{60}$ alkyl group" as used herein refers to a linear or branched aliphatic hydrocarbon monovalent group that has one to sixty carbon atoms, and examples thereof may include a methyl group, an ethyl group, an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, and a tert-decyl group. The term "$C_1$-$C_{60}$ alkylene group" as used herein refers to a divalent group having substantially the same structure as the $C_1$-$C_{60}$ alkyl group.

The term "$C_2$-$C_{60}$ alkenyl group" as used herein refers to a monovalent hydrocarbon group having at least one carbon-carbon double bond in the middle and/or at a terminal end (e.g., the terminus) of the $C_2$-$C_{60}$ alkyl group, and examples thereof may include an ethenyl group, a propenyl group, and a butenyl group. The term "$C_2$-$C_{60}$ alkenylene group" as used herein refers to a divalent group having substantially the same structure as the $C_2$-$C_{60}$ alkenyl group.

The term "$C_2$-$C_{60}$ alkynyl group" as used herein refers to a monovalent hydrocarbon group having at least one carbon-carbon triple bond in the middle and/or at a terminal end (e.g., the terminus) of the $C_2$-$C_{60}$ alkyl group, and examples thereof may include an ethynyl group and a propynyl group. The term "$C_2$-$C_{60}$ alkynylene group" as used herein refers to a divalent group having substantially the same structure as the $C_2$-$C_{60}$ alkynyl group.

The term "$C_1$-$C_{60}$ alkoxy group" as used herein refers to a monovalent group represented by —$OA_{101}$ (wherein $A_{101}$ is the $C_1$-$C_{60}$ alkyl group), and examples thereof may include a methoxy group, an ethoxy group, and an isopropyloxy group.

The term "$C_3$-$C_{10}$ cycloalkyl group" as used herein refers to a monovalent saturated hydrocarbon cyclic group having 3 to 10 carbon atoms, and examples thereof may include a cyclopropyl group, a cyclobutyl group, a cyclopentyl group, a cyclohexyl group, a cycloheptyl group, a cyclooctyl group, an adamantanyl group, a norbornanyl group (or a bicyclo[2.2.1]heptyl group), a bicyclo[1.1.1]pentyl group, a bicyclo[2.1.1]hexyl group, and a bicyclo[2.2.2]octyl group. The term "$C_3$-$C_{10}$ cycloalkylene group" as used herein refers to a divalent group having substantially the same structure as the $C_3$-$C_{10}$ cycloalkyl group.

The term "$C_1$-$C_{10}$ heterocycloalkyl group" as used herein refers to a monovalent saturated monocyclic group that includes, in addition to 1 to 10 carbon atoms, at least one heteroatom as ring-forming atoms, and examples thereof may include a 1,2,3,4-oxatriazolidinyl group, a tetrahydrofuranyl group, and a tetrahydrothiophenyl group. The term "$C_1$-$C_{10}$ heterocycloalkylene group" as used herein refers to a divalent group having substantially the same structure as the $C_1$-$C_{10}$ heterocycloalkyl group.

The term "$C_3$-$C_{10}$ cycloalkenyl group" used herein refers to a monovalent cyclic group that has three to ten carbon atoms and at least one carbon-carbon double bond in the ring thereof and no aromaticity, and examples thereof may include a cyclopentenyl group, a cyclohexenyl group, and a cycloheptenyl group. The term "$C_3$-$C_{10}$ cycloalkenylene group" as used herein refers to a divalent group having substantially the same structure as the $C_3$-$C_{10}$ cycloalkenyl group.

The term "$C_1$-$C_{10}$ heterocycloalkenyl group" as used herein refers to a monovalent cyclic group that has, in addition to 1 to 10 carbon atoms, at least one heteroatom as ring-forming atoms, and at least one carbon-carbon double bond in the cyclic structure thereof. Examples of the $C_1$-$C_{10}$ heterocycloalkenyl group may include a 4,5-dihydro-1,2,3,4-oxatriazolyl group, a 2,3-dihydrofuranyl group, and a 2,3-dihydrothiophenyl group. The term "$C_1$-$C_{10}$ heterocycloalkenylene group" as used herein refers to a divalent group having substantially the same structure as the $C_1$-$C_{10}$ heterocycloalkenyl group.

The term "$C_6$-$C_{60}$ aryl group" as used herein refers to a monovalent group having a carbocyclic aromatic system having six to sixty carbon atoms, and the term "$C_6$-$C_{60}$ arylene group" as used herein refers to a divalent group having a carbocyclic aromatic system having six to sixty carbon atoms. Examples of the $C_6$-$C_{60}$ aryl group may include a phenyl group, a pentalenyl group, a naphthyl group, an azulenyl group, an indacenyl group, an acenaphthyl group, a phenalenyl group, a phenanthrenyl group, an anthracenyl group, a fluoranthenyl group, a triphenylenyl group, a pyrenyl group, a chrysenyl group, a perylenyl group, a pentaphenyl group, a heptalenyl group, a naphthacenyl group, a picenyl group, a hexacenyl group, a pentacenyl group, a rubicenyl group, a coronenyl group, a fluorenyl group, and an ovalenyl group. When the $C_6$-$C_{60}$ aryl group and the $C_6$-$C_{60}$ arylene group each include two or more rings, the two or more rings may be condensed with each other.

The term "$C_1$-$C_{60}$ heteroaryl group" as used herein refers to a monovalent group having a heterocyclic aromatic system that has, in addition to 1 to 60 carbon atoms, at least one heteroatom as ring-forming atoms. The term "$C_1$-$C_{60}$ heteroarylene group" as used herein refers to a divalent group having a heterocyclic aromatic system that has, in addition to 1 to 60 carbon atoms, at least one heteroatom as ring-forming atoms. Examples of the $C_1$-$C_{60}$ heteroaryl group may include a pyridinyl group, a pyrimidinyl group, a pyrazinyl group, a pyridazinyl group, a triazinyl group, a quinolinyl group, a benzoquinolinyl group, an isoquinolinyl group, a benzoisoquinolinyl group, a quinoxalinyl group, a benzoquinoxalinyl group, a quinazolinyl group, a benzoquinazolinyl group, a cinnolinyl group, a phenanthrolinyl group, a phthalazinyl group, a carbazolyl group, a dibenzofuranyl group, a dibenzothiofuranyl group, and a naphthyridinyl group. When the $C_1$-$C_{60}$ heteroaryl group and the $C_1$-$C_{60}$ heteroarylene group each include two or more rings, the rings may be condensed with each other.

The term "monovalent non-aromatic condensed polycyclic group" as used herein refers to a monovalent group having two or more rings condensed to each other, only carbon atoms (for example, having 8 to 60 carbon atoms) as ring-forming atoms, and non-aromaticity in its molecular structure when considered as a whole. Examples of the monovalent non-aromatic condensed polycyclic group may include an indenyl group, a fluorenyl group, a spiro-bifluorenyl group, a benzofluorenyl group, an indenophenanthrenyl group, an adamantyl group, and an indeno anthracenyl group. The term "divalent non-aromatic condensed polycyclic group" as used herein refers to a divalent group having substantially the same structure as a monovalent non-aromatic condensed polycyclic group.

The term "monovalent non-aromatic condensed heteropolycyclic group" as used herein refers to a monovalent group having two or more rings condensed to each other, at least one heteroatom in addition to 1 to 60 carbon atoms as ring-forming atoms, and non-aromaticity in its molecular structure when considered as a whole. Examples of the monovalent non-aromatic condensed heteropolycyclic group may include a pyrrolyl group, a thiophenyl group, a furanyl group, an indolyl group, a benzoindolyl group, a naphtho indolyl group, an isoindolyl group, a benzoisoindolyl group, a naphthoisoindolyl group, a benzosilolyl group, a benzothiophenyl group, a benzofuranyl group, a carbazolyl group, a dibenzosilolyl group, a dibenzothiophenyl group, a dibenzofuranyl group, an azacarbazolyl group, an azafluorenyl group, an azadibenzosilolyl group, an azadibenzothiophenyl group, an azadibenzofuranyl group, a pyrazolyl group, an imidazolyl group, a triazolyl group, a tetrazolyl group, an oxazolyl group, an isoxazolyl group, a thiazolyl group, an isothiazolyl group, an oxadiazolyl group, a thiadiazolyl group, a benzopyrazolyl group, a benzimidazolyl group, a benzoxazolyl group, a benzothiazolyl group, a benzoxadiazolyl group, a benzothiadiazolyl group, an imidazopyridinyl group, an imidazopyrimidinyl group, an imidazotriazinyl group, an imidazopyrazinyl group, an imidazopyridazinyl group, an indenocarbazolyl group, an indolocarbazolyl group, a benzofurocarbazolyl group, a benzothienocarbazolyl group, a benzosilolocarbazolyl group, a benzoindolocarbazolyl group, a benzocarbazolyl group, a benzonaphthofuranyl group, a benzonaphthothiophenyl group, a benzonaphthosilolyl group, a benzofurodibenzofuranyl group, a benzofurodibenzothiophenyl group, an azaadamantyl group, and a benzothienodibenzothiophenyl group. The term "divalent non-aromatic condensed heteropolycyclic group" as used herein refers to a divalent group having substantially the same structure as a monovalent non-aromatic condensed heteropolycyclic group.

The term "$C_6$-$C_{60}$ aryloxy group" as used herein refers to a monovalent group represented by —$OA_{102}$ (wherein $A_{102}$ is the $C_6$-$C_{60}$ aryl group), and the term "$C_6$-$C_{60}$ arylthio group" as used herein refers to a monovalent group represented by —$SA_{103}$ (wherein $A_{103}$ is the $C_6$-$C_{60}$ aryl group).

The term "$C_7$-$C_{60}$ aryl alkyl group" used herein refers to a monovalent group represented by -$A_{104}A_{105}$ (where $A_{104}$ may be a $C_1$-$C_{54}$ alkylene group, and $A_{105}$ may be a $C_6$-$C_{59}$ aryl group), and the term "$C_2$-$C_{60}$ heteroaryl alkyl group" used herein refers to a monovalent group represented by -$A_{106}A_{107}$ (where $A_{106}$ may be a $C_1$-$C_{59}$ alkylene group, and $A_{107}$ may be a $C_1$-$C_{59}$ heteroaryl group).

$R_{10a}$ may be:

deuterium (-D), —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, a $C_2$-$C_{60}$ heteroaryl alkyl group, —$Si(Q_{11})(Q_{12})(Q_{13})$, —$N(Q_{11})(Q_{12})$, —$B(Q_{11})(Q_{12})$, —$C(=O)(Q_{11})$, —$S(=O)_2(Q_{11})$, —$P(=O)(Q_{11})(Q_{12})$, or any combination thereof;

a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, or a $C_2$-$C_{60}$ heteroaryl alkyl group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, a $C_2$-$C_{60}$ heteroaryl alkyl group, —$Si(Q_{21})(Q_{22})(Q_{23})$, —$N(Q_{21})(Q_{22})$, —$B(Q_{21})(Q_{22})$, —$C(=O)(Q_{21})$, —$S(=O)_2(Q_{21})$, —$P(=O)(Q_{21})(Q_{22})$, or any combination thereof; or —$Si(Q_{31})(Q_{32})(Q_{33})$, —$N(Q_{31})(Q_{32})$, —$B(Q_{31})(Q_{32})$, —$C(=O)(Q_{31})$, —$S(=O)_2(Q_{31})$, or —$P(=O)(Q_{31})(Q_{32})$.

$Q_1$ to $Q_3$, $Q_{11}$ to $Q_{13}$, $Q_{21}$ to $Q_{23}$, and $Q_{31}$ to $Q_{33}$ used herein may each independently be: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof; a $C_7$-$C_{60}$ aryl alkyl group; or a $C_2$-$C_{60}$ heteroaryl alkyl group.

The term "hetero atom" as used herein refers to any atom other than a carbon atom. Examples of the heteroatom may include O, S, N, P, Si, B, Ge, Se, or any combination thereof.

The term "the third-row transition metal" used herein includes hafnium (Hf), tantalum (Ta), tungsten (W), rhenium (Re), osmium (Os), iridium (Ir), platinum (Pt), gold (Au), and/or the like.

The term "Ph" as used herein refers to a phenyl group, the term "Me" as used herein refers to a methyl group, the term "Et" as used herein refers to an ethyl group, the term "ter-Bu" or "$Bu^t$" as used herein refers to a tert-butyl group, and the term "OMe" as used herein refers to a methoxy group.

The term "biphenyl group" as used herein refers to "a phenyl group substituted with a phenyl group." In other words, the "biphenyl group" is a substituted phenyl group having a $C_6$-$C_{60}$ aryl group as a substituent.

The term "terphenyl group" as used herein refers to "a phenyl group substituted with a biphenyl group". The "terphenyl group" is a substituted phenyl group having, as a substituent, a $C_6$-$C_{60}$ aryl group substituted with a $C_6$-$C_{60}$ aryl group.

* and *' as used herein, unless defined otherwise, each refer to a binding site to a neighboring atom in a corresponding formula or moiety.

Hereinafter, compounds according to embodiments and light-emitting devices according to embodiments will be described in more detail with reference to the following synthesis examples and examples. The wording "B was utilized instead of A" used in describing Synthesis Examples refers to that an identical molar equivalent of B was utilized in place of A.

EXAMPLES

Example 1

As an anode, a glass substrate (product of Corning Inc.) with a 15 Ω/cm$^2$ (1,200 Å) ITO electrode formed thereon was cut to a size of 50 mm×50 mm×0.5 mm, sonicated in isopropyl alcohol and pure water for 5 minutes each, and then cleaned with irradiation of ultraviolet rays and exposure of ozone thereto for 30 minutes. Then, the resultant glass substrate was mounted on a vacuum deposition apparatus.

HT1 was deposited on the anode to form a hole injection layer having a thickness of 120 nm, and Compound 3-3 was deposited on the hole injection layer to form a hole transport layer having a thickness of 5 nm.

Compound 3-1 (first host), Compound 4-1 (second host), and Compound 5-1 (dopant) were co-deposited on the hole transport layer at a weight ratio of 7:3:1 to form an emission layer having a thickness of 30 nm.

Next, Compound 1-4, which is a first compound, and ET-D1 (LiQ) were co-deposited on the emission layer at a weight ratio of 5:5 to form a first electron transport layer having a thickness of 10 nm, Compound 2-4, which is a second compound, and ET-D1 (LiQ) were co-deposited on the first electron transport layer at a weight ratio of 5:5 to form a second electron transport layer having a thickness of 10 nm, ET-D1 (LiQ) was deposited on the second electron transport layer to form an electron injection layer having a thickness of 1 nm, and then Mg:Ag was deposited on the electron injection layer to form a cathode having a thickness of 10 nm, thereby completing manufacture of a light-emitting device.

HT1

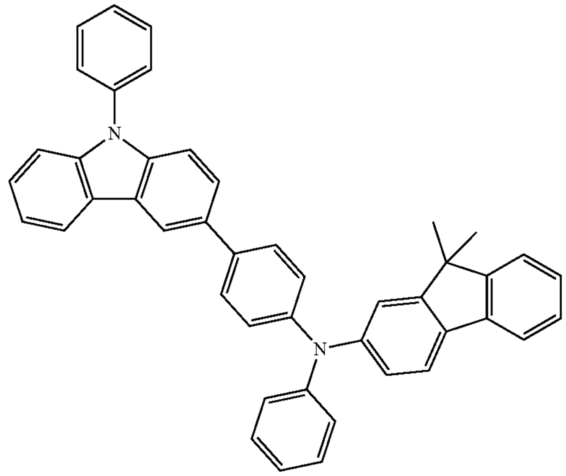

ET-D1

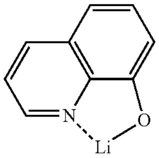

-continued 3-1

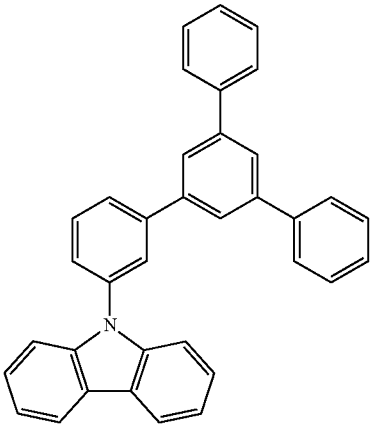

4-1

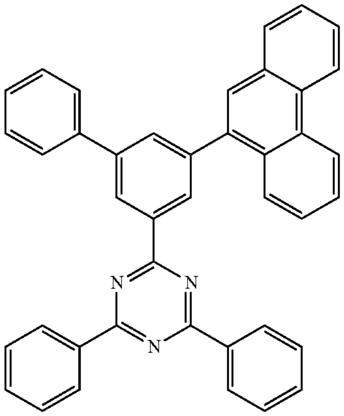

5-1

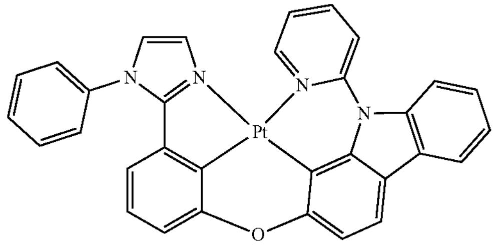

Examples 2 and 3 and Comparative Examples 1 to 4

Organic light-emitting devices were manufactured in substantially the same manner as in Example 1, except that compounds shown in Table 1 were utilized to form a first electron transport layer and a second electron transport layer. However, in the case of Comparative Examples 1 and 2, an electron transport layer having a single layer rather than having a multi-layered structure was formed.

Evaluation Example 1

The driving voltage at 1,000 cd/$m^2$ and lifespan of the organic light-emitting devices manufactured in Examples 1 to 3 and Comparative Examples 1 to 4 were measured by utilizing the Keithley MU 236 and the luminance meter PR650. The lifespan is a measure of the time taken for the luminance to reduce to 95% of the initial luminance value while a relative luminance change over time was recorded by applying a constant current corresponding to 1,000 cd/m$^2$. The measurement results are shown as relative values with respect to Comparative Example 1. That is, the driving voltage and lifespan shown in Table 1 are relative values with those of Comparative Example 1 as 100%.

Also, a LUMO energy level of each compound was measured by utilizing the Gaussian 09 program with molecular structure optimization obtained by B3LYP-based density functional theory (DFT), and a value thereof is shown in Table 1.

TABLE 1

| | First electron transport layer | | Second electron transport layer | | Driving | Life- |
|---|---|---|---|---|---|---|
| No. | First compound | $\lvert E_{LUMO\_E1}\rvert$ | Second compound | $\lvert E_{LUMO\_E2}\rvert$ | voltage (%) | span (%) |
| Example 1 | Compound 1-4 | 2.7 | Compound 2-4 | 2.8 | 96% | 105% |
| Example 2 | Compound 1-4 | 2.7 | Compound 2-3 | 2.8 | 94% | 110% |
| Example 3 | Compound 1-3 | 2.65 | Compound 2-4 | 2.8 | 95% | 108% |
| Comparative Example 1 | Compound 2-4 | 2.8 | — | — | 100% | 100% |
| Comparative Example 2 | Compound 1-4 | 2.7 | — | — | 102% | 95% |
| Comparative Example 3 | Compound A | 2.1 | Compound B | 3.0 | 110% | 80% |
| Comparative Example 4 | Compound C | 2.8 | Compound D | 3.0 | 97% | 85% |

1-3

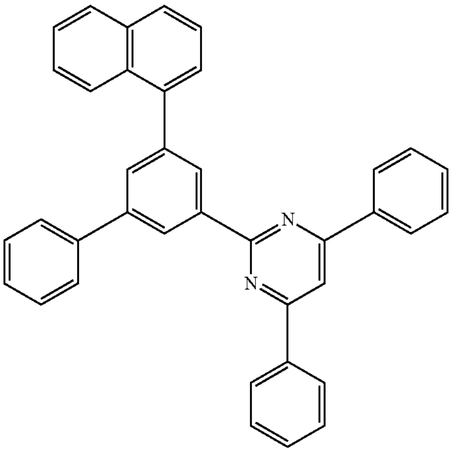

-continued 1-4

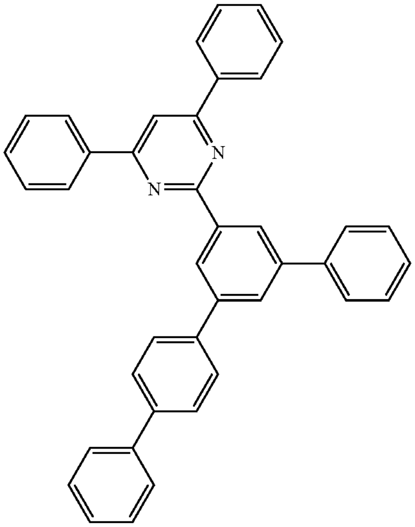

2-3

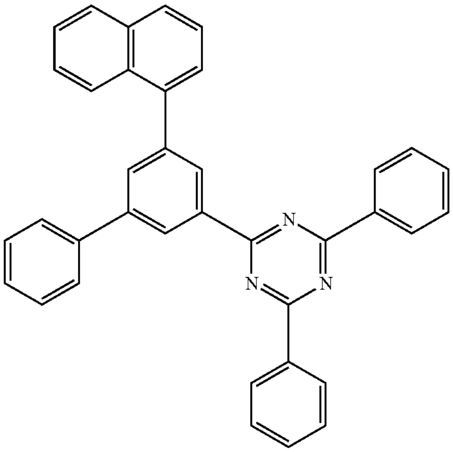

2-4

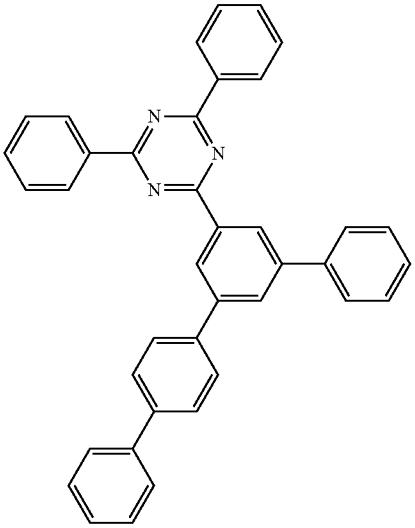

-continued

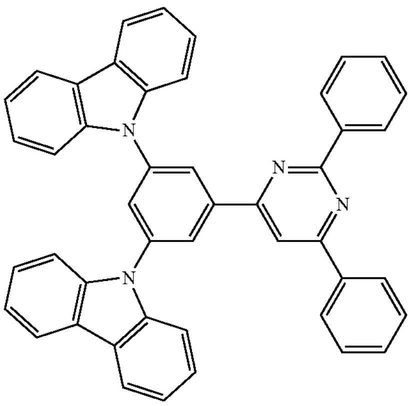

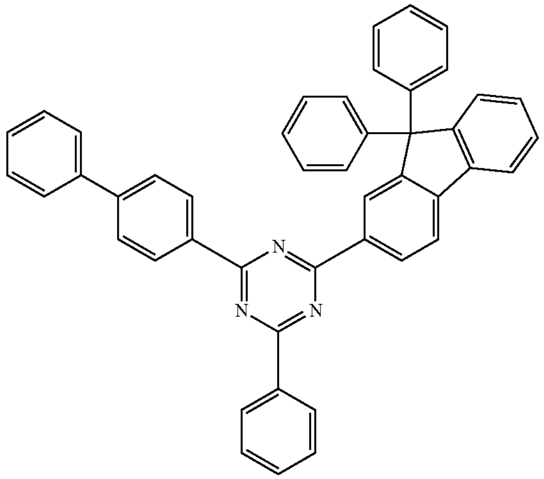

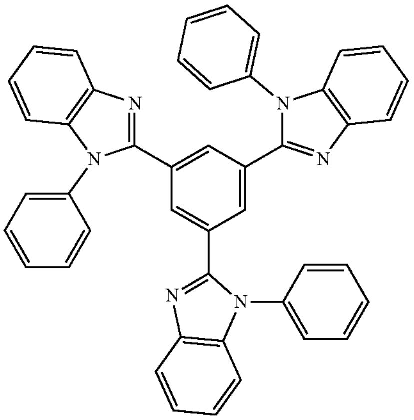

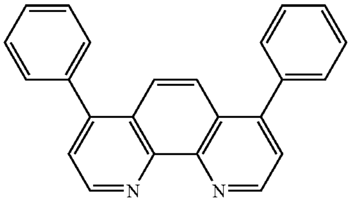

From Table 1, it may be confirmed that when the first electron transport layer and the second electron transport layer each include a specific compound, as in the organic light-emitting devices of Examples 1 to 3, in which the compounds satisfies a specific LUMO energy condition, improved driving voltage and improved efficiency were obtained, as compared to Comparative Examples 1 to 4.

The light-emitting device includes a first electron transport layer and a second electron transport layer, wherein the first electron transport layer includes a first compound represented by Formula 1, the second electron transport layer includes a second compound, and the first compound and the second compound satisfy a specific LUMO energy level relationship, and thus, electron mobility is improved, and the light-emitting device may have excellent or suitable driving voltage and excellent or suitable luminescence lifespan, and may be utilized to manufacture a high-quality electronic apparatus.

The use of "may" when describing embodiments of the present disclosure refers to "one or more embodiments of the present disclosure".

As used herein, the terms "substantially", "about", and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

The electronic apparatus, the display device, and/or any other relevant devices or components according to embodiments of the present invention described herein may be implemented utilizing any suitable hardware, firmware (e.g. an application-specific integrated circuit), software, or a combination of software, firmware, and hardware. For example, the various components of the device may be formed on one integrated circuit (IC) chip or on separate IC chips. Further, the various components of the device may be implemented on a flexible printed circuit film, a tape carrier package (TCP), a printed circuit board (PCB), or formed on one substrate. Further, the various components of the device may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the scope of the embodiments of the present disclosure.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the drawings, it will be understood by those of ordinary skill in the art that one or more suitable changes in form and details may be made therein without departing from the spirit and scope as defined by the following claims and equivalents thereof.

What is claimed is:

1. A light-emitting device comprising:

a first electrode;

a second electrode facing the first electrode; and an interlayer between the first electrode and the second electrode, wherein the interlayer comprises an emission layer and an electron transport region between the emission layer and the second electrode, the electron transport region comprises a first electron transport layer between the emission layer and the second electrode and a second electron transport layer between the first electron transport layer and the second electrode, the first electron transport layer comprises a first compound, the second electron transport layer comprises a second compound, the first compound comprises a pyrimidine group, the second compound comprises a triazine group, an absolute value of a lowest unoccupied molecular orbital (LUMO) energy of the first compound ($E_{LUMO\_E1}$) is less than an absolute value of a LUMO energy of the second compound ($E_{LUMO\_E2}$), the emission layer comprises a host and a dopant, and the host comprises a first host represented by Formula 3a or 3b and a second host represented by Formula 4a or 4b:

Formula 3a

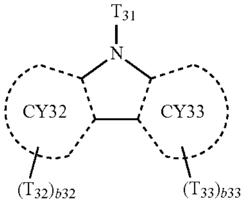

Formula 3b

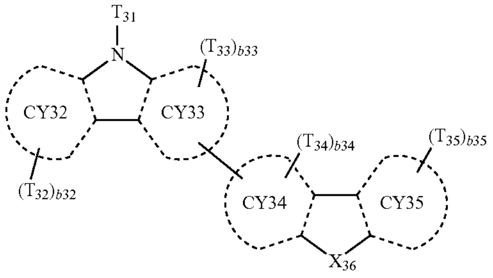

-continued

Formula 4a

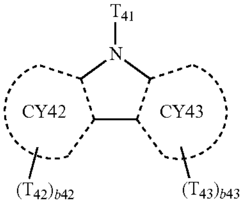

Formula 4b

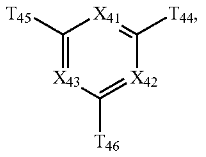

wherein, in Formulae 3a, 3b, 4a, and 4b, ring CY32 to ring CY35 and ring CY42 and ring CY43 are each independently a $C_3$-$C_{60}$ carbocyclic group that is unsubstituted or substituted with at least one $R_{10a}$ or a $C_1$-$C_{60}$ heterocyclic group that is unsubstituted or substituted with at least one $R_{10a}$, $X_{36}$ is O, S, N($T_{36}$), C($R_{36}$)($R_{37}$), or Si($R_{36}$)($R_{37}$), $X_{41}$ is N, C($R_{41}$), or Si($R_{41}$), $X_{42}$ is N, C($R_{42}$), or Si($R_{42}$), $X_{43}$ is N, C($R_{43}$), or Si($R_{43}$), $T_{31}$ is *-[$(L_{31})_{a31}$-$R_{31}$], $T_{32}$ is *-[$(L_{32})_{a32}$-$R_{32}$], $T_{33}$ is *-[$(L_{33})_{a33}$-$R_{33}$], $T_{34}$ is *-[$(L_{34})_{a34}$-$R_{34}$], $T_{35}$ is *-[$(L_{35})_{a35}$-$R_{35}$], $T_{36}$ is *-[$(L_{36})_{a36}$-$R_{36}$], $T_{41}$ is *-[$(L_{41})_{a41}$-$R_{41}$], $T_{42}$ is *-[$(L_{42})_{a42}$-$R_{42}$], $T_{43}$ is *-[$(L_{43})_{a43}$-$R_{43}$], $T_{44}$ is *-[$(L_{44})_{a44}$-$R_{44}$], $T_{45}$ is *-[$(L_{45})_{a45}$-$R_{45}$], $T_{46}$ is *-[$(L_{46})_{a46}$-$R_{46}$], $L_{31}$ to $L_{36}$ and $L_{41}$ to $L_{46}$ are each independently a single bond, a $C_5$-$C_{30}$ carbocyclic group that is unsubstituted or substituted with at least one $R_{10a}$, or a $C_1$-$C_{30}$ heterocyclic group that is unsubstituted or substituted with at least one $R_{10a}$, a31 to a36 and a41 to a46 are each independently an integer from 0 to 3, $R_{31}$ to $R_{37}$ and $R_{41}$ to $R_{46}$ are each independently hydrogen, deuterium, —F, —Cl, —Br, —I, a hydroxyl group, a cyano group, a nitro group, a $C_1$-$C_{60}$ alkyl group that is unsubstituted or substituted with at least one $R_{10a}$, a $C_2$-$C_{60}$ alkenyl group that is unsubstituted or substituted with at least one $R_{10a}$, a $C_2$-$C_{60}$ alkynyl group that is unsubstituted or substituted with at least one $R_{10a}$, a $C_1$-$C_{60}$ alkoxy group that is unsubstituted or substituted with at least one $R_{10a}$, a $C_3$-$C_{60}$ carbocyclic group that is unsubstituted or substituted with at least one $R_{10a}$, a $C_1$-$C_{60}$ heterocyclic group that is unsubstituted or substituted with at least one $R_{10a}$, a $C_6$-$C_{60}$ aryloxy group that is unsubstituted or substituted with at least one $R_{10a}$, a $C_6$-$C_{60}$ arylthio group that is unsubstituted or substituted with at least one $R_{10a}$, a $C_7$-$C_{60}$ aryl alkyl group that is unsubstituted or substituted with at least one $R_{10a}$, a $C_2$-$C_{60}$ heteroaryl alkyl group that is unsubstituted or substituted with at least one $R_{10a}$, —Si($Q_1$)($Q_2$)($Q_3$), —N($Q_1$)($Q_2$), —B($Q_1$)($Q_2$), —C(=O)($Q_1$), —S(=O)$_2$($Q_1$), or —P(=O)($Q_1$)($Q_2$), b32 to b35 and b42 and b43 are each independently an integer from 0 to 10,

* indicates a binding site to a neighboring atom, $R_{10a}$ is:

deuterium (-D), —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, a $C_2$-$C_{60}$ heteroaryl alkyl group, —Si($Q_{11}$)($Q_{12}$)($Q_{13}$), —N($Q_{11}$)($Q_{12}$), —B($Q_{11}$)($Q_{12}$), —C(═O)($Q_{11}$), —S(═O)$_2$($Q_{11}$), —P(═O)($Q_{11}$)($Q_{12}$), or any combination thereof;

a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, or a $C_2$-$C_{60}$ heteroaryl alkyl group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, a $C_2$-$C_{60}$ heteroaryl alkyl group, —Si($Q_{21}$)($Q_{22}$)($Q_{23}$), —N($Q_{21}$)($Q_{22}$), —B($Q_{21}$)($Q_{22}$), —C(═O)($Q_{21}$), —S(═O)$_2$($Q_{21}$), —P(═O)($Q_{21}$)($Q_{22}$), or any combination thereof; or —Si($Q_{31}$)($Q_{32}$)($Q_{33}$), —N($Q_{31}$)($Q_{32}$), —B($Q_{31}$)($Q_{32}$), —C(═O)($Q_{31}$), —S(═O)$_2$($Q_{31}$), or —P(═O)($Q_{31}$)($Q_{32}$), and $Q_1$ to $Q_3$, $Q_{11}$ to $Q_{13}$, $Q_{21}$ to $Q_{23}$, and $Q_{31}$ to $Q_{33}$ are each independently: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; or a $C_3$-$C_{60}$ carbocyclic group, a $C_1$-$C_{60}$ heterocyclic group, a $C_7$-$C_{60}$ aryl alkyl group, or a $C_2$-$C_{60}$ heteroaryl alkyl group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof.

2. The light-emitting device of claim 1, wherein the first compound comprises a pyrimidine group, and does not comprise a triazine group, and the second compound comprises a triazine group, and does not comprise a pyrimidine group.

3. The light-emitting device of claim 1, wherein the first compound is represented by Formula 1, and the second compound is represented by Formula 2:

Formula 1

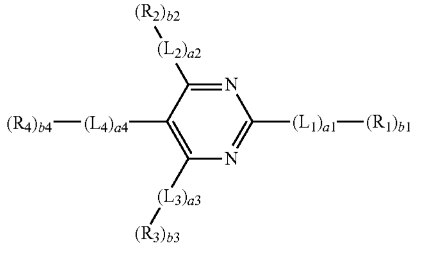

-continued

Formula 2

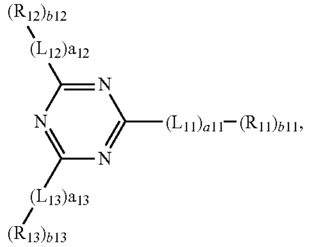

wherein, in Formulae 1 and 2, $L_1$ to $L_4$ and $L_{11}$ to $L_{13}$ are each independently a single bond, a $C_5$-$C_{30}$ carbocyclic group that is unsubstituted or substituted with at least one $R_{10a}$, or a $C_1$-$C_{30}$ heterocyclic group that is unsubstituted or substituted with at least one $R_{10a}$, a1 to a4 and a11 to a13 are each independently an integer from 0 to 3, $R_1$ to $R_4$ and $R_{11}$ to $R_{13}$ are each independently hydrogen, deuterium, —F, —Cl, —Br, —I, a hydroxyl group, a cyano group, a nitro group, a $C_1$-$C_{60}$ alkyl group that is unsubstituted or substituted with at least one $R_{10a}$, a $C_2$-$C_{60}$ alkenyl group that is unsubstituted or substituted with at least one $R_{10a}$, a $C_2$-$C_{60}$ alkynyl group that is unsubstituted or substituted with at least one $R_{10a}$, a $C_1$-$C_{60}$ alkoxy group that is unsubstituted or substituted with at least one $R_{10a}$, a $C_3$-$C_{60}$ carbocyclic group that is unsubstituted or substituted with at least one $R_{10a}$, a $C_1$-$C_{60}$ heterocyclic group that is unsubstituted or substituted with at least one $R_{10a}$, a $C_6$-$C_{60}$ aryloxy group that is unsubstituted or substituted with at least one $R_{10a}$, a $C_6$-$C_{60}$ arylthio group that is unsubstituted or substituted with at least one $R_{10a}$, a $C_7$-$C_{60}$ aryl alkyl group that is unsubstituted or substituted with at least one $R_{10a}$, a $C_2$-$C_{60}$ heteroaryl alkyl group that is unsubstituted or substituted with at least one $R_{10a}$, —Si($Q_1$)($Q_2$)($Q_3$), —N($Q_1$)($Q_2$), —B($Q_1$)($Q_2$), —C(═O)($Q_1$), —S(═O)$_2$($Q_1$), or —P(═O)($Q_1$)($Q_2$), b1 to b4 and b11 to b13 are each independently an integer from 0 to 10, $R_{10a}$ is:

deuterium (-D), —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, a $C_2$-$C_{60}$ heteroaryl alkyl group, —Si($Q_{11}$)($Q_{12}$)($Q_{13}$), —N($Q_{11}$)($Q_{12}$), —B($Q_{11}$)($Q_{12}$), —C(═O)($Q_{11}$), —S(═O)$_2$($Q_{11}$), —P(═O)($Q_{11}$)($Q_{12}$), or any combination thereof;

a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, or a $C_2$-$C_{60}$ heteroaryl alkyl group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, a $C_2$-$C_{60}$ heteroaryl alkyl group, —Si($Q_{21}$)($Q_{22}$)($Q_{23}$), —N($Q_{21}$)($Q_{22}$), —B($Q_{21}$)($Q_{22}$), —C(═O)($Q_{21}$), —S(═O)$_2$($Q_{21}$), —P(═O)($Q_{21}$)($Q_{22}$), or any combination thereof; or —Si($Q_{31}$)($Q_{32}$)($Q_{33}$), —N($Q_{31}$)($Q_{32}$), —B($Q_{31}$)($Q_{32}$), —C(═O)($Q_{31}$), —S(═O)$_2$($Q_{31}$), or —P(═O)($Q_{31}$)($Q_{32}$), and $Q_1$ to $Q_3$, $Q_{11}$ to $Q_{13}$, $Q_{21}$ to $Q_{23}$, and $Q_{31}$ to $Q_{33}$ are each independently: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; or a $C_3$-$C_{60}$ carbocyclic group, a $C_1$-$C_{60}$ heterocyclic group, a $C_7$-$C_{60}$ aryl alkyl group, or a $C_2$-$C_{60}$ heteroaryl alkyl group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof.

4. The light-emitting device of claim 3, wherein, in Formulae 1 and 2, $L_1$ to $L_4$ and $L_{11}$ to $L_{13}$ are each independently a single bond or a $C_6$-$C_{14}$ carbocyclic group that is unsubstituted or substituted with at least one $R_{10a}$.

5. The light-emitting device of claim 3, wherein, in Formulae 1 and 2, $R_1$ to $R_4$ and $R_{11}$ to $R_{13}$ are each independently a $C_6$-$C_{14}$ carbocyclic group that is unsubstituted or substituted with at least one $R_{10a}$.

6. The light-emitting device of claim 3, wherein the first compound is represented by Formula 1a, and the second compound is represented by Formula 2a:

Formula 1a

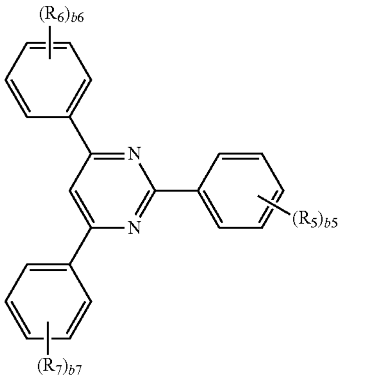

Formula 2a

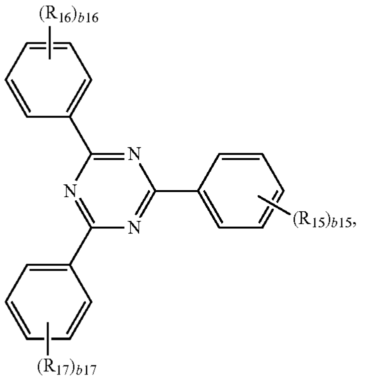

wherein, in Formulae 1a and 2a, $R_5$ to $R_7$ and $R_{15}$ to $R_{17}$ are each independently the same as described in connection with $R_1$ in Formula 1, and b5 to b7 and b15 to b17 are each independently an integer from 0 to 5.

7. The light-emitting device of claim 1, wherein the first compound is one of compounds represented by Formulae 1-1 to 1-16:

1-1

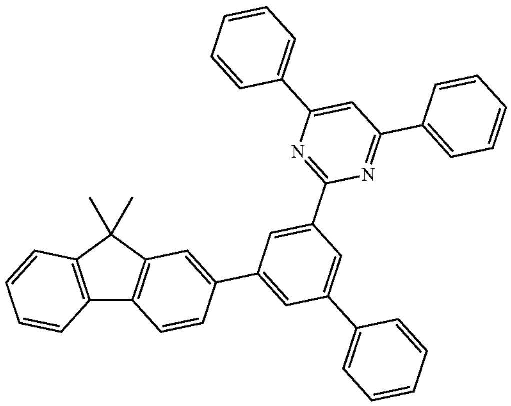

1-2

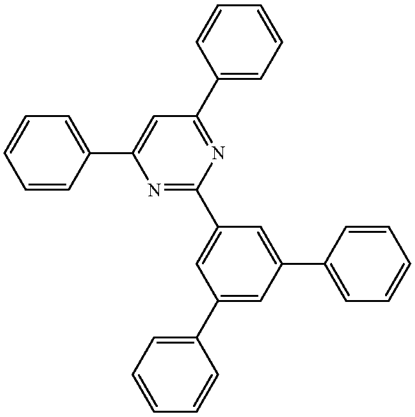

1-3

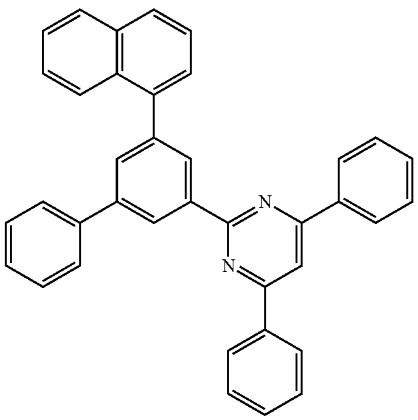

-continued
1-4
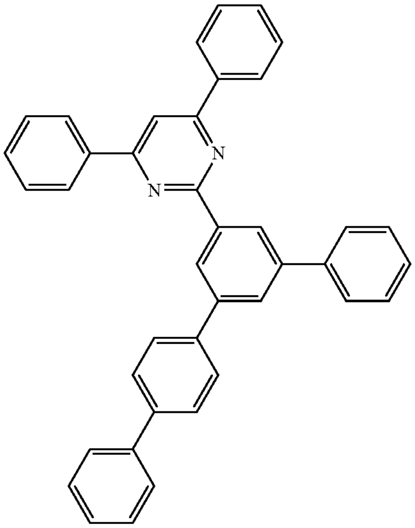
1-5
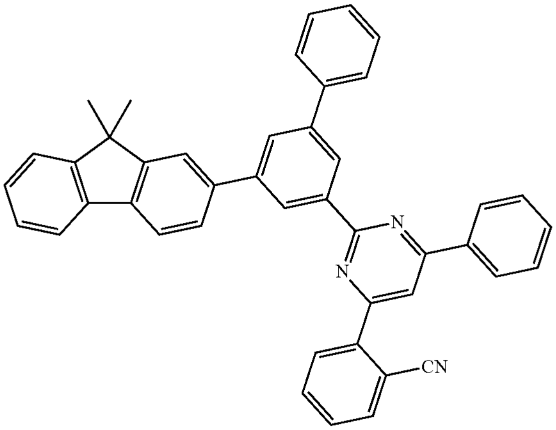
1-6
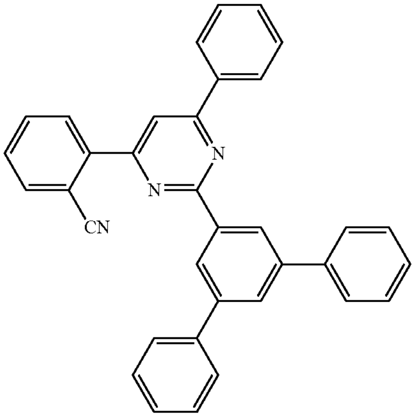
-continued
1-7
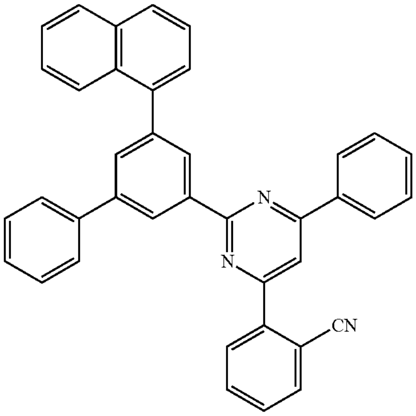
1-8
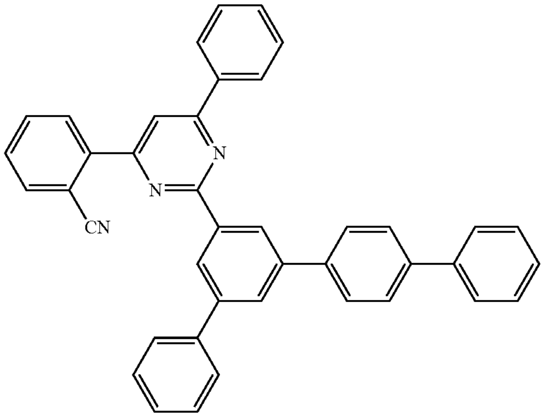
1-9
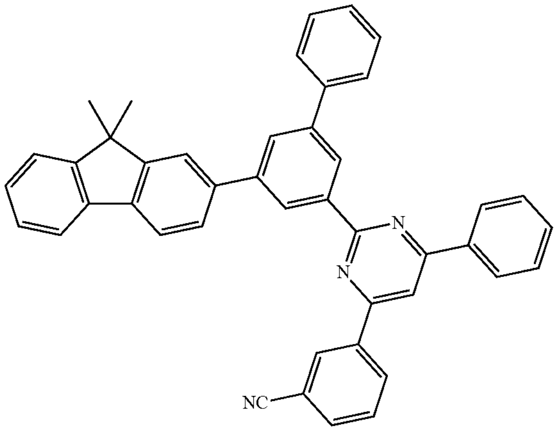

-continued
1-10
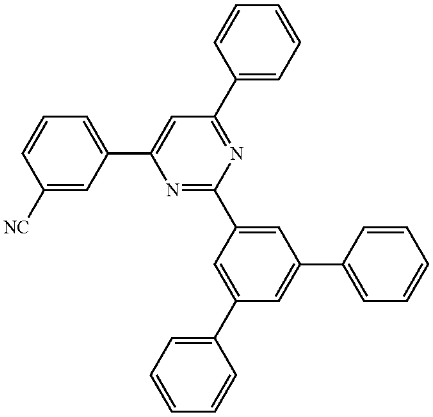
1-11
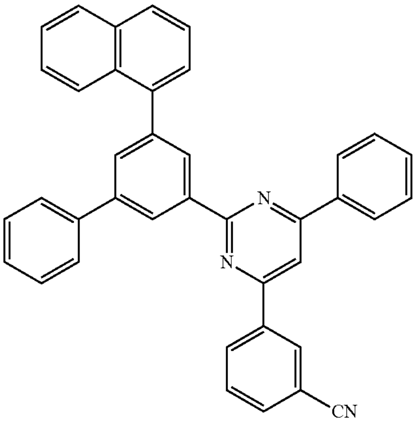
1-12
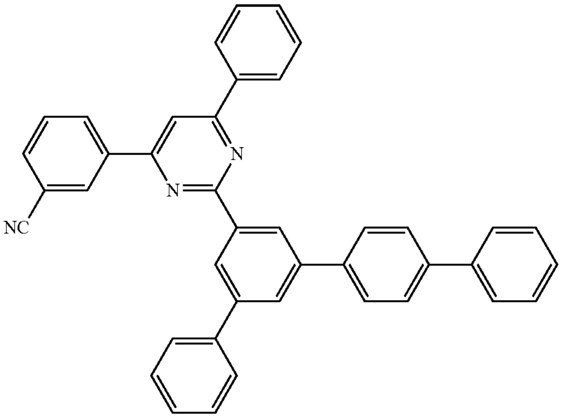
-continued
1-13
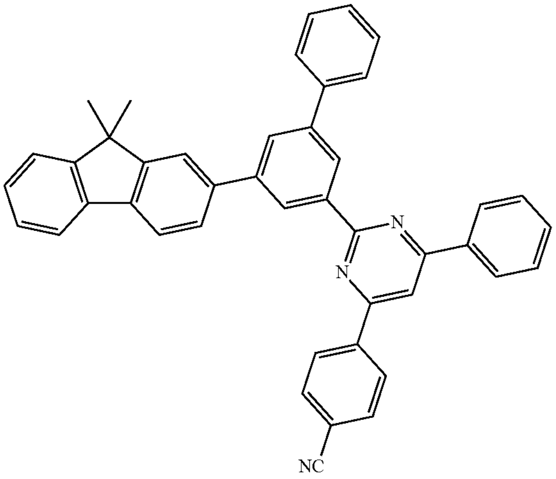
1-14
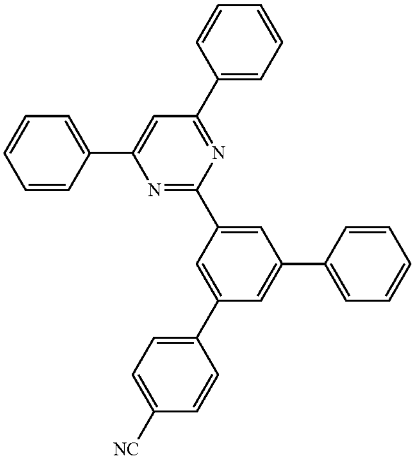
1-15
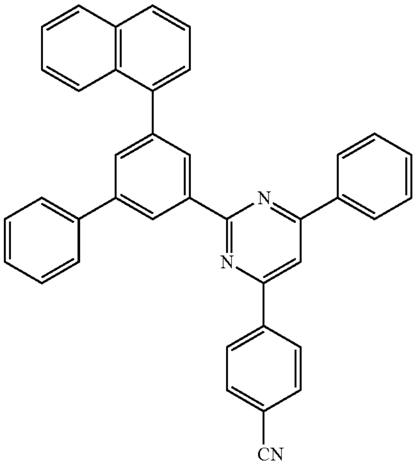

-continued
1-16
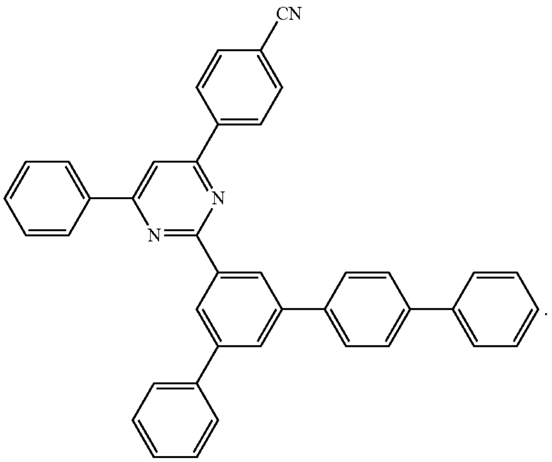
8. The light-emitting device of claim 1, wherein the second compound is one of compounds represented by Formulae 2-1 to 2-16:
2-1
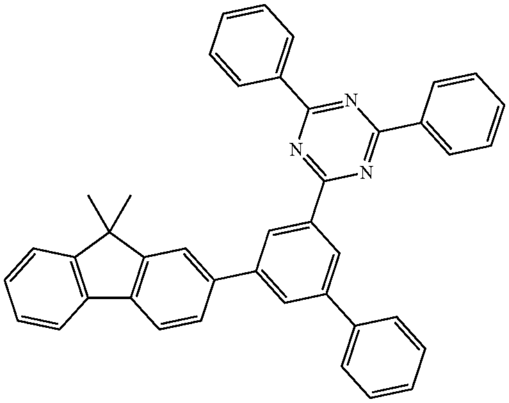
2-2
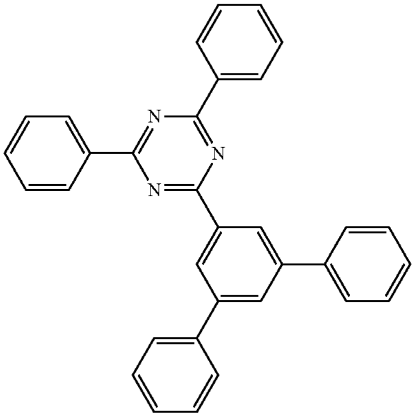
-continued
2-3
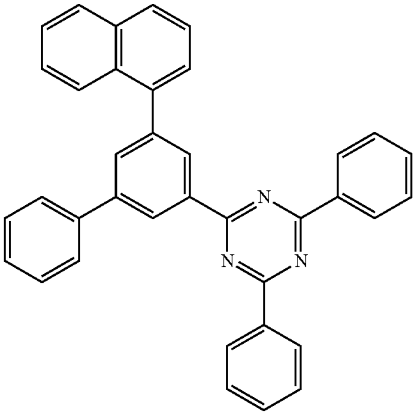
2-4
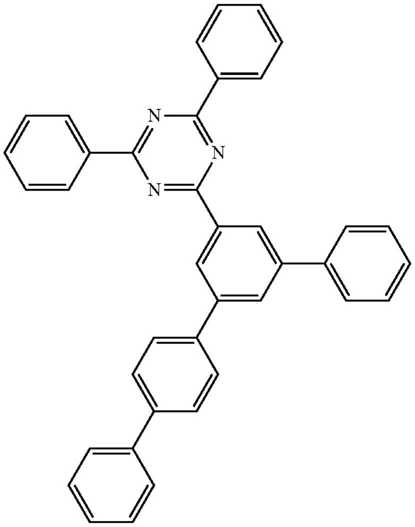
2-5
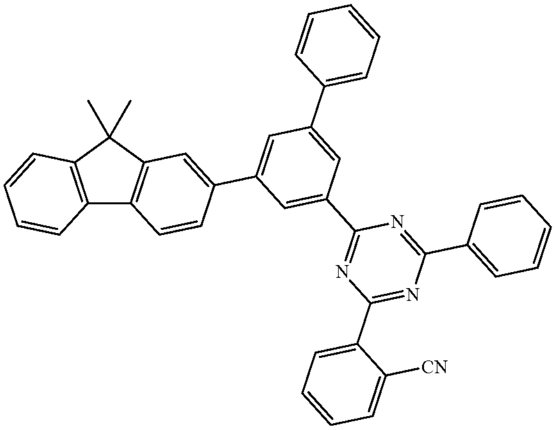

-continued
2-6
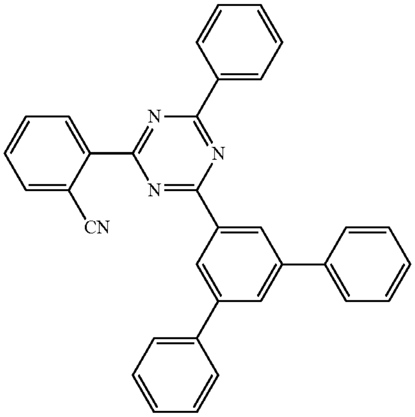
2-7
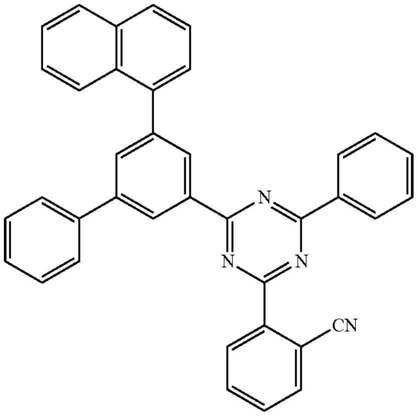
2-8
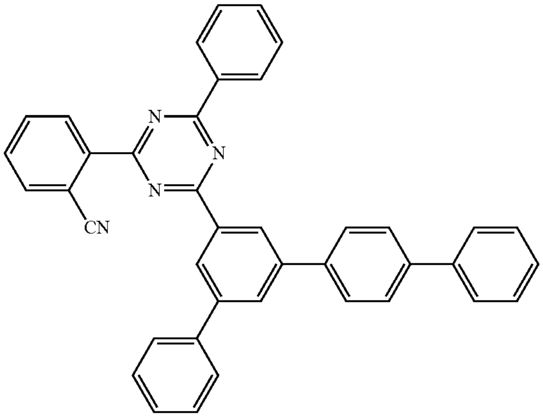
-continued
2-9
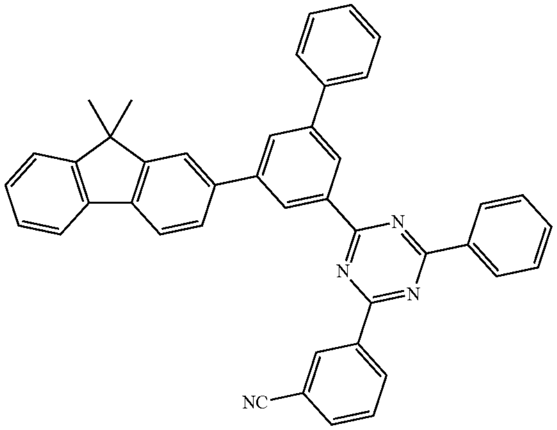
2-10
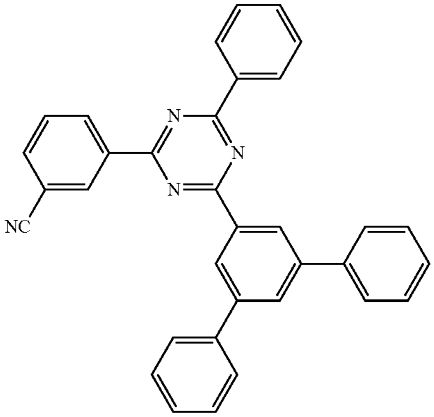
2-11
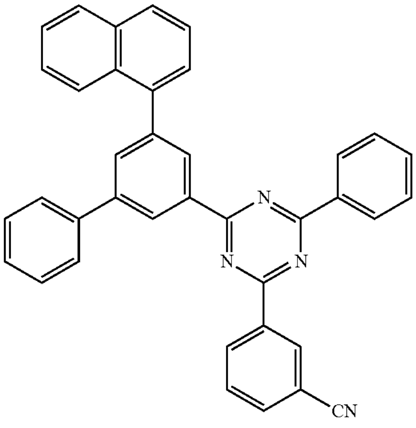

-continued 2-12

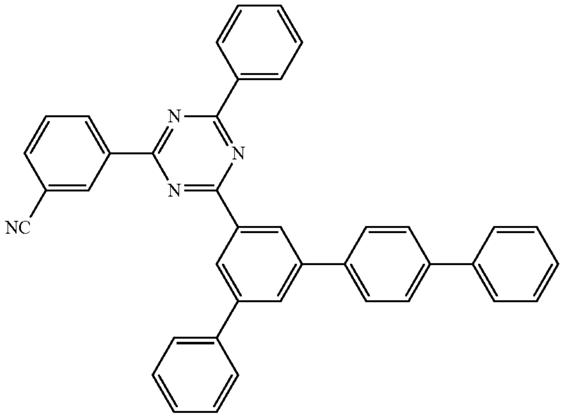

2-13

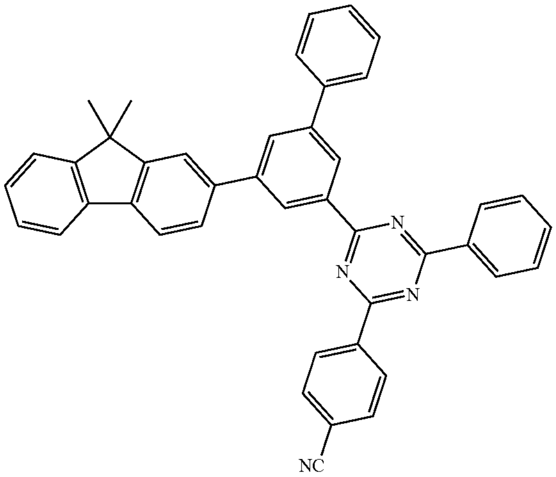

2-14

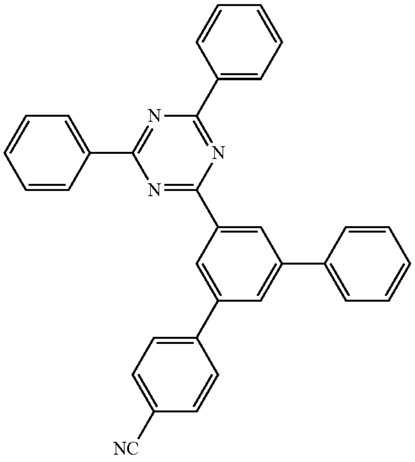

-continued 2-15

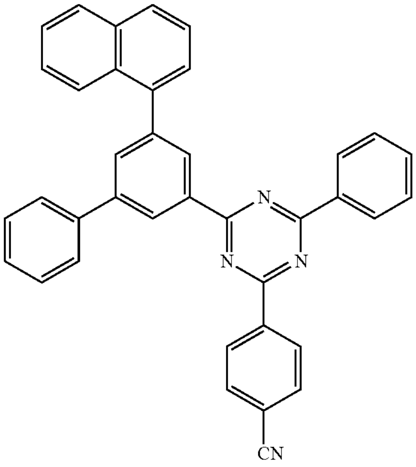

2-16

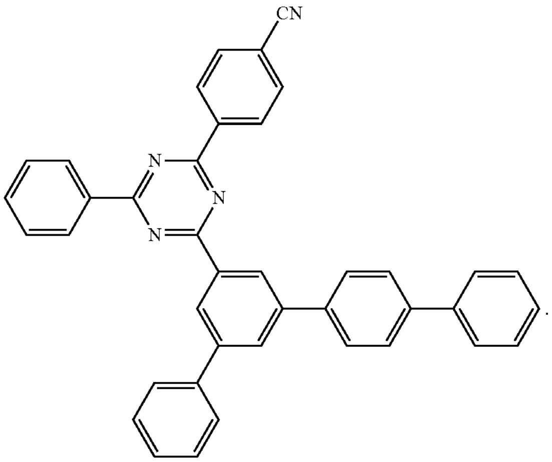

9. The light-emitting device of claim 1, wherein, in Formulae 3a, 3b, and 4a, ring CY32 to ring CY35, ring CY42, and ring CY43 are each independently a benzene group, a naphthalene group, or a phenanthrene group.

10. The light-emitting device of claim 1, wherein, in Formulae 3a, 3b, 4a, and 4b, $L_{31}$ to $L_{36}$ and $L_{41}$ to $L_{46}$ are each independently:

a single bond; or a phenylene group, a naphthylene group, a fluorenylene group, a triphenylenylene group, a carbazolylene group, a dibenzofuranylene group, a dibenzothiophenylene group, a benzocarbazolylene group, or a dibenzocarbazolylene group; or a phenylene group, a naphthylene group, a fluorenylene group, a triphenylenylene group, a carbazolylene group, a dibenzofuranylene group, a dibenzothiophenylene group, a benzocarbazolylene group, or a dibenzocarbazolylene group, each substituted with deuterium, —F, —Cl, —Br, —I, a hydroxyl group, a cyano group, a nitro group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a naphthyl group, a fluorenyl group, a triphenylenyl group, a carbazolyl group, a dibenzofuranyl group, a dibenzothiophenylene group, a benzocarbazolyl group, a dibenzocarbazolyl group, or any combination thereof.

11. The light-emitting device of claim 1, wherein, in Formulae 3a, 3b, 4a, and 4b, $R_{31}$ to $R_{37}$ and $R_{41}$ to $R_{46}$ are each independently:

hydrogen, deuterium, —F, a methyl group, an iso-propyl group, a tert-butyl group, or a cyano group;

a phenyl group, a biphenyl group, a naphthyl group, a $C_1$-$C_{20}$ alkylphenyl group, a triphenylenyl group, a pyridinyl group, a pyrimidinyl group, a pyridazinyl group, a pyrazinyl group, a triazinyl group, a fluorenyl group, a carbazolyl group, a benzocarbazolyl group, a dibenzocarbazolyl group, a dibenzofuranyl group, or a dibenzothiophenyl group, each unsubstituted or substituted with deuterium, —F, a tert-butyl group, a cyano group, a $C_1$-$C_{20}$ alkyl group, a phenyl group, a biphenyl group, a naphthyl group, a $C_1$-$C_{20}$ alkylphenyl group, a triphenylenyl group, a pyridinyl group, a pyrimidinyl group, a pyridazinyl group, a pyrazinyl group, a triazinyl group, a fluorenyl group, a carbazolyl group, a benzocarbazolyl group, a dibenzocarbazolyl group, a dibenzofuranyl group, a dibenzothiophenyl group, or any combination thereof, or —$Si(Q_1)(Q_2)(Q_3)$.

12. The light-emitting device of claim 1, wherein the first host is one of compounds represented by Formulae 3-1 to 3-22:

3-1

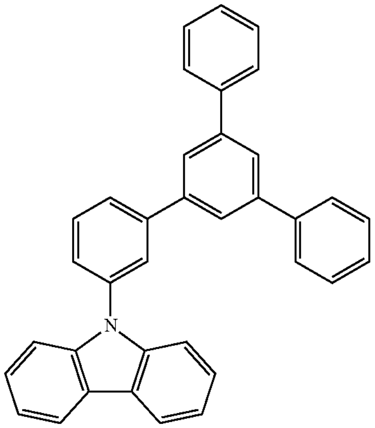

3-2

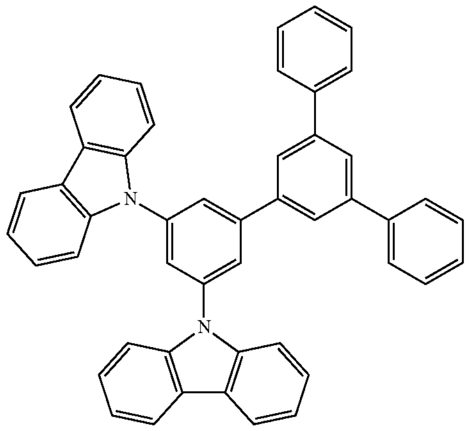

-continued 3-3

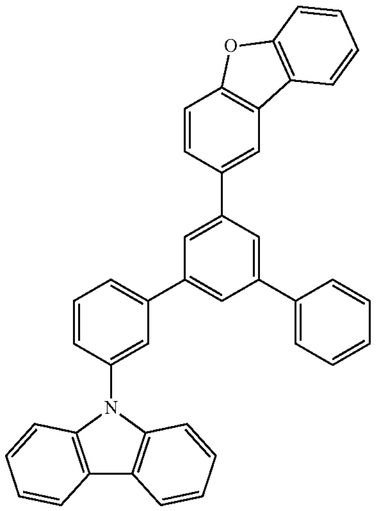

3-4

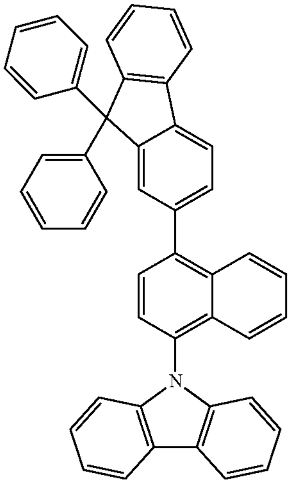

3-5

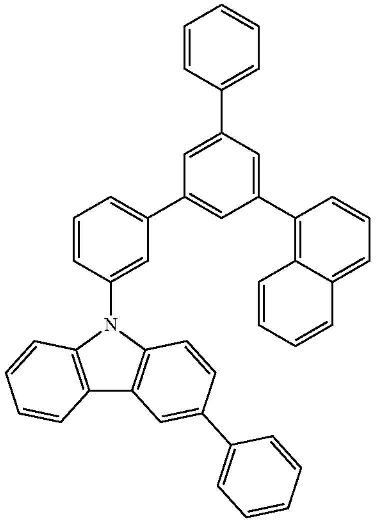

-continued
3-6
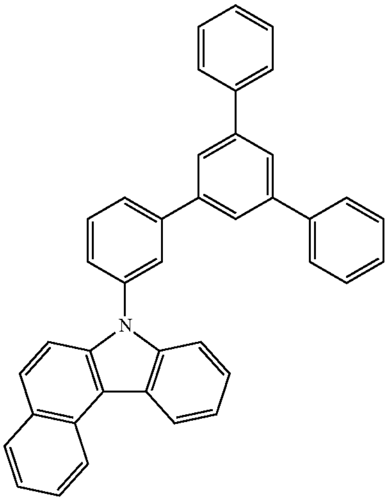
3-7
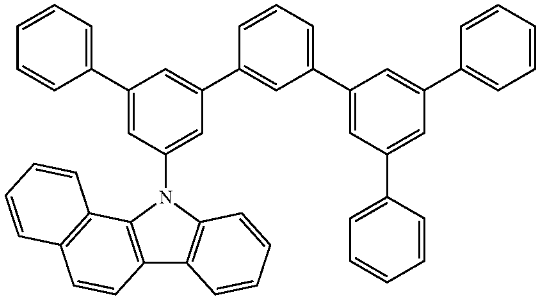
3-8
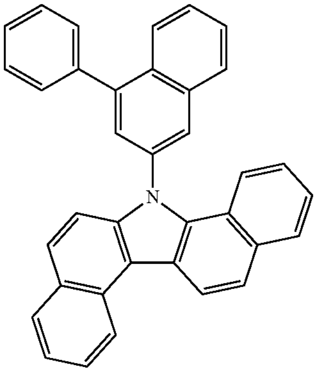
3-9
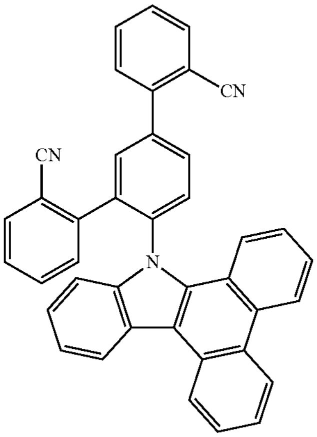
-continued
3-10
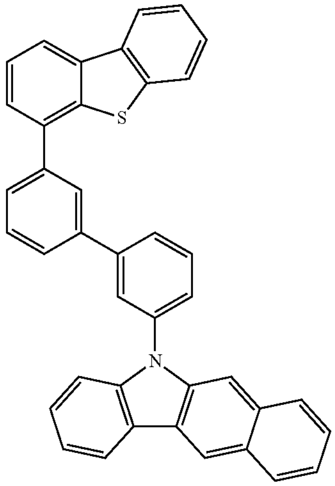
3-11
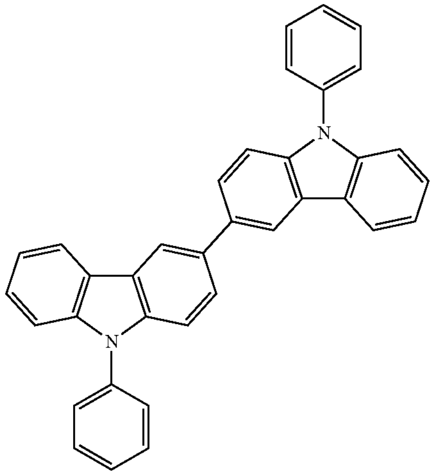
3-12
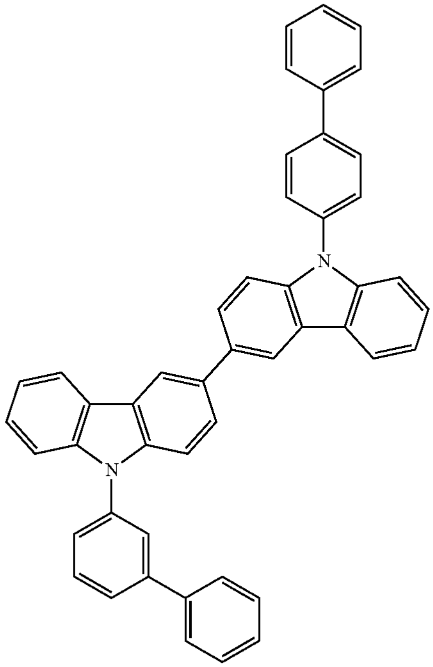

-continued
3-13
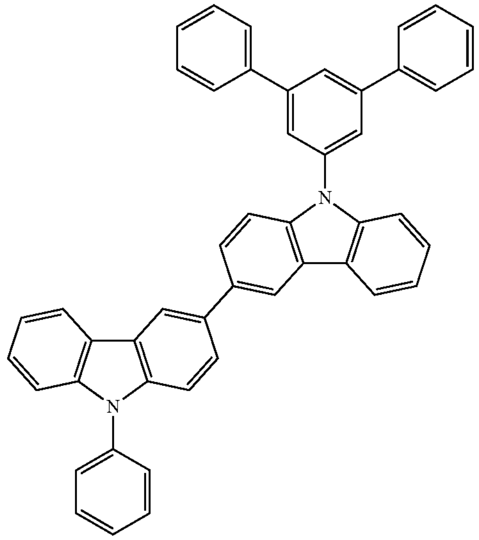
3-14
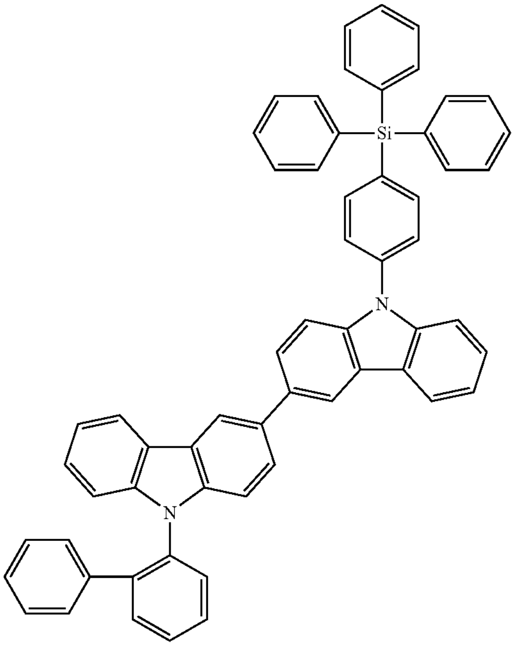
-continued
3-15
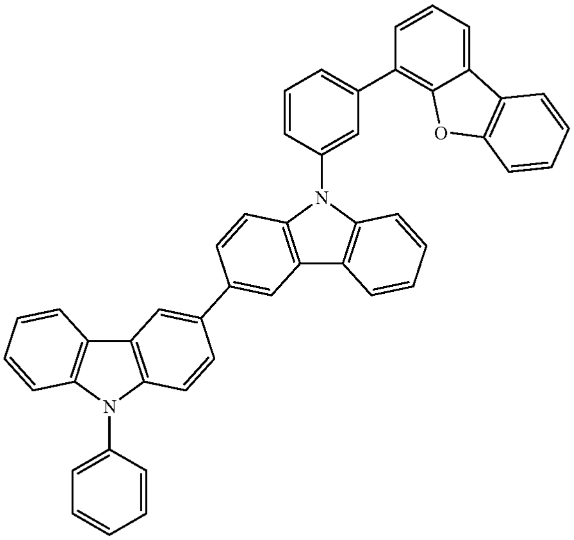
3-16
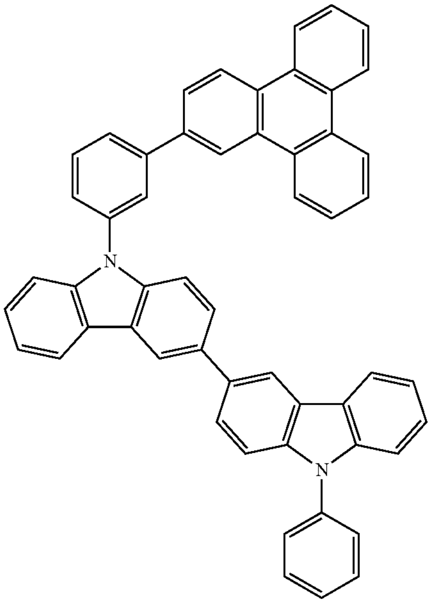
3-17
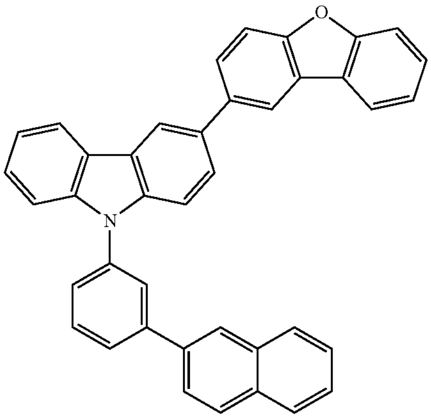

-continued
3-18
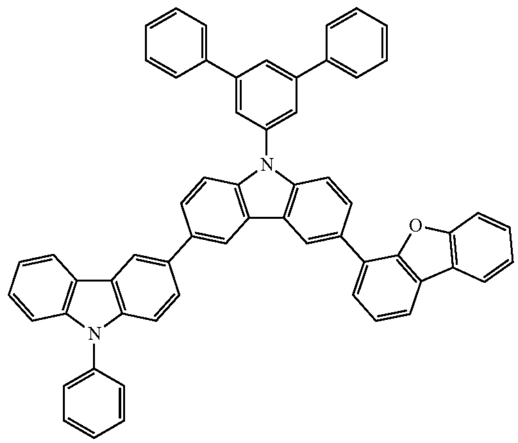
3-19
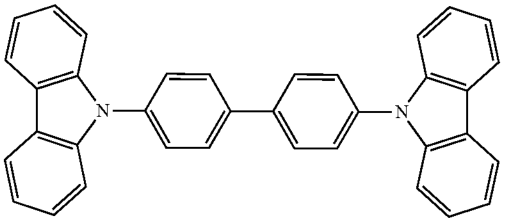
3-20
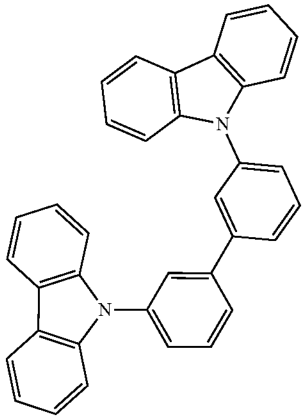
3-21
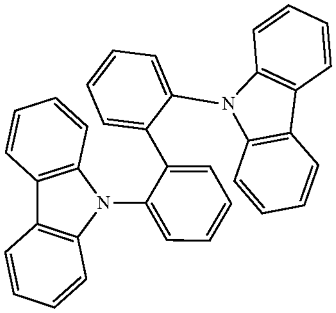
-continued
3-22
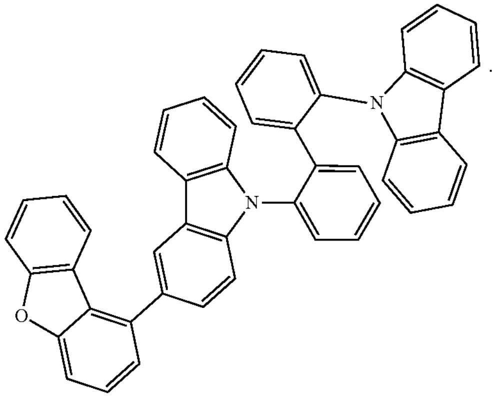
13. The light-emitting device of claim 1, wherein the second host is one of compounds represented by Formulae 4-1 to 4-16:
4-1
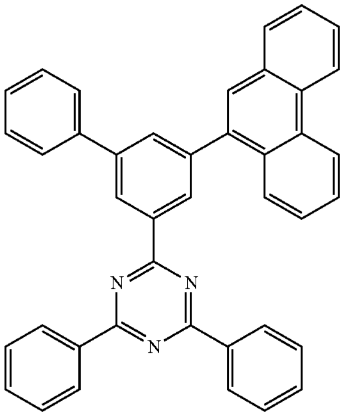
4-2
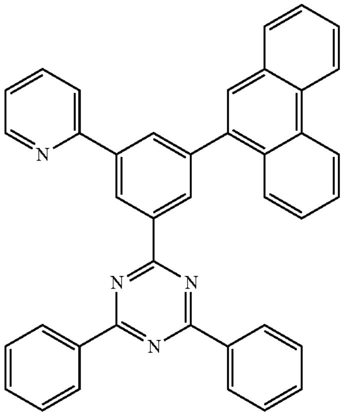

-continued
4-3
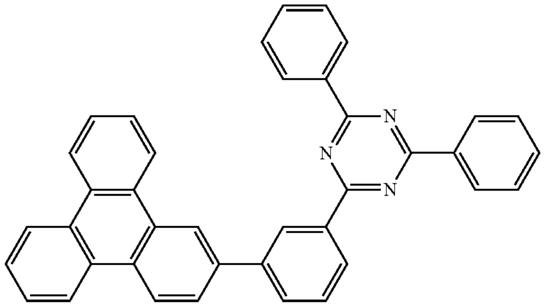
4-4
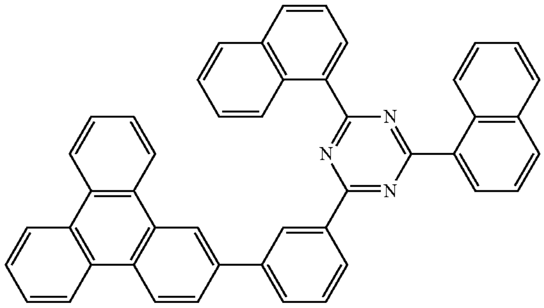
4-5
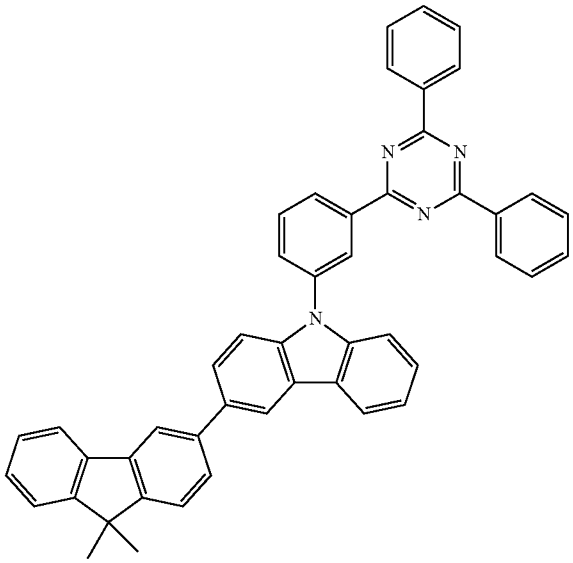
-continued
4-6
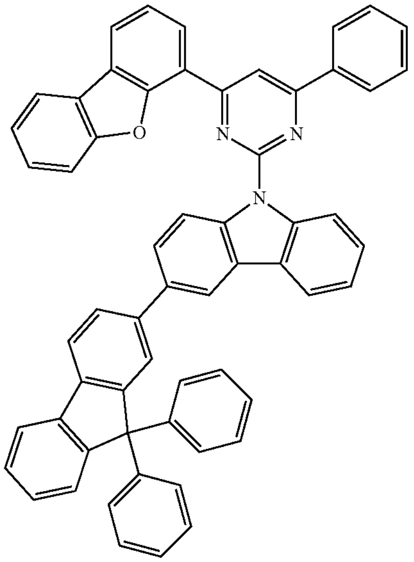
4-7
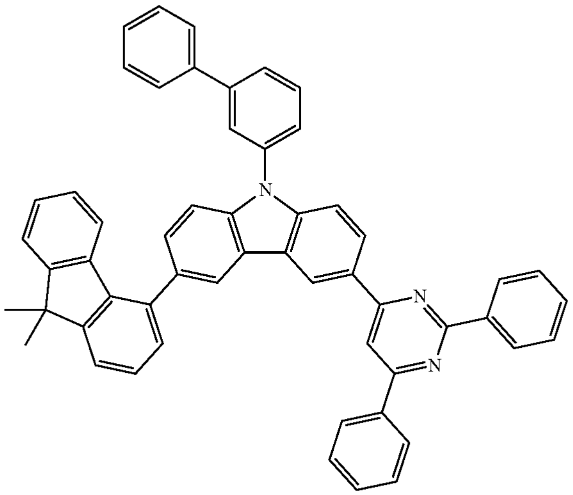
4-8
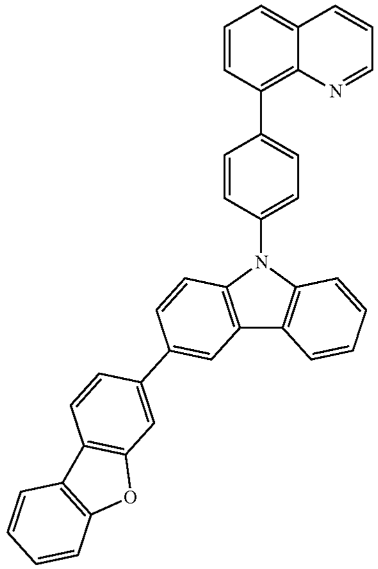

-continued
4-9
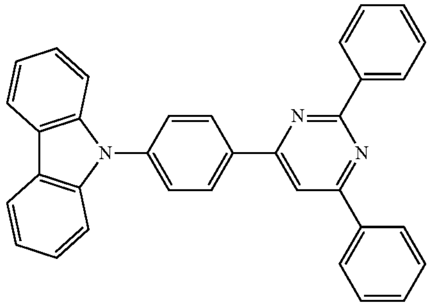
4-10
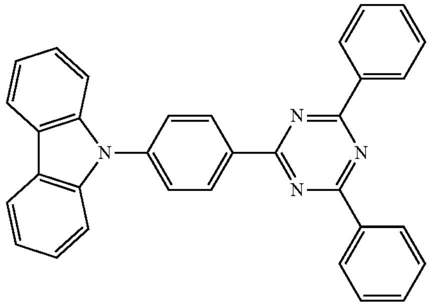
4-11
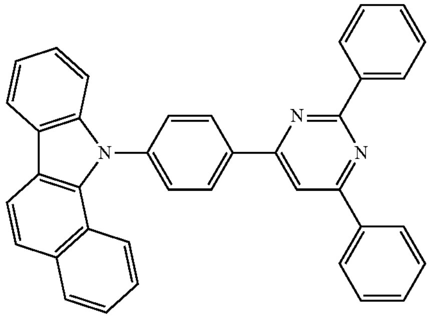
4-12
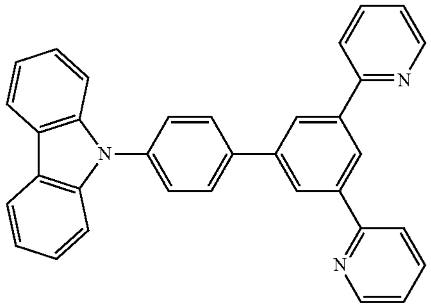
4-13
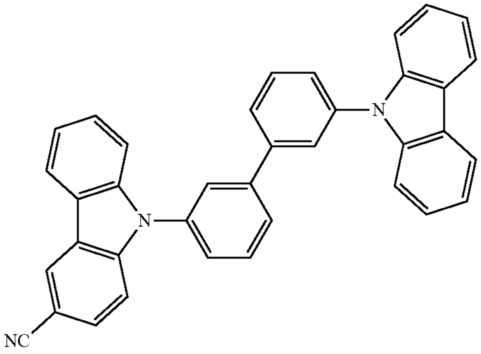
-continued
4-14
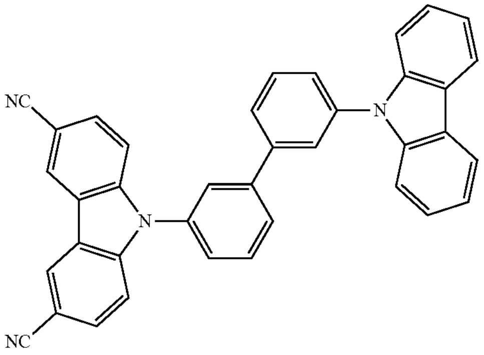
4-15
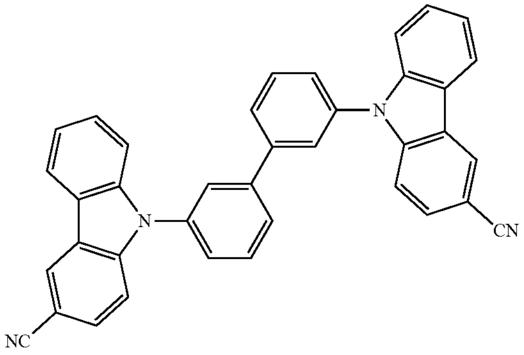
4-16
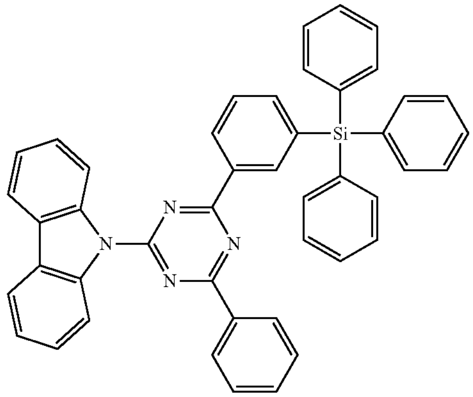
.
14. The light-emitting device of claim 1, wherein the dopant is an organometallic compound represented by Formula 5:
Formula 5
$$M(L_{51})_{a51}(L_{52})_{a52}$$

-continued

Formula 5a

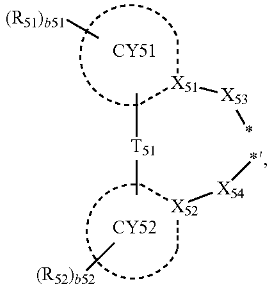

wherein, in Formulae 5 and 5a,

M is iridium (Ir), platinum (Pt), palladium (Pd), osmium (Os), titanium (Ti), gold (Au), hafnium (Hf), europium (Eu), terbium (Tb), rhodium (Rh), rhenium (Re), or thulium (Tm), $L_{51}$ is a ligand represented by Formula 5a, a51 is an integer from 1 to 3, when a51 is 2 or 3, two or three $L_{51}$(s) are identical to or different from each other, $L_{52}$ is an organic ligand, a52 is an integer from 1 to 3, when a52 is 2 or 3, two or three $L_{52}$(s) are identical to or different from each other, when a51 is 2 or 3, two rings CY51 of two or three $L_{51}$(s) are optionally linked together via $T_{52}$ which is a linking group, or two rings CY52 are optionally linked together via $T_{53}$ which is a linking group, $X_{51}$ and $X_{52}$ are each independently nitrogen or carbon, ring CY51 and ring CY52 are each independently a $C_3$-$C_{60}$ carbocyclic group or a $C_1$-$C_{60}$ heterocyclic group, $T_{51}$ to $T_{53}$ are each independently a single bond, *"—O—*"', *"—S—*"', *"—C(═O)—*"', *"—N($Q_{411}$)-*"', *"—C($Q_{411}$)($Q_{412}$)-*"', *"—C($Q_{411}$)═C($Q_{412}$)-*"', *"—C($Q_{411}$)═*"', or *"═C═*"',

*" and *"' each indicate a binding site to a neighboring atom, $X_{53}$ and $X_{54}$ are each independently a covalent bond, a coordinate bond, O, S, N($Q_{413}$), B($Q_{413}$), P($Q_{413}$), C($Q_{413}$)($Q_{414}$), or Si($Q_{413}$)($Q_{414}$), $R_{51}$ and $R_{52}$ are each independently hydrogen, deuterium, —F, —Cl, —Br, —I, a hydroxyl group, a cyano group, a nitro group, a $C_1$-$C_{20}$ alkyl group that is unsubstituted or substituted with at least one $R_{10a}$, a $C_1$-$C_{20}$ alkoxy group that is unsubstituted or substituted with at least one $R_{10a}$, a $C_3$-$C_{60}$ carbocyclic group that is unsubstituted or substituted with at least one $R_{10a}$, a $C_1$-$C_{60}$ heterocyclic group that is unsubstituted or substituted with at least one $R_{10a}$, —Si($Q_{401}$)($Q_{402}$)($Q_{403}$), —N($Q_{401}$)($Q_{402}$), —B($Q_{401}$)($Q_{402}$), —C(═O)($Q_{401}$), —S(═O)$_2$($Q_{401}$), or —P(═O)($Q_{401}$)($Q_{402}$), b51 and b52 are each independently an integer from 0 to 10, two or more of $R_{51}$(s) when b51 is an integer of 2 or more; two or more of $R_{52}$(s) when b52 is an integer of 2 or more; and $R_{51}$ and $R_{52}$ are optionally linked together to form a $C_3$-$C_{60}$ carbocyclic group that is unsubstituted or substituted with at least one $R_{10a}$ or a $C_1$-$C_{60}$ heterocyclic group that is unsubstituted or substituted with at least one $R_{10a}$, $Q_{401}$ to $Q_{403}$ and $Q_{411}$ to $Q_{414}$ are each independently hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; or a $C_3$-$C_{60}$ carbocyclic group, a $C_1$-$C_{60}$ heterocyclic group, a $C_7$-$C_{60}$ aryl alkyl group, or a $C_2$-$C_{60}$ heteroaryl alkyl group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof, and

* and *' in Formula 5a each indicates a binding site to M in Formula 5.

15. The light-emitting device of claim 1, wherein the dopant is one of compounds represented by Formulae 5-1 to 5-8:

5-1

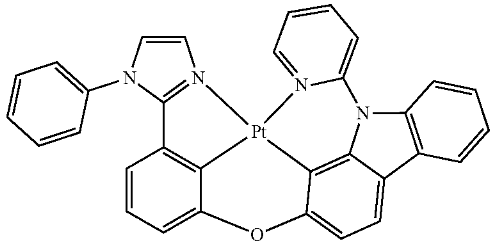

5-2

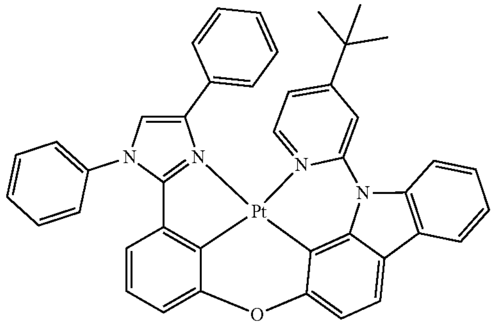

5-3

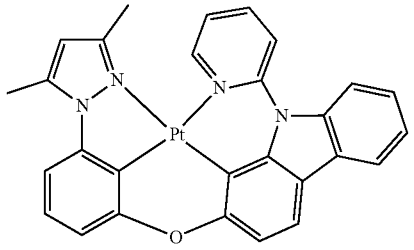

5-4

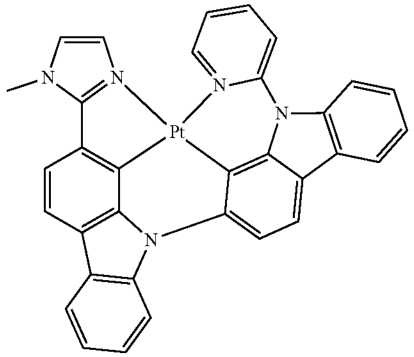

-continued 5-5

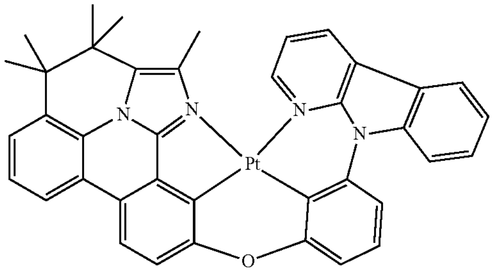

5-6

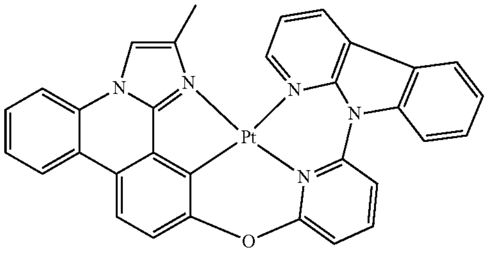

5-7

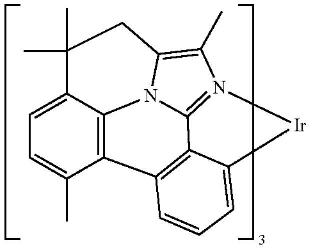

-continued 5-8

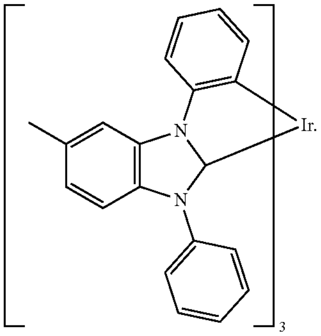

16. The light-emitting device of claim 1, wherein the emission layer is to emit blue light.

17. An electronic apparatus comprising the light-emitting device of claim 1.

18. The electronic apparatus of claim 17, further comprising a thin-film transistor, wherein the thin-film transistor comprises a source electrode and a drain electrode, and the first electrode of the light-emitting device is electrically connected to the source electrode or the drain electrode of the thin-film transistor.

19. The electronic apparatus of claim 17, further comprising a color filter, a quantum dot color conversion layer, a touch screen layer, a polarizing layer, or any combination thereof.

* * * * *